United States Patent
Yoshida et al.

(10) Patent No.: US 8,399,932 B2
(45) Date of Patent: Mar. 19, 2013

(54) SEMICONDUCTOR DEVICE, SEMICONDUCTOR INTEGRATED CIRCUIT, SRAM, AND METHOD FOR PRODUCING DT-MOS TRANSISTOR

(75) Inventors: Eiji Yoshida, Yokohama (JP); Akihisa Yamaguchi, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 31 days.

(21) Appl. No.: 13/118,918

(22) Filed: May 31, 2011

(65) Prior Publication Data
US 2012/0032272 A1 Feb. 9, 2012

(30) Foreign Application Priority Data
Aug. 6, 2010 (JP) ................... 2010-177443

(51) Int. Cl.
*H01L 21/70* (2006.01)
(52) U.S. Cl. ........ 257/369; 257/371; 257/503; 257/505; 257/506; 257/508; 257/376
(58) Field of Classification Search .................. 257/369, 257/371, 503, 505, 506, 507, 508, 376
See application file for complete search history.

(56) References Cited

U.S. PATENT DOCUMENTS

| | | | | |
|---|---|---|---|---|
| 5,610,550 A * | 3/1997 | Furutani | ........................ | 327/543 |
| 5,920,089 A * | 7/1999 | Kanazawa et al. | ............. | 257/202 |
| 6,009,021 A * | 12/1999 | Kioi | ........................ | 365/189.06 |
| 6,040,610 A * | 3/2000 | Noguchi et al. | ............... | 257/392 |
| 6,140,686 A * | 10/2000 | Mizuno et al. | ................. | 257/369 |
| 6,177,811 B1 * | 1/2001 | Fuse et al. | ..................... | 326/119 |
| 6,218,895 B1 * | 4/2001 | De et al. | ........................ | 327/566 |
| 6,300,819 B1 * | 10/2001 | De et al. | ........................ | 327/534 |
| 6,455,901 B2 * | 9/2002 | Kameyama et al. | ........... | 257/371 |
| 6,593,799 B2 * | 7/2003 | De et al. | ........................ | 327/534 |
| 6,646,296 B2 * | 11/2003 | Horiuchi | ........................ | 257/288 |
| 6,774,440 B1 * | 8/2004 | Shibata et al. | ................ | 257/369 |
| 6,949,777 B2 * | 9/2005 | Hayashi et al. | ................ | 257/213 |
| 7,109,568 B2 * | 9/2006 | Kumagai et al. | ............... | 257/627 |
| 7,190,032 B2 * | 3/2007 | Hayashi et al. | ................ | 257/366 |

(Continued)

FOREIGN PATENT DOCUMENTS

| | | |
|---|---|---|
| JP | 2000-114399 A | 4/2000 |
| JP | 2006-049784 A | 2/2006 |

OTHER PUBLICATIONS

Assaderaghi, F. et al., "A Dynamic Threshold Voltage MOSFET(DTMOS) for Very Low Voltage Operation", IEEE Electron Device Letters, vol. 15, pp. 510-512 (1994).

*Primary Examiner* — Fernando L Toledo
*Assistant Examiner* — Mohammed Shamsuzzaman
(74) *Attorney, Agent, or Firm* — Westerman, Hattori, Daniels & Adrian, LLP

(57) ABSTRACT

A semiconductor device includes a silicon substrate; an element isolation region; an element region including a first well; a contact region; a gate electrode extending from the element region to a sub-region of the element isolation region between the element region and the contact region; a source diffusion region; a drain diffusion region; a first insulating region contacting a lower end of the source diffusion region; a second insulating region contacting a lower end of the drain diffusion region; and a via plug configured to electrically connect the gate electrode with the contact region. The first well is disposed below the gate electrode and is electrically connected with the contact region via the silicon substrate under the sub-region. The lower end of the element isolation region except the sub-region is located lower than the lower end of the first well.

12 Claims, 136 Drawing Sheets

U.S. PATENT DOCUMENTS

| | | | |
|---|---|---|---|
| 7,269,053 B2* | 9/2007 | Anezaki et al. | 365/154 |
| 7,425,744 B2* | 9/2008 | Mokhlesi et al. | 257/350 |
| 7,508,692 B2* | 3/2009 | Anezaki et al. | 365/63 |
| 7,755,928 B2* | 7/2010 | Anezaki et al. | 365/154 |
| 7,808,017 B2* | 10/2010 | Hamada | 257/204 |
| 7,893,477 B2* | 2/2011 | Watanabe et al. | 257/296 |
| 7,956,421 B2* | 6/2011 | Becker | 257/369 |
| 8,048,732 B2* | 11/2011 | Kapoor et al. | 438/199 |
| 8,159,013 B2* | 4/2012 | Nishimura et al. | 257/296 |
| 8,178,909 B2* | 5/2012 | Venkatraman et al. | 257/211 |
| 8,203,149 B2* | 6/2012 | Azuma | 257/71 |
| 8,258,581 B2* | 9/2012 | Becker | 257/369 |
| 8,273,617 B2* | 9/2012 | Thompson et al. | 438/197 |
| 2002/0135068 A1* | 9/2002 | Honda | 257/758 |
| 2002/0195623 A1* | 12/2002 | Horiuchi | 257/200 |
| 2003/0087480 A1* | 5/2003 | Kang | 438/151 |
| 2003/0102514 A1 | 6/2003 | Sato | |
| 2003/0209761 A1* | 11/2003 | Yagishita et al. | 257/347 |
| 2003/0218193 A1* | 11/2003 | Hayashi et al. | 257/288 |
| 2004/0142579 A1* | 7/2004 | Morita et al. | 438/785 |
| 2004/0217448 A1* | 11/2004 | Kumagai et al. | 257/627 |
| 2005/0077550 A1* | 4/2005 | Inaba et al. | 257/250 |
| 2005/0078546 A1 | 4/2005 | Hirano et al. | |
| 2005/0190633 A1* | 9/2005 | Kang et al. | 365/230.06 |
| 2005/0253196 A1* | 11/2005 | Yagishita et al. | 257/347 |
| 2007/0029621 A1* | 2/2007 | Tatsumi | 257/371 |
| 2007/0069306 A1* | 3/2007 | Kapoor et al. | 257/369 |
| 2007/0085146 A1* | 4/2007 | Sumita | 257/371 |
| 2007/0176237 A1* | 8/2007 | Yagishita et al. | 257/347 |
| 2010/0244142 A1* | 9/2010 | Katakura | 257/369 |
| 2011/0102019 A1* | 5/2011 | Osada et al. | 326/102 |
| 2012/0033488 A1* | 2/2012 | Nagatsuka et al. | 365/149 |
| 2012/0193717 A1* | 8/2012 | Katakami et al. | 257/348 |

* cited by examiner

AA-AA'

BB-BB'

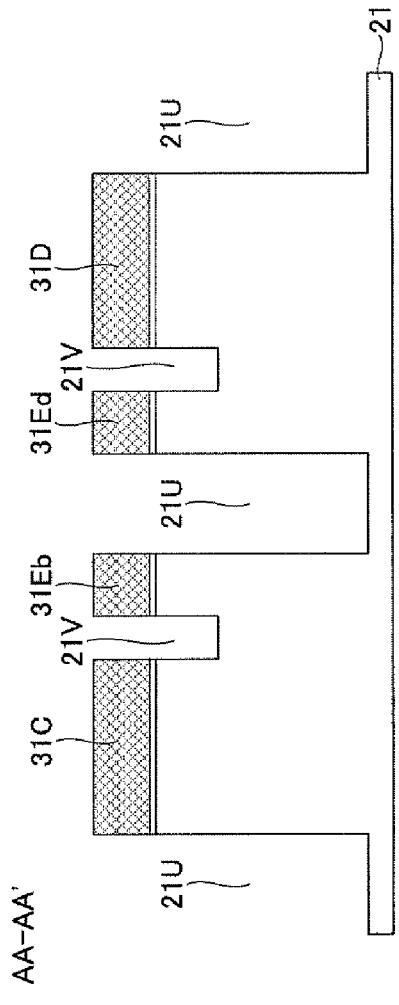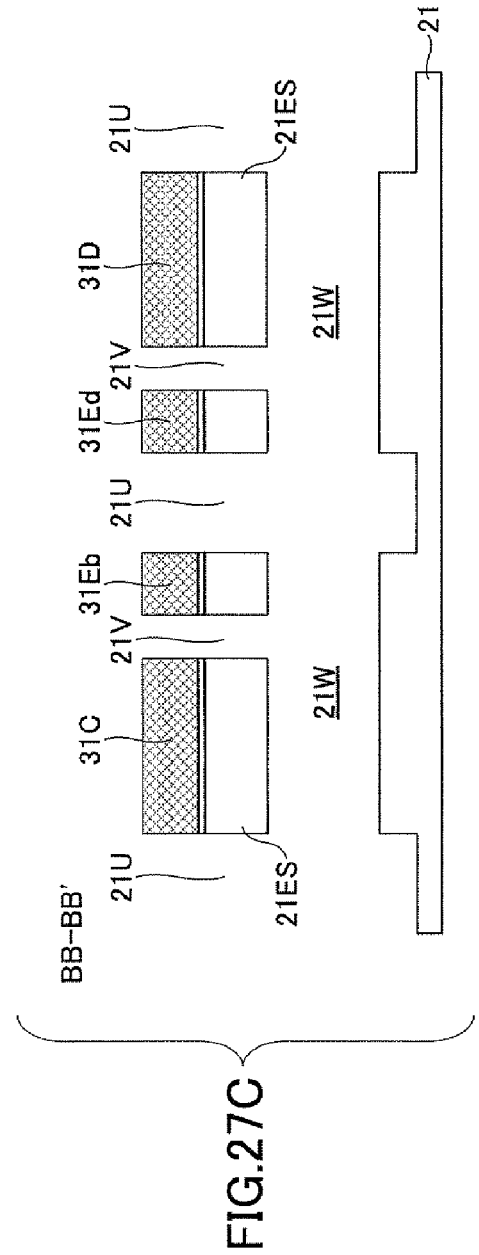

A-A'

C-C'

AA-AA'

A-A'

C-C'

D-D'

C-C'

D-D'

D-D'

SEMICONDUCTOR DEVICE, SEMICONDUCTOR INTEGRATED CIRCUIT, SRAM, AND METHOD FOR PRODUCING DT-MOS TRANSISTOR

CROSS-REFERENCE TO RELATED APPLICATION

This application is based upon and claims the benefit of priority of Japanese Patent Application No. 2010-177443 filed on Aug. 6, 2010, the entire contents of which are incorporated herein by reference.

FIELD

The embodiments discussed herein are related to a dynamic-threshold metal-oxide-semiconductor transistor (hereafter called a Dt-MOS transistor), a method for producing the Dt-MOS transistor, and a semiconductor integrated circuit.

BACKGROUND

In a Dt-MOS transistor, a gate electrode is short-circuited to a semiconductor layer or a well region where a channel region is formed, and an input signal is applied at the same time to both the gate electrode and the semiconductor layer or the well region where the channel region is formed. This configuration makes it possible to achieve a low off-state current and a high on-state current with a low threshold voltage and thereby makes it possible to reduce the power consumption. The semiconductor layer or the well region where the channel region is formed may be called a body.

FIG. 1 is a drawing illustrating an exemplary configuration of a typical Dt-MOS transistor 10, and FIG. 2 is a graph representing operating characteristics of the Dt-MOS transistor 10 of FIG. 1.

The Dt-MOS transistor 10 of FIG. 1 is an re-channel MOS transistor and includes a silicon substrate 11 on which a p-type well 11P is formed. The p-type well 11P includes a source region 11S and a drain region 11D that are n-doped. The Dt-MOS transistor 10 also includes a gate insulating film 12 formed on a channel region 11C between the source region 11S and the drain region 11D and a gate electrode 13 formed on the silicon substrate 11 via the gate insulating film 12. The gate electrode 13 includes, for example, n-type polysilicon.

The gate electrode 13 is electrically connected to the p-type well 11P, i.e., a body. Accordingly, a signal voltage applied to the gate electrode 13 is also applied to the body 11P. With this configuration, the signal voltage causes a decrease in the threshold voltage of the Dt-MOS transistor 10 and as the signal voltage increases, the operating characteristics of the Dt-MOS transistor 10 gradually come close to the operating characteristics of a MOS transistor with a low threshold voltage. In this case, the Dt-MOS transistor 10 is turned on with a low signal voltage.

Meanwhile, when the signal voltage is low, i.e., equal or close to 0 V, the electric potential of the body 11P becomes equal or close to 0 V and the operating characteristics of the Dt-MOS transistor 10 come close to the operating characteristics of a MOS transistor with a high threshold voltage. In this case, the threshold voltage of the Dt-MOS transistor 10 is similar to a high threshold voltage of a typical re-channel MOS transistor, and the off-current and the off-leakage current of the Dt-MOS transistor 10 are low as illustrated in FIG. 2.

With the Dt-MOS transistor 10 as described above, since a junction region 11J (surrounded by a dotted line in FIG. 1) between the source region 11S and the body 11P is forward-biased, it is not possible to apply a high supply voltage between the source region 11S and the drain region 11D. When a silicon substrate is used as in the Dt-MOS transistor 10, it is necessary to set the supply voltage at 0.7 V or lower that corresponds to the built-in potential of the silicon pn-junction.

The above descriptions also apply to a p-channel MOS transistor where "p-type" and "n-type" in the Dt-MOS transistor 10 are reversed.

[Patent document 1] Japanese Laid-Open Patent Publication No. 2006-49784

[Patent document 2] Japanese Laid-Open Patent Publication No. 2000-114399

[Non-patent document 1] Assaderaaghi, F. et al., IEEE Electron Device Lett. 15, pp. 510-(1994)

When a Dt-MOS transistor as described above is formed on a typical silicon substrate (hereafter called a silicon bulk substrate) that is cut out from a single-crystal silicon ingot, the leakage current from the source or the drain tends to increase. Also in this case, the junction capacitance between the body and the source region or the drain region may increase and the operation speed of the Dt-MOS transistor may be reduced due to the influence of the time constant. For these reasons, a Dt-MOS transistor is typically formed on a silicon-on-insulator (SOI) substrate (see, for example, non-patent document 1). The operating characteristics in FIG. 2 are obtained using a Dt-MOS transistor formed on a SOI substrate as described in non-patent document 1.

However, in a semiconductor integrated circuit such as a System On Chip (SoC) where a system is implemented on one substrate, transistors other than dynamic threshold transistors such as Dt-MOS transistors are also integrated on the same substrate. Such transistors may include input/output transistors and analog transistors that are not designed to use dynamic thresholds.

Here, with a Dt-MOS transistor, as is apparent from FIG. 1, the same signal applied to the gate electrode is also applied to the channel region directly below the gate electrode. Therefore, when Dt-MOS transistors are integrated on one silicon substrate, the Dt-MOS transistors may interfere with each other or with other transistors.

To prevent such interference, one well may be provided for each transistor and adjacent wells may be electrically separated from each other by a well with an opposite conductivity type. However, this configuration greatly increases the area occupied by the Dt-MOS transistors on the silicon substrate.

FIG. 3 illustrates an exemplary semiconductor structure where two Dt-MOS transistors with the configuration illustrated in FIG. 1 are formed adjacent to each other on one silicon substrate 11.

In FIG. 3, two p-type wells $11P_1$ and $11P_2$ are formed in a deep n-type well 11N that is formed in the silicon substrate 11. The Dt-MOS transistors are n-channel Dt-MOS transistors and are formed in the corresponding p-type wells $11P_1$ and $11P_2$. The p-type wells $11P_1$ and $11P_2$ are separated from each other by an n-type well 11n having a width B and extending upward from the n-type well 11N. A shallow trench isolation (STI) region 11I is formed on the silicon substrate to prevent short circuit of the n-type well 11n and an n-type source region 11S and/or an n-type drain region 11D. The STI region 11I is wider than the n-type well 11n and is deeper than the n-type source region 11S and the n-type drain region 11D.

This configuration may prevent the interference between the n-channel Dt-MOS transistors, but increases the area of the semiconductor structure by the width B of the n-type well 11n separating the p-type wells 11P₁ and 11P₂.

The width B of the n-type well 11n is determined according to design rules employed and taking into account the breakdown voltage of a pn junction to be formed and an error in the size or the position of an ion implantation mask, and therefore cannot be changed freely. When, for example, the width B is set at 0.5 μm, even if the area of gate electrodes 13 is considered, the area of the semiconductor structure becomes almost two times greater than a case where Dt-MOS transistors are not used, i.e., where the drain region 11D in the p-type well 11P₁ is adjacent to the source region 11S in the p-type well 11P₂.

SUMMARY

According to an aspect of the invention, there is provided a semiconductor device including a silicon substrate; an element isolation region formed in the silicon substrate; an element region including a first well having a first conductivity type; a contact region having the first conductivity type, the element region and the contact region being defined by the element isolation region; a gate electrode formed on the silicon substrate via a gate insulating film and extending from the element region to a sub-region of the element isolation region between the element region and the contact region; a source diffusion region formed in the first well and having a second conductivity type that is opposite to the first conductivity type; a drain diffusion region formed in the first well and having the second conductivity type; a first insulating region formed in the silicon substrate and disposed to contact a lower end of the source diffusion region; a second insulating region formed in the silicon substrate and disposed to contact a lower end of the drain diffusion region; and a via plug configured to electrically connect the gate electrode with the contact region. The first well is disposed below the gate electrode between the first insulating region and the second insulating region; the first well is electrically connected with the contact region via the silicon substrate under the sub-region; the upper ends of the first and second insulating regions are located higher than the lower end of the first well; the lower ends of the first and second insulating regions are located lower than the lower end of the first well; the lower end of the element isolation region except the sub-region is located lower than the lower end of the first well; and the sub-region is in contact with the first and second insulating regions at a position higher than the lower end of the first well.

The object and advantages of the invention will be realized and attained by means of the elements and combinations particularly pointed out in the claims.

It is to be understood that both the foregoing general description and the followed detailed description are exemplary and explanatory and are not restrictive of the invention as claimed.

BRIEF DESCRIPTION OF DRAWINGS

FIG. 27B is a cross-sectional view of the silicon bulk substrate of FIG. 27A taken along line AA-AA';

FIG. 27C is a cross-sectional view of the silicon bulk substrate of FIG. 27A taken along line BB-BB';

FIG. 38D is a cross-sectional view of the silicon bulk substrate of FIG. 38A taken along line C-C';

FIG. 38E is a cross-sectional view of the silicon bulk substrate of FIG. 38A taken along line D-D';

FIG. 39A is a plan view of a silicon bulk substrate used to describe a method of producing a semiconductor integrated circuit according to the second embodiment;

FIG. 39B is a cross-sectional view of the silicon bulk substrate of FIG. 39A taken along line AA-AA';

FIG. 39C is a cross-sectional view of the silicon bulk substrate of FIG. 39A taken along line A-A';

FIG. 39D is a cross-sectional view of the silicon bulk substrate of FIG. 39A taken along line C-C';

FIG. 39E is a cross-sectional view of the silicon bulk substrate of FIG. 39A taken along line D-D';

FIG. 40A is a plan view of a silicon bulk substrate used to describe a method of producing a semiconductor integrated circuit according to the second embodiment;

FIG. 40B is a cross-sectional view of the silicon bulk substrate of FIG. 40A taken along line AA-AA';

FIG. 40C is a cross-sectional view of the silicon bulk substrate of FIG. 40A taken along line A-A';

FIG. 40D is a cross-sectional view of the silicon bulk substrate of FIG. 40A taken along line C-C';

FIG. 40E is a cross-sectional view of the silicon bulk substrate of FIG. 40A taken along line D-D';

Figure 41A:
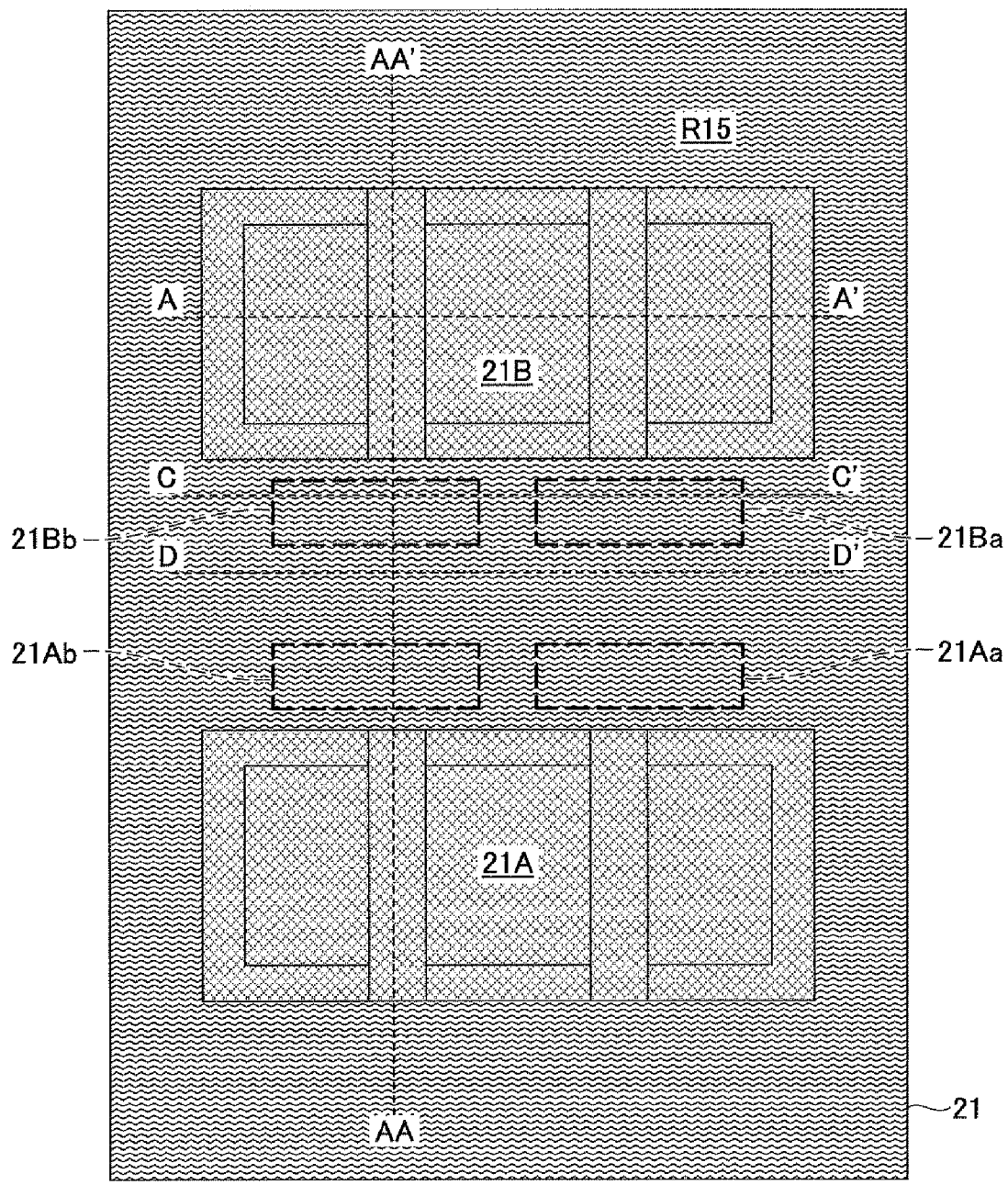
Figure 41B:
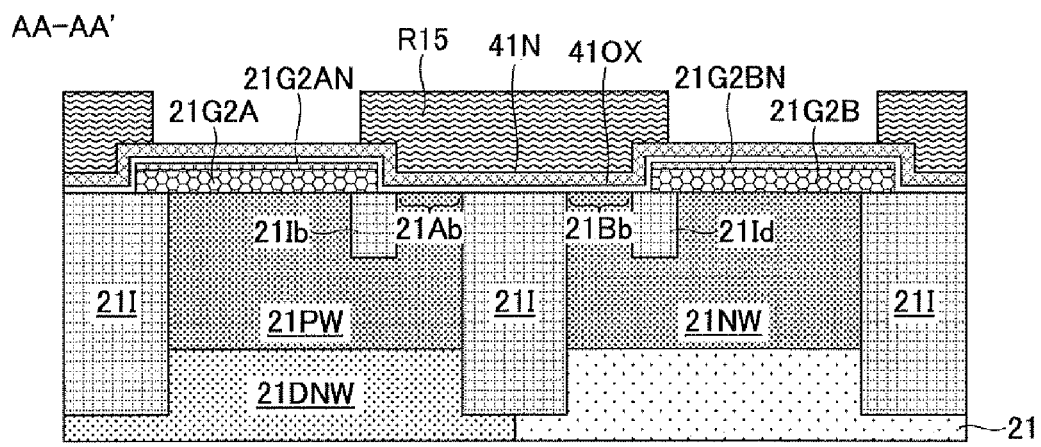
Figure 41C:
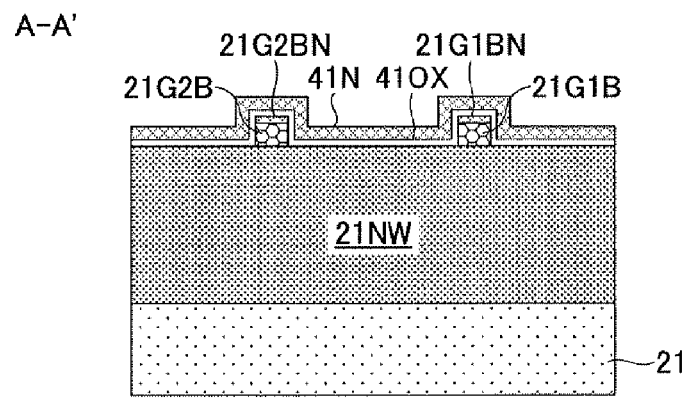
Figure 41D:
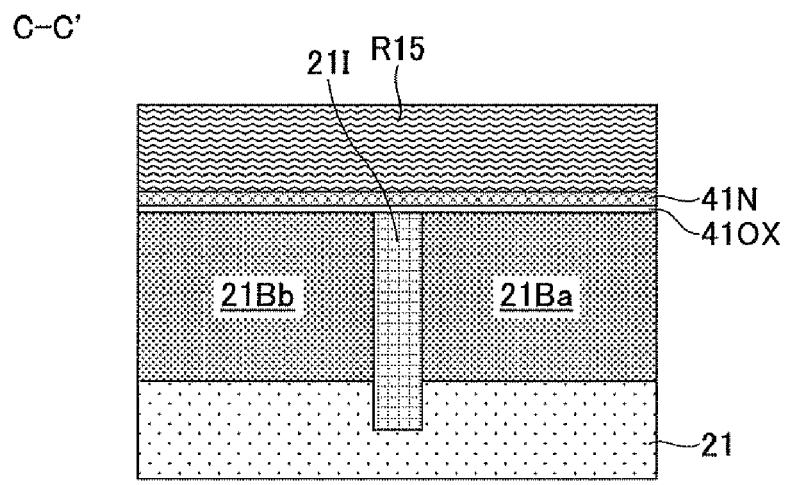
Figure 41E:
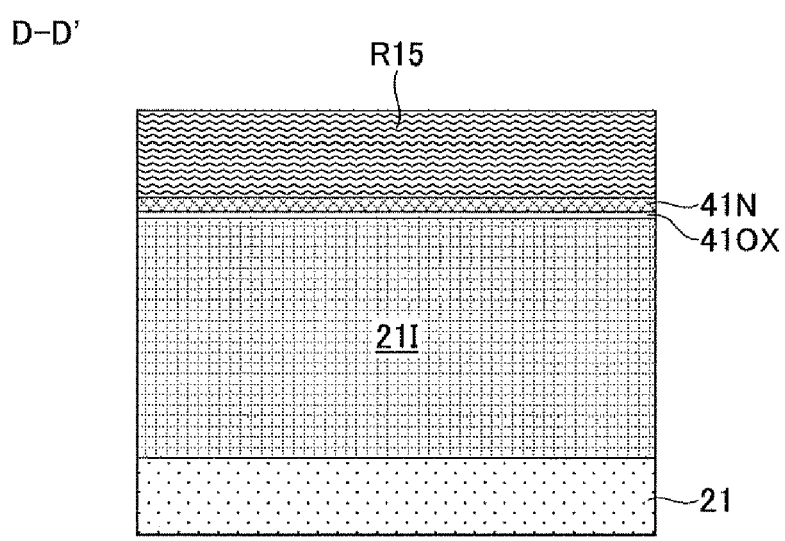
Figure 42A:
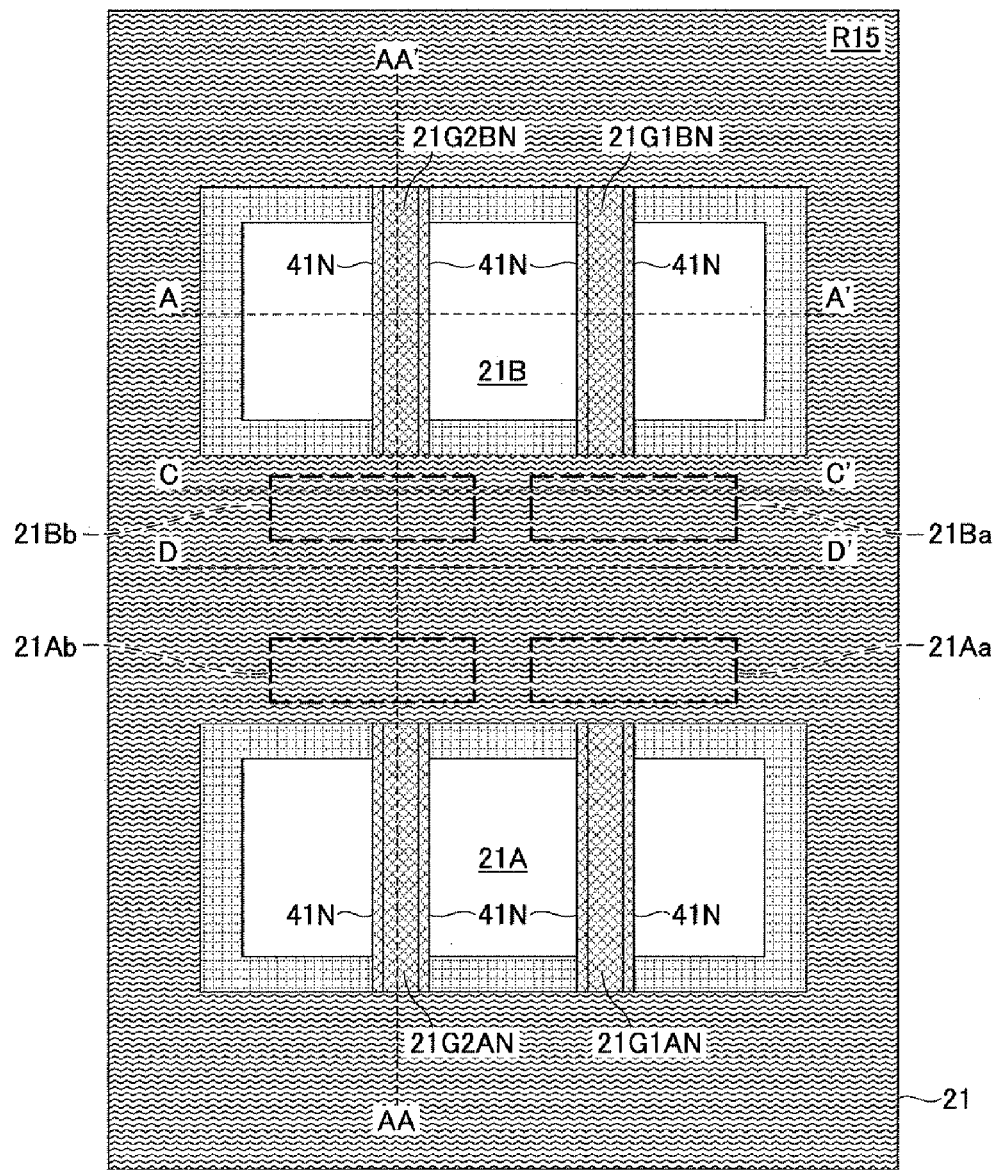
Figure 42B:
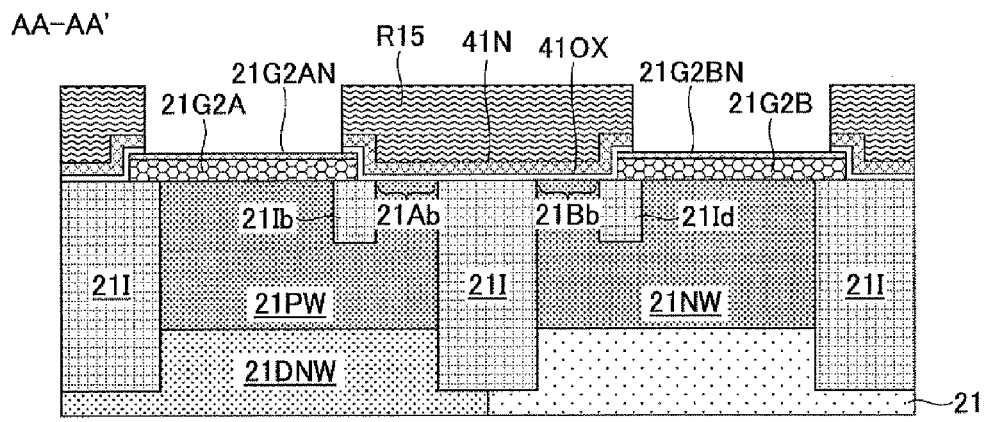
Figure 42C:
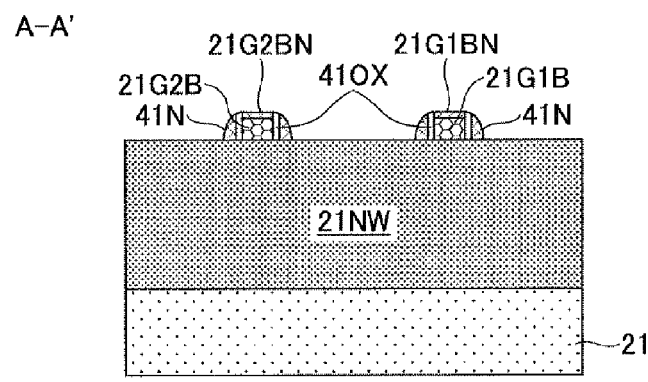
Figure 42D:
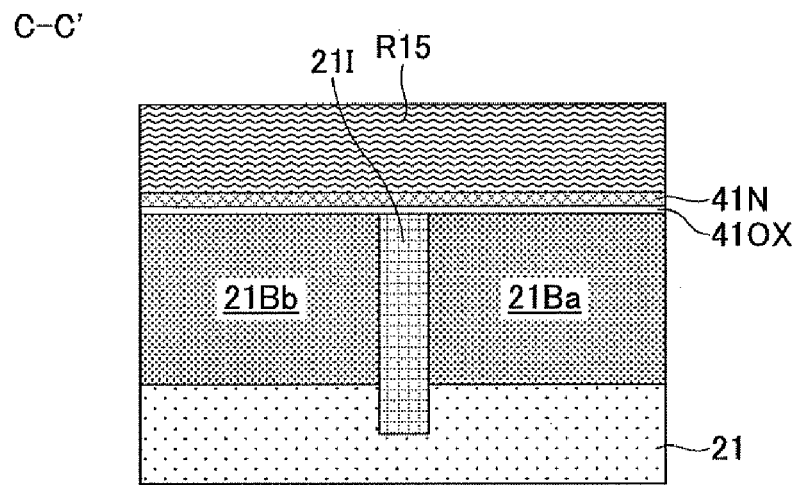
Figure 42E:
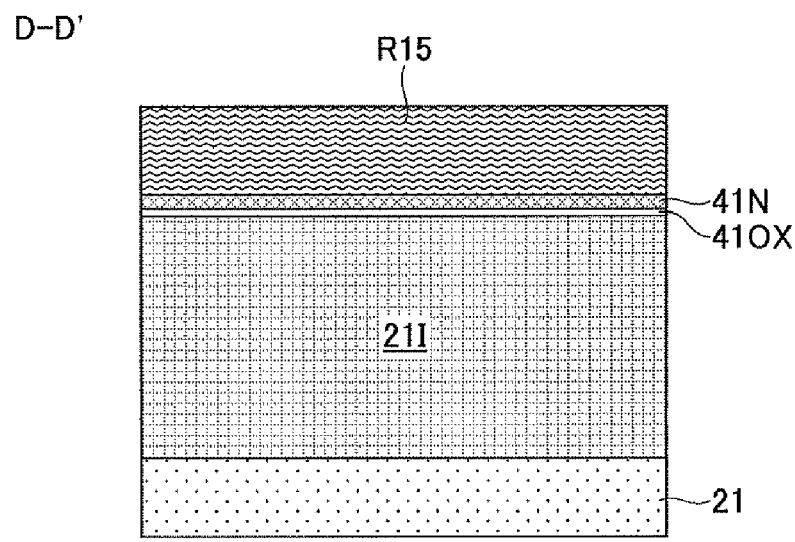
Figure 43A:
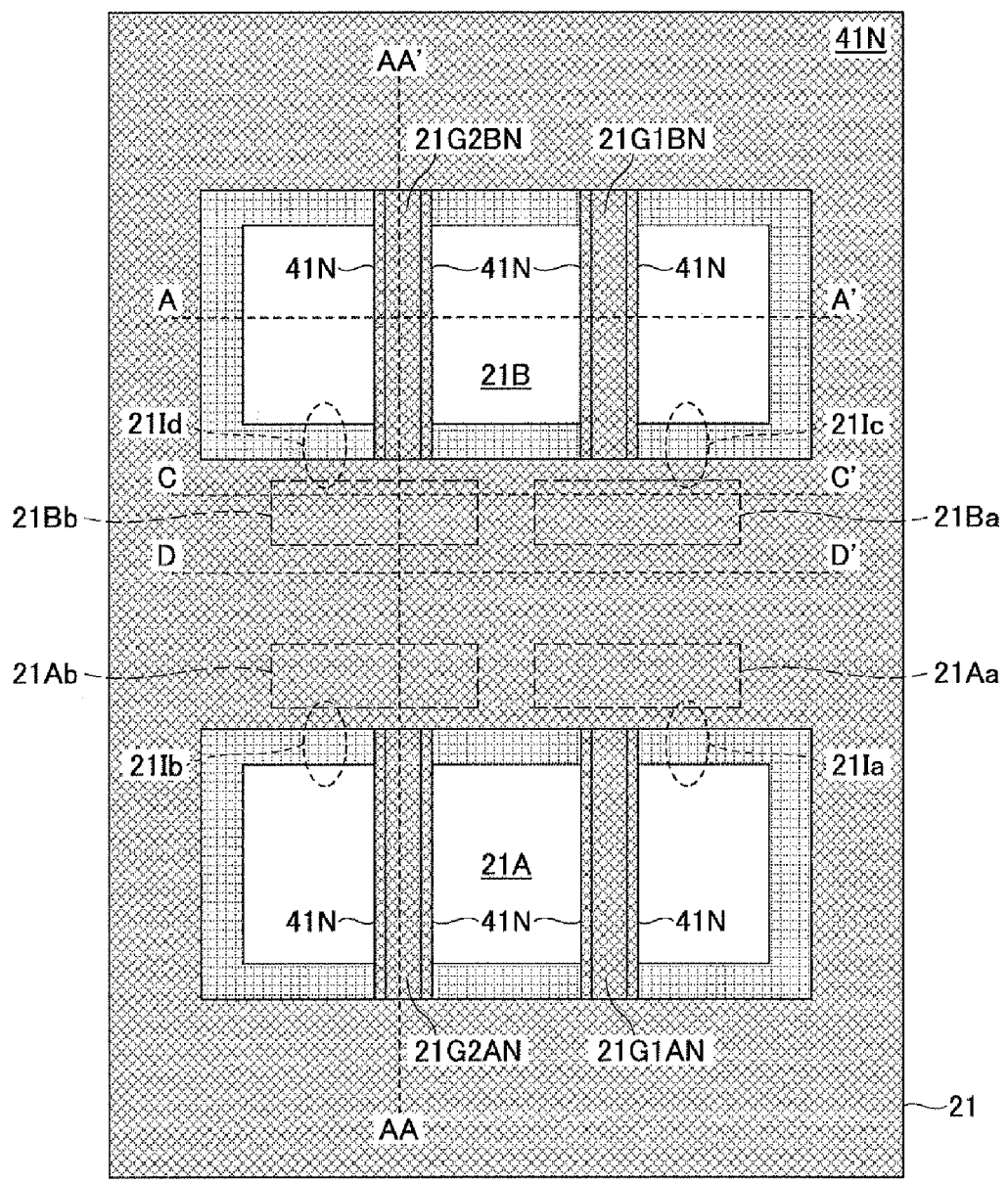
Figure 43B:
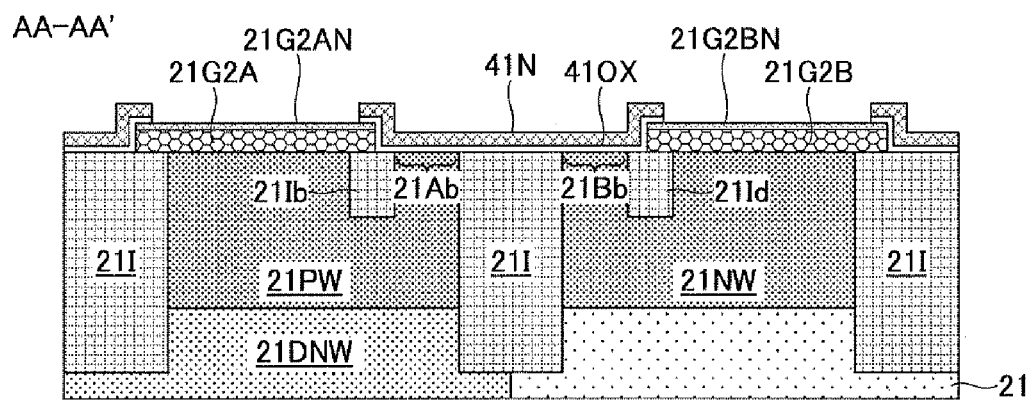
Figure 43C:
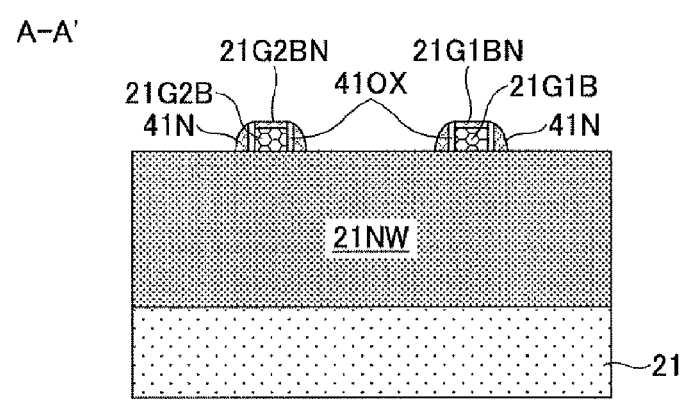
Figure 43D:
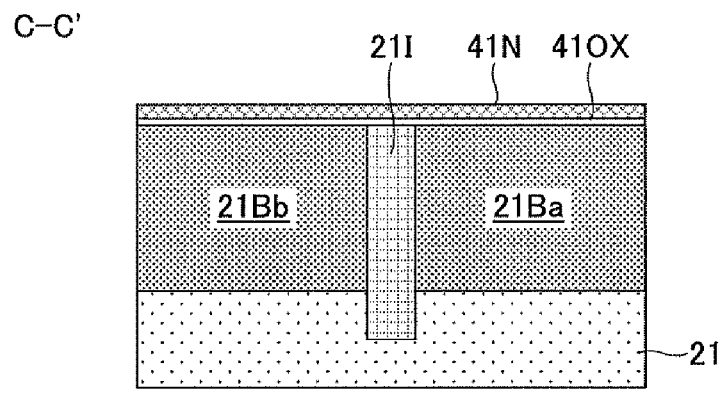
Figure 43E:
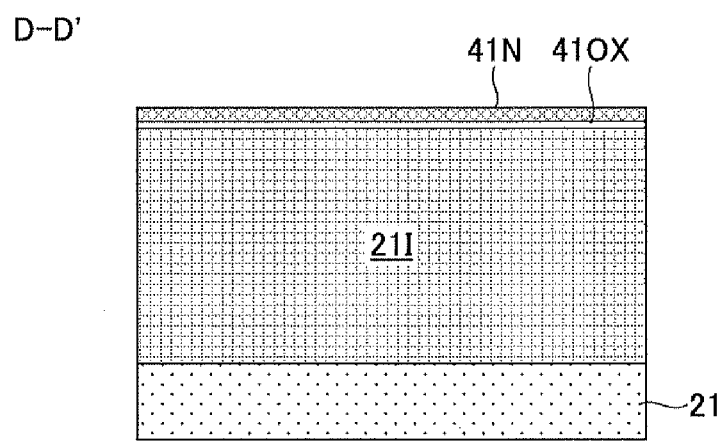
Figure 44A:
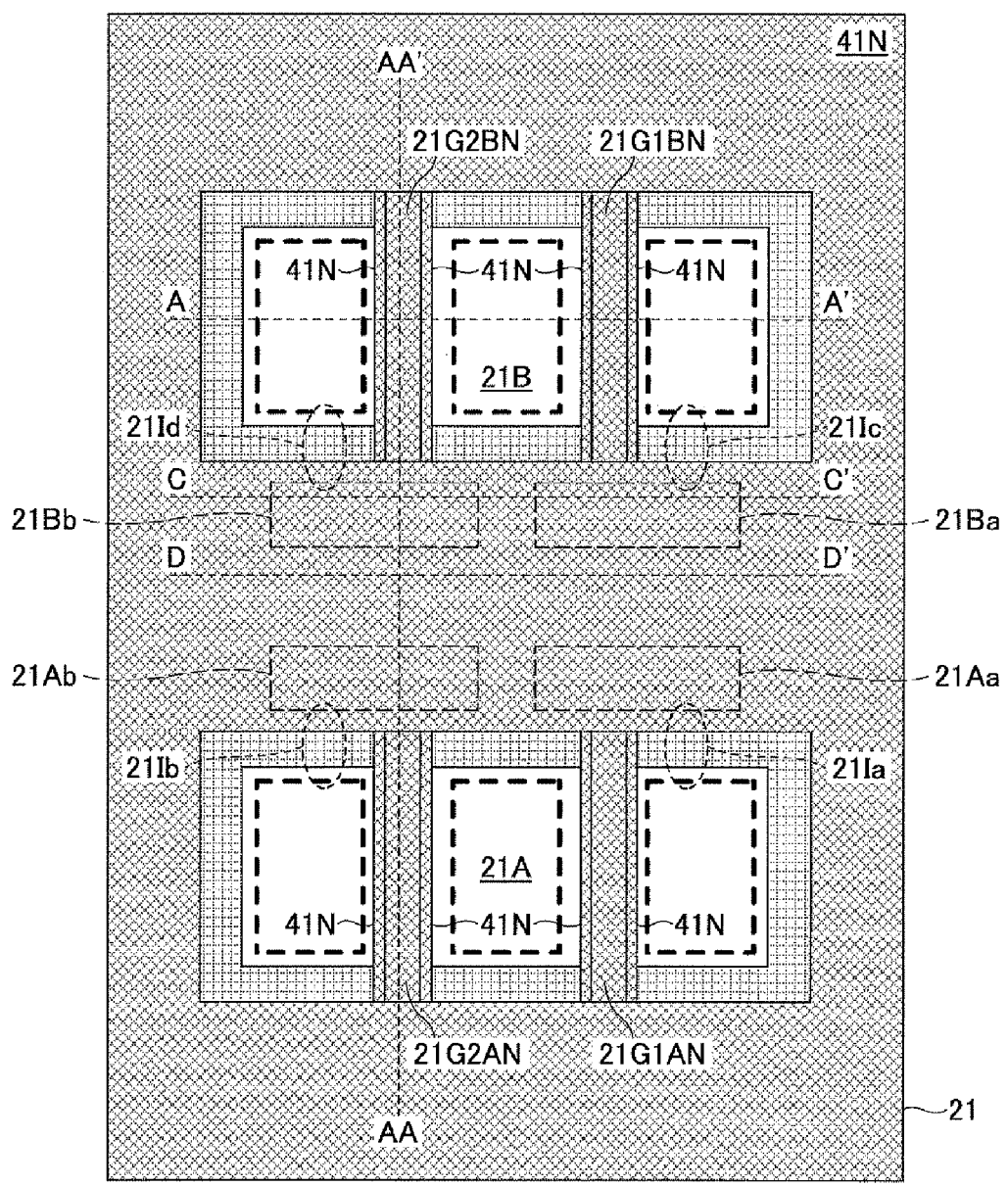
Figure 44B:
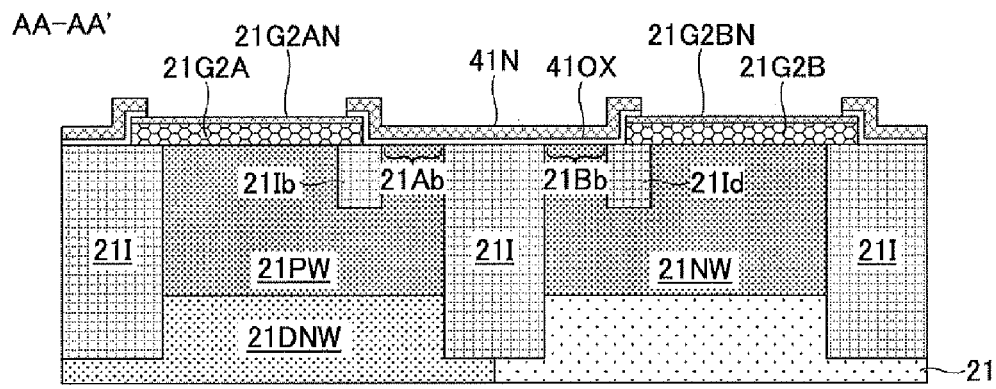
Figure 44C:
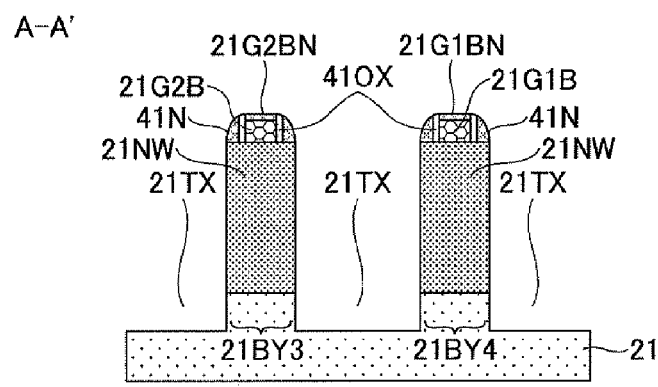
Figure 44D:
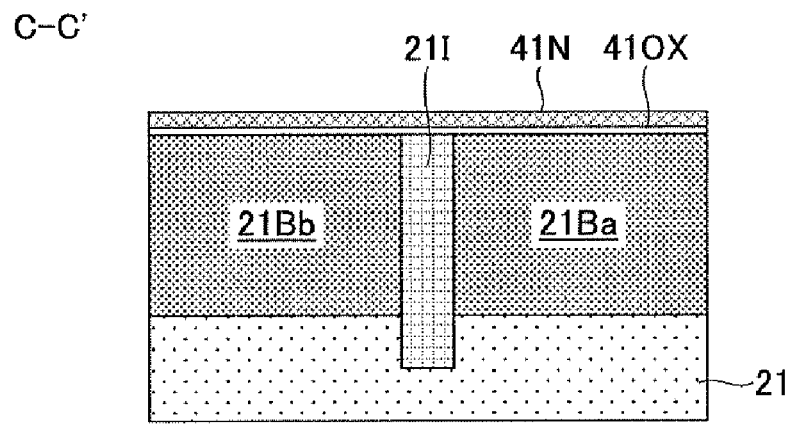
Figure 44E:
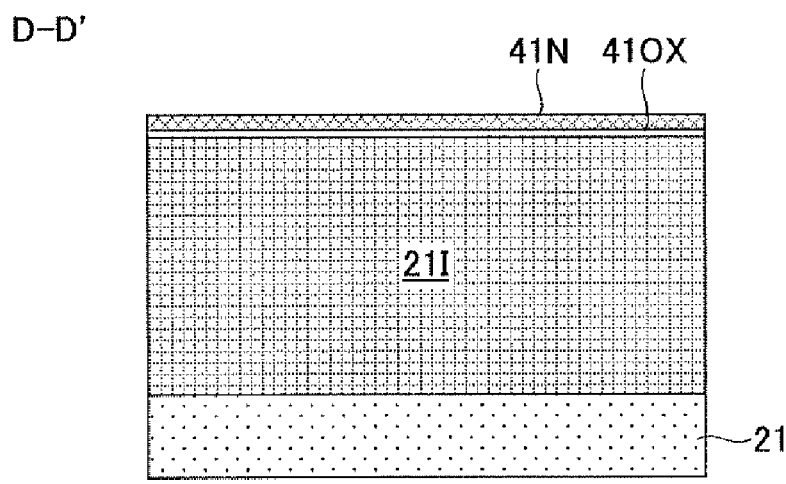
Figure 45A:
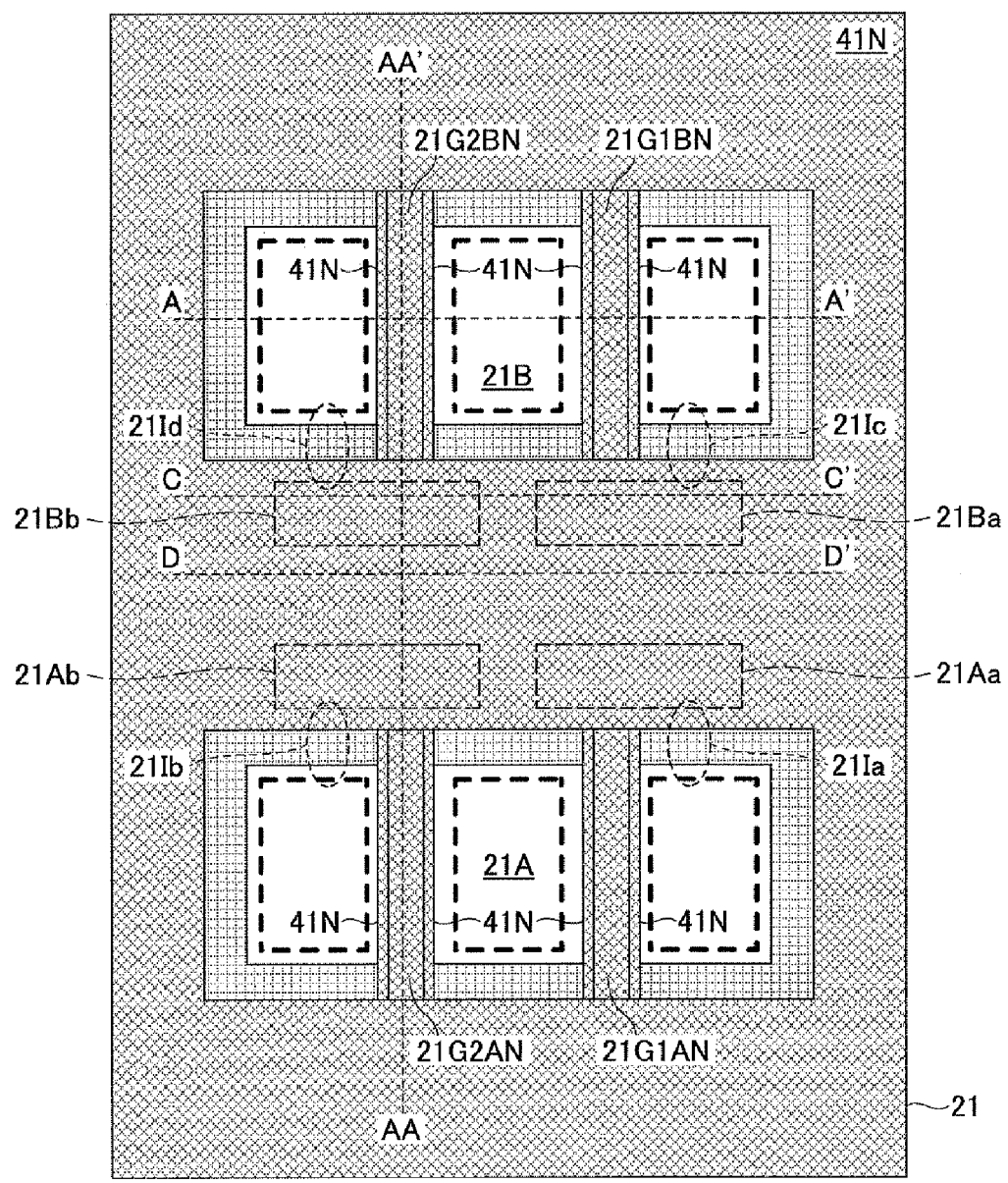
Figure 45B:
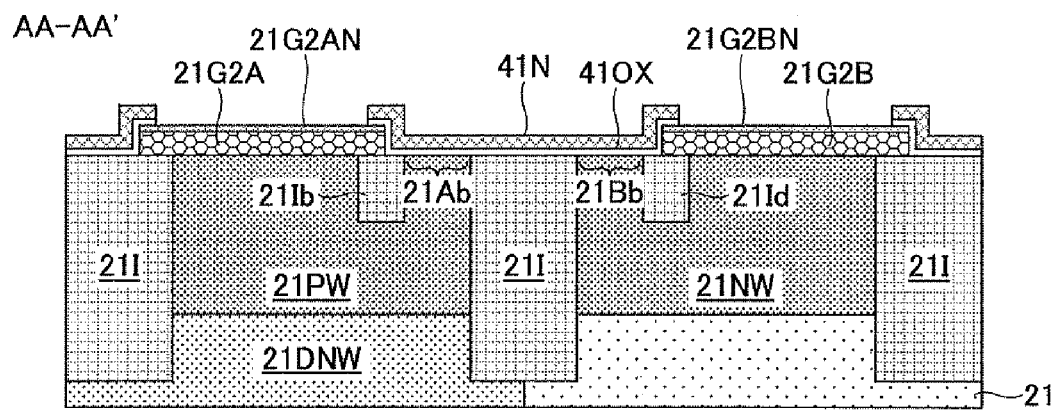
Figure 45C:
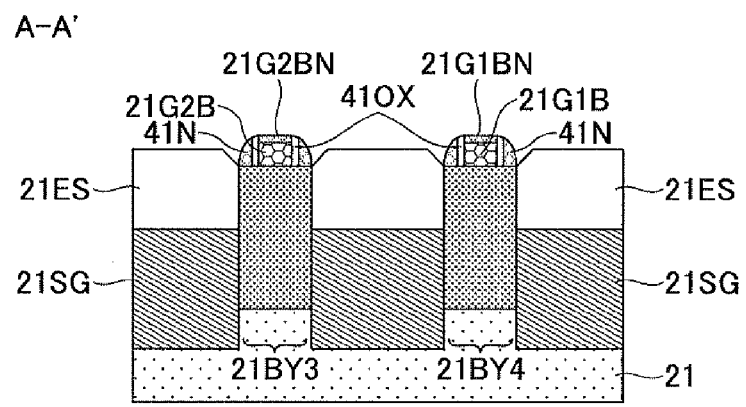
Figure 45D:
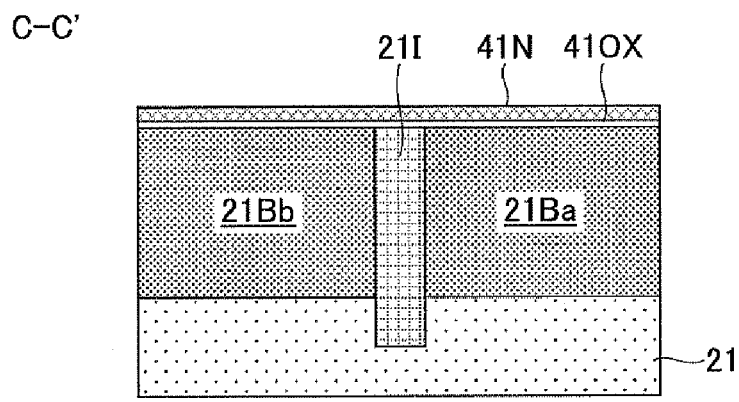
Figure 45E:
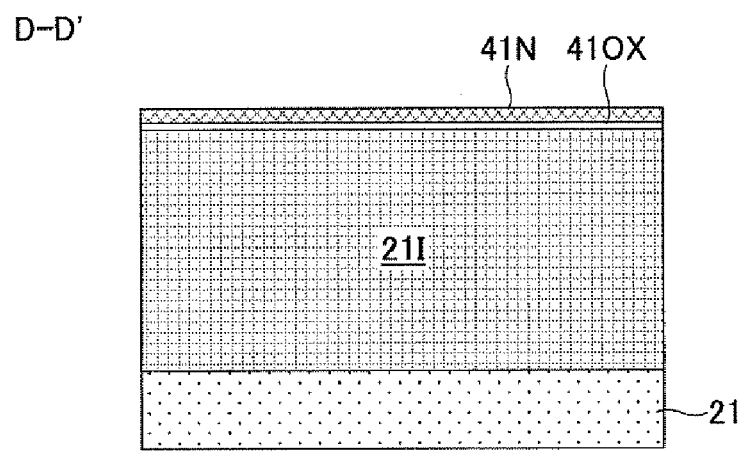
Figure 46A:
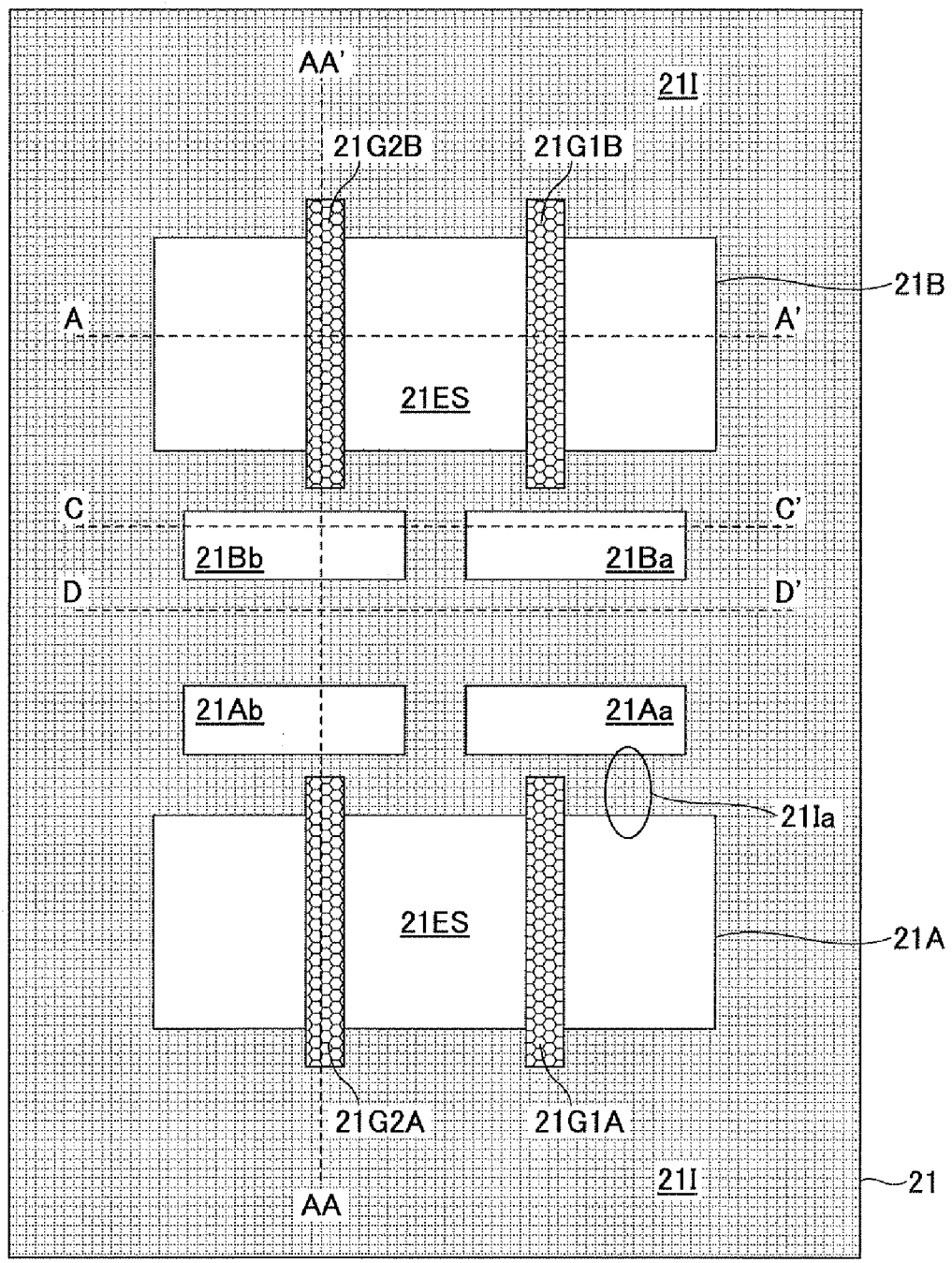
Figure 46B:
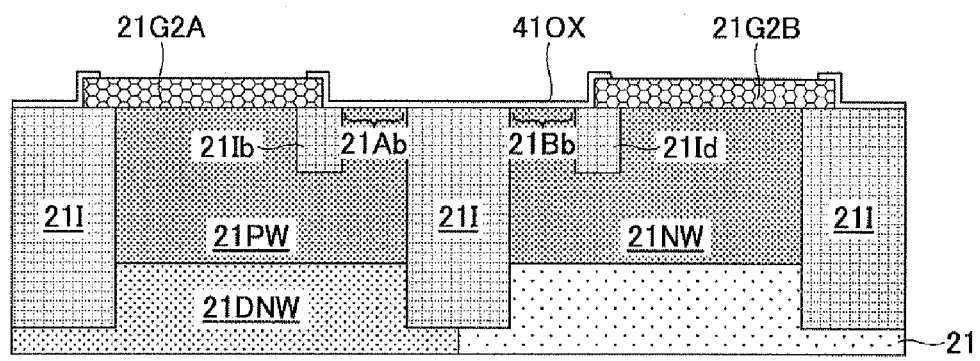
Figure 46C:
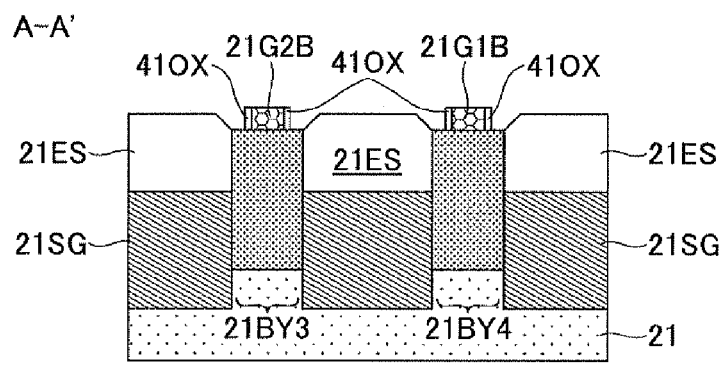
Figure 46D:
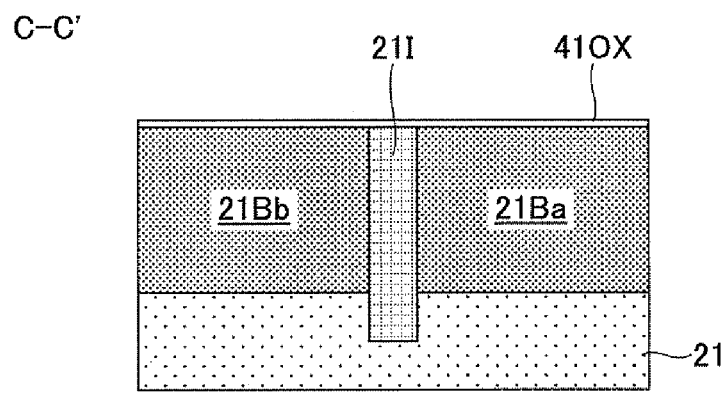
Figure 46E:
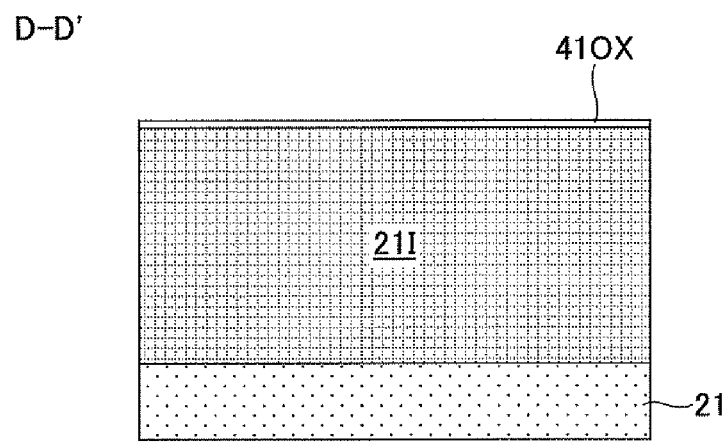
Figure 47A:
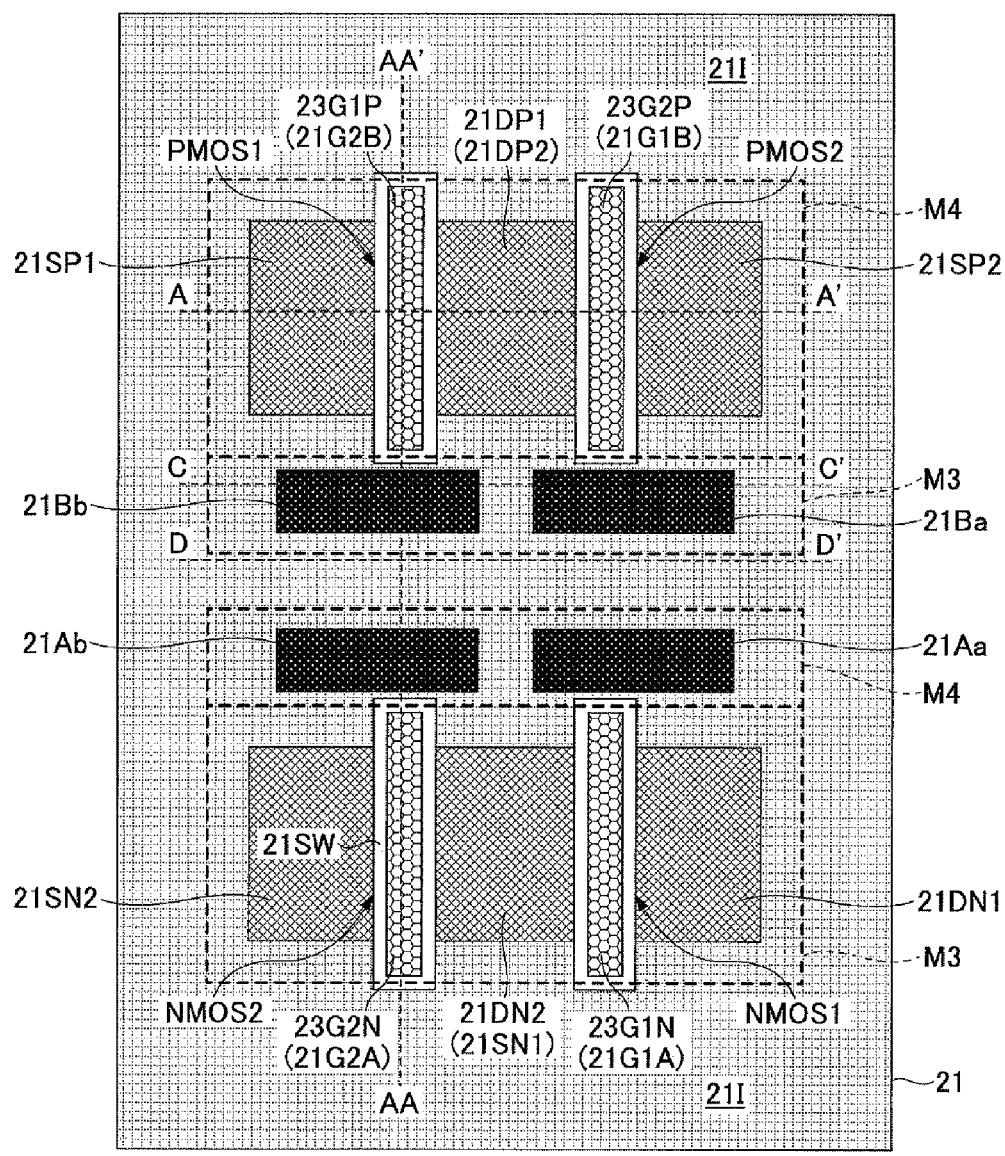
Figure 47B:
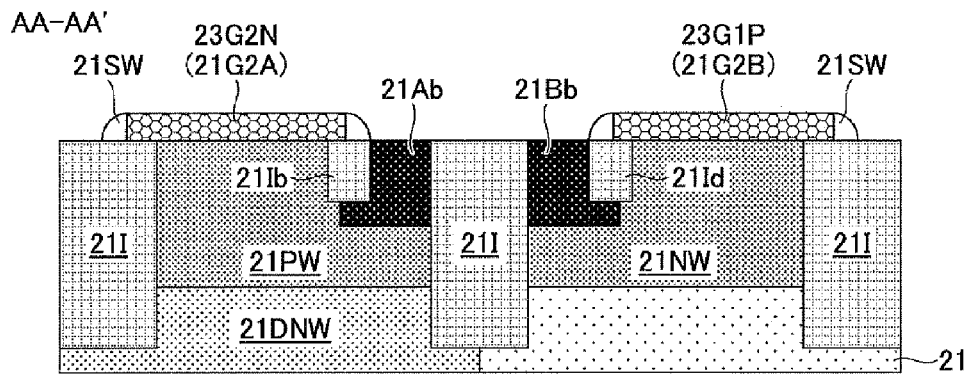
Figure 47C:
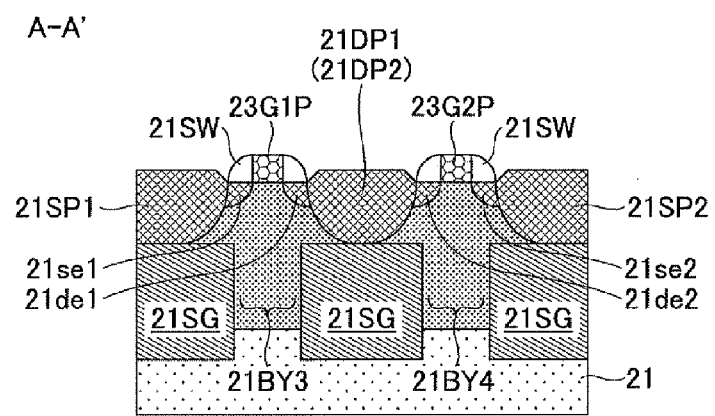
Figure 47D:
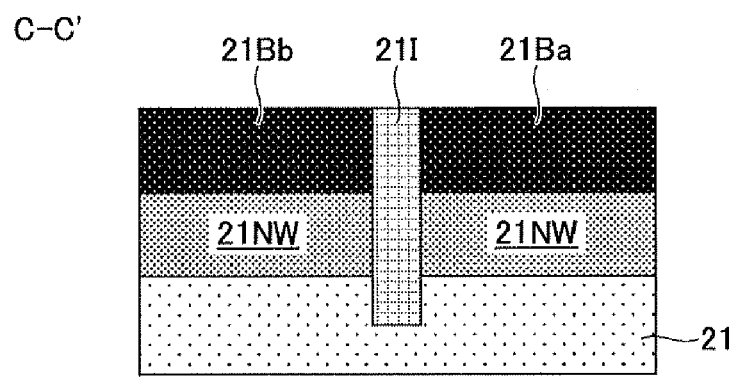
Figure 47E:
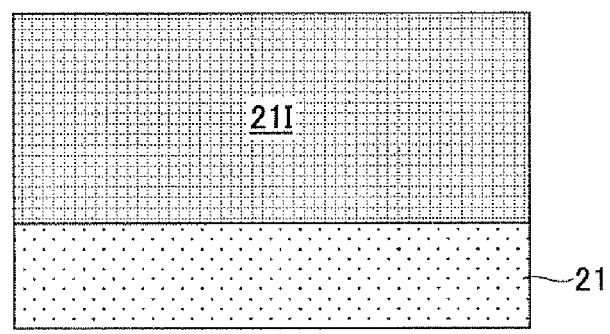
Figure 48A:
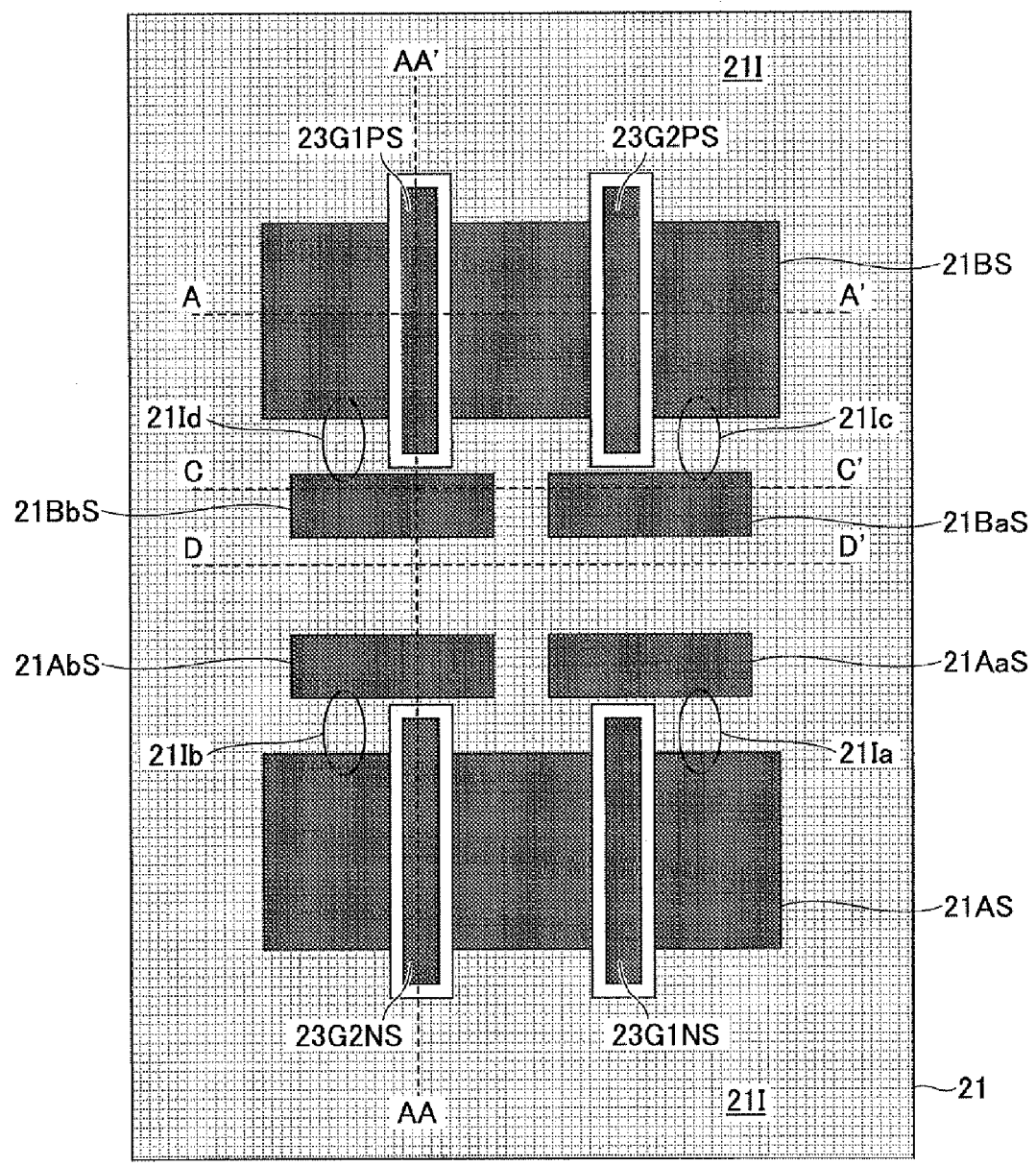
Figure 48B:
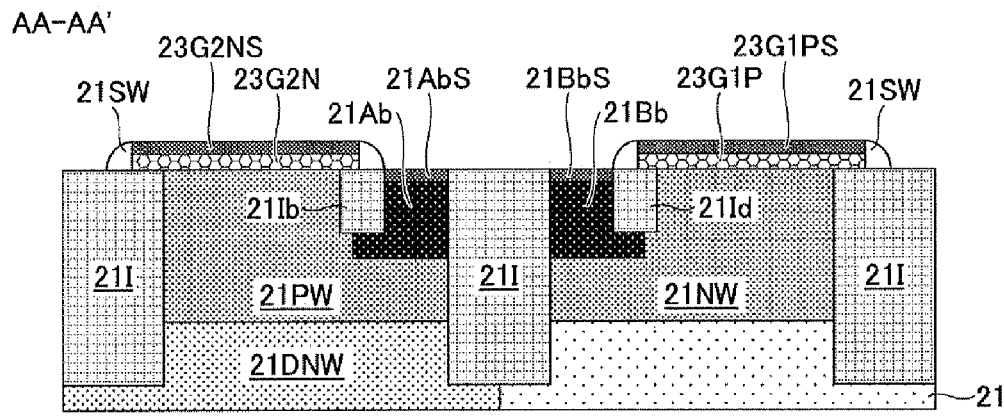
Figure 48C:
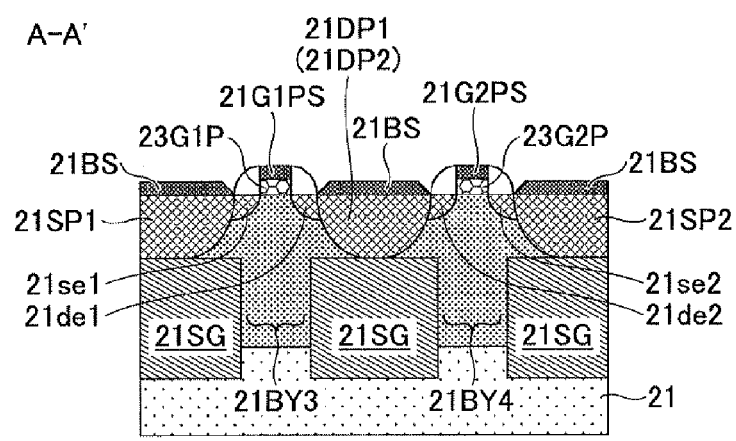
Figure 48D:
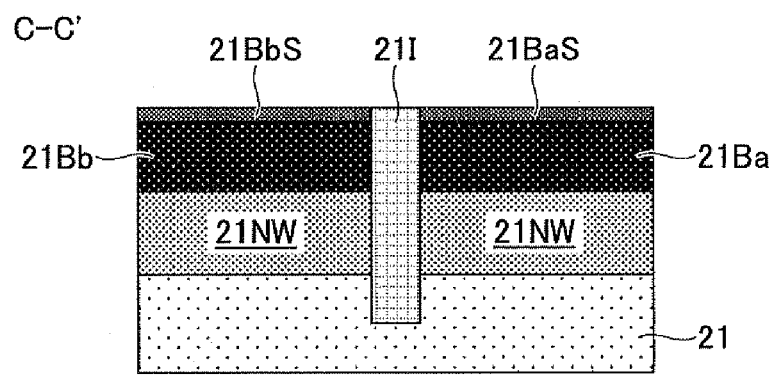
Figure 48E:
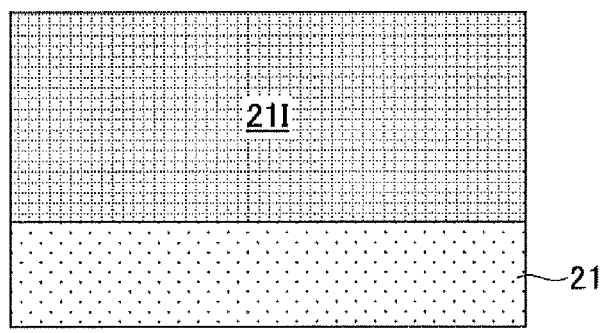
Figure 49A:
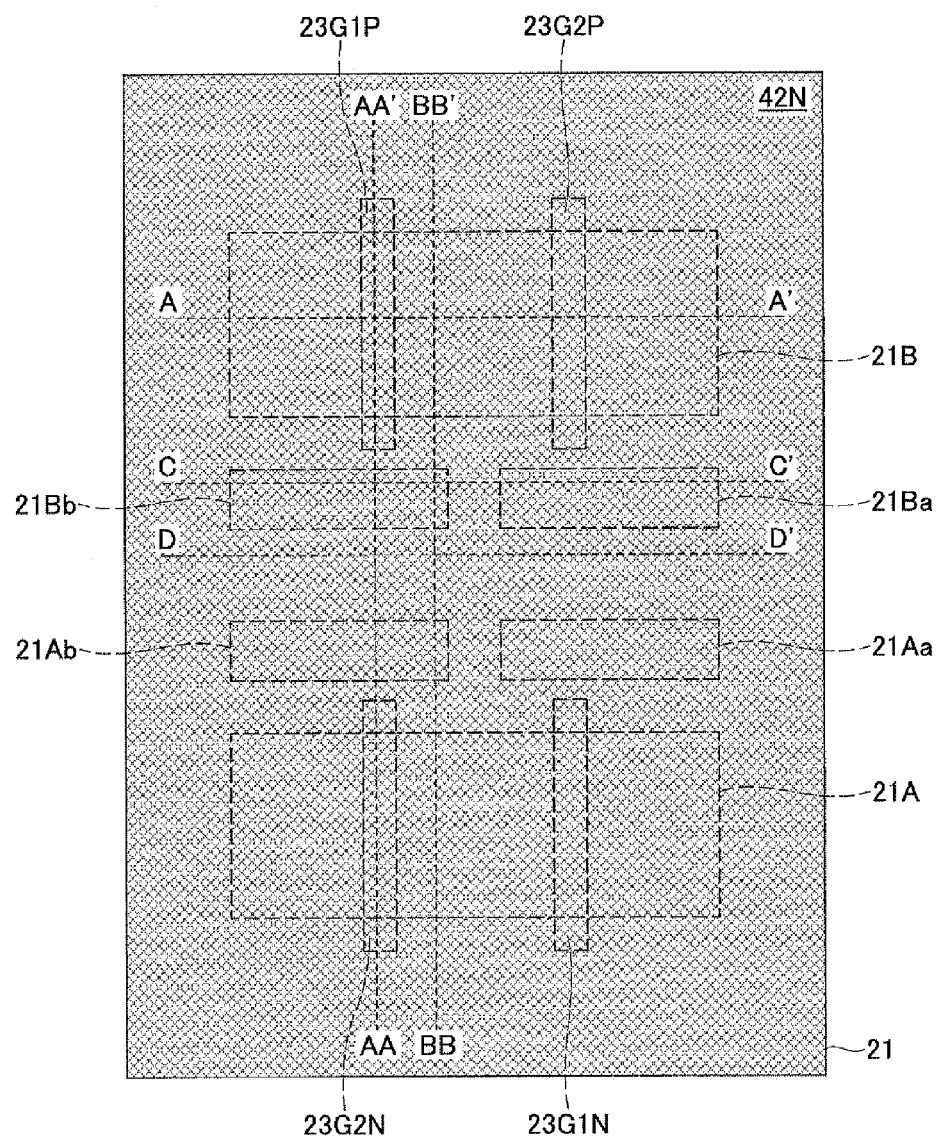
Figure 49B:
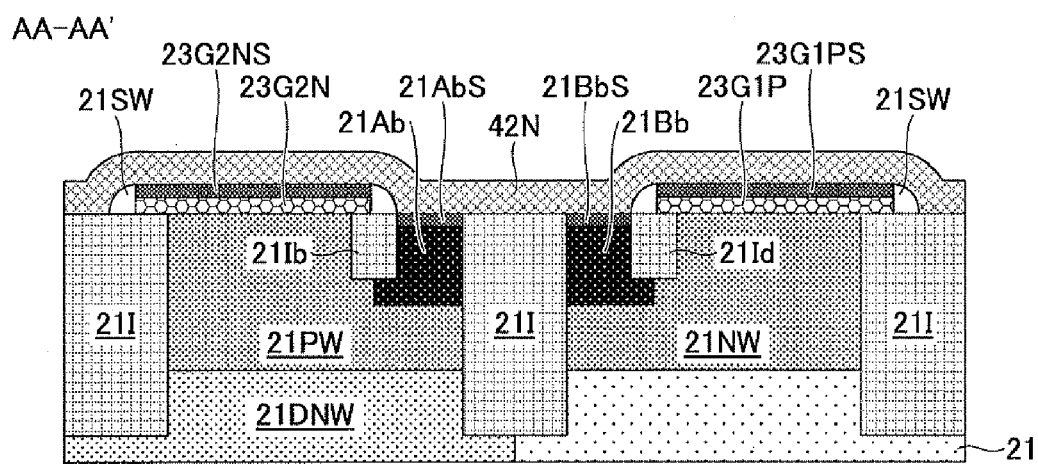
Figure 49C:
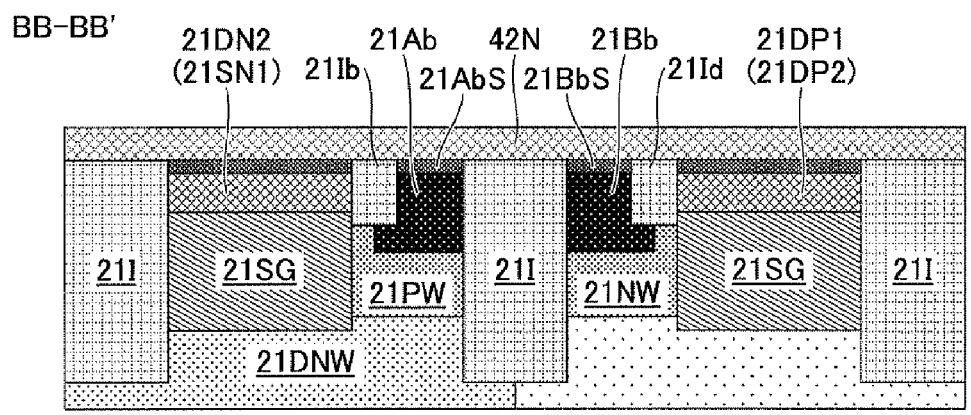
Figure 49D:
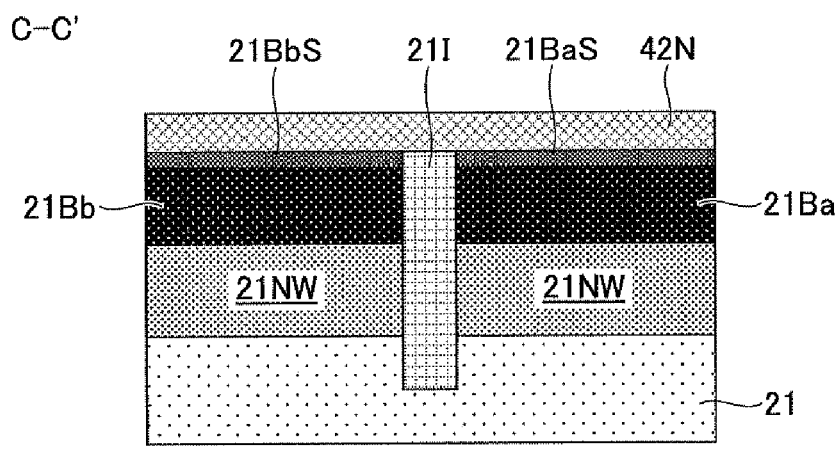
Figure 49E:
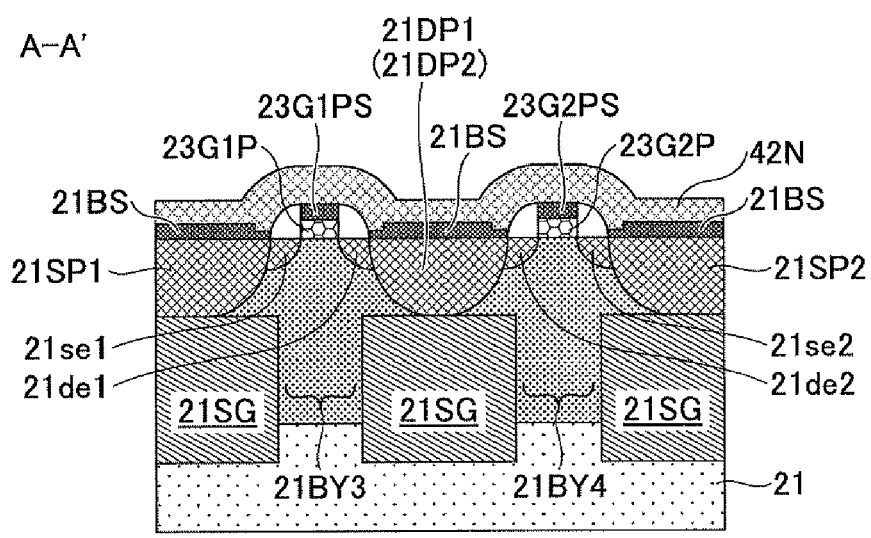
Figure 49F:
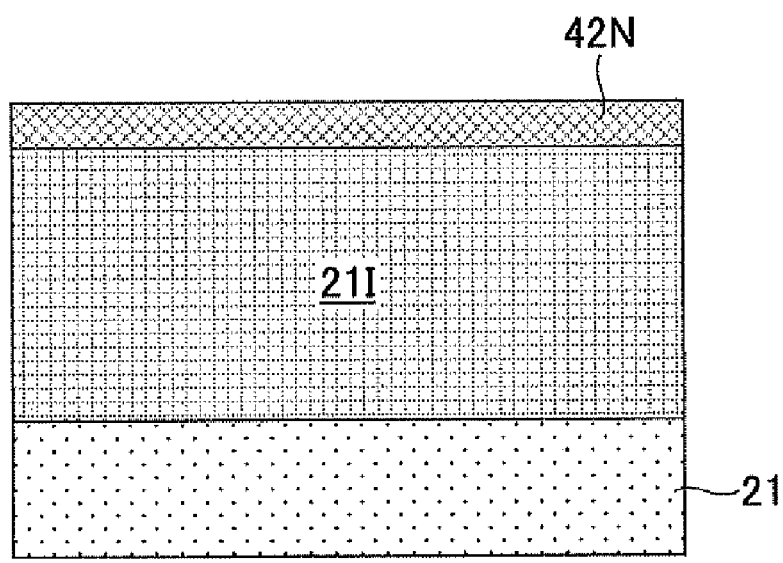
Figure 50A:
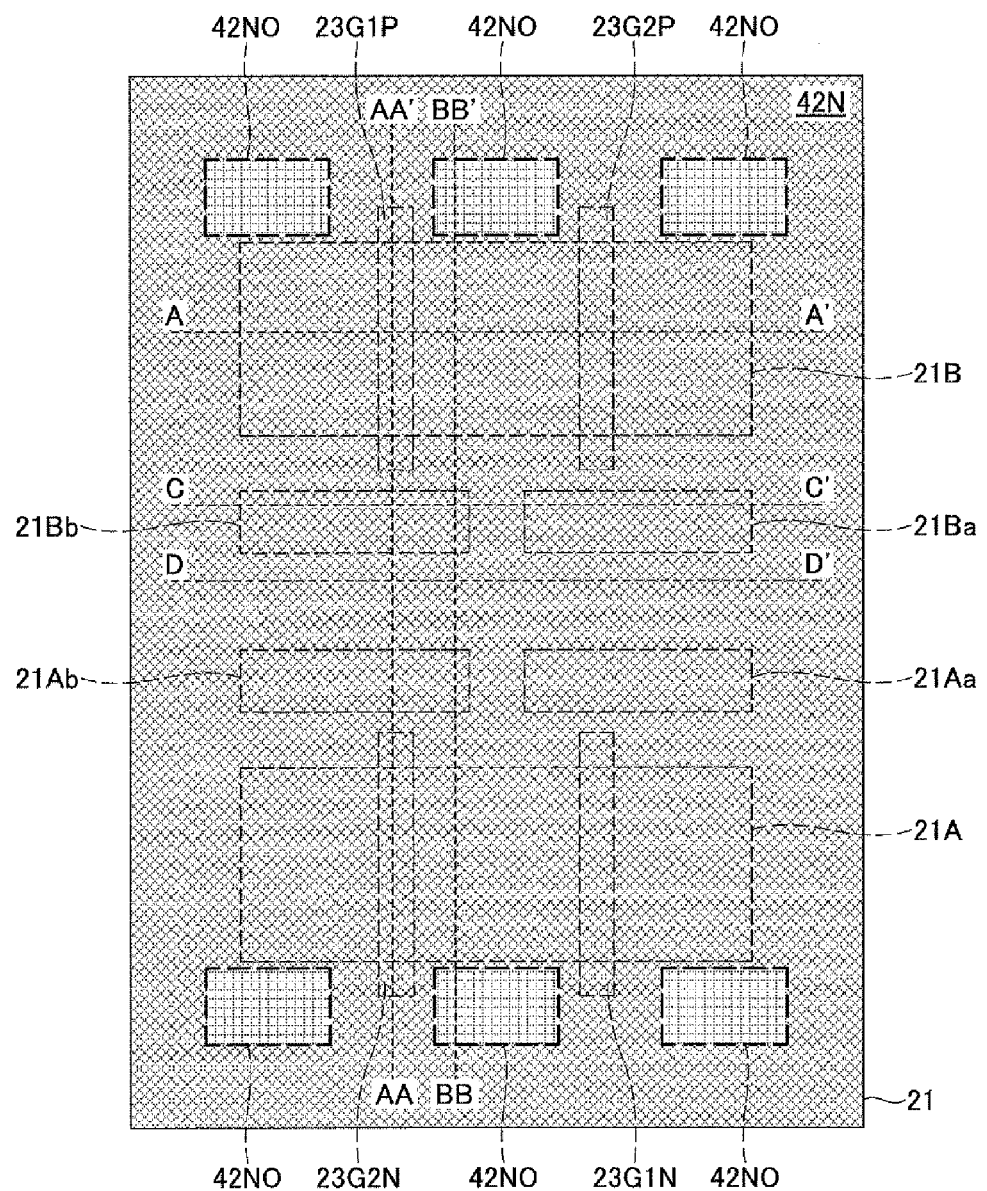
Figure 50B:
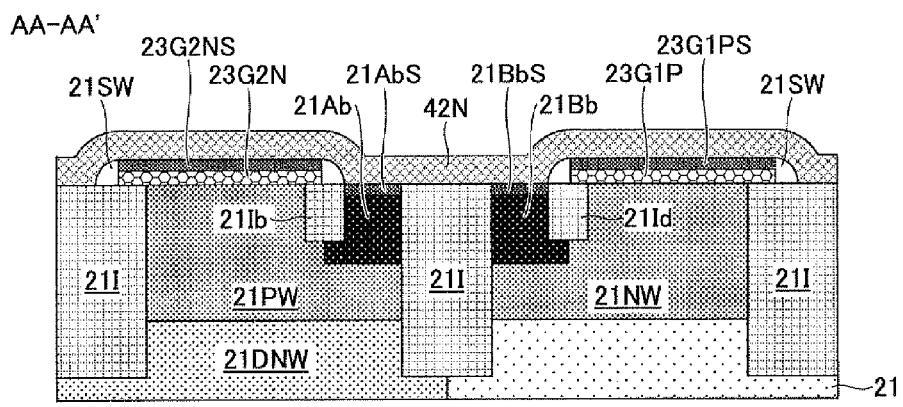
Figure 50C:
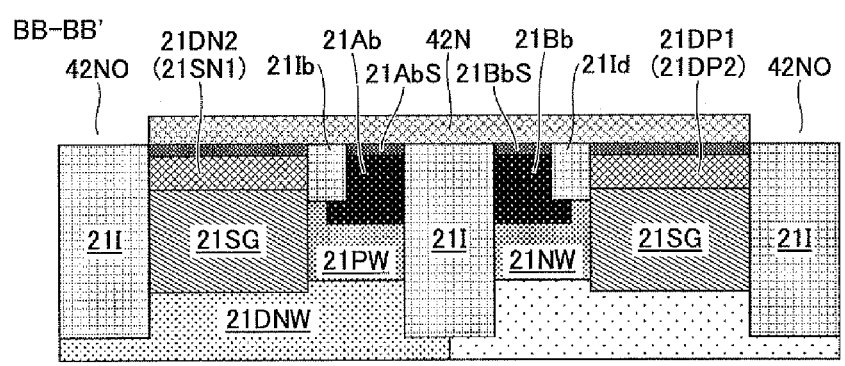
Figure 50D:
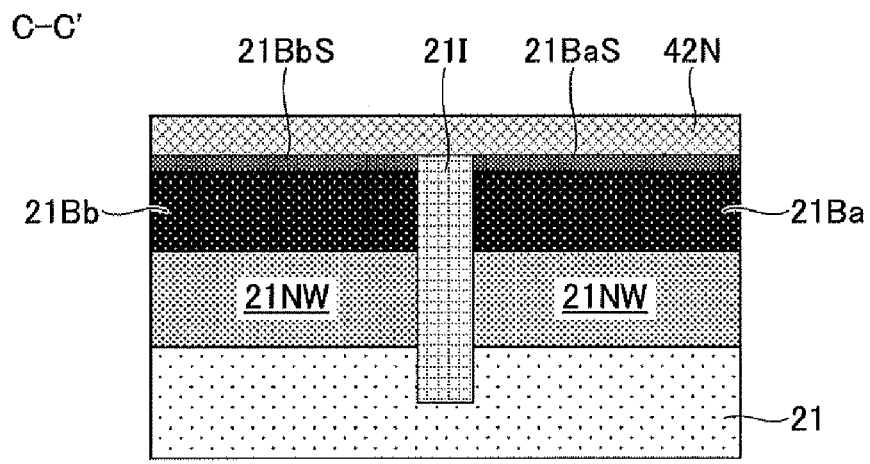
Figure 50E:
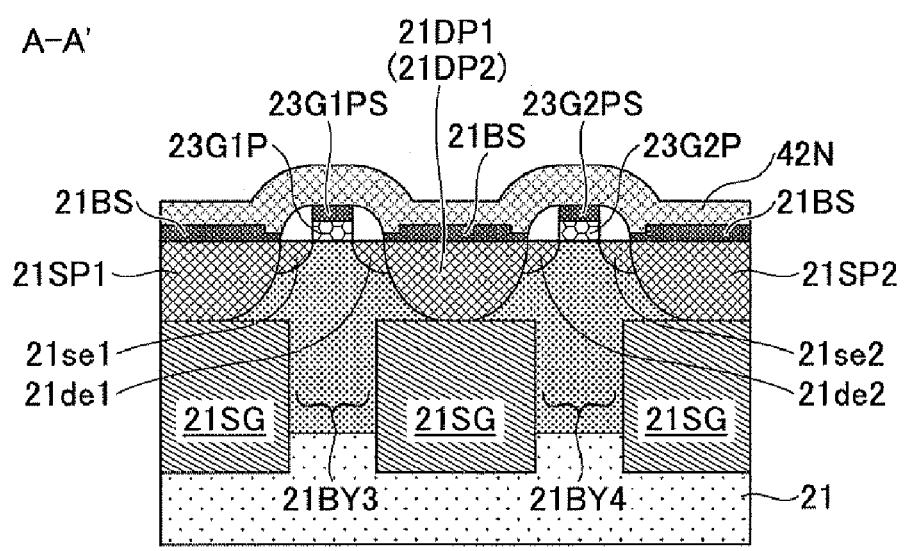
Figure 50F:
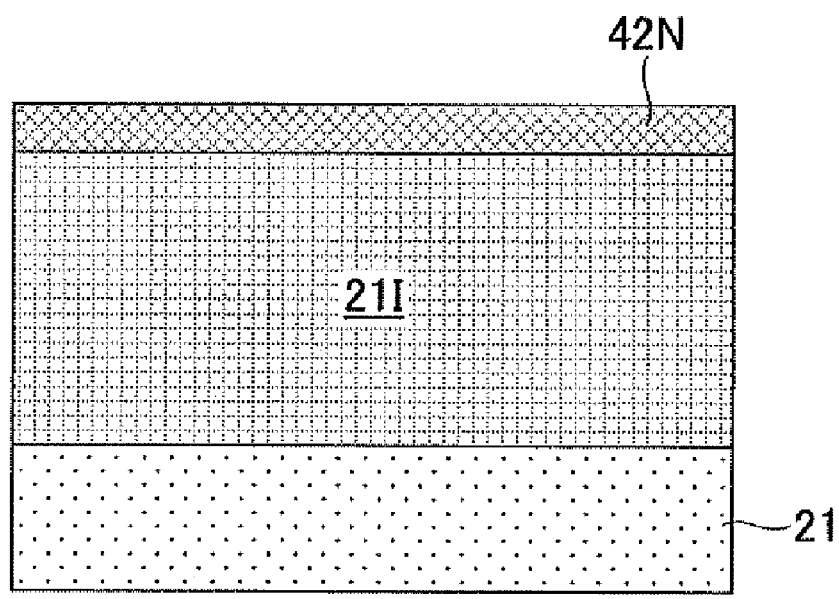
Figure 51A:
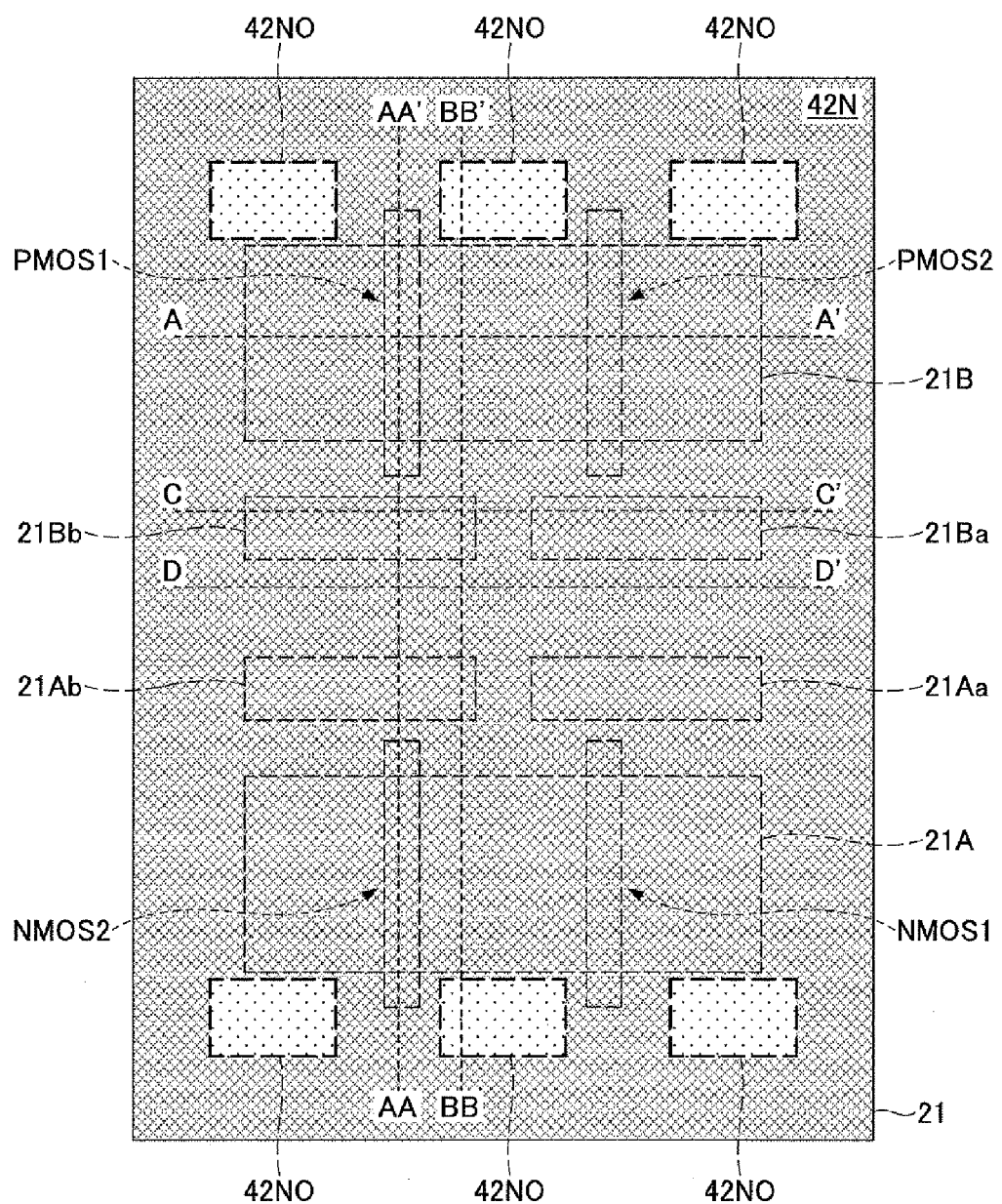
Figure 51B:
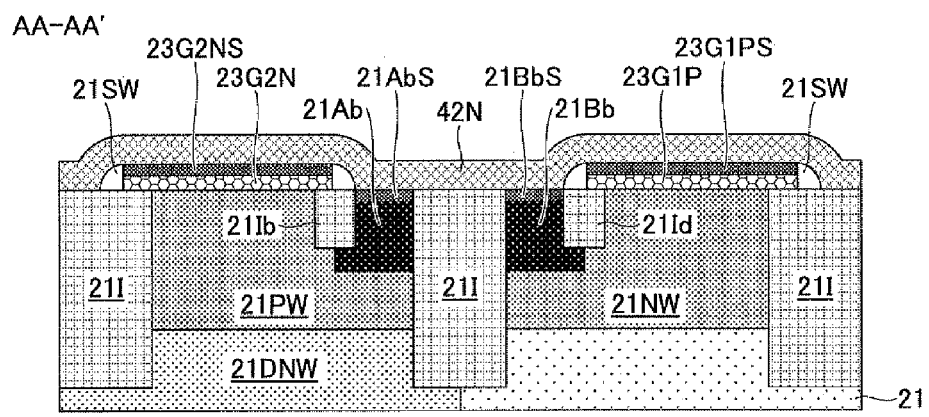
Figure 51C:
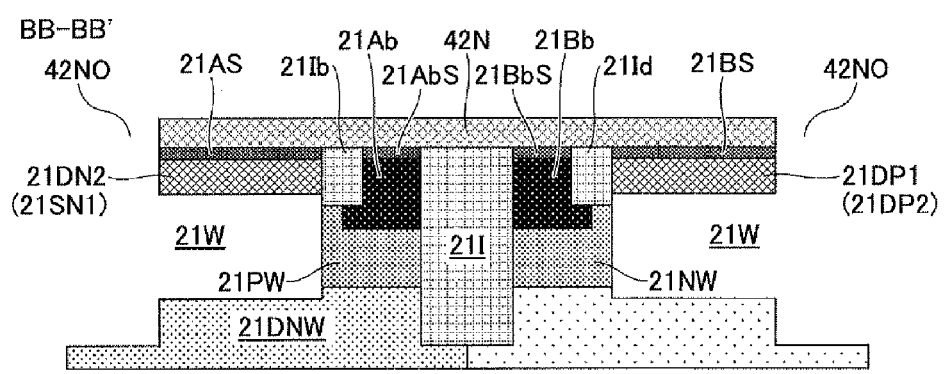
Figure 51D:
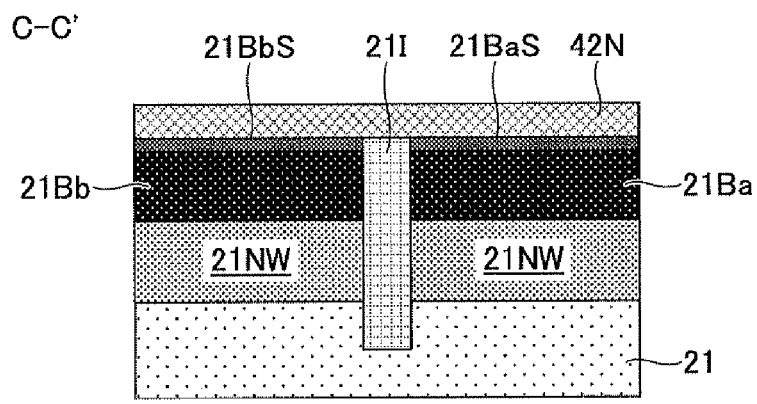
Figure 51E:
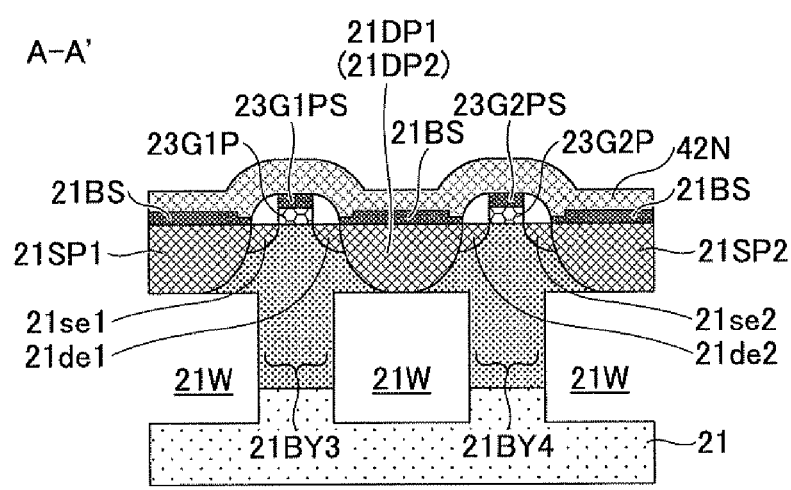
Figure 51F:
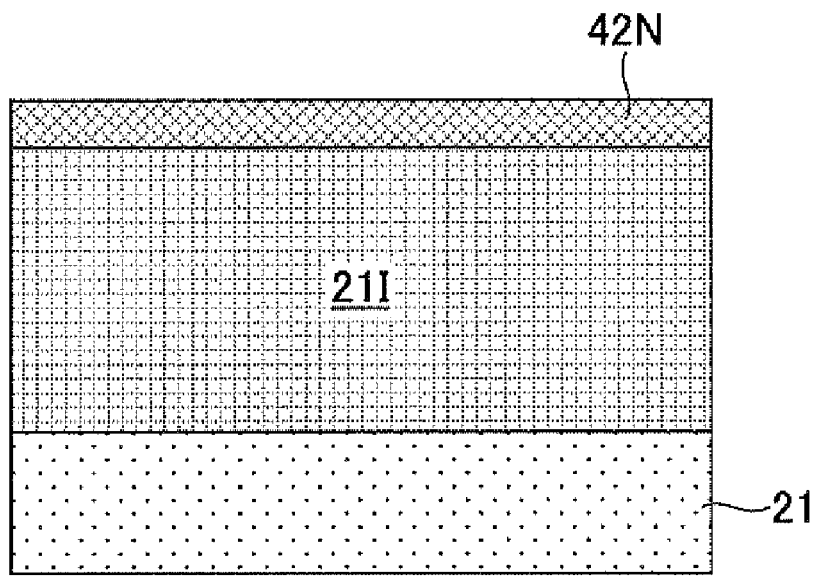
Figure 52A:
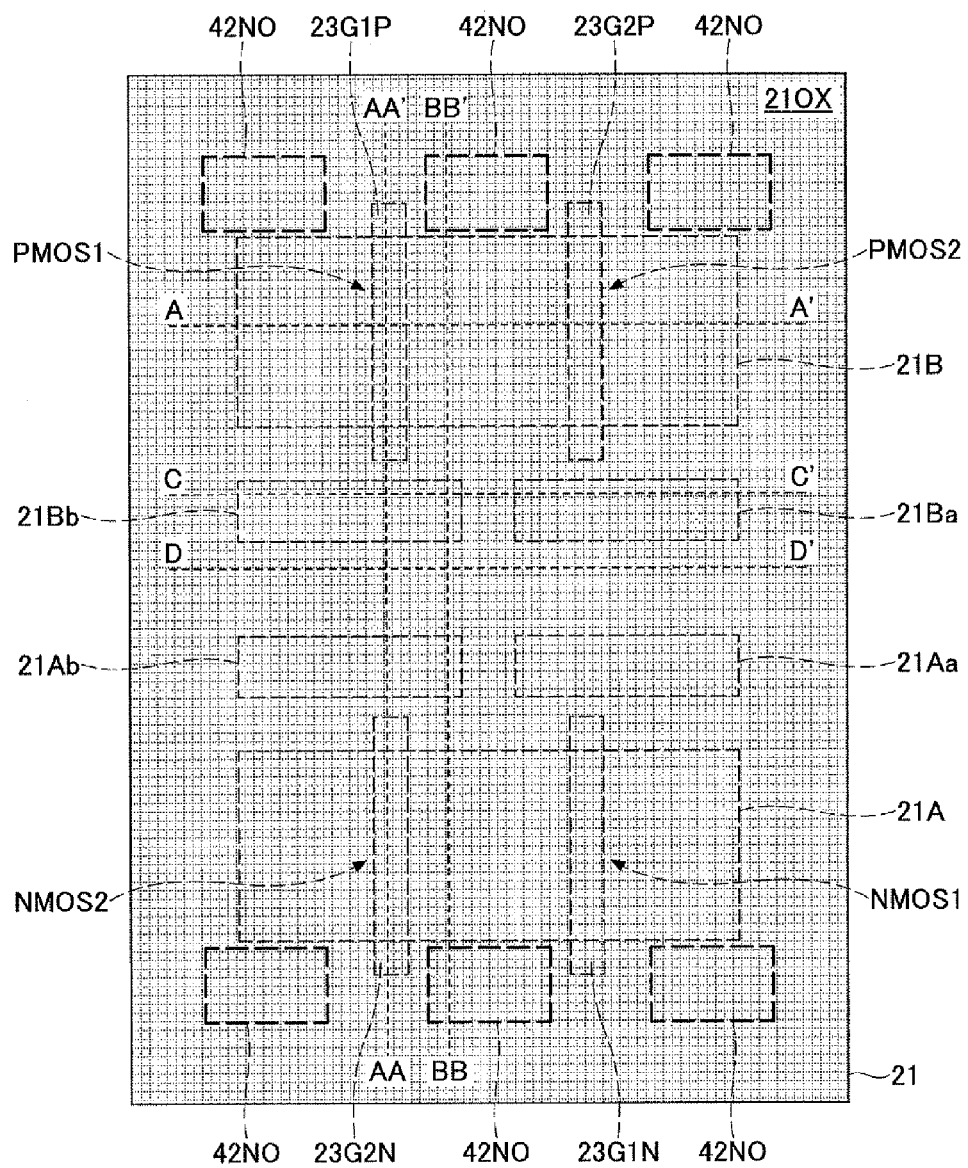
Figure 52B:
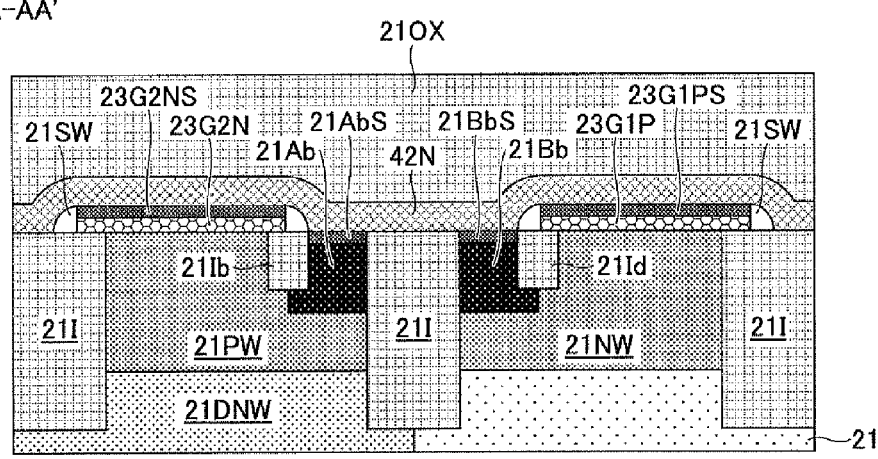
Figure 52C:
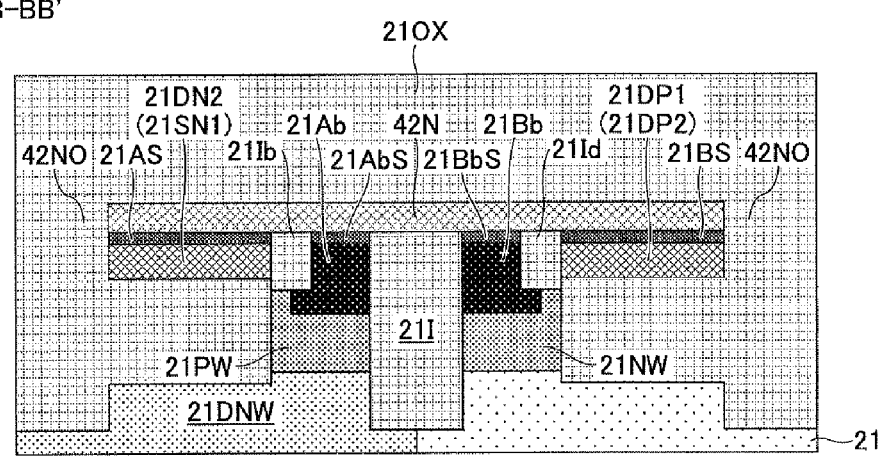
Figure 52D:
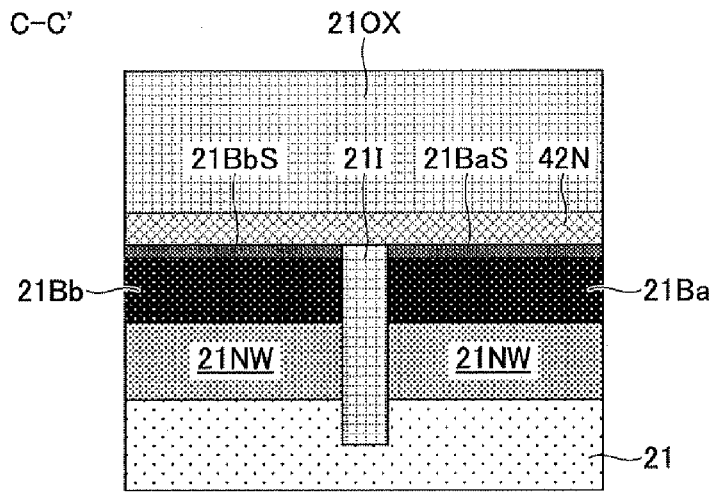
Figure 52E:
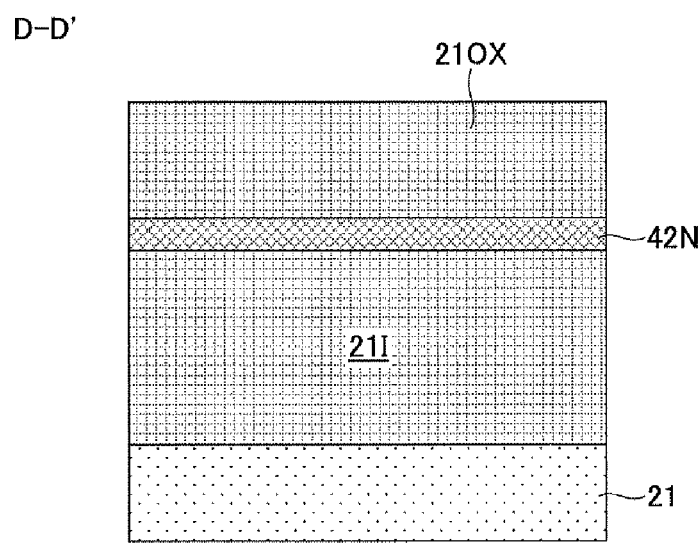
Figure 52F:
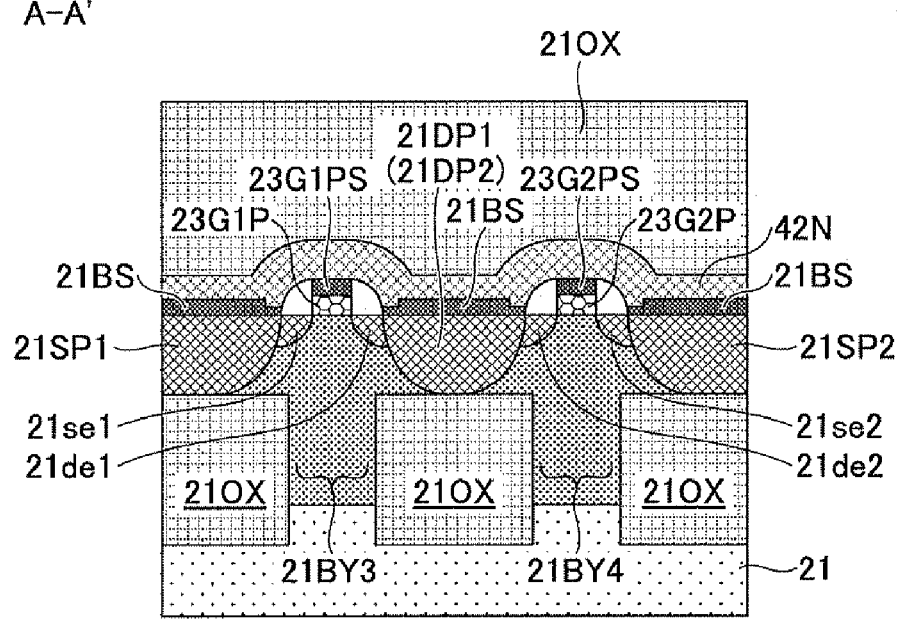
Figure 53A:
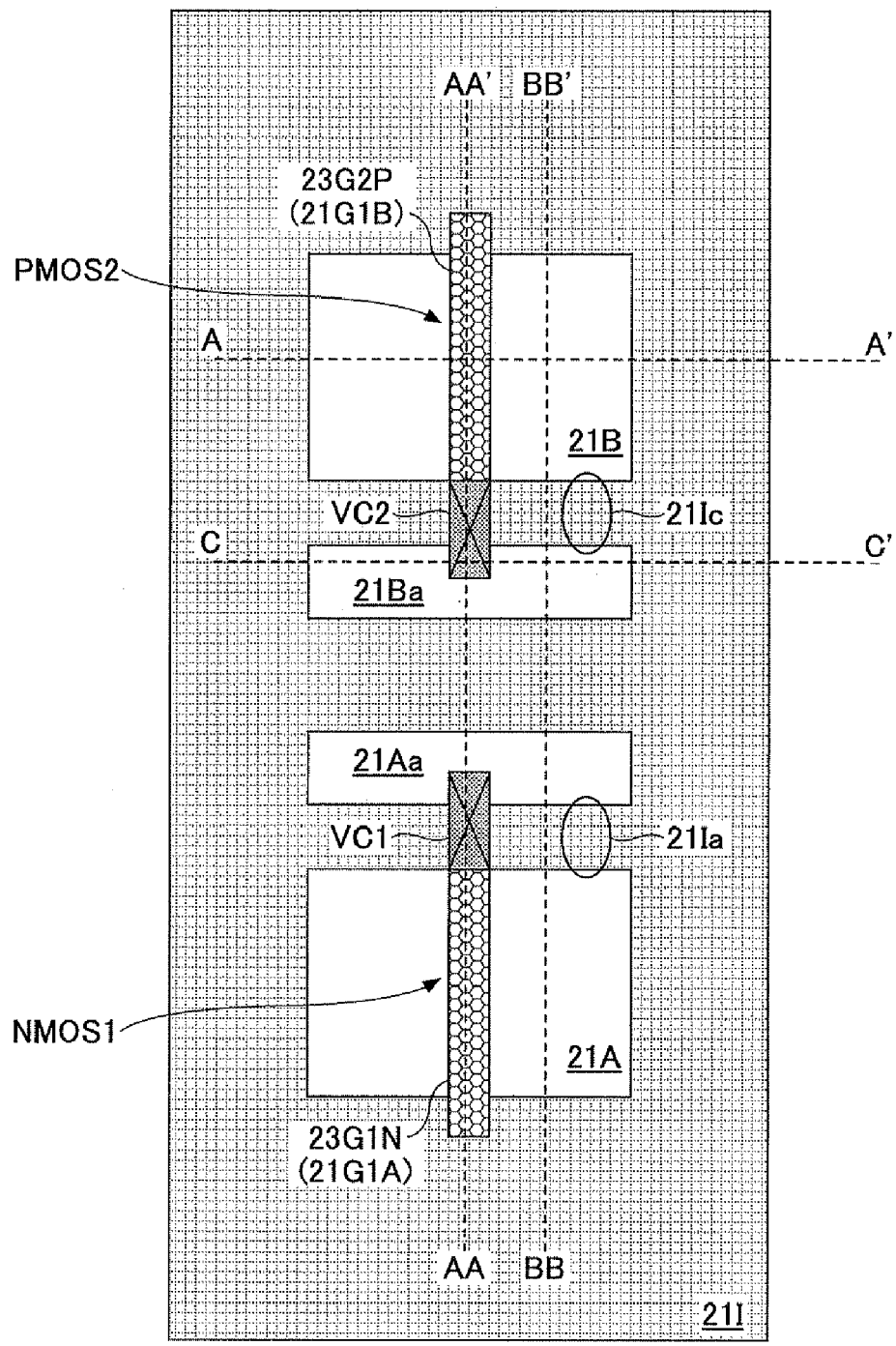
Figure 53B:
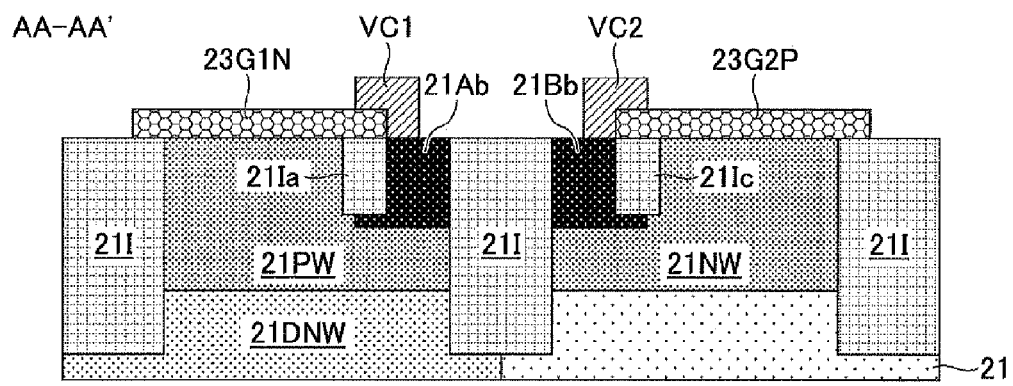
Figure 53C:
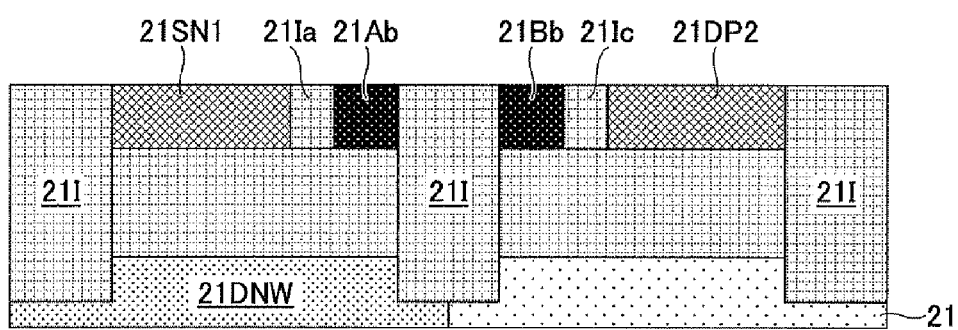
Figure 53D:
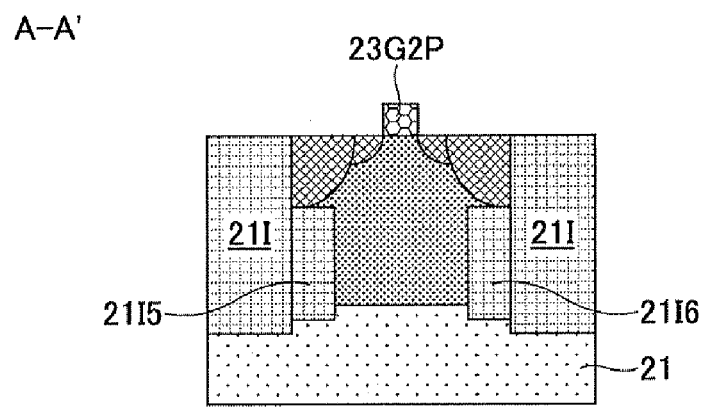
Figure 53E:
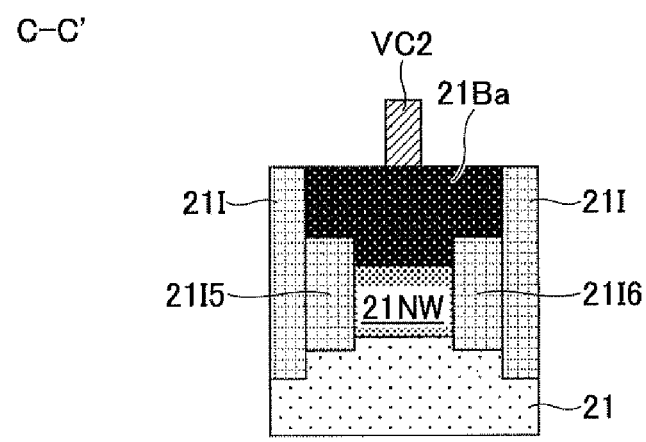
Figure 54:
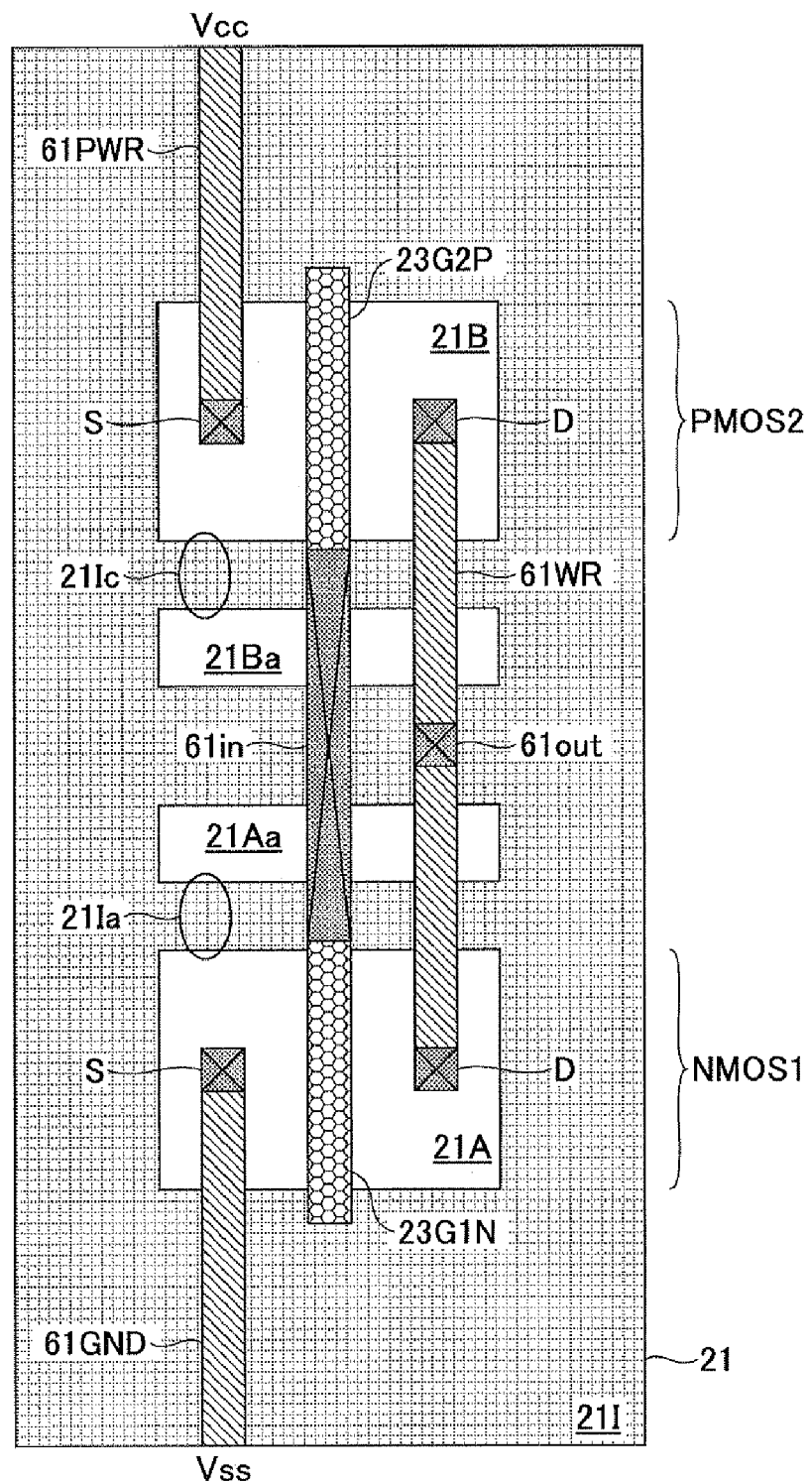
Figure 55:
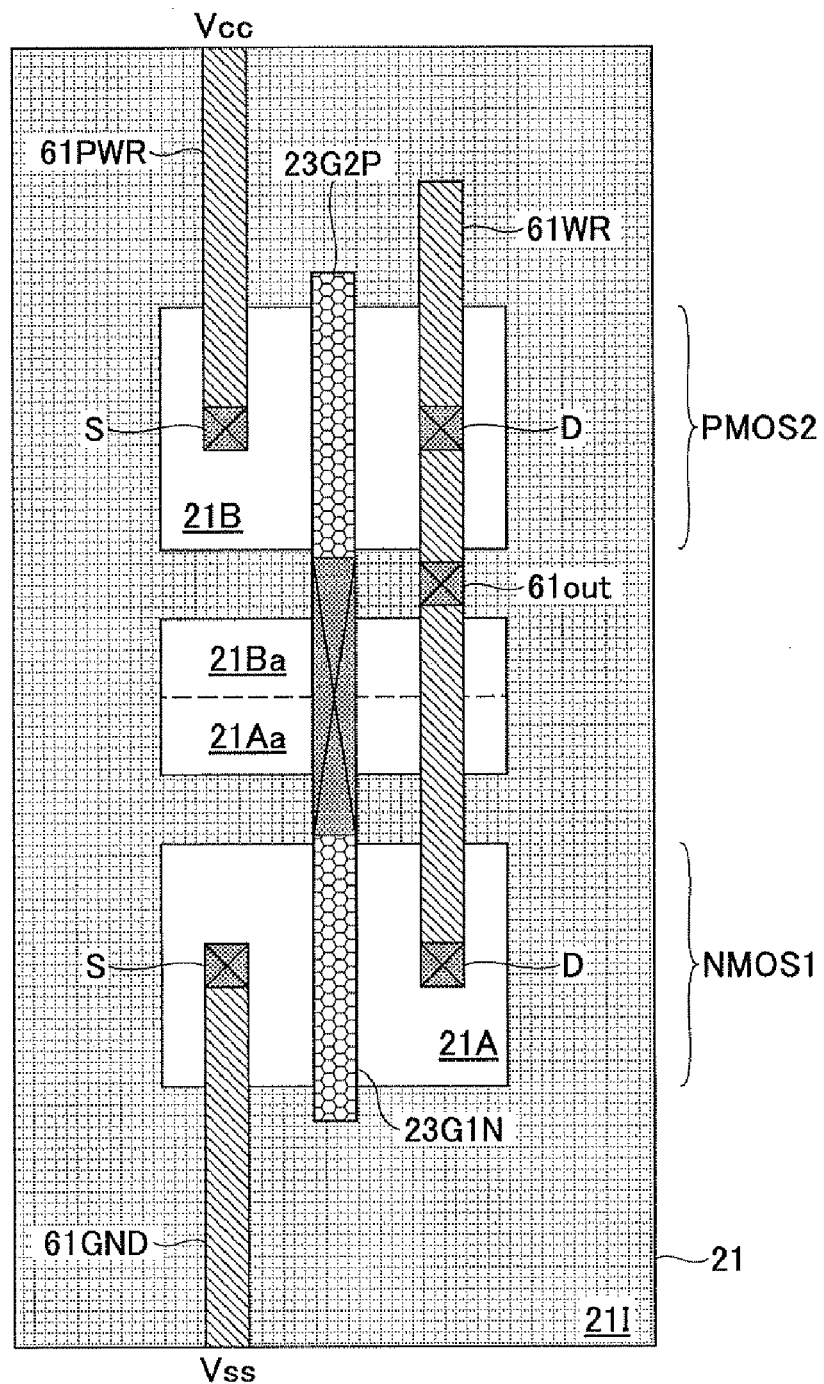
Figure 56:
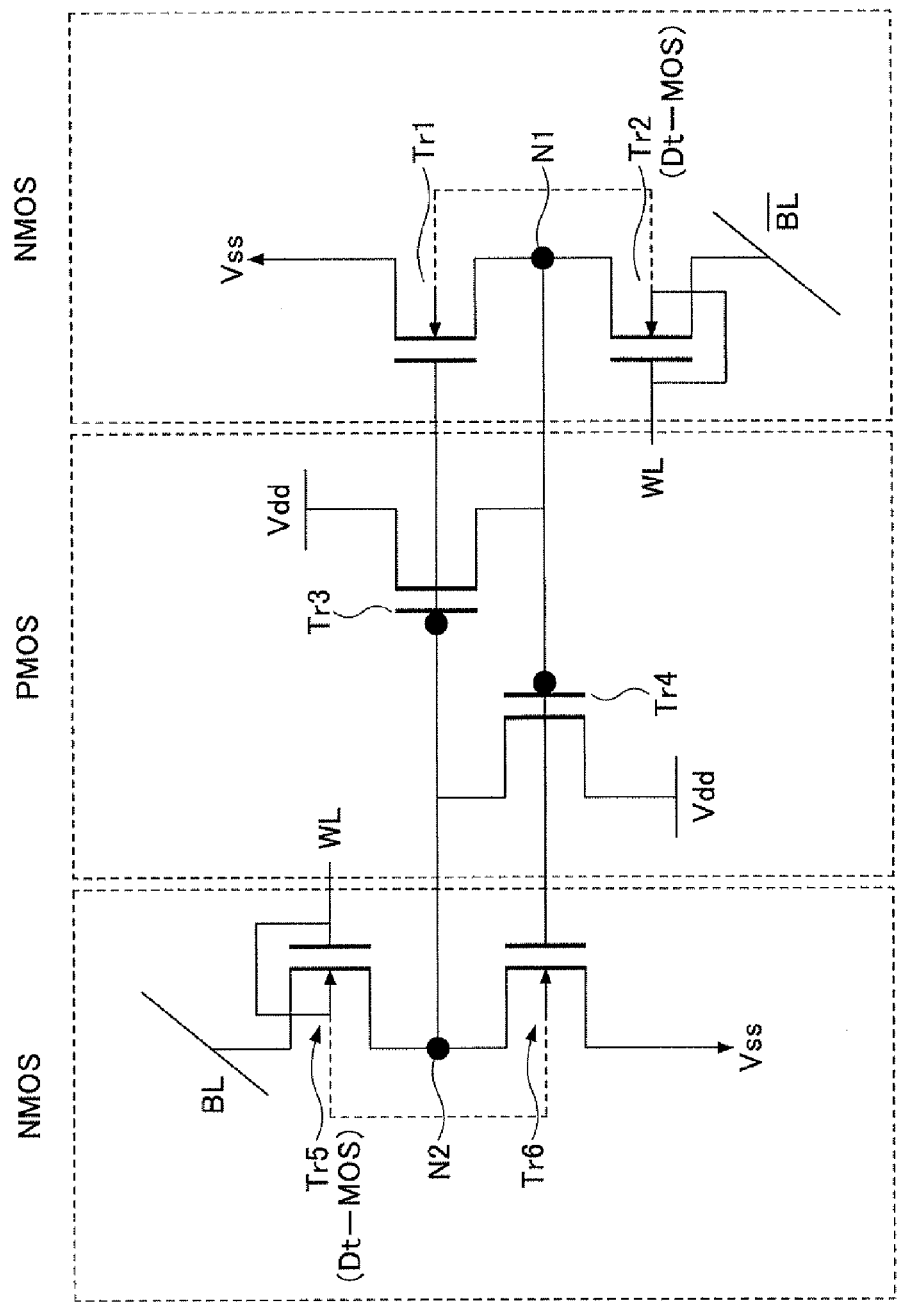
Figure 57:
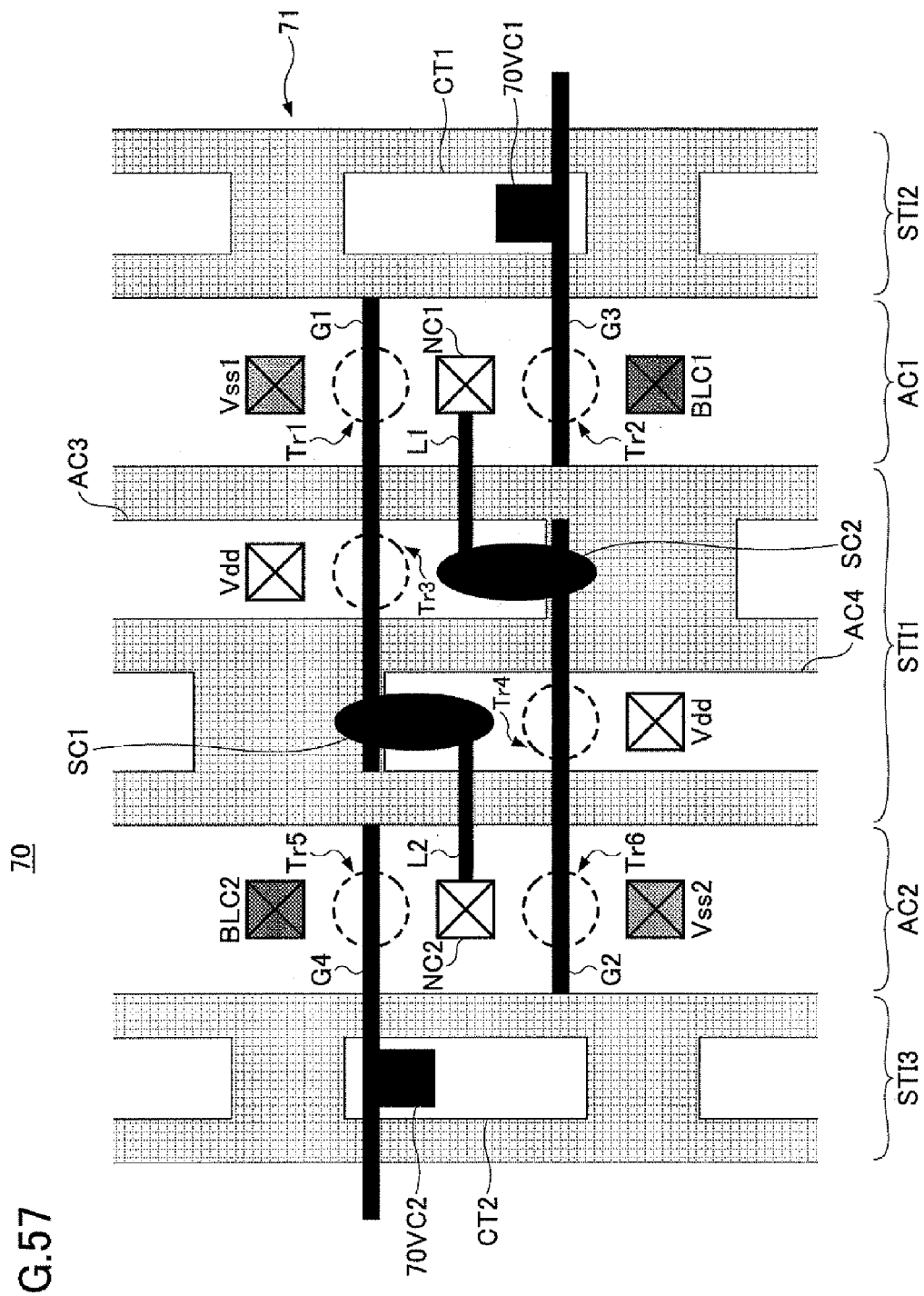
Figure 58A:
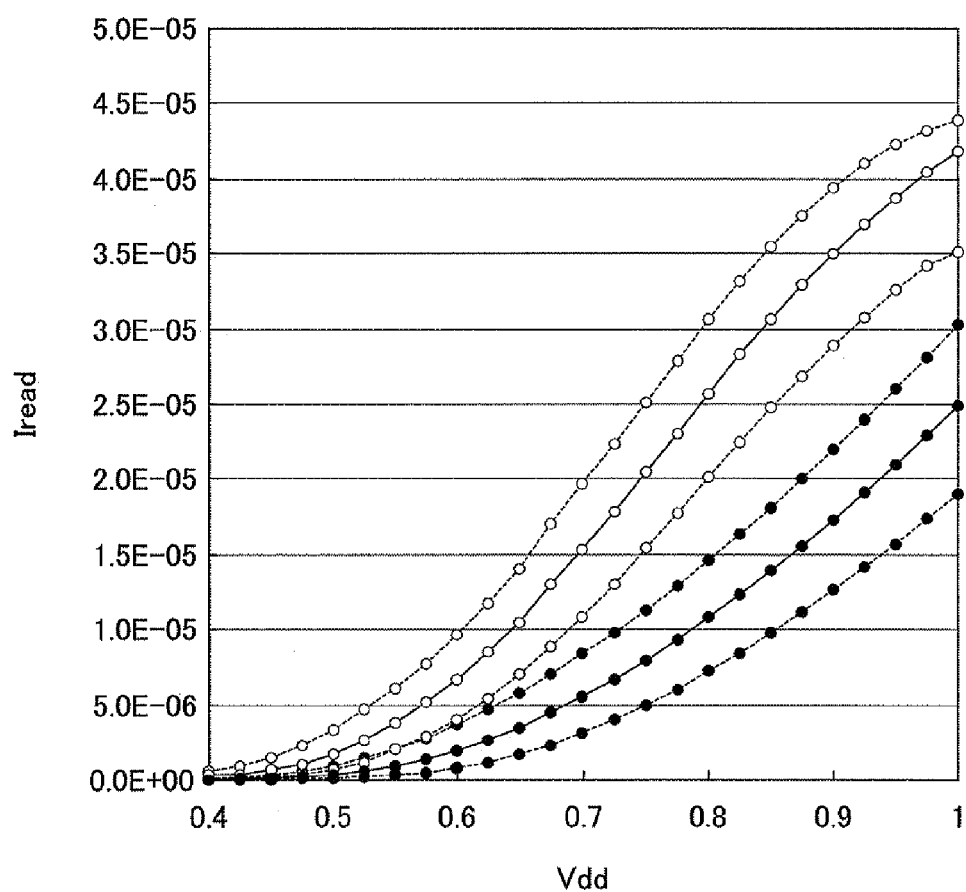

FIG. 41A is a plan view of a silicon bulk substrate used to describe a method of producing a semiconductor integrated circuit according to the second embodiment;

FIG. 41B is a cross-sectional view of the silicon bulk substrate of FIG. 41A taken along line AA-AA';

FIG. 41C is a cross-sectional view of the silicon bulk substrate of FIG. 41A taken along line A-A';

FIG. 41D is a cross-sectional view of the silicon bulk substrate of FIG. 41A taken along line C-C';

FIG. 41E is a cross-sectional view of the silicon bulk substrate of FIG. 41A taken along line D-D';

FIG. 42A is a plan view of a silicon bulk substrate used to describe a method of producing a semiconductor integrated circuit according to the second embodiment;

FIG. 42B is a cross-sectional view of the silicon bulk substrate of FIG. 42A taken along line AA-AA';

FIG. 42C is a cross-sectional view of the silicon bulk substrate of FIG. 42A taken along line A-A';

FIG. 42D is a cross-sectional view of the silicon bulk substrate of FIG. 42A taken along line C-C';

FIG. 42E is a cross-sectional view of the silicon bulk substrate of FIG. 42A taken along line D-D';

FIG. 43A is a plan view of a silicon bulk substrate used to describe a method of producing a semiconductor integrated circuit according to the second embodiment;

FIG. 43B is a cross-sectional view of the silicon bulk substrate of FIG. 43A taken along line AA-AA';

FIG. 43C is a cross-sectional view of the silicon bulk substrate of FIG. 43A taken along line A-A';

FIG. 43D is a cross-sectional view of the silicon bulk substrate of FIG. 43A taken along line C-C';

FIG. 43E is a cross-sectional view of the silicon bulk substrate of FIG. 43A taken along line D-D';

FIG. 44A is a plan view of a silicon bulk substrate used to describe a method of producing a semiconductor integrated circuit according to the second embodiment;

FIG. 44B is a cross-sectional view of the silicon bulk substrate of FIG. 44A taken along line AA-AA';

FIG. 44C is a cross-sectional view of the silicon bulk substrate of FIG. 44A taken along line A-A';

FIG. 44D is a cross-sectional view of the silicon bulk substrate of FIG. 44A taken along line C-C';

FIG. 44E is a cross-sectional view of the silicon bulk substrate of FIG. 44A taken along line D-D';

FIG. 45A is a plan view of a silicon bulk substrate used to describe a method of producing a semiconductor integrated circuit according to the second embodiment;

FIG. 45B is a cross-sectional view of the silicon bulk substrate of FIG. 45A taken along line AA-AA';

FIG. 45C is a cross-sectional view of the silicon bulk substrate of FIG. 45A taken along line A-A';

FIG. 45D is a cross-sectional view of the silicon bulk substrate of FIG. 45A taken along line C-C';

FIG. 45E is a cross-sectional view of the silicon bulk substrate of FIG. 45A taken along line D-D';

FIG. 46A is a plan view of a silicon bulk substrate used to describe a method of producing a semiconductor integrated circuit according to the second embodiment;

FIG. 46B is a cross-sectional view of the silicon bulk substrate of FIG. 46A taken along line AA-AA';

FIG. 46C is a cross-sectional view of the silicon bulk substrate of FIG. 46A taken along line A-A';

FIG. 46D is a cross-sectional view of the silicon bulk substrate of FIG. 46A taken along line C-C';

FIG. 46E is a cross-sectional view of the silicon bulk substrate of FIG. 46A taken along line D-D';

FIG. 47A is a plan view of a silicon bulk substrate used to describe a method of producing a semiconductor integrated circuit according to the second embodiment;

FIG. 47B is a cross-sectional view of the silicon bulk substrate of FIG. 47A taken along line AA-AA';

FIG. 47C is a cross-sectional view of the silicon bulk substrate of FIG. 47A taken along line A-A';

FIG. 47D is a cross-sectional view of the silicon bulk substrate of FIG. 47A taken along line C-C';

FIG. 47E is a cross-sectional view of the silicon bulk substrate of FIG. 47A taken along line D-D';

FIG. 48A is a plan view of a silicon bulk substrate used to describe a method of producing a semiconductor integrated circuit according to the second embodiment;

FIG. 48B is a cross-sectional view of the silicon bulk substrate of FIG. 48A taken along line AA-AA';

FIG. 48C is a cross-sectional view of the silicon bulk substrate of FIG. 48A taken along line A-A';

FIG. 48D is a cross-sectional view of the silicon bulk substrate of FIG. 48A taken along line C-C';

FIG. 48E is a cross-sectional view of the silicon bulk substrate of FIG. 48A taken along line D-D';

FIG. 49A is a plan view of a silicon bulk substrate used to describe a method of producing a semiconductor integrated circuit according to the second embodiment;

FIG. 49B is a cross-sectional view of the silicon bulk substrate of FIG. 49A taken along line AA-AA';

FIG. 49C is a cross-sectional view of the silicon bulk substrate of FIG. 49A taken along line BB-BB';

FIG. 49D is a cross-sectional view of the silicon bulk substrate of FIG. 49A taken along line C-C';

FIG. 49E is a cross-sectional view of the silicon bulk substrate of FIG. 49A taken along line A-A';

FIG. 49F is a cross-sectional view of the silicon bulk substrate of FIG. 49A taken along line D-D';

FIG. 50A is a plan view of a silicon bulk substrate used to describe a method of producing a semiconductor integrated circuit according to the second embodiment;

FIG. 50B is a cross-sectional view of the silicon bulk substrate of FIG. 50A taken along line AA-AA';

FIG. 50C is a cross-sectional view of the silicon bulk substrate of FIG. 50A taken along line BB-BB';

FIG. 50D is a cross-sectional view of the silicon bulk substrate of FIG. 50A taken along line C-C';

FIG. 50E is a cross-sectional view of the silicon bulk substrate of FIG. 50A taken along line A-A';

FIG. 50F is a cross-sectional view of the silicon bulk substrate of FIG. 50A taken along line D-D';

FIG. 51A is a plan view of a silicon bulk substrate used to describe a method of producing a semiconductor integrated circuit according to the second embodiment;

FIG. 51B is a cross-sectional view of the silicon bulk substrate of FIG. 51A taken along line AA-AA';

FIG. 51C is a cross-sectional view of the silicon bulk substrate of FIG. 51A taken along line BB-BB';

FIG. 51D is a cross-sectional view of the silicon bulk substrate of FIG. 51A taken along line C-C';

FIG. 51E is a cross-sectional view of the silicon bulk substrate of FIG. 51A taken along line A-A';

FIG. 51F is a cross-sectional view of the silicon bulk substrate of FIG. 51A taken along line D-D';

FIG. 52A is a plan view of a silicon bulk substrate used to describe a method of producing a semiconductor integrated circuit according to the second embodiment;

FIG. 52B is a cross-sectional view of the silicon bulk substrate of FIG. 52A taken along line AA-AA';

FIG. 52C is a cross-sectional view of the silicon bulk substrate of FIG. 52A taken along line BB-BB';

FIG. 52D is a cross-sectional view of the silicon bulk substrate of FIG. 52A taken along line C-C';

FIG. 52E is a cross-sectional view of the silicon bulk substrate of FIG. 52A taken along line D-D';

FIG. 52F is a cross-sectional view of the silicon bulk substrate of FIG. 52A taken along line A-A';

FIG. 53A is a plan view of a silicon bulk substrate used to describe a method of producing a semiconductor integrated circuit according to the second embodiment;

FIG. 53B is a cross-sectional view of the silicon bulk substrate of FIG. 53A taken along line AA-AA';

FIG. 53C is a cross-sectional view of the silicon bulk substrate of FIG. 53A taken along line BB-BB';

FIG. 53D is a cross-sectional view of the silicon bulk substrate of FIG. 53A taken along line A-A';

FIG. 53E is a cross-sectional view of the silicon bulk substrate of FIG. 53A taken along line C-C';

FIG. 54 is a plan view of a CMOS device according to a third embodiment;

FIG. 55 is a plan view of a CMOS device according to a variation of the third embodiment;

FIG. 56 is an equivalent circuit schematic of an SRAM according to a fourth embodiment;

FIG. 57 is a plan view of the SRAM of FIG. 56;

FIG. 58A is a graph representing a read current of the SRAM of FIG. 56; and

Figure 58B:
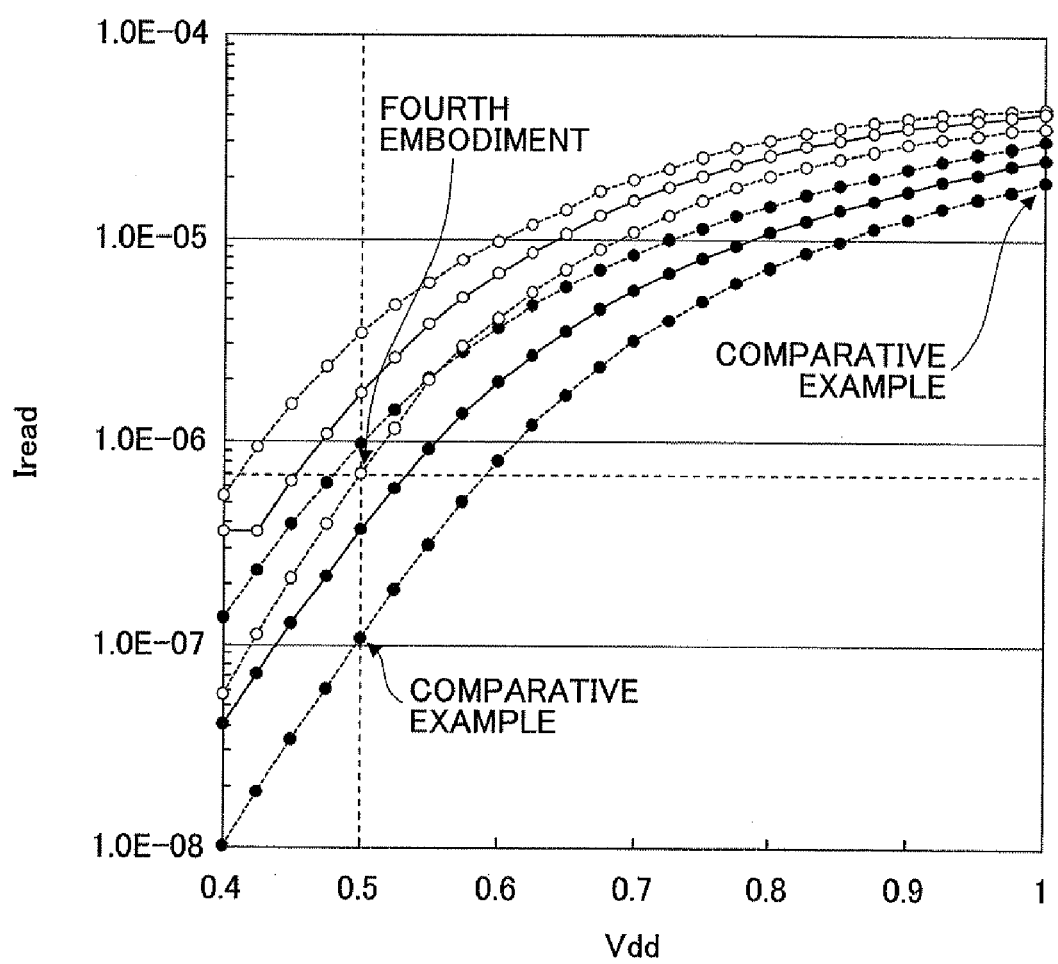

FIG. 58B is a graph representing a part of the graph of FIG. 58A in a logarithmic scale.

DESCRIPTION OF EMBODIMENTS

Preferred embodiments of the present invention will be described with reference to the accompanying drawings.
<First Embodiment>

Figure 4:
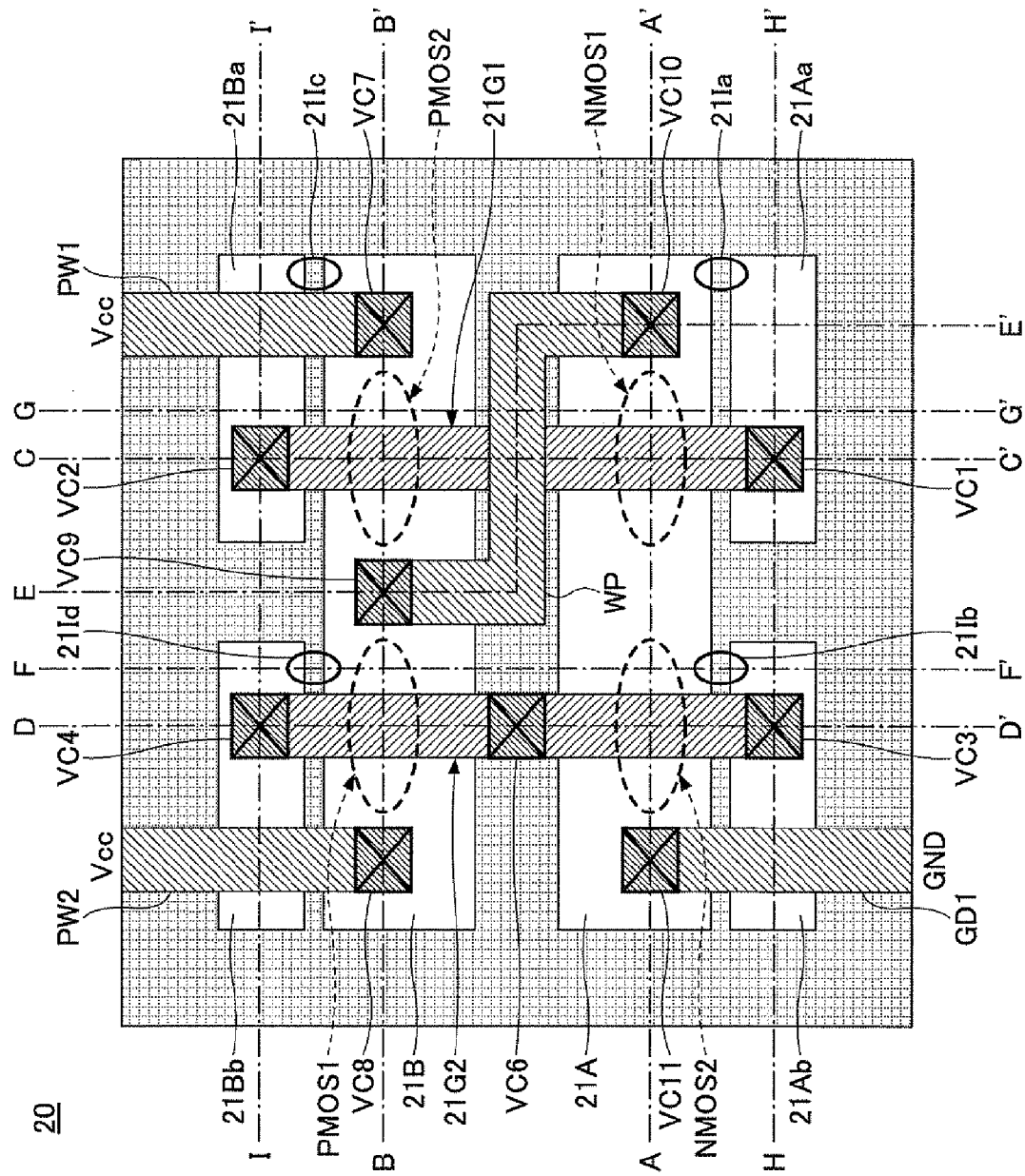
FIG. 4 is a plan view of a semiconductor logic circuit according to a first embodiment.
Figure 5:
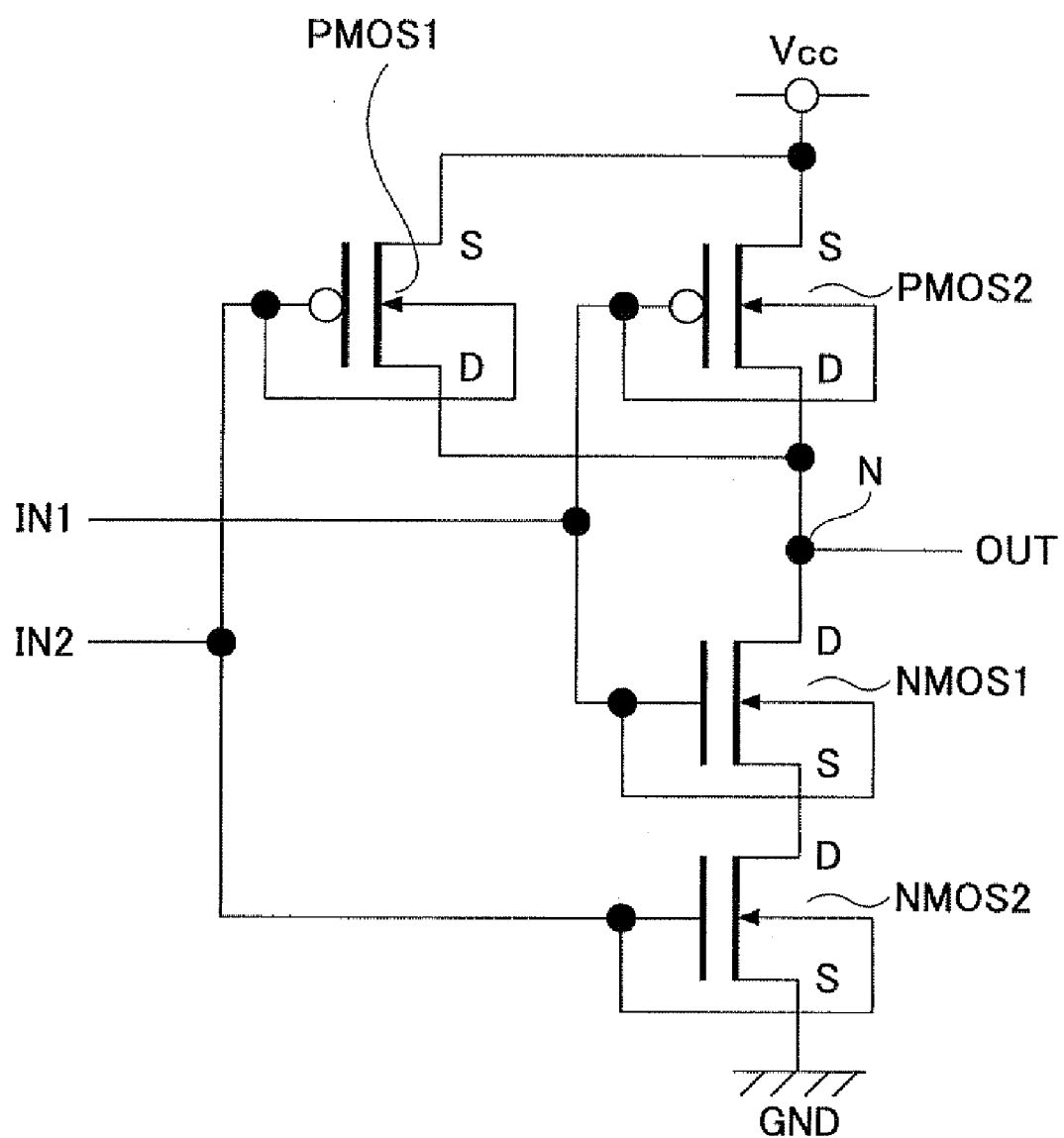
FIG. 5 is an equivalent circuit schematic of the semiconductor logic circuit of FIG. 4.

FIG. 4 is a plan view of a 2-input NAND circuit (semiconductor logic circuit) 20 provided as an example of a semiconductor integrated circuit including Dt-MOS transistors according to a first embodiment. FIG. 5 is an equivalent circuit schematic of the 2-input NAND circuit 20 of FIG. 4.

As illustrated in FIG. 5, the 2-input NAND circuit 20 includes two p-channel Dt-MOS transistors PMOS1 and PMOS2 that are connected in parallel, and two n-channel Dt-MOS transistors NMOS1 and NMOS2 that are connected in series to the p-channel Dt-MOS transistors PMOS1 and PMOS2. The p-channel Dt-MOS transistors PMOS1 and PMOS2 and the n-channel Dt-MOS transistors NMOS1 and NMOS2 are formed, for example, on a p-doped silicon bulk substrate 21.

Both of sources S of the p-channel Dt-MOS transistors PMOS1 and PMOS2 are connected to a power supply Vcc, and both of drains D of the p-channel Dt-MOS transistors PMOS1 and PMOS2 are connected to a drain D of the n-channel Dt-MOS transistor NMOS1. A source S of the n-channel Dt-MOS transistor NMOS1 is connected to a drain D of the n-channel Dt-MOS transistor NMOS2, and a source S of the n-channel Dt-MOS transistor NMOS2 is connected to a ground GND.

A first input signal IN1 is supplied to gate electrodes of the p-channel Dt-MOS transistor PMOS2 and the n-channel Dt-MOS transistor NMOS1, and a second input signal IN2 is supplied to gate electrodes of the p-channel Dt-MOS transistor PMOS1 and the n-channel Dt-MOS transistor NMOS2. A logic output signal is obtained at a connection node N between the drain D of the drains D of the p-channel Dt-MOS transistors PMOS1 and PMOS2 and the drain D of the n-channel Dt-MOS transistor NMOS1.

Referring to FIG. 4, a first element region 21A is defined in the silicon bulk substrate 21 by a shallow trench isolation (STI) region (element isolation region) 21I and element isolation sub-regions 21Ia and 21Ib that are contiguous with the element isolation region 21I, and a second element region 21B is defined in the silicon bulk substrate 21 by the element isolation region 21I and element isolation sub-regions 21Ic and 21Id that are contiguous with the element isolation region 21I.

Also on the silicon bulk substrate 21, a contact region 21Aa surrounded by the element isolation region 21I and the element isolation sub-region 21Ia is formed adjacent to the element region 21A; and a contact region 21Ab surrounded by the element isolation region 21I and the element isolation sub-region 21Ib is formed adjacent to the element region 21A and the contact region 21Aa.

Similarly, on the silicon bulk substrate 21, a contact region 21Ba surrounded by the element isolation region 21I and the element isolation sub-region 21Ic is formed adjacent to the element region 21B; and a contact region 21Bb surrounded by the element isolation region 21I and the element isolation sub-region 21Id is formed adjacent to the element region 21B and the contact region 21Ba. Although not shown, a silicide layer is formed on the surface of each of the first and second element regions 21A and 21B and the contact regions 21Aa, 21Ab, 21Ba, and 21Bb.

In the element region 21A, the n-channel Dt-MOS transistor NMOS1 is formed using a polysilicon pattern 21G1 as the gate electrode and the n-channel Dt-MOS transistor NMOS2 is formed using a polysilicon pattern 21G2 as the gate electrode.

The polysilicon patterns 21G1 and 21G2 extend to the element region 21B where the p-channel Dt-MOS transistors PMOS2 and PMOS1 are formed using the polysilicon patterns 21G1 and 21G2 as the gate electrodes.

The polysilicon pattern 21G1 also extends from the element region 21A across the element isolation sub-region 21Ia to the contact region 21Aa and contacts the silicon bulk substrate 21 through a via contact VC1 in the contact region 21Aa. Since the element isolation sub-region 21Ia formed on the silicon bulk substrate 21 is shallow, the polysilicon pattern 21G1 contacting the silicon bulk substrate 21 through the via contact VC1 is electrically connected with a part of the element region 21A directly below the polysilicon pattern 21G1 via a region (or a portion of the silicon bulk substrate 21) under the element isolation sub-region 21Ia.

The polysilicon pattern 21G1 further extends from the element region 21B across the element isolation sub-region 21Ic to the contact region 21Ba and contacts the silicon bulk substrate 21 through a via contact VC2 in the contact region 21Ba. Since the element isolation sub-region 21Ic formed on the silicon bulk substrate 21 is shallow, the polysilicon pattern 21G1 contacting the silicon bulk substrate 21 through the via contact VC2 is electrically connected with a part of the element region 21B directly below the polysilicon pattern 21G1 via a region (or a portion of the silicon bulk substrate 21) under the element isolation sub-region 21Ic.

The polysilicon pattern 21G2 also extends from the element region 21A across the element isolation sub-region 21Ib to the contact region 21Aa and contacts the silicon bulk substrate 21 through a via contact VC3 in the contact region 21Ab. Since the element isolation sub-region 21Ib formed on the silicon bulk substrate 21 is shallow, the polysilicon pattern 21G2 contacting the silicon bulk substrate 21 through the via contact VC3 is electrically connected with a part of the element region 21A directly below the polysilicon pattern 21G2 via a region (or a portion of the silicon bulk substrate 21) under the element isolation sub-region 21Ib.

The polysilicon pattern 21G2 further extends from the element region 21B across the element isolation sub-region 21Id to the contact region 21Bb and contacts the silicon bulk substrate 21 through a via contact VC4 in the contact region 21Bb. Since the element isolation sub-region 21Id formed on the silicon bulk substrate 21 is shallow, the polysilicon pattern 21G2 contacting the silicon bulk substrate 21 through the via contact VC4 is electrically connected with a part of the element region 21B directly below the polysilicon pattern 21G2 via a region (or a portion of the silicon bulk substrate 21) under the element isolation sub-region 21Id. With the above configuration, the n-channel Dt-MOS transistors NMOS1 and NMOS2 and the p-channel Dt-MOS transistors PMOS1 and PMOS2 operate as dynamic threshold transistors as described with reference to FIG. 2.

Figure 3:
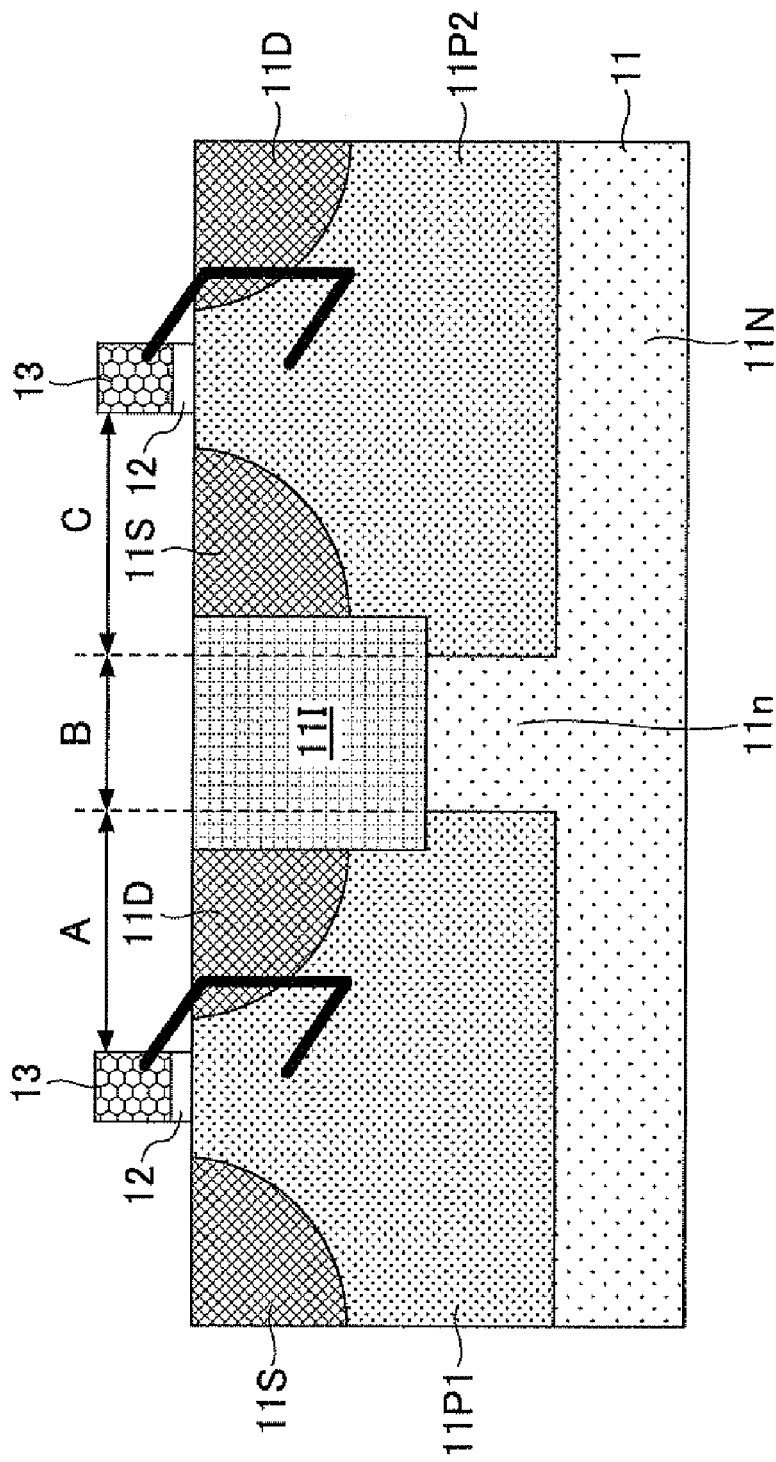
FIG. 3 is a drawing illustrating an exemplary semiconductor structure including Dt-MOS transistors.

Also with the above configuration, the drain D of the p-channel Dt-MOS transistor PMOS1 and the drain D of the p-channel Dt-MOS transistor PMOS2 are implemented by a common component (or region), and the source S of the n-channel Dt-MOS transistor NMOS1 and the drain D of the n-channel Dt-MOS transistor NMOS2 are implemented by a common component (or region). Compared with a case where the p-channel Dt-MOS transistors PMOS1 and PMOS2 and the n-channel Dt-MOS transistors NMOS1 and NMOS2 are separated by element isolation regions as illustrated in FIG. 3, the above configuration makes it possible to reduce the area of the semiconductor logic circuit 20.

Although not shown in FIG. 4, a via contact VC5 (see FIG. 8) for the polysilicon pattern 21G1 is formed above the element isolation region 21I between the first and second element regions 21A and 21B. An input signal A is supplied to the via contact VC5. Similarly, a via contact VC6 (see FIG. 10) for the polysilicon pattern 21G2 is formed above the element isolation region 21I between the first and second element regions 21A and 21B. An input signal B is supplied to the via contact VC6.

Also, to implement the circuit illustrated in FIG. 5, via contacts VC7 and VC8 are formed in the corresponding source regions S of the p-channel Dt-MOS transistors PMOS1 and PMOS2 in the element region 21B. A supply voltage Vcc is supplied from power supply patterns PW1 and PW2 to the corresponding via contacts VC7 and VC8. The drains D of the p-channel Dt-MOS transistors PMOS1 and PMOS2 are connected to a via contact VC10 formed at the drain D of the n-channel Dt-MOS transistor NMOS1 through a via contact VC9 and a wiring pattern WP. Also, the source S of the n-channel Dt-MOS transistor NMOS2 is connected to the ground GND via a via contact VC11 and a ground pattern GD1. An output of the semiconductor logic circuit 20 is obtained on the wiring pattern WP.

Figure 6:
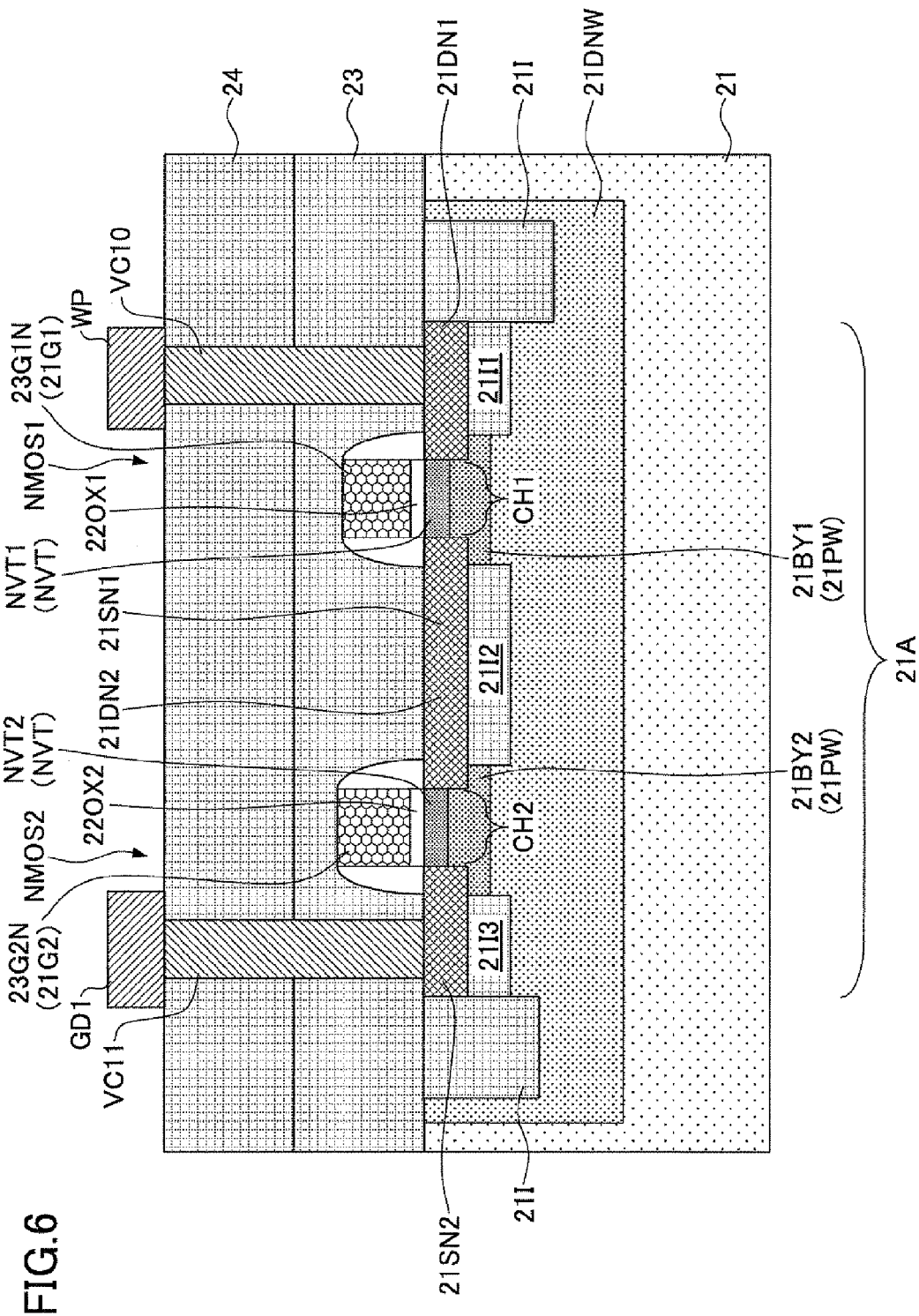
FIG. 6 is a cross-sectional view of the semiconductor logic circuit of FIG. 4 taken along line A-A'.

FIG. 6 is a cross-sectional view of the semiconductor logic circuit 20 of FIG. 4 taken along line A-A'.

As illustrated in FIG. 6, in the element region 21A, a deep n-type well 21DNW is formed in the silicon bulk substrate 21, and shallow p-type wells 21PW corresponding to bodies 21BY1 and 21BY2 of the n-channel Dt-MOS transistors NMOS1 and NMOS2 are formed on the n-type well 21DNW directly below an n-doped gate electrode 23G1N and an n-doped gate electrode 23G2N. The n-doped gate electrode 23G1N is implemented by the polysilicon pattern 21G1 and the n-doped gate electrode 23G2N is implemented by the polysilicon pattern 21G2.

On the bodies 21BY1 and 21BY2, p-doped channel regions NVT1 and NVT2 for threshold control are formed as parts of a p-doped region NVT. The p-doped channel regions NVT1 and NVT2 correspond to a channel region CH1 of the n-channel Dt-MOS transistor NMOS1 directly below the gate electrode 23G1N and a channel region CH2 of the n-channel Dt-MOS transistor NMOS2 directly below the gate electrode 23G2N. Alternatively, the p-doped channel regions NVT1 and NVT2 may be implemented by the shallow p-type wells 21PW forming the bodies 21BY1 and 21BY2.

Referring back to FIG. 4, the polysilicon pattern 21G1 implementing the gate electrode 23G1N is electrically connected through the via contact VC1 to the silicon bulk substrate 21 and accordingly, to the body 21BY1. Therefore, the input signal IN1 applied to the gate electrode 23G1N is also applied at the same time to the body 21BY1 and the n-channel Dt-MOS transistor NMOS1 functions as a dynamic threshold transistor. Similarly, the polysilicon pattern 21G2 implementing the gate electrode 23G2N is electrically connected through the via contact VC3 to the silicon bulk substrate 21 and accordingly, to the body 21BY2. Therefore, the input signal IN2 applied to the gate electrode 23G2N is also applied at the same time to the body 21BY2 and the n-channel Dt-MOS transistor NMOS2 functions as a dynamic threshold transistor.

The gate electrodes 23G1N and 23G2N are formed on the silicon bulk substrate 21 via gate insulating films 22OX1 and 22OX2. In the deep well 21DNW, an n-type diffusion region 21DN1 is formed on a first side of the channel region CH1 and an n-type diffusion region 21SN1 is formed on a second side of the channel region CH1 so as to oppose the n-type diffusion region 21DN1 across the channel region CH1. The n-type diffusion region 21DN1 forms the drain D of the n-channel Dt-MOS transistor NMOS1 and the n-type diffusion region 21SN1 forms the source S of the n-channel Dt-MOS transistor NMOS1.

Also in the deep well 21DNW, an n-type diffusion region 21DN2 is formed on a first side of the channel region CH2 and an n-type diffusion region 21SN2 is formed on a second side of the channel region CH2 so as to oppose the n-type diffusion region 21DN2 across the channel region CH2. The n-type diffusion region 21DN2 forms the drain D of the n-channel Dt-MOS transistor NMOS2 and the n-type diffusion region 21SN2 forms the source S of the n-channel Dt-MOS transistor NMOS2. The n-type diffusion region 21SN1 and the n-type diffusion region 21DN2 are implemented by the same n-type diffusion region. Accordingly, this configuration makes it possible to reduce the area of the semiconductor logic circuit 20.

Also in FIG. 6, insulating regions 21I1, 21I2, and 21I3 made of a silicon oxide film are formed directly below the n-type diffusion region 21DN1, the n-type diffusion region 21SN1, i.e., the n-type diffusion region 21DN2, and the n-type diffusion region 21SN2.

The insulating region 21I1 is contiguous with the adjacent element isolation region 21I and the insulating region 21I3 is contiguous with the adjacent element isolation region 21I.

Also, the insulating regions 21I1, 21I2, and 21I3 are deeper than the shallow p-type wells 21PW that form the bodies 21BY1 and 21BY2 (i.e., the lower ends of the insulating regions 21I1, 21I2, and 21I3 are located lower than the lower ends of the shallow p-type wells 21PW). With this configuration, the bodies 21BY1 and 21BY2 are electrically separated from each other and therefore the input signals IN1 and IN2 do not interfere with each other.

Meanwhile, the n-type diffusion regions 21DN1, 21SN1, 21DN2, and 21SN2 are shallower than the shallow p-type wells 21PW (i.e., the lower ends of the n-type diffusion regions 21DN1, 21SN1, 21DN2, and 21SN2 are located higher than the lower ends of the shallow p-type wells 21PW) and therefore the n-type diffusion regions 21DN1, 21SN, 21DN2, and 21SN2 are not short-circuited with the n-type well 21DNW.

Also in FIG. 6, interlayer insulating films 23 and 24 are stacked on the silicon bulk substrate 21, and the via contact VC10 passes through the interlayer insulating films 23 and 24 and contacts the n-type diffusion region 21DN1. Similarly, the via contact VC11 passes through the interlayer insulating films 23 and 24 and contacts the n-type diffusion region 21SN2. The via contact VC10 contacts the wiring pattern WP formed on the interlayer insulating film 24 and the via contact VC11 is connected to the ground pattern GD1 formed on the interlayer insulating film 24 and connected to the ground GND.

Figure 7:
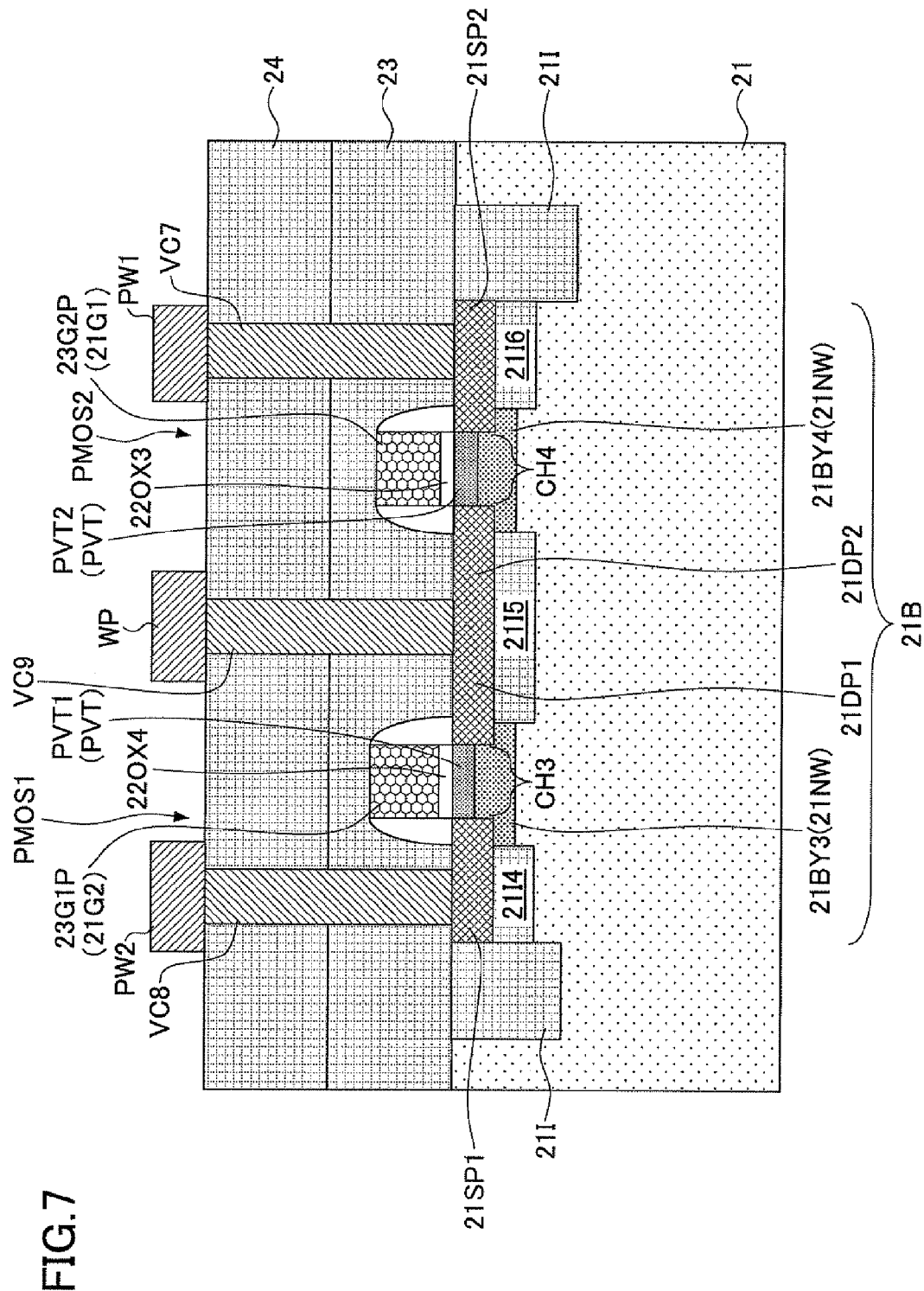
FIG. 7 is a cross-sectional view of the semiconductor logic circuit of FIG. 4 taken along line B-B'.

FIG. 7 is a cross-sectional view of the semiconductor logic circuit 20 of FIG. 4 taken along line B-B'.

As illustrated in FIG. 7, in the element region 21B, shallow n-type wells 21NW corresponding to bodies 21BY4 and 21BY3 of the p-channel Dt-MOS transistors PMOS2 and PMOS1 are formed on the silicon bulk substrate 21 directly below a p-doped gate electrode 23G2P and a p-doped gate electrode 23G1P. The p-doped gate electrode 23G2P is implemented by the polysilicon pattern 21G1 and the p-doped gate electrode 23G1P is implemented by the polysilicon pattern 21G2.

On the bodies 21BY3 and 21BY4, n-doped channel regions PVT1 and PVT2 for threshold control are formed as parts of an n-doped region PVT. The n-doped channel regions PVT1 and PVT2 correspond to a channel region CH3 of the p-channel Dt-MOS transistor PMOS1 directly below the gate electrode 23G1P and a channel region CH4 of the p-channel Dt-MOS transistor PMOS2 directly below the gate electrode 23G2P. Alternatively, the n-doped channel regions PVT1 and PVT2 may be implemented by the shallow n-type wells 21NW forming the bodies 21BY1 and 21BY2.

Referring back to FIG. 4, the polysilicon pattern 21G1 implementing the gate electrode 23G2P is electrically connected through the via contact VC2 to the silicon bulk substrate 21 and accordingly, to the body 21BY4. Therefore, the input signal IN1 applied to the gate electrode 23G2P is also applied at the same time to the body 21BY4 and the p-channel Dt-MOS transistor PMOS2 functions as a dynamic threshold transistor. Similarly, the polysilicon pattern 21G2 implementing the gate electrode 23G1P is electrically connected through the via contact VC4 to the silicon bulk substrate 21 and accordingly, to the body 21BY3. Therefore, the input signal IN2 applied to the gate electrode 23G1P is also applied at the same time to the body 21BY3 and the p-channel Dt-MOS transistor PMOS1 functions as a dynamic threshold transistor.

The gate electrodes 23G2P and 23G1P are formed on the silicon bulk substrate 21 via gate insulating films 22OX3 and 22OX4. In the silicon bulk substrate 21, a p-type diffusion region 21SP2 is formed on a first side of the channel region CH4 and a p-type diffusion region 21DP2 is formed on a second side of the channel region CH4 so as to oppose the p-type diffusion region 21SP2 across the channel region CH4. The p-type diffusion region 21SP2 forms the source S of the p-channel Dt-MOS transistor PMOS2 and the p-type diffusion region 21DP2 forms the drain D of the p-channel Dt-MOS transistor PMOS2.

Also in the silicon bulk substrate 21, a p-type diffusion region 21DP1 is formed on a first side of the channel region CH3 and a p-type diffusion region 21SP1 is formed on a second side of the channel region CH3 so as to oppose the p-type diffusion region 21DP1 across the channel region CH3. The p-type diffusion region 21DP1 forms the drain D of the p-channel Dt-MOS transistor PMOS1 and the p-type diffusion region 21SP1 forms the source D of the p-channel Dt-MOS transistor PMOS1. The p-type diffusion region 21DP2 and the p-type diffusion region 21DP1 are implemented by the same p-type diffusion region, and the via contact VC9 illustrated in FIG. 4 is electrically connected to the p-type diffusion regions 21DP2 and 21DP1. Implementing the p-type diffusion regions 21DP2 and 21DP1 by the same p-type diffusion region makes it possible to reduce the area of the semiconductor logic circuit 20.

The via contact VP9 extends through the interlayer insulating films 23 and 24 and is connected to the wiring pattern WP formed on the interlayer insulating film 24.

Also in FIG. 7, insulating regions 21I4, 21I5, and 21I6 made of a silicon oxide film are formed directly below the p-type diffusion region 21SP1, the p-type diffusion region 21DP1, i.e., the p-type diffusion region 21DP2, and the p-type diffusion region 21SP2.

The insulating region 21I4 is contiguous with the adjacent element isolation region 21I and the insulating region 21I6 is contiguous with the adjacent element isolation region 21I. Also, the insulating regions 21I4, 21I5, and 21I6 are deeper than the shallow n-type wells 21NW that form the bodies 21BY3 and 21BY4 (i.e., the lower ends of the insulating regions 21I4, 21I5, and 21I6 are located lower than the lower ends of the shallow n-type wells 21NW). With this configuration, the bodies 21BY3 and 21BY4 are electrically separated from each other and therefore the input signals IN1 and IN2 do not interfere with each other.

Meanwhile, the p-type diffusion regions 21SP1, 21DP1, 21DP2, and 21SP2 are shallower than the shallow n-type wells 21NW (i.e., the lower ends of the p-type diffusion regions 21SP1, 21DP1, 21DP2, and 21SP2 are located higher than the lower ends of the shallow n-type wells 21NW) and therefore the p-type diffusion regions 21SP1, 21DP1, 21DP2, and 21SP2 are not short-circuited with the silicon bulk substrate 21.

Also in FIG. 7, the via contact VC7 passes through the interlayer insulating films 23 and 24 and contacts the p-type diffusion region 21SP2. Similarly, the via contact VC8 passes through the interlayer insulating films 23 and 24 and contacts the p-type diffusion region 21SP1. The via contact VC7 contacts the power supply pattern PW1 formed on the interlayer insulating film 24 and the via contact VC8 is connected to the power supply pattern PW2 formed on the interlayer insulating film 24.

Figure 8:
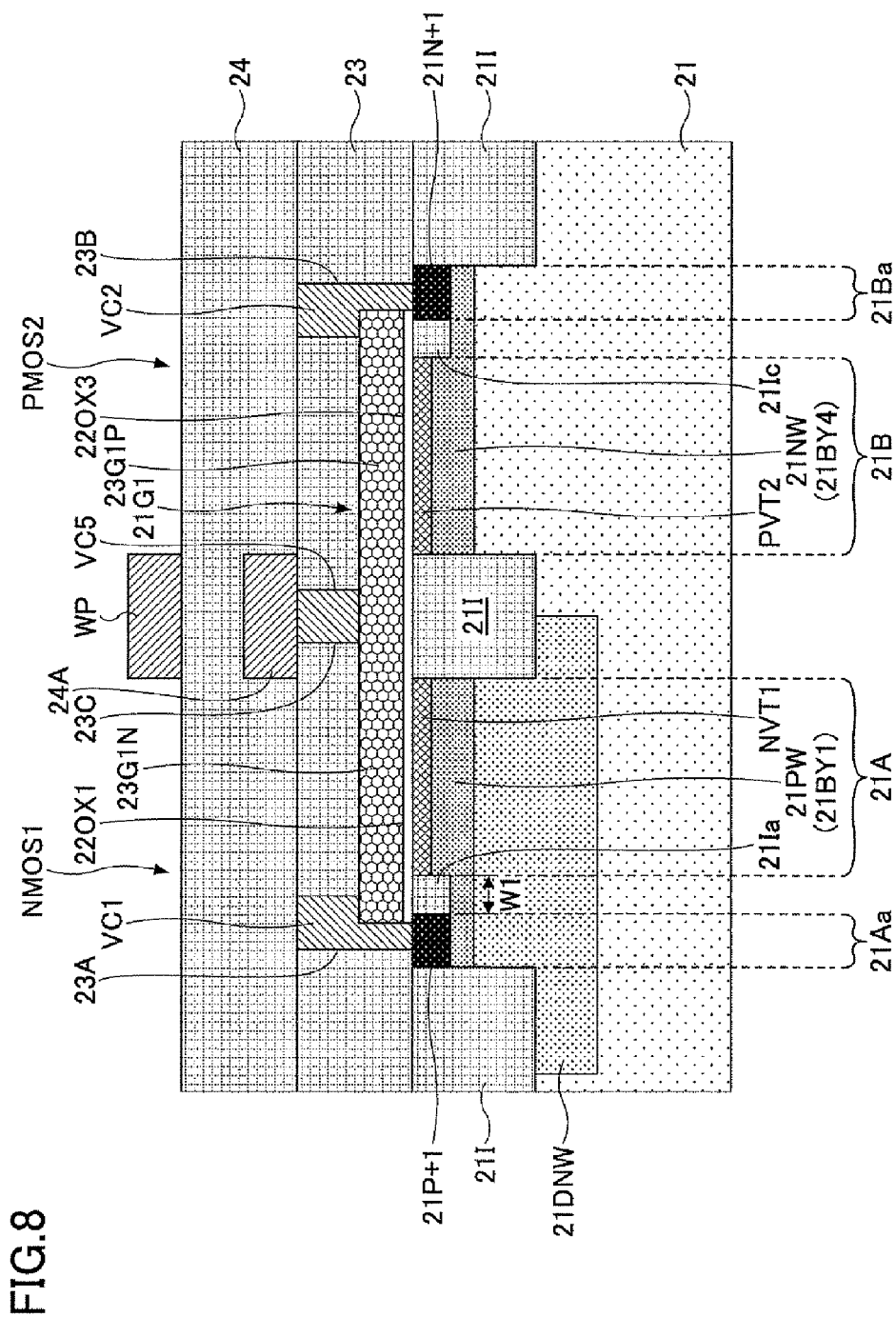
FIG. 8 is a cross-sectional view of the semiconductor logic circuit of FIG. 4 taken along line C-C'.

FIG. 8 is a cross-sectional view of the semiconductor logic circuit 20 of FIG. 4 taken along line C-C'.

As illustrated in FIG. 8, in the element region 21A, the shallow p-type well 21PW corresponding to the body 21BY1 and including the p-doped channel region NVT1 is formed directly below the gate electrode 23G1N implemented by a part of the polysilicon pattern 21G1. One end of the p-type well 21PW is defined (or limited) by the element isolation region 21I separating the element region 21A and the element region 21B. The other end of the p-type well 21PW is defined (or limited) by the shallow element isolation sub-region 21Ia separating the element region 21A and the contact region 21Aa.

A highly-doped p-type region 21P+1 for ohmic connection is formed in the contact region 21Aa. The highly-doped p-type region 21P+1 is electrically connected with the p-type well 21PW under the shallow element isolation sub-region 21Ia.

An opening 23A is formed in the interlayer insulating film 23 to expose the highly-doped p-type region 21P+1 and an end of the gate electrode 23G1N adjacent to the highly-doped p-type region 21P+1. The opening 23A is filled with the via contact VC1 made of, for example, a metal plug to electrically connect the gate electrode 23G1N with the shallow well 21PW.

Similarly, in the element region 21B, the shallow n-type well 21NW corresponding to the body 21BY4 and including the n-doped channel region PVT2 is formed directly below the gate electrode 23G1P implemented by a part of the polysilicon pattern 21G1. One end of the n-type well 21NW is defined (or limited) by the element isolation region 21I separating the element region 21A and the element region 21B. The other end of the n-type well 21NW is defined (or limited) by the shallow element isolation sub-region 21Ic separating the element region 21B and the contact region 21Ba.

A highly-doped n-type region 21N+1 for ohmic connection is formed in the contact region 21Ba. The highly-doped n-type region 21N+1 is electrically connected with the n-type well 21NW under the shallow element isolation sub-region 21Ic.

An opening 23B is formed in the interlayer insulating film 23 to expose the highly-doped n-type region 21N+1 and an end of the gate electrode 23G1P adjacent to the highly-doped n-type region 21N+1. The opening 23B is filled with the via contact VC2 made of, for example, a metal plug to electrically connect the gate electrode 23G1P with the shallow well 21NW. With the above configuration, the p-channel Dt-MOS transistor PMOS1 and the n-channel Dt-MOS transistor NMOS2 function as dynamic threshold transistors.

Figure 9:
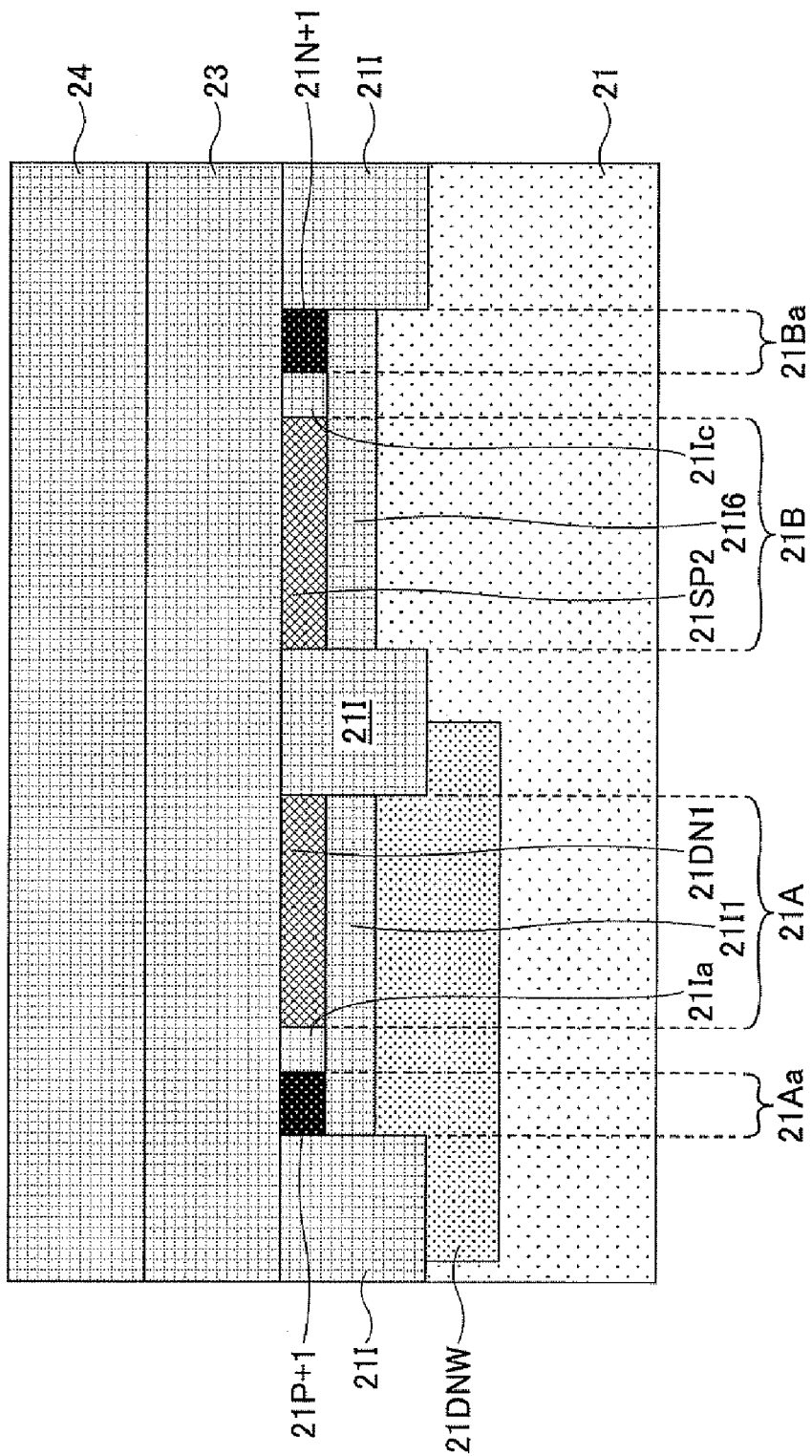
FIG. 9 is a cross-sectional view of the semiconductor logic circuit of FIG. 4 taken along line G-G'.

FIG. 9 is a cross-sectional view of the semiconductor logic circuit 20 of FIG. 4 taken along line G-G'.

Referring to FIG. 9 together with FIG. 6, the insulating region 21I1 is formed directly below the drain region 21DN1 of the n-channel Dt-MOS transistor NMOS1. The insulating region 21I1 extends below the shallow element isolation sub-region 21Ia to the contact region 21Aa and shallow element isolation sub-region 21Ia is contiguous with the insulating region 21I1. With this configuration, the highly-doped p-type region 21P+1 formed in the contact region 21Aa is electrically connected with the p-type well 21PW forming the body 21BY1 of the n-channel Dt-MOS transistor NMOS1, but is electrically and physically separated by the shallow element isolation sub-region 21Ia from the n-type diffusion region 21DN1 forming the drain region of the n-channel Dt-MOS transistor NMOS1. This is also true for the source side of the n-channel Dt-MOS transistor NMOS1.

Referring to FIG. 8, a contact hole 23C is formed in the interlayer insulating film 23 at a position corresponding to the element isolation region 21I between the element region 21A and the element region 21B. The contact hole 23C is filled with the via contact VC5 made of, for example, a metal plug to electrically connect a signal wiring pattern 24A formed on the interlayer insulating film 23 with the polysilicon pattern 21G1. The input signal IN1 is supplied to the signal wiring pattern 24A. Although not shown, a low-resistance silicide layer is formed on the polysilicon pattern 21G1. The low-resistance silicide layer prevents an increase in electric resistance at a junction between the n-doped gate electrode 23G1N and the p-doped gate electrode 23G1P of the polysilicon pattern 21G1. The via contact VC5 is not illustrated in FIG. 4 because it is formed directly below the wiring pattern WP formed on the interlayer insulating film 24.

Figure 10:
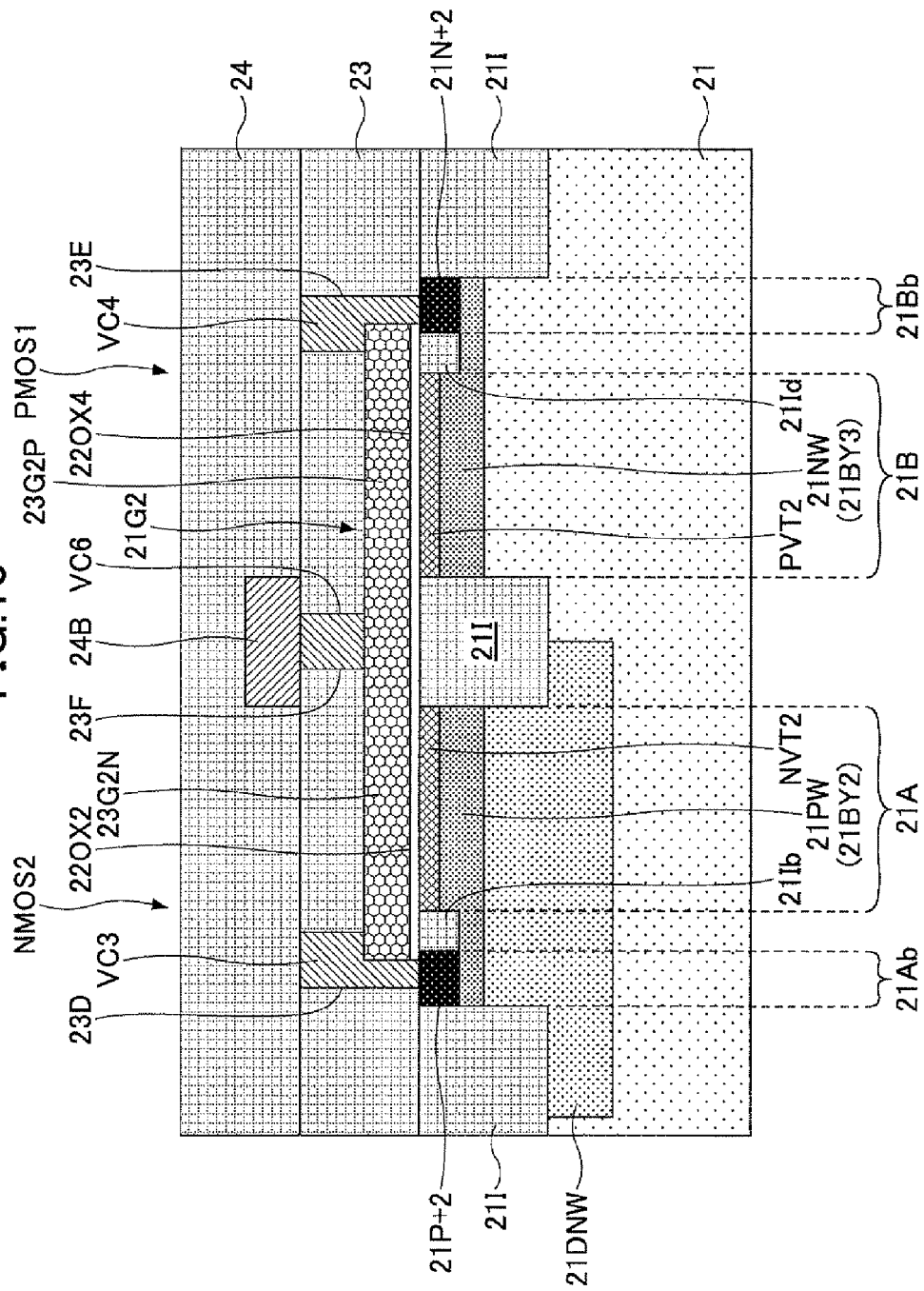
FIG. 10 is a cross-sectional view of the semiconductor logic circuit of FIG. 4 taken along line D-D'.

FIG. 10 is a cross-sectional view of the semiconductor logic circuit 20 of FIG. 4 taken along line D-D'.

As illustrated in FIG. 10, in the element region 21A, the shallow p-type well 21PW corresponding to the body 21BY2 and including the p-doped channel region NVT2 is formed directly below the gate electrode 23G2N implemented by a part of the polysilicon pattern 21G2. One end of the p-type well 21PW is defined (or limited) by the element isolation region 21I separating the element region 21A and the element region 21B. The other end of the p-type well 21PW is defined (or limited) by the shallow element isolation sub-region 21Ib separating the element region 21A and the contact region 21Ab.

A highly-doped p-type region 21P+2 for ohmic connection is formed in the contact region 21Ab. The highly-doped p-type region 21P+2 is electrically connected with the p-type well 21PW under the shallow element isolation sub-region 21Ib.

An opening 23D is formed in the interlayer insulating film 23 to expose the highly-doped p-type region 21P+2 and an end of the gate electrode 23G2N adjacent to the highly-doped p-type region 21P+2. The opening 23A is filled with the via contact VC3 made of, for example, a metal plug to electrically connect the gate electrode 23G2N with the shallow well 21PW.

Similarly, in the element region 21B, the shallow n-type well 21NW corresponding to the body 21BY3 and including the n-doped channel region PVT2 is formed directly below the gate electrode 23G2P implemented by a part of the polysilicon pattern 21G2. One end of the n-type well 21NW is defined (or limited) by the element isolation region 21I separating the element region 21A and the element region 21B. The other end of the n-type well 21NW is defined (or limited) by the shallow element isolation sub-region 21Id separating the element region 21B and the contact region 21Bb.

A highly-doped n-type region 21N+2 for ohmic connection is formed in the contact region 21Bb. The highly-doped n-type region 21N+2 is electrically connected with the n-type well 21NW under the shallow element isolation sub-region 21Id.

An opening 23E is formed in the interlayer insulating film 23 to expose the highly-doped n-type region 21N+2 and an end of the gate electrode 23G2P adjacent to the highly-doped n-type region 21N+2. The opening 23E is filled with the via contact VC4 made of, for example, a metal plug to electrically connect the gate electrode 23G2P with the shallow well 21NW. With the above configuration, the p-channel Dt-MOS transistor PMOS1 and the n-channel Dt-MOS transistor NMOS2 function as dynamic threshold transistors.

Figure 11:
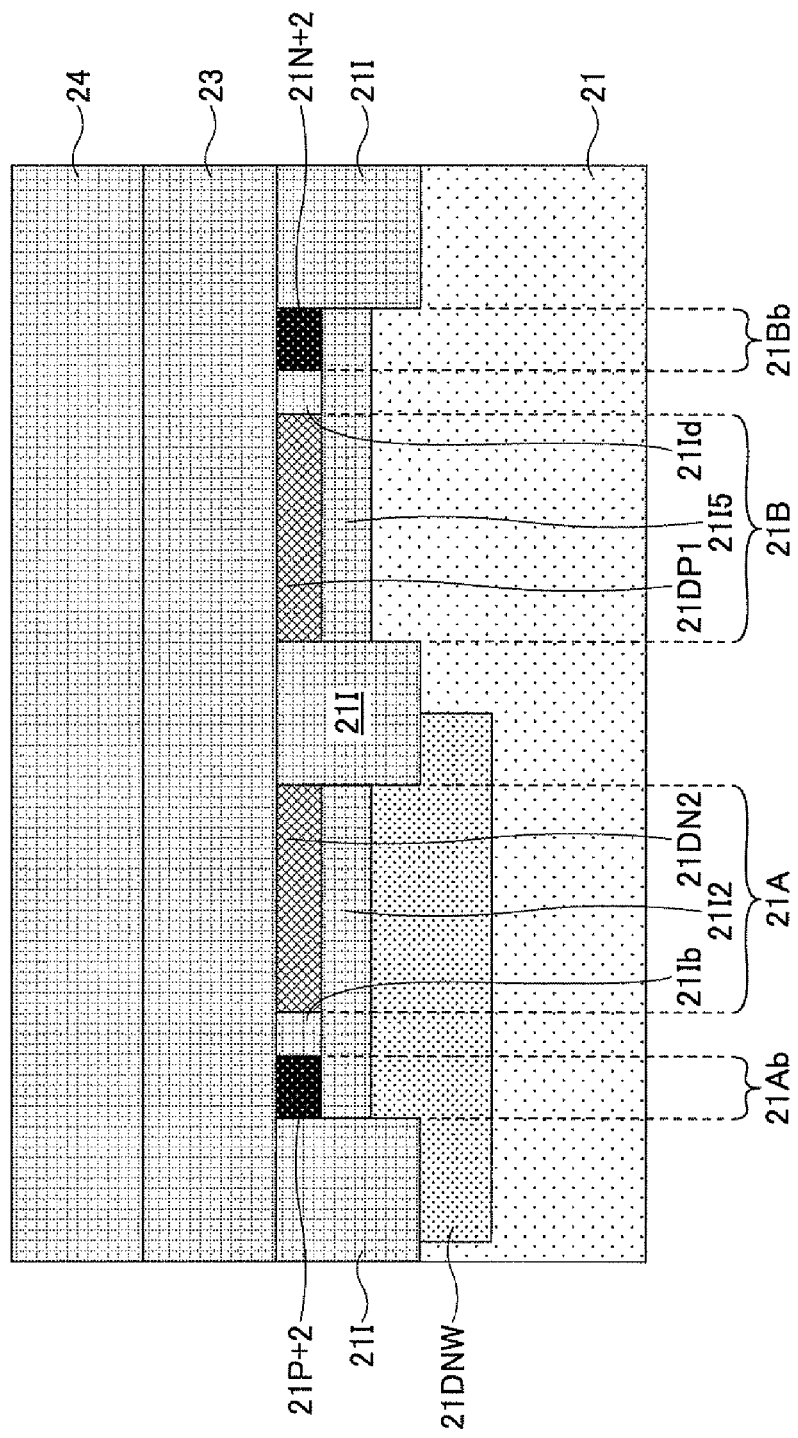
FIG. 11 is a cross-sectional view of the semiconductor logic circuit of FIG. 4 taken along line F-F'.

FIG. 11 is a cross-sectional view of the semiconductor logic circuit 20 of FIG. 4 taken along line F-F'.

Referring to FIG. 11 together with FIG. 6, the insulating region 21I2 is formed directly below the drain region 21DN2 of the n-channel Dt-MOS transistor NMOS2. The insulating region 21I2 extends below the shallow element isolation sub-region 21Ib to the contact region 21Ab and the shallow element isolation sub-region 21Ib is contiguous with the insulating region 21I2. With this configuration, the highly-doped p-type region 21P+2 formed in the contact region 21Ab is electrically connected with the p-type well 21PW forming the body 21BY2 of the n-channel Dt-MOS transistor NMOS2, but is electrically and physically separated by the shallow element isolation sub-region 21Ib from the n-type diffusion region 21DN2 forming the drain region of the n-channel Dt-MOS transistor NMOS2. This is also true for the source side of the n-channel Dt-MOS transistor NMOS2.

Referring to FIG. 10, a contact hole 23F is formed in the interlayer insulating film 23 at a position corresponding to the element isolation region 21I between the element region 21A and the element region 21B. The contact hole 23F is filled with the via contact VC6 made of, for example, a metal plug to electrically connect a signal wiring pattern 24B formed on the interlayer insulating film 23 with the polysilicon pattern 21G2. The input signal IN2 is supplied to the signal wiring pattern 24B. Although not shown, a low-resistance silicide layer is formed on the polysilicon pattern 21G2. The low-resistance silicide layer prevents an increase in electric resistance at a junction between the n-doped gate electrode 23G2N and the p-doped gate electrode 23G2P of the polysilicon pattern 21G2.

Figure 12:
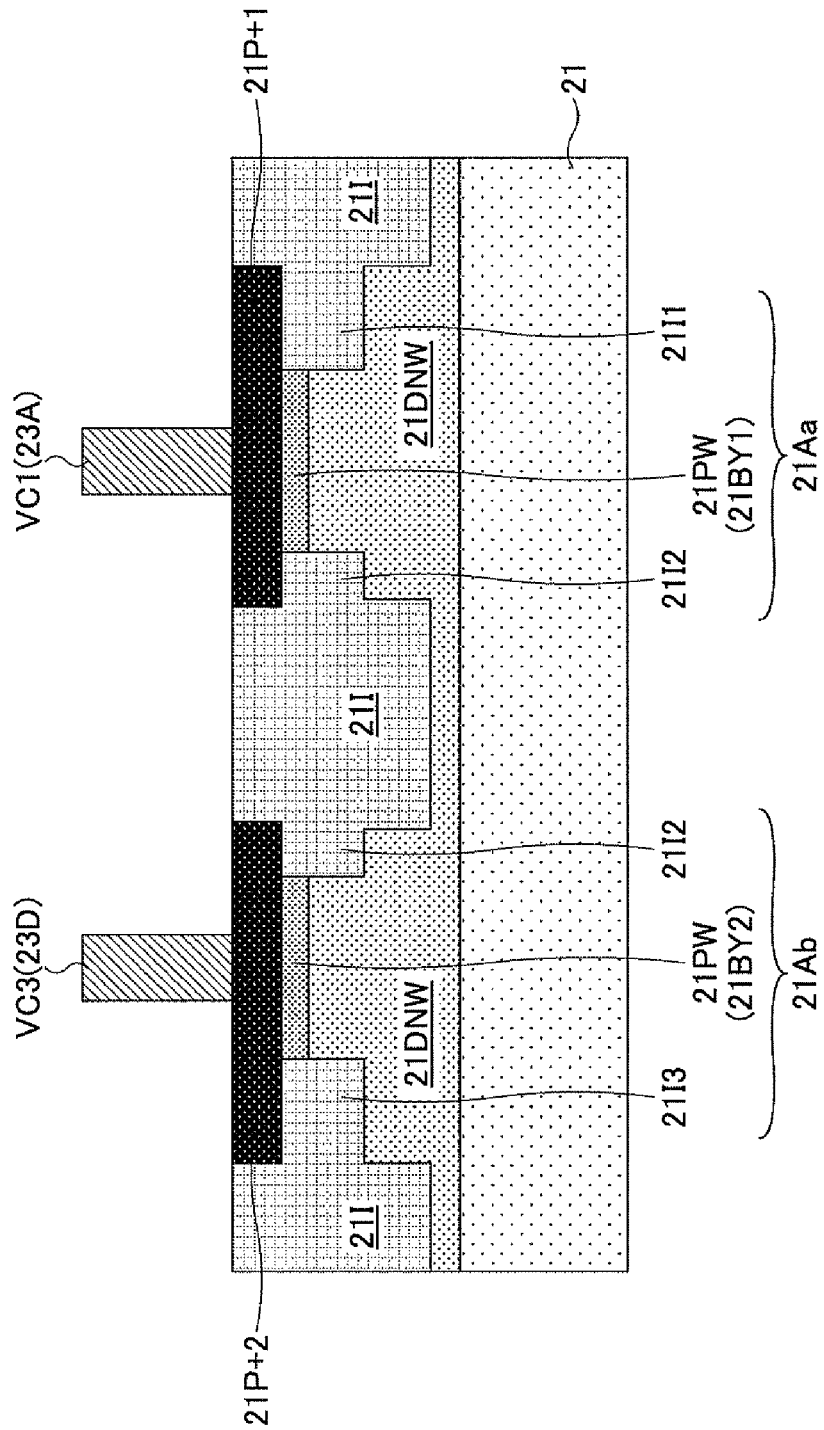
FIG. 12 is a cross-sectional view of the semiconductor logic circuit of FIG. 4 taken along line H-H'.

FIG. 12 is a cross-sectional view of the semiconductor logic circuit 20 of FIG. 4 taken along line H-H'.

Referring to FIG. 12 together with FIG. 9, the insulating region 21I1 extends below the highly-doped p-type region 21P+1 to the contact region 21Aa, and the insulating region 21I2 extends below the highly-doped p-type region 21P+1 to the contact region 21Aa. However, the highly-doped p-type region 21P+1 is in contact with the p-type well 21PW forming the body 21BY1 at a position between the insulating regions 21I1 and 21I2. Also in FIG. 12, the insulating region 21I2 extends below the highly-doped p-type region 21P+2 to the contact region 21Ab, and the insulating region 21I3 extends below the highly-doped p-type region 21P+2 to the contact region 21Ab. However, the highly-doped p-type region 21P+2 is in contact with the p-type well 21PW forming the body 21BY2 at a position between the insulating regions 21I2 and 21I3. With this configuration, the n-type gate electrode 23G1N is electrically connected through the via contact VC1 with the body 21BY1 in the contact region 21Aa and the n-type gate electrode 23G2N is electrically connected through the via contact VC3 with the body 21BY2 in the contact region 21Ab.

Figure 13:
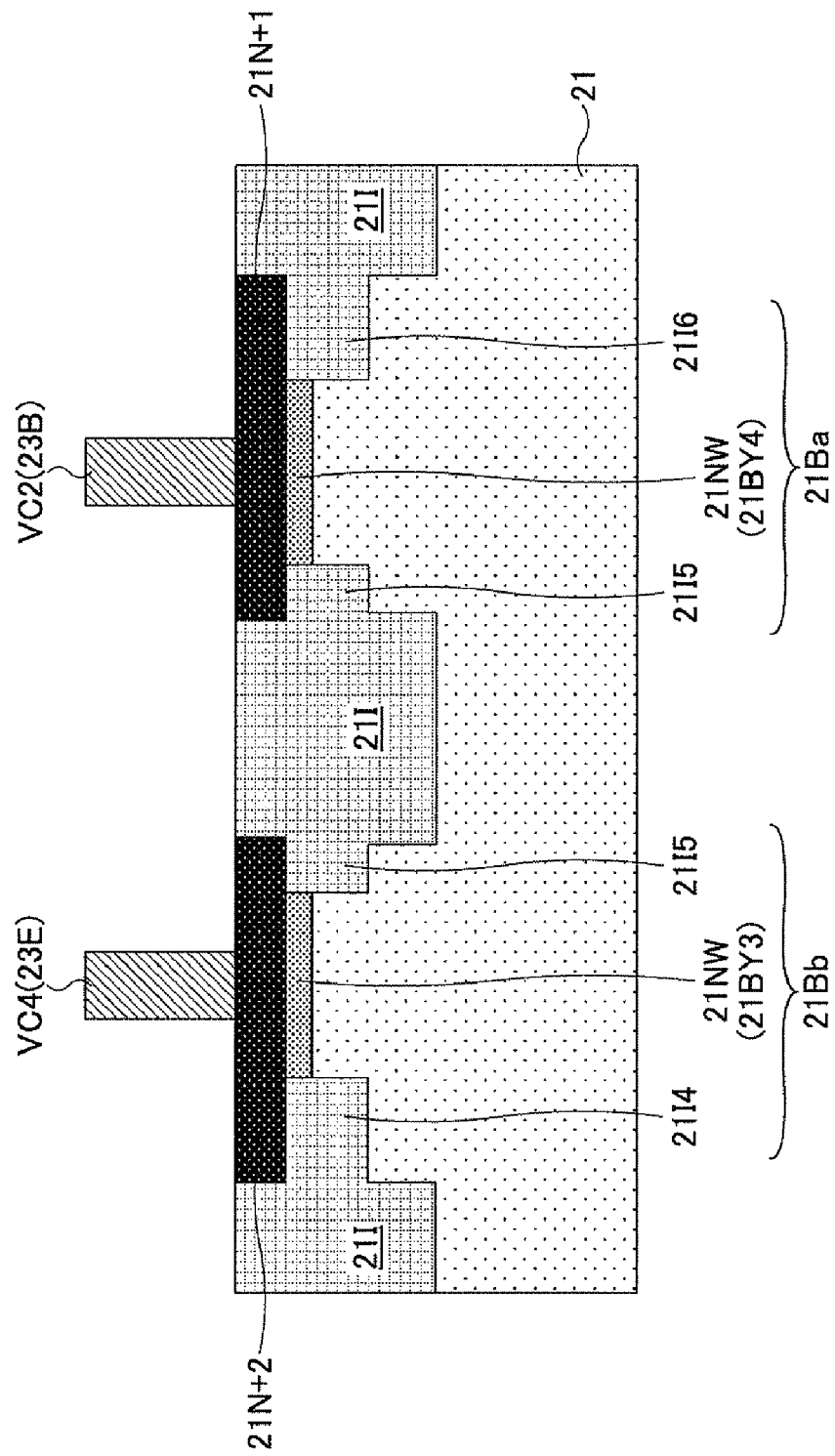
FIG. 13 is a cross-sectional view of the semiconductor logic circuit of FIG. 4 taken along line I-I'.

FIG. 13 is a cross-sectional view of the semiconductor logic circuit 20 of FIG. 4 taken along line I-I'.

Referring to FIG. 13 together with FIG. 9, the insulating region 21I6 extends below the highly-doped n-type region 21N+1 to the contact region 21Ba, and the insulating region 21I5 extends below the highly-doped n-type region 21N+1 to the contact region 21Ba. However, the highly-doped n-type region 21N+1 is in contact with the n-type well 21NW forming the body 21BY4 at a position between the insulating regions 21I5 and 21I6. Also in FIG. 13, the insulating region 21I5 extends below the highly-doped n-type region 21N+2 to the contact region 21Bb, and the insulating region 21I4 extends below the highly-doped n-type region 21N+2 to the contact region 21Bb. However, the highly-doped n-type region 21N+2 is in contact with the n-type well 21NW forming the body 21BY3 at a position between the insulating regions 21I4 and 21I5. With this configuration, the p-type gate electrode 23G1P is electrically connected through the via contact VC2 with the body 21BY4 in the contact region 21Ba and the p-type gate electrode 23G2P is electrically connected through the via contact VC4 with the body 21BY3 in the contact region 21Bb.

Figure 14:
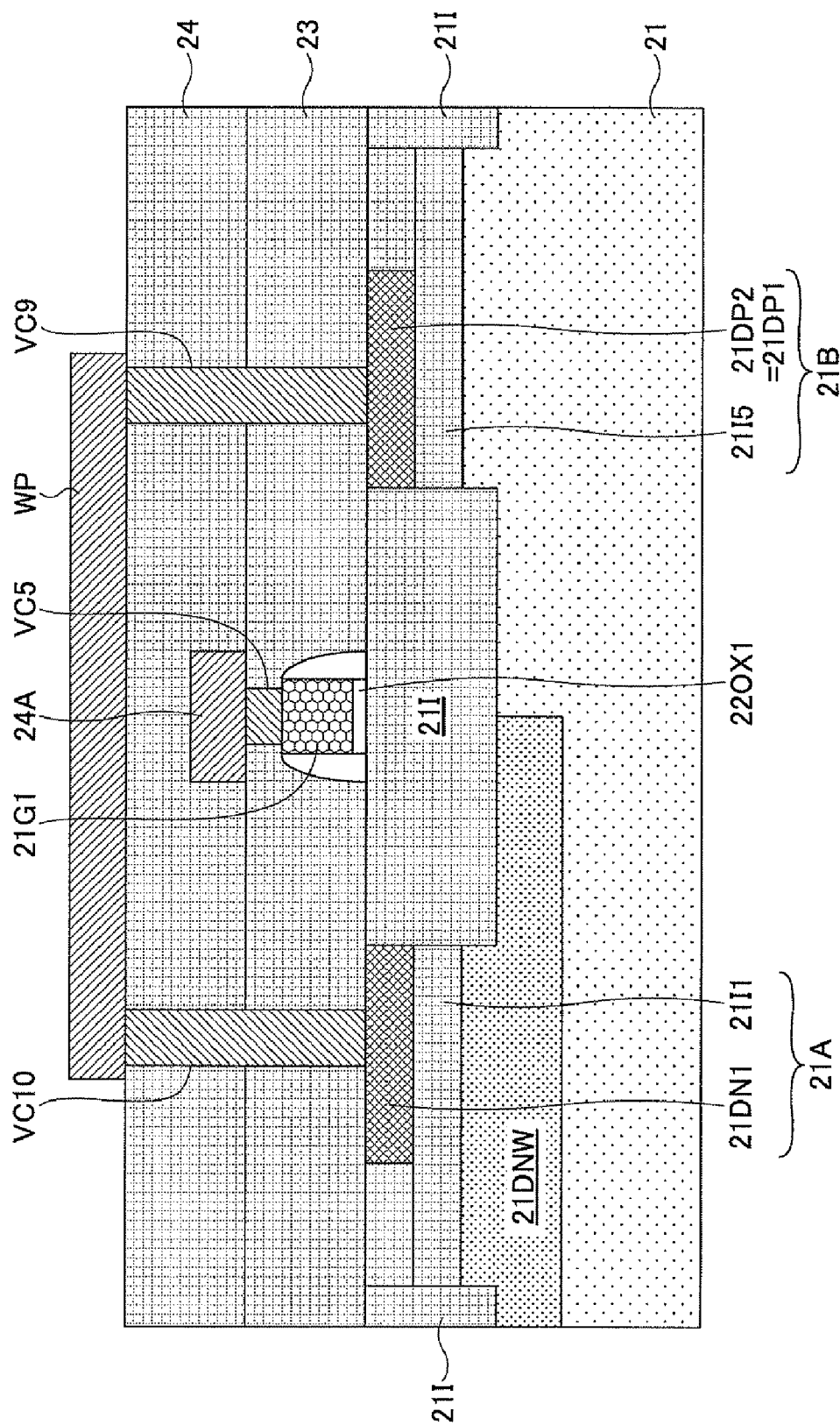
FIG. 14 is a cross-sectional view of the semiconductor logic circuit of FIG. 4 taken along line E-E'.

FIG. 14 is a cross-sectional view of the semiconductor logic circuit 20 of FIG. 4 taken along line E-E'.

Referring to FIG. 14, the wiring pattern WP on the interlayer insulating film 24 extends over the via contact VC5 and the signal wiring pattern 24A formed on the polysilicon pattern 21G1. The wiring pattern WP contacts the p-type diffusion region 21DP1/21DP2 through the via contact VC9 and contacts the n-type diffusion region 21DN1 through the via contact VC10.

Also in FIG. 14, the insulating region 21I5 made of a silicon oxide film is formed directly below the n-type well 21NW and the p-type diffusion region 21DP1/21DP2 formed in the n-type well 21NW, and the insulating region 21I1 made of a silicon oxide film is formed directly below the p-type well 21PW and the n-type diffusion region 21DN1 formed in the p-type well 21PW.

Figure 15A:
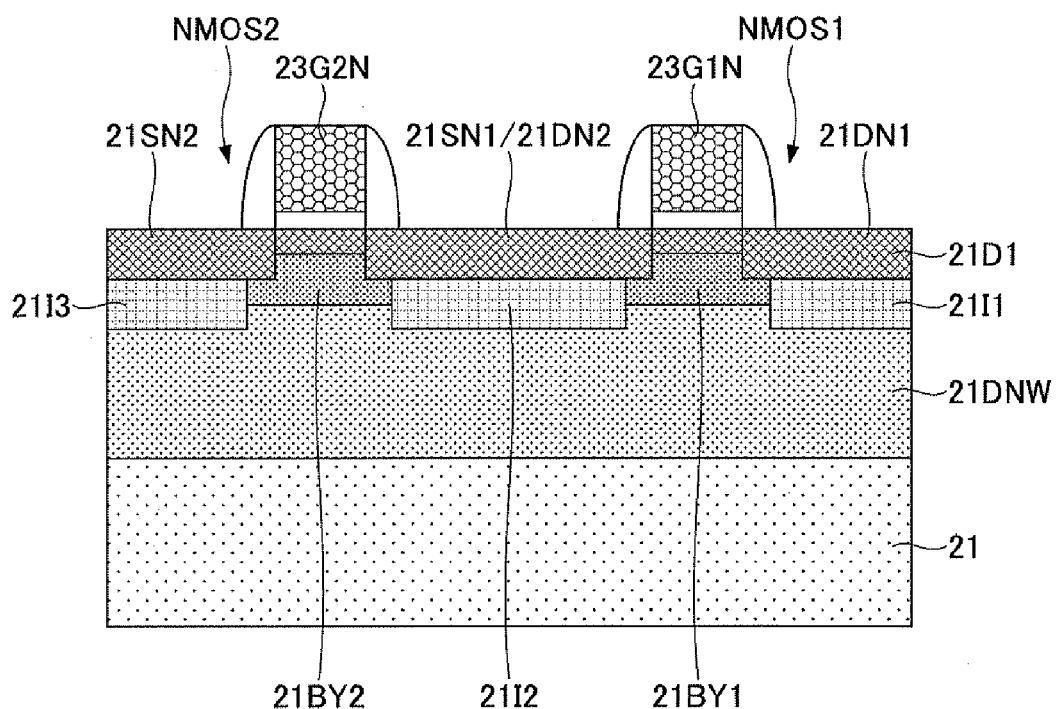
FIG. 15A is a simplified cross-sectional view of the semiconductor logic circuit of FIG. 4 taken along line A-A'.
Figure 15B:
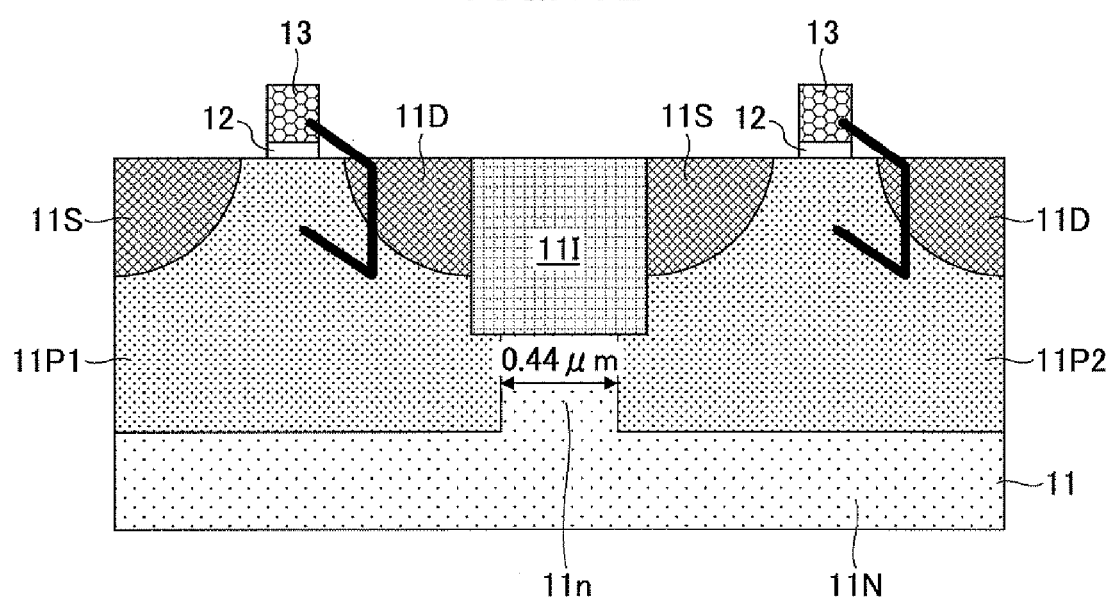
FIG. 15B is a cross sectional view of a semiconductor logic circuit of a comparative example that corresponds to the cross section illustrated in FIG. 15A.

FIG. 15A is a cross-sectional view of the semiconductor logic circuit 20 of FIG. 4 taken along line A-A', and FIG. 15B is a cross sectional view of a semiconductor logic circuit of a comparative example that corresponds to the cross section illustrated in FIG. 15A. FIG. 15A is a simplified version of the cross section illustrated in FIG. 6.

As illustrated in FIG. 15A, in this embodiment, the source region 21SN1 of the n-channel Dt-MOS transistor NMOS1 and the drain region 21DN2 of the n-channel Dt-MOS transistor NMOS2 are implemented by a common component (or region) and therefore no element isolation structure is provided between the n-channel Dt-MOS transistors NMOS1 and NMOS2.

Meanwhile, with the configuration illustrated in FIG. 15B, a p-type well 11P1 and a p-type well 11P2 are separated by an n-type well 11n. As described above, in an element isolation technique using a pn junction, the width of an isolation region is determined according to design rules taking into account the breakdown voltage of the pn junction and an error in the size or the position of an ion implantation mask. In the example illustrated in FIG. 15B, it is necessary to set the width of the n-type well 11n at 0.44 µm or greater. Accordingly, with the configuration of this embodiment, the width of the Dt-MOS transistor integrated circuit illustrated in FIG. 15A can be reduced to about one half of the width of the Dt-MOS transistor integrated circuit illustrated in FIG. 15B. For example, when the width of a source region 11S and a drain region 11D is 0.16 µm and the distance between gate electrodes 13 is 0.76 µm (=0.16 µm+0.44 µm+0.16 µm) in the configuration of FIG. 15B, the distance between the gate electrodes 23G1N and 23G2N can be reduced to about 0.2 µm.

In other words, this embodiment makes it possible to reduce the size in the gate length direction of a Dt-MOS transistor integrated circuit as illustrated in FIG. 15 to that of a non-Dt-MOS transistor integrated circuit where there is no interference between transistors and it is not necessary to separate adjacent transistors by a well.

Figure 16A:
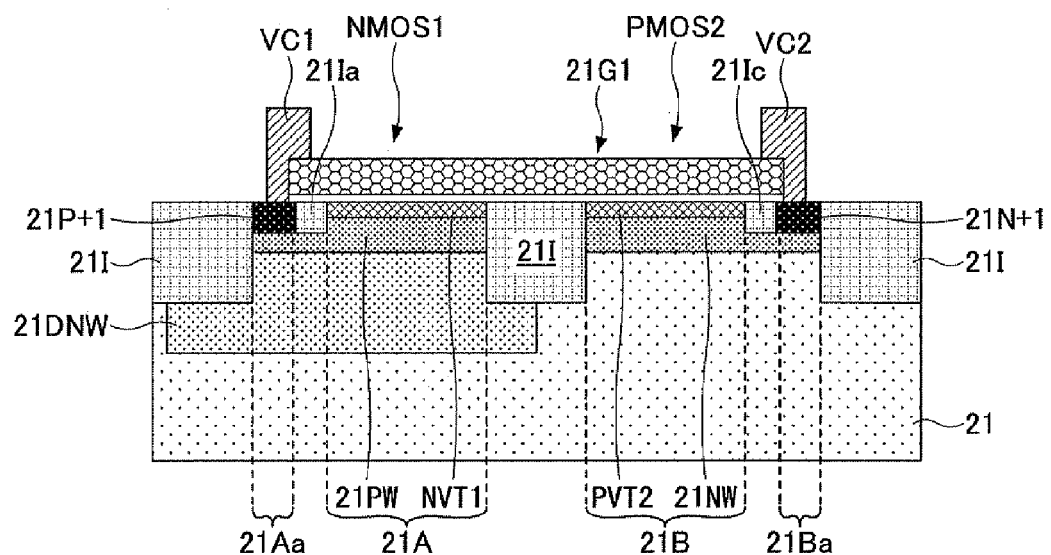
FIG. 16A is a simplified cross-sectional view of the semiconductor logic circuit of FIG. 4 taken along line C-C'.
Figure 16B:
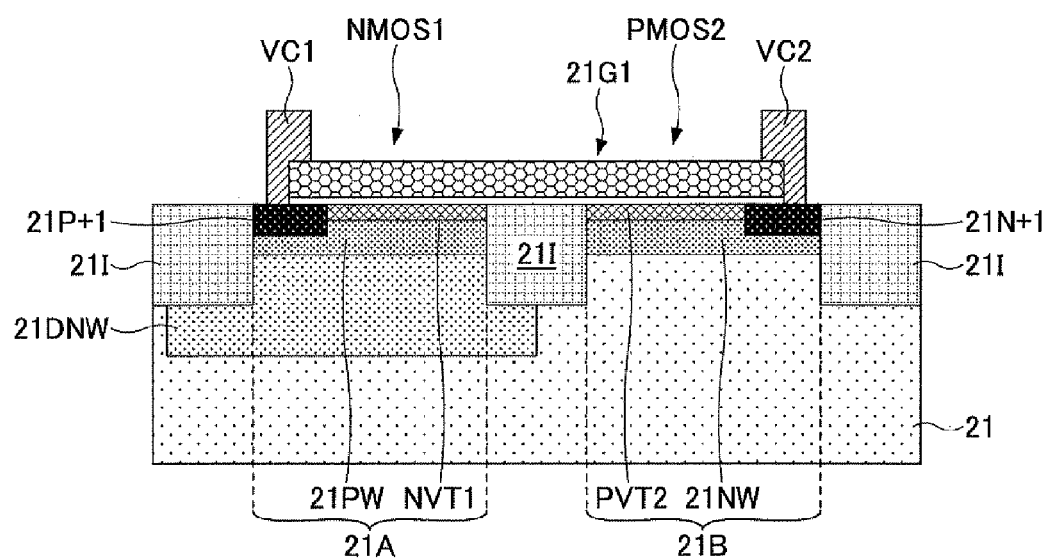
FIG. 16B is a cross sectional view of a semiconductor logic circuit of a comparative example that corresponds to the cross section illustrated in FIG. 16A.
Figure 17A:
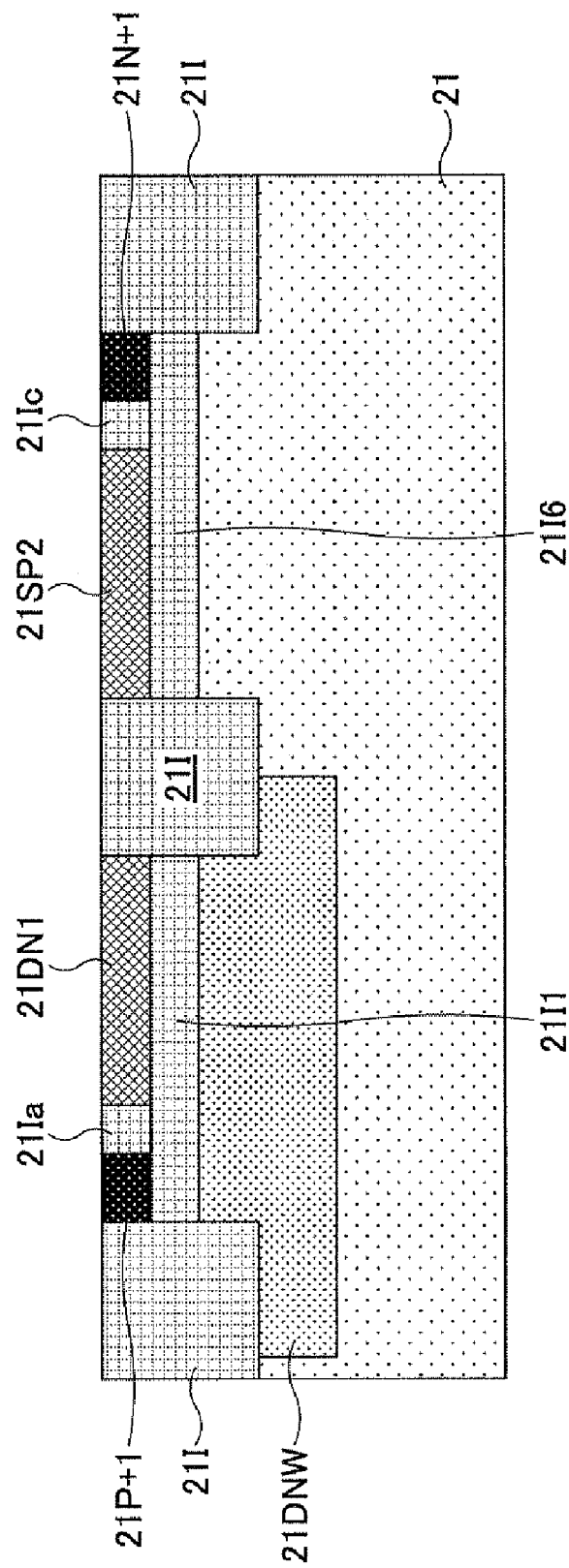
FIG. 17A is a simplified cross-sectional view of the semiconductor logic circuit of FIG. 4 taken along line G-G'.
Figure 17B:
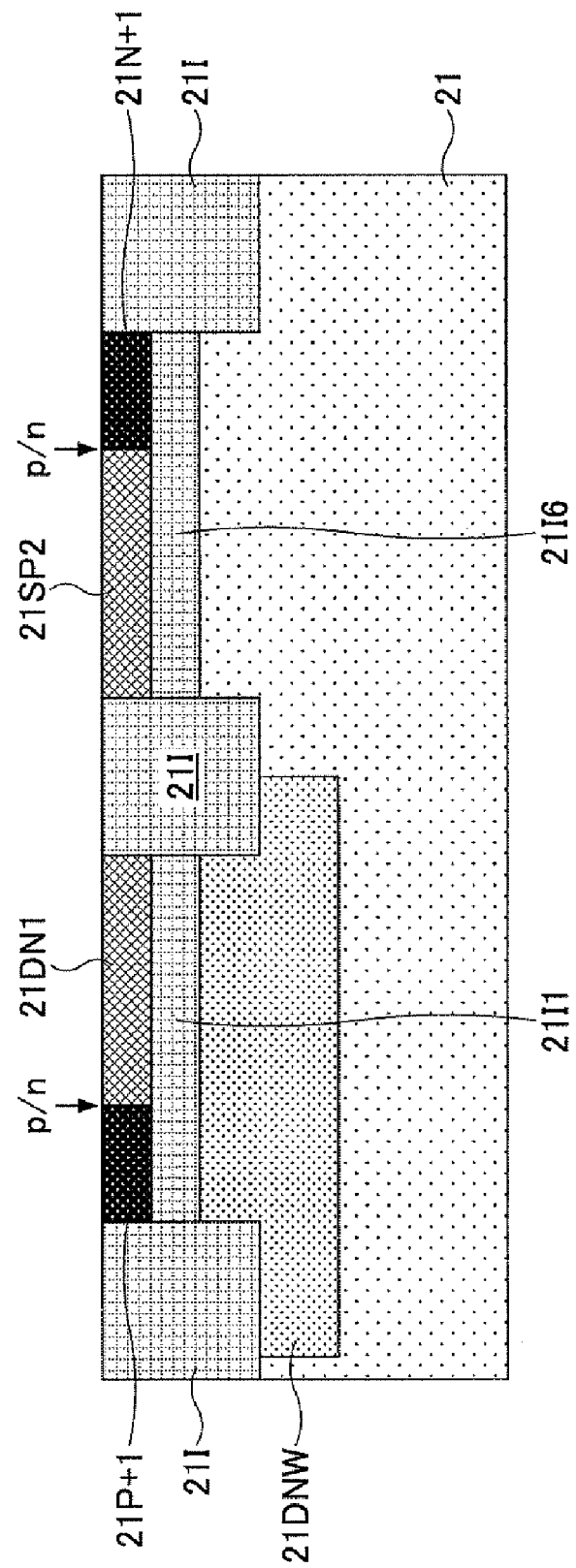
FIG. 17B is a cross sectional view of a semiconductor logic circuit of a comparative example that corresponds to the cross section illustrated in FIG. 17A.

FIG. 16A is a cross-sectional view of the semiconductor logic circuit 20 of FIG. 4 taken along line C-C'. FIG. 16B is a cross sectional view of a semiconductor logic circuit of a comparative example that corresponds to the cross section illustrated in FIG. 16A. FIG. 16A is a simplified version of the cross section illustrated in FIG. 8. For comparison, the same reference numbers are assigned to the corresponding components in FIGS. 16A and 16B. FIG. 17A is a simplified cross-sectional view of the semiconductor logic circuit 20 of FIG. 4 taken along line G-G'. FIG. 17B is a cross sectional view of a semiconductor logic circuit of a comparative example that corresponds to the cross section illustrated in FIG. 17A. In FIGS. 16A and 16B, the semiconductor logic circuits are illustrated such that the effective gate widths of the Dt-MOS transistors NMOS1 and PMOS2 become the same.

Comparing FIGS. 16A and 16B, in the comparative example, the element isolation sub-regions 21Ia and 21Ic are omitted and the highly-doped p-type region 21P+1 is directly in contact with the p-type well 21PW in the element region 21A. Also in the comparative example, the highly-doped n-type region 21N+1 is directly in contact with the n-type well 21NW in the element region 21B. Further in the comparative example, the contact region 21Aa isolated from the element region 21A and the contact region 21Ba isolated from the element region 21B are not formed.

Since the element isolation sub-regions 21Ia and 21Ic are omitted in FIG. 16B, it seems that the comparative example can reduce the circuit size in the length direction of the polysilicon pattern 21G1. However, as illustrated in FIG. 17B, with the configuration of the comparative example, the highly-doped p-type region 21P+1 contacts the n-type diffusion region 21DN1 and the highly-doped n-type region 21N+1 contacts the p-type diffusion region 21SP2. Accordingly, the highly-doped p-type region 21P+1 is isolated from the n-type diffusion region 21DN1 by the pn junction, and the highly-doped n-type region 21N+1 is isolated from the p-type diffusion region 21SP2 by the pn junction.

For the above reasons, it is necessary to set the width of the highly-doped p-type region 21P+1 and the highly-doped n-type region 21N+1 according to design rules taking into account the breakdown voltage of the pn junction and an error in the size or the position of an ion implantation mask. In the example illustrated in FIG. 17B, it is necessary to set the width of the highly-doped p-type region 21P+1 and the highly-doped n-type region 21N+1 at 0.44 µm or greater. Thus, the size of the semiconductor logic circuit of the comparative example (FIG. 17B) in the length direction of the polysilicon pattern 21G1 becomes greater than that of the semiconductor logic circuit 20 of this embodiment (FIG. 17A). Assuming that the same design rules are applied, the widths of the element isolation sub-regions 21Ia and 21Ic in FIG. 17A can be set at 0.11 µm. Thus, the element isolation sub-regions 21Ia and 21Ic do not greatly increase the size of the semiconductor logic circuit 20. Also, since the highly-doped p-type region 21P+1 and the highly-doped n-type region 21N+1 in FIG. 17A are not isolated by a pn junction, their widths can be set at, for example, 70 nm.

Thus, this embodiment makes it possible to prevent an increase in the size of the cross section of the semiconductor logic circuit 20 illustrated in FIG. 15A and also makes it possible to minimize the increase in the size of the cross section of the semiconductor logic circuit 20 illustrated in FIG. 16A or 17A.

Also in this embodiment, the n-type diffusion region 21DN1 forming the drain region of the n-channel Dt-MOS transistor NMOS1 and the p-type diffusion region 21SP2 forming the source region of the p-channel Dt-MOS transistor PMOS2 are electrically separated by the element isolation sub-regions 21Ia and 21Ic. This configuration makes it possible to prevent generation of huge parasitic capacitance due to the pn junction.

Further, with the configuration of FIG. 17B, when a silicide layer is formed on the silicon bulk substrate 21, the highly-doped p-type region 21P+1 is short-circuited with the n-type diffusion region 21DN1 and the highly-doped n-type region 21N+1 is short-circuited with the p-type diffusion region 21SP2. This makes it difficult to form a silicide layer or makes it necessary to form an insulating pattern to prevent formation of a silicide layer at a position corresponding to the pn junction. The configuration of this embodiment illustrated in FIG. 17A makes it possible to prevent these problems and makes it possible to easily form silicide layers on the highly-doped p-type region 21P+1, the n-type diffusion region 21DN1, the highly-doped n-type region 21N+1, and the p-type diffusion region 21SP2 using a typical self aligned silicide (SALICIDE) method.

An exemplary method of producing a Dt-MOS transistor integrated circuit according to the first embodiment is described below. A Dt-MOS transistor integrated circuit used in the descriptions below has substantially the same configuration as that illustrated in FIG. 4 except that the contact region 21Aa of the n-channel Dt-MOS transistor NMOS1 is disposed to face the contact region 21Ba of the p-channel Dt-MOS transistor PMOS2, and the contact region 21Ab of the n-channel Dt-MOS transistor NMOS2 is disposed to face the contact region 21Bb of the p-channel Dt-MOS transistor PMOS1.

Figure 18A:
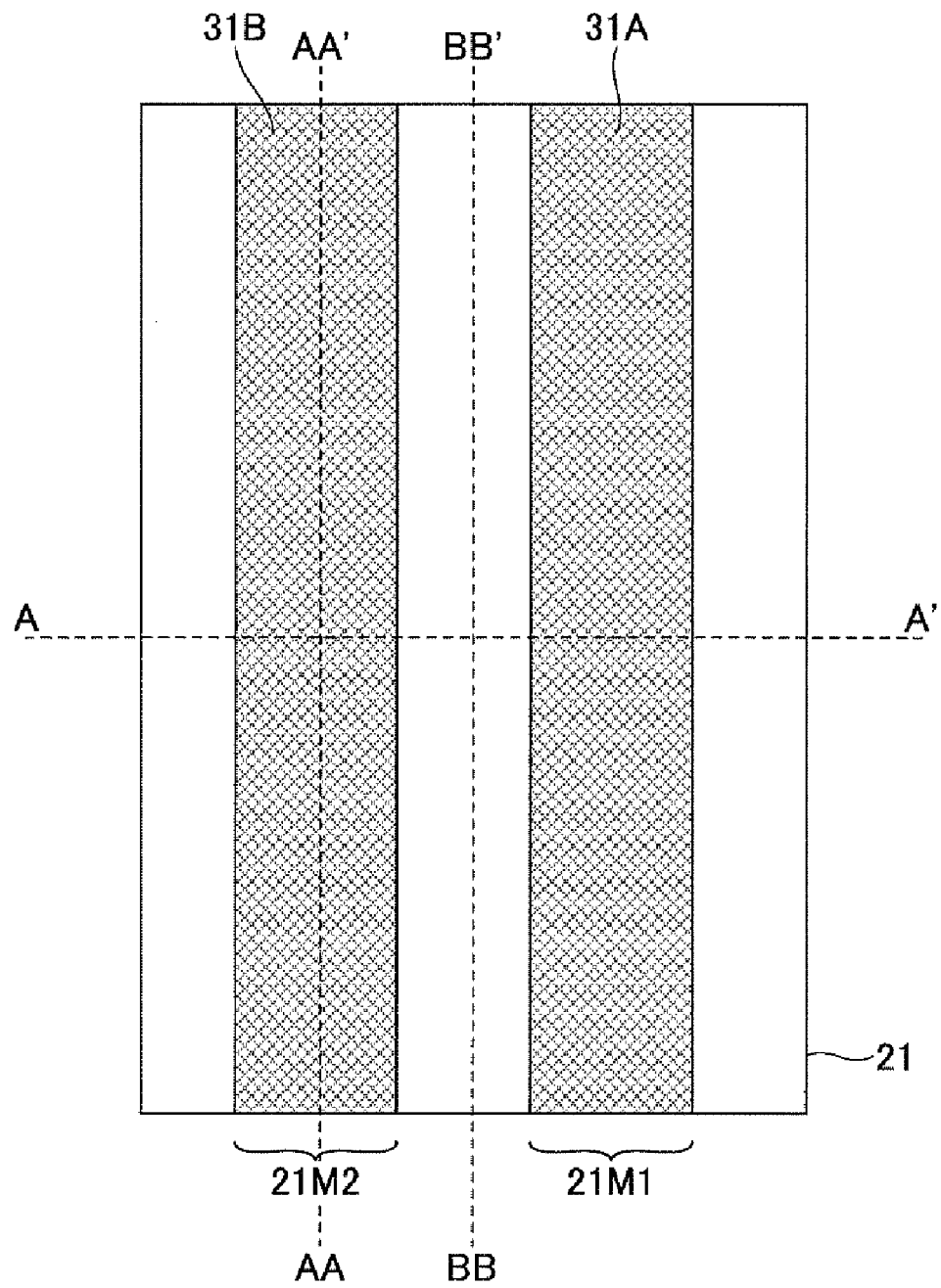
FIG. 18A is a plan view of a silicon bulk substrate used to describe a method of producing a semiconductor integrated circuit according to the first embodiment.
Figure 18B:
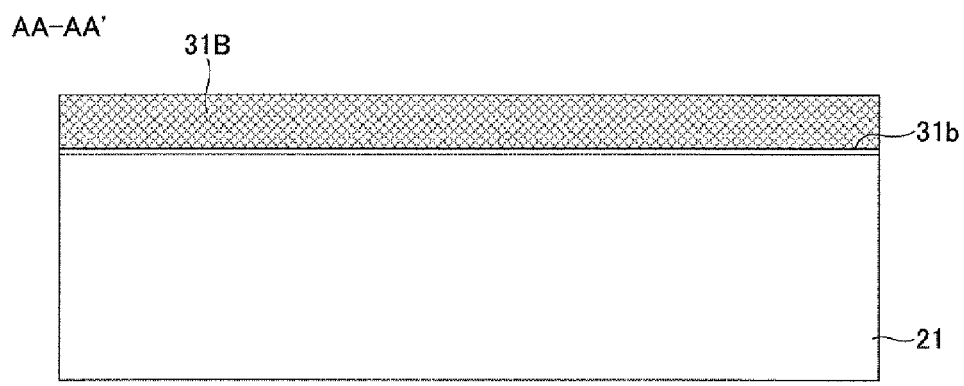
FIG. 18B is a cross-sectional view of the silicon bulk substrate of FIG. 18A taken along line AA-AA'.
Figure 18C:
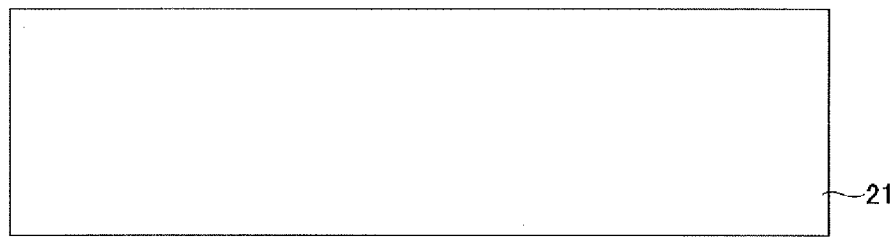
FIG. 18C is a cross-sectional view of the silicon bulk substrate of FIG. 18A taken along line BB-BB'.
Figure 18D:
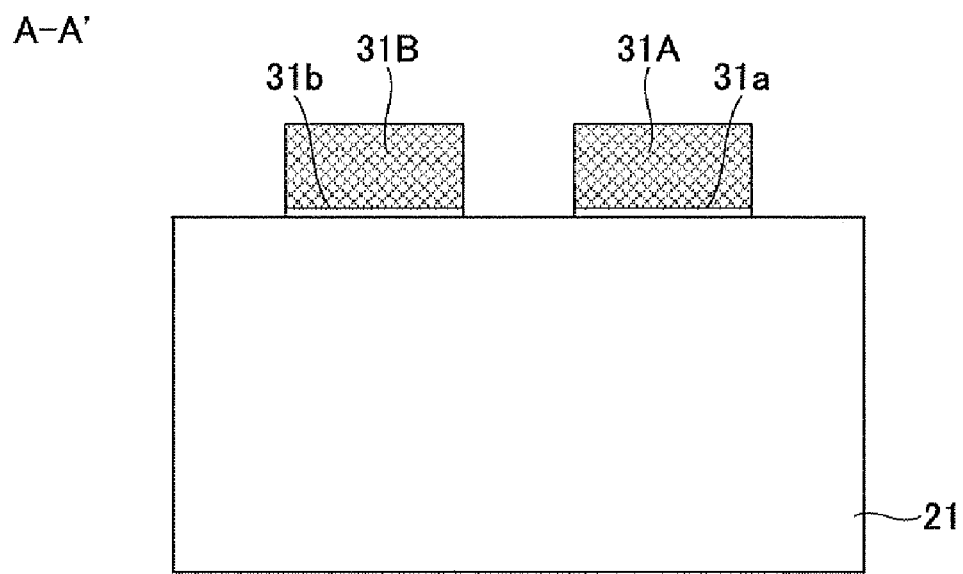
FIG. 18D is a cross-sectional view of the silicon bulk substrate of FIG. 18A taken along line A-A'.

FIG. 18A is a plan view of the p-doped silicon bulk substrate 21, FIG. 18B is a cross-sectional view of the silicon bulk substrate 21 of FIG. 18A taken along line AA-AA', FIG. 18C is a cross-sectional view of the silicon bulk substrate 21 of FIG. 18A taken along line BB-BB', and FIG. 18D is a cross-sectional view of the silicon bulk substrate 21 of FIG. 18A taken along line A-A'.

Referring to FIGS. 18A through 18D, a silicon nitride mask pattern 31A is formed on the silicon bulk substrate 21 via a pad 31a in a position corresponding to the body 21BY1 in FIG. 6 and the body 21BY4 in FIG. 7, and a silicon nitride mask pattern 31B is formed on the silicon bulk substrate 21 via a pad 31b in a position corresponding to the body 21BY2 in FIG. 6 and the body 21BY3 in FIG. 7. The pads 31a and 31b are made of thermally-oxidized films. Along the cross section BB-BB', the surface of the silicon substrate 21 is exposed.

Figure 19A:
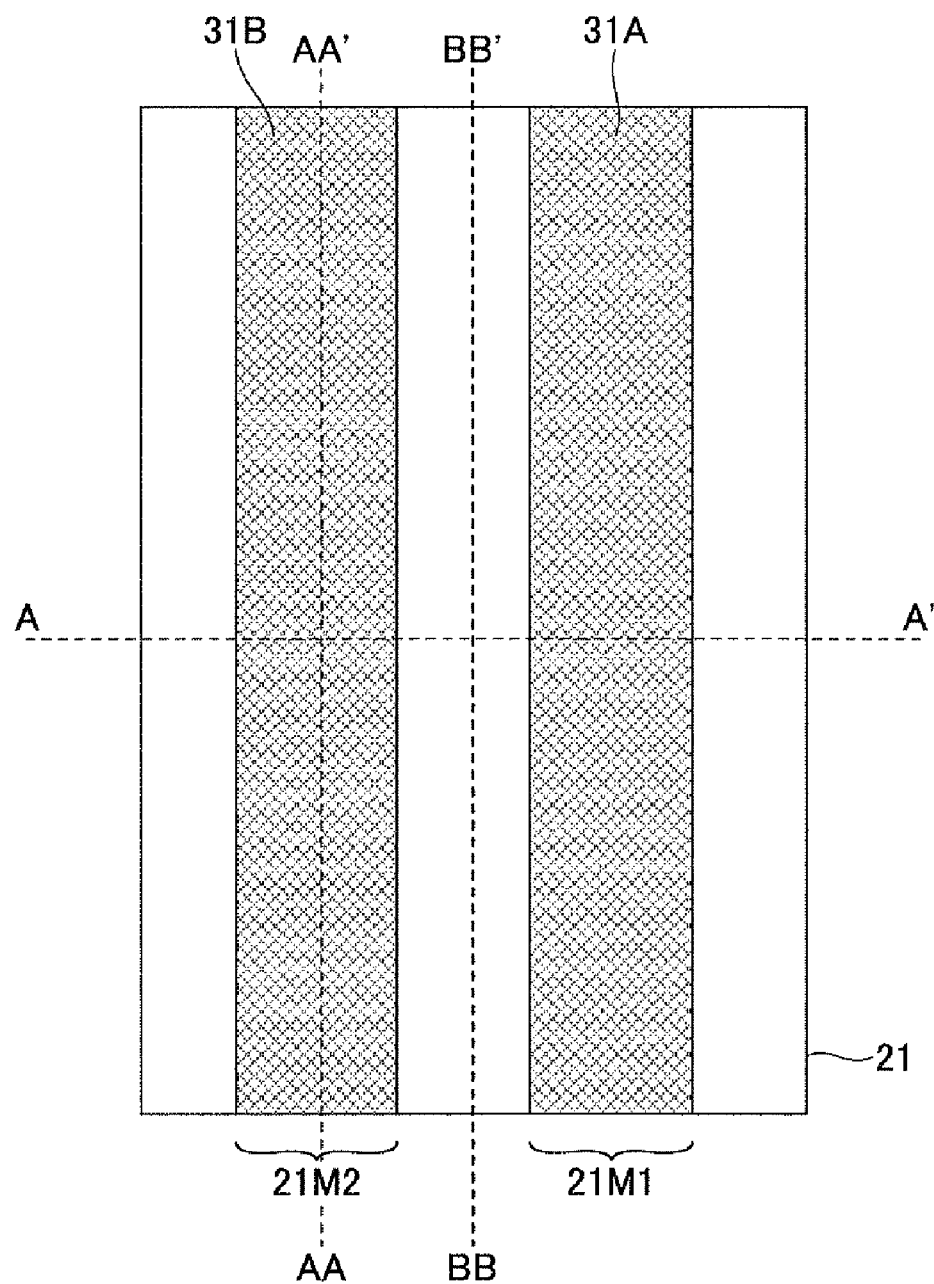
FIG. 19A is a plan view of a silicon bulk substrate used to describe a method of producing a semiconductor integrated circuit according to the first embodiment.
Figure 19B:
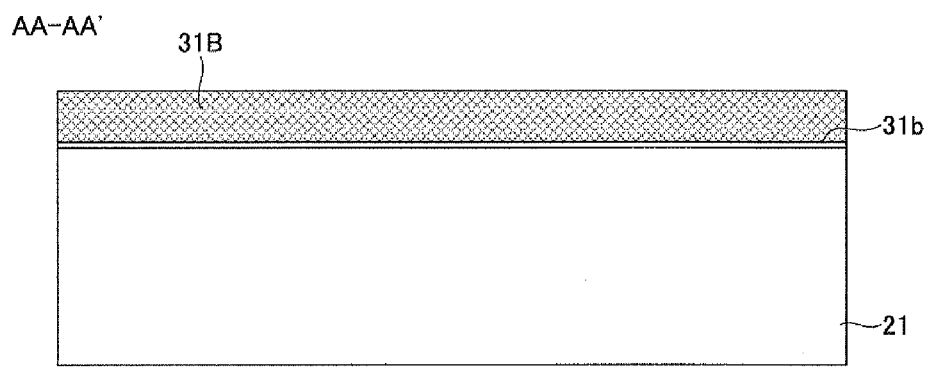
FIG. 19B is a cross-sectional view of the silicon bulk substrate of FIG. 19A taken along line AA-AA'.
Figure 19C:
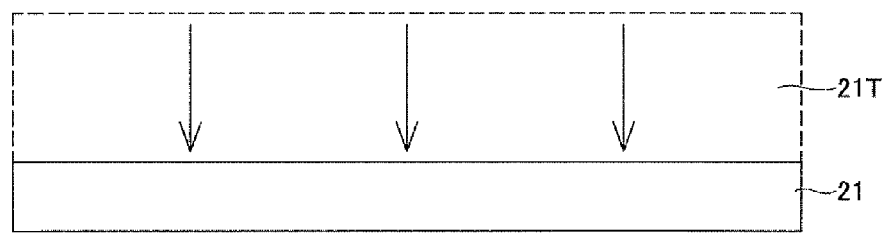
FIG. 19C is a cross-sectional view of the silicon bulk substrate of FIG. 19A taken along line BB-BB'.
Figure 19D:
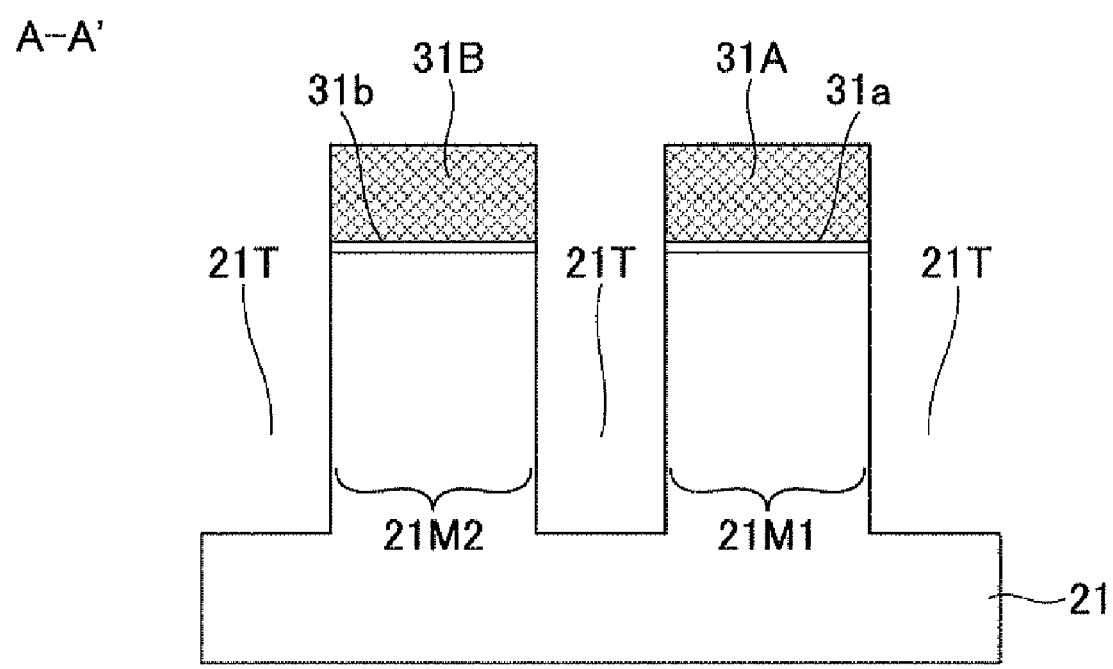
FIG. 19D is a cross-sectional view of the silicon bulk substrate of FIG. 19A taken along line A-A'.

FIG. 19A is a plan view of the silicon bulk substrate 21, FIG. 19B is a cross-sectional view of the silicon bulk substrate 21 of FIG. 19A taken along line AA-AA', FIG. 19C is a cross-sectional view of the silicon bulk substrate 21 of FIG. 19A taken along line BB-BB', and FIG. 19D is a cross-sectional view of the silicon bulk substrate 21 of FIG. 19A taken along line A-A'.

In the steps illustrated by FIGS. 19A through 19D, the silicon bulk substrate 21 etched by dry etching using the silicon nitride mask patterns 31A and 31B to form trenches 21T with, for example, a depth of 80 nm and a width of 40-150 nm on both sides of the regions protected by the silicon nitride mask patterns 31A and 31B. For the dry etching, an etching gas such as $Cl_2$ or HCl may be used. As a result of forming the trenches 21T, mesa structures 21M1 and 21M2 protected by the silicon nitride mask patterns 31A and 31B are formed on the silicon bulk substrate 21.

Figure 20A:
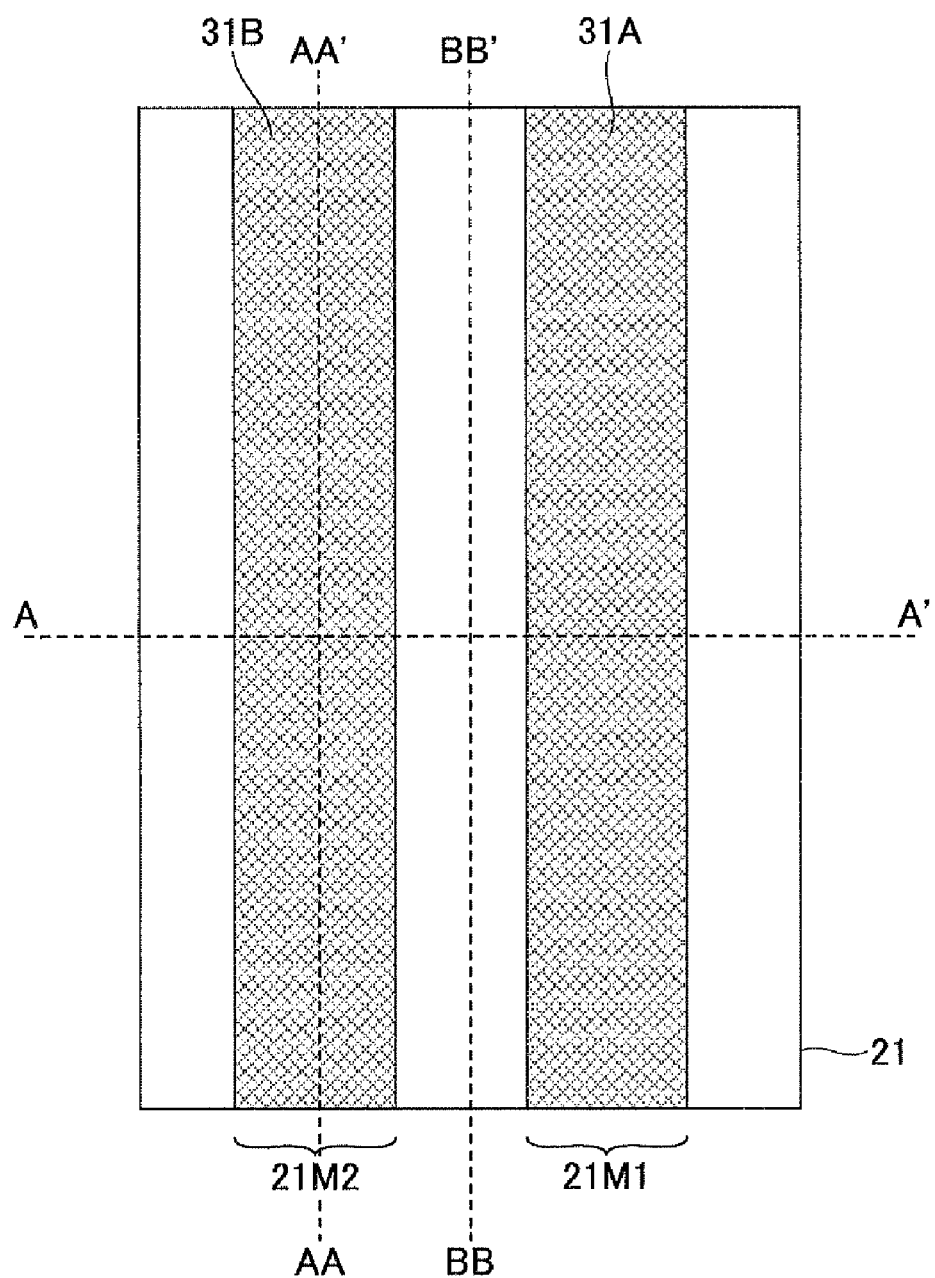
FIG. 20A is a plan view of a silicon bulk substrate used to describe a method of producing a semiconductor integrated circuit according to the first embodiment.
Figure 20B:
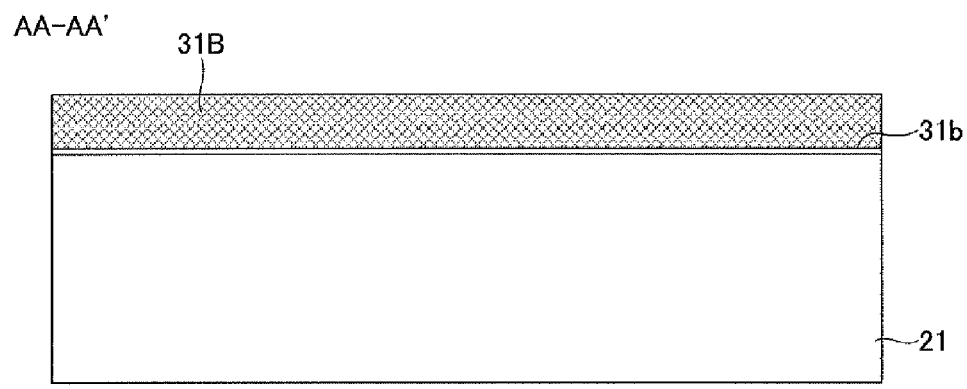
FIG. 20B is a cross-sectional view of the silicon bulk substrate of FIG. 20A taken along line AA-AA'.
Figure 20C:
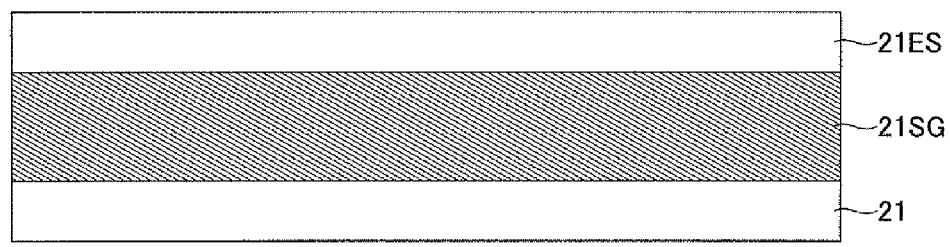
FIG. 20C is a cross-sectional view of the silicon bulk substrate of FIG. 20A taken along line BB-BB'.
Figure 20D:
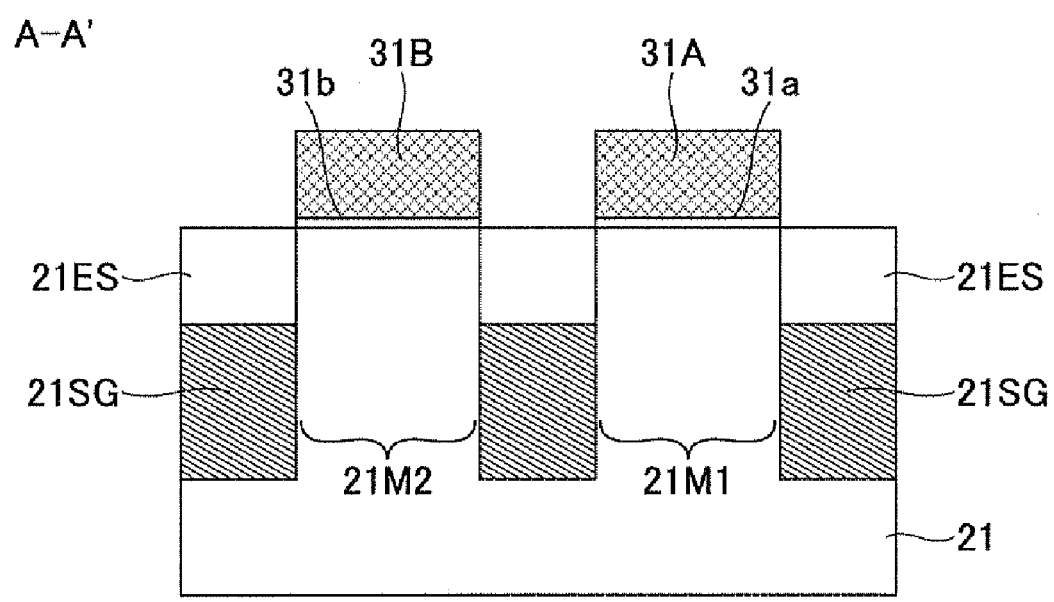
FIG. 20D is a cross-sectional view of the silicon bulk substrate of FIG. 20A taken along line A-A'.

FIG. 20A is a plan view of the silicon bulk substrate 21, FIG. 20B is a cross-sectional view of the silicon bulk substrate 21 of FIG. 20A taken along line AA-AA', FIG. 20C is a cross-sectional view of the silicon bulk substrate 21 of FIG. 20A taken along line BB-BB', and FIG. 20D is a cross-sectional view of the silicon bulk substrate 21 of FIG. 20A taken along line A-A'.

In the steps illustrated by FIGS. 20A through 20D, SiGe mixed crystal layers 21SG with a thickness of, for example, 50 nm are epitaxially grown selectively in the trenches 21T. For example, the SiGe mixed crystal layers 21SG may be grown by a chemical vapor deposition (CVD) method using a mixed gas of silane ($SiH_4$) or dichlorosilane ($SiH_2Cl_2$), germane ($GeH_4$), hydrogen chloride (HCl), and hydrogen ($H_2$) as a material. In the present application, "SiGe mixed crystal layer" may indicate a mixed crystal layer that includes not only Si and Ge but also other elements.

The epitaxial growth of the SiGe mixed crystal layers 21SG may be performed, for example, under a pressure of 1330-13300 Pa (10-100 Torr), or preferably 5320 Pa (40 Torr); with a substrate temperature of 650-750° C., or preferably 700° C.; with a hydrogen partial pressure of 4000-6000 Pa, or preferably 5300 Pa; with a dichlorosilane partial pressure of 20-30 Pa, or preferably 26 Pa; with a monogermane partial pressure of 10-15 Pa, or preferably 12 Pa; with a hydrogen chloride partial pressure of 10-15 Pa, or preferably 12 Pa; and at a growth rate of 45 nm/min.

The SiGe mixed crystal layers 21SG may include, for example, 20 atomic percent (atomic fraction) of Ge. The proportion of Ge may be increased as long as the SiGe mixed crystal layers 21SG can be epitaxially grown on the silicon bulk substrate 21. For example, SiGe mixed crystal layers including 40 atomic percent of Ge may be used as the SiGe mixed crystal layers 21SG. Also, SiGeC mixed crystal layers additionally including carbon (C) may be used as the SiGe mixed crystal layers 21SG.

Also in the steps illustrated by FIGS. 20A through 20D, after the selective epitaxial growth of the SiGe mixed crystal layers 21SG, silicon epitaxial layers 21ES are epitaxially grown on the SiGe mixed crystal layers 21SG to substantially fill the trenches 21T. For example, the silicon epitaxial layers 21ES may be grown by a CVD method using a mixed gas of silane or disilane, hydrogen chloride, and hydrogen as a material.

The epitaxial growth of the silicon epitaxial layers 21ES may be performed, for example, under a pressure of 1330-13300 Pa (10-100 Torr), or preferably 5320 Pa (40 Torr); with a substrate temperature of 650-750° C., or preferably 700° C.; with a hydrogen partial pressure of 4000-6000 Pa, or preferably 5300 Pa; with a dichlorosilane partial pressure of 15-25 Pa, or preferably 21 Pa; with a hydrogen chloride partial pressure of 3-10 Pa, or preferably 5 Pa; and at a growth rate of 0.7 nm/min.

As a result, as illustrated in FIG. 20D, the trenches 21T formed on the sides of the mesa structures 21M1 and 21M2 of the silicon bulk substrate 21 protected by the silicon nitride mask patterns 31A and 31B are substantially filled with laminated structures including the SiGe mixed crystal layers 21SG and the silicon epitaxial layers 21ES.

Figure 21A:
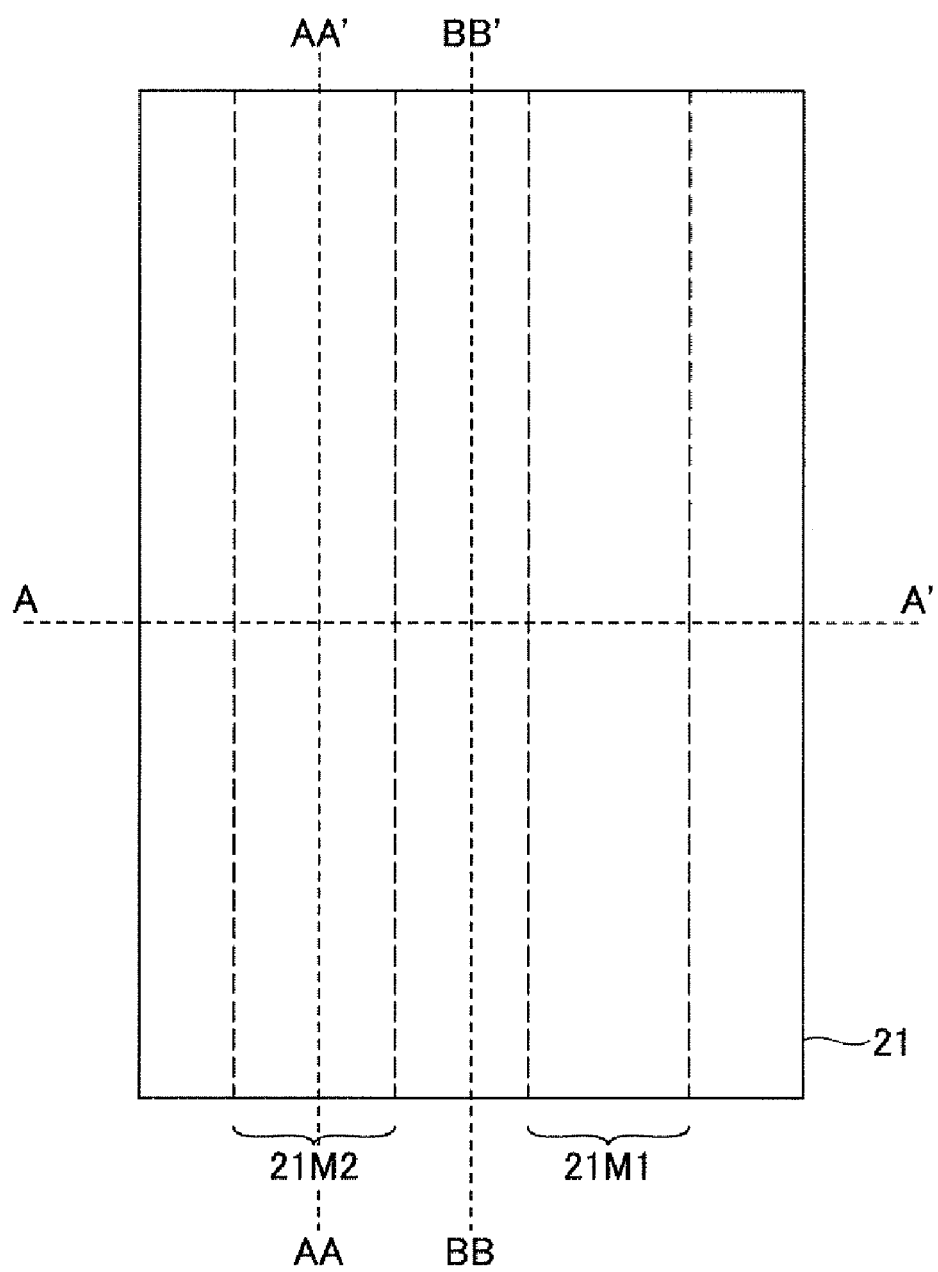
FIG. 21A is a plan view of a silicon bulk substrate used to describe a method of producing a semiconductor integrated circuit according to the first embodiment.
Figure 21B:
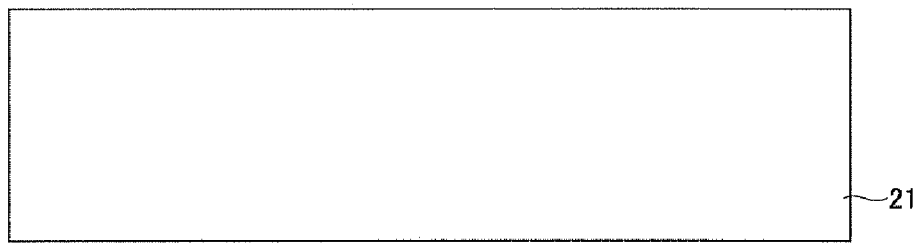
FIG. 21B is a cross-sectional view of the silicon bulk substrate of FIG. 21A taken along line AA-AA'.
Figure 21C:
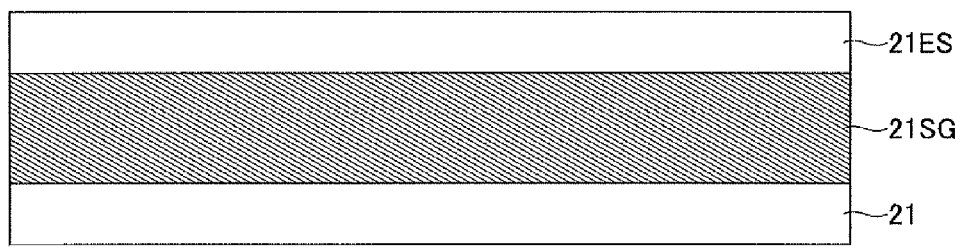
FIG. 21C is a cross-sectional view of the silicon bulk substrate of FIG. 21A taken along line BB-BB'.
Figure 21D:
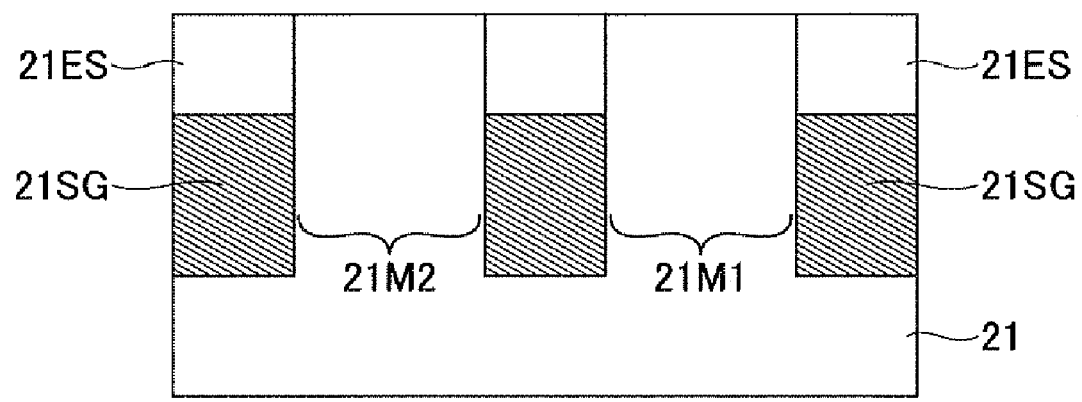
FIG. 21D is a cross-sectional view of the silicon bulk substrate of FIG. 21A taken along line A-A'.

FIG. 21A is a plan view of the silicon bulk substrate 21, FIG. 21B is a cross-sectional view of the silicon bulk substrate 21 of FIG. 21A taken along line AA-AA', FIG. 21C is a cross-sectional view of the silicon bulk substrate 21 of FIG. 21A taken along line BB-BB', and FIG. 21D is a cross-sectional view of the silicon bulk substrate 21 of FIG. 21A taken along line A-A'.

In the steps illustrated by FIGS. 21A through 21D, the silicon nitride mask patterns 31A and 31B and the pads 31a and 31b are removed by wet etching. As a result, the surfaces of the mesa structures 21M1 and 21M2 and the surfaces of the silicon epitaxial layers 21ES are exposed. The surfaces of the silicon epitaxial layers 21ES correspond to the principal surface of the silicon bulk substrate 21, i.e., the surfaces of the mesa structures 21M1 and 21M2.

Figure 22A:
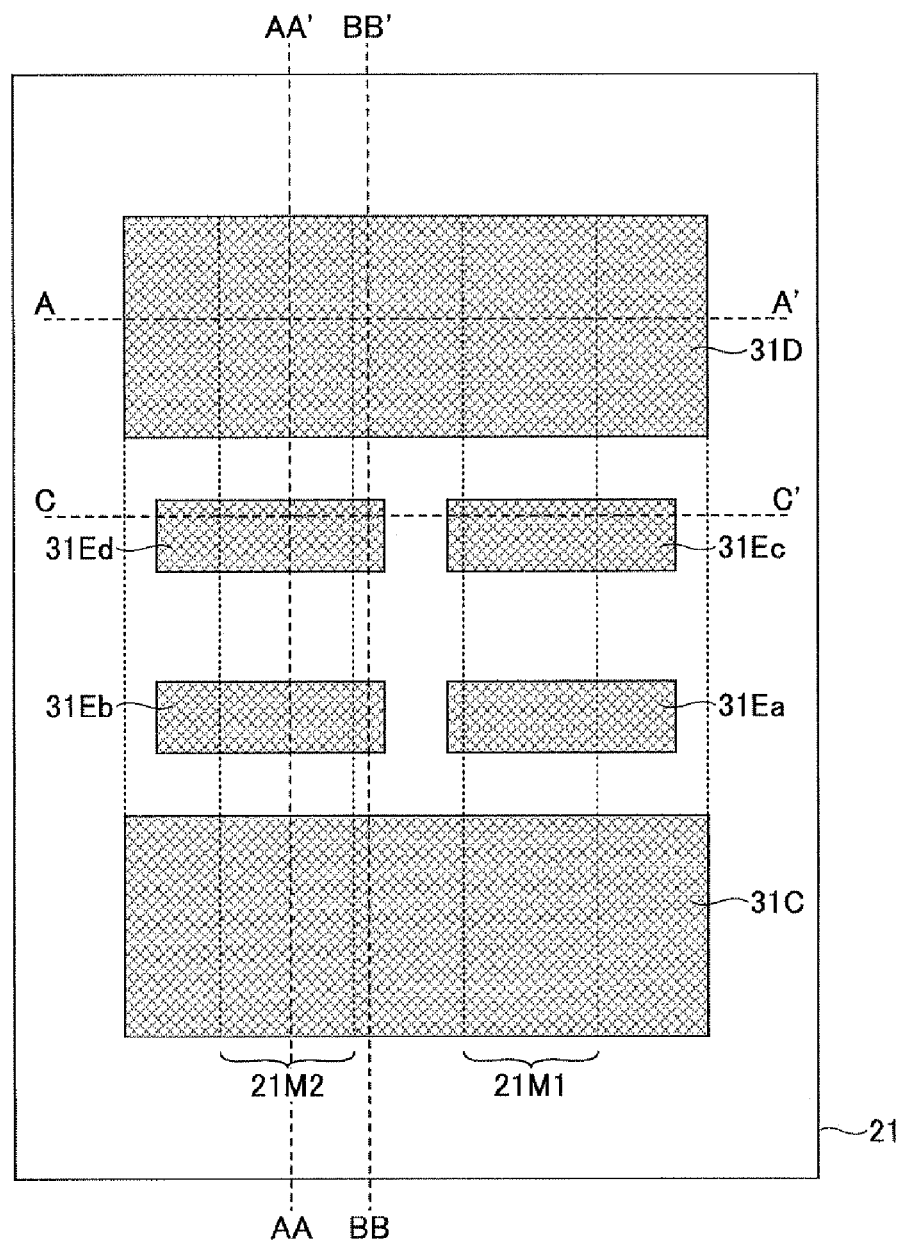
FIG. 22A is a plan view of a silicon bulk substrate used to describe a method of producing a semiconductor integrated circuit according to the first embodiment.
Figure 22B:
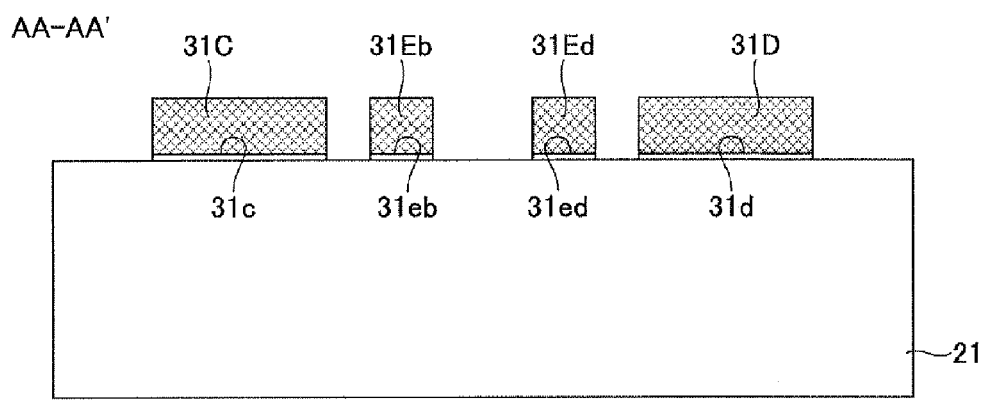
FIG. 22B is a cross-sectional view of the silicon bulk substrate of FIG. 22A taken along line AA-AA'.
Figure 22C:
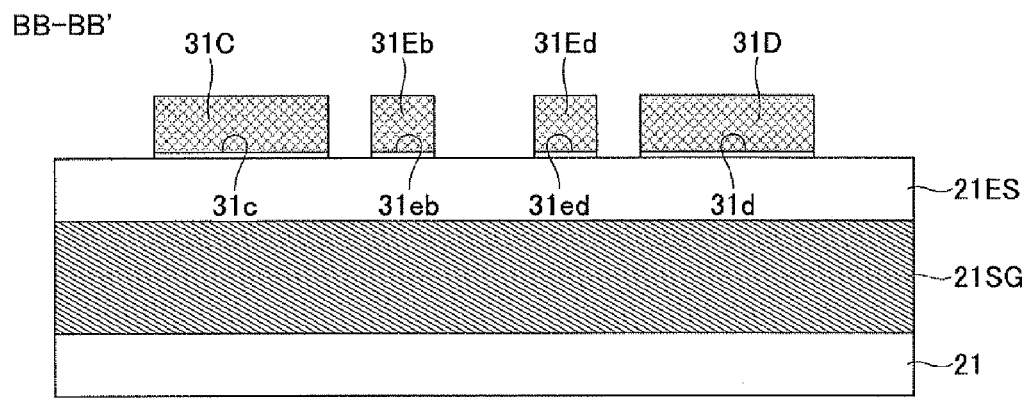
FIG. 22C is a cross-sectional view of the silicon bulk substrate of FIG. 22A taken along line BB-BB'.
Figure 22D:
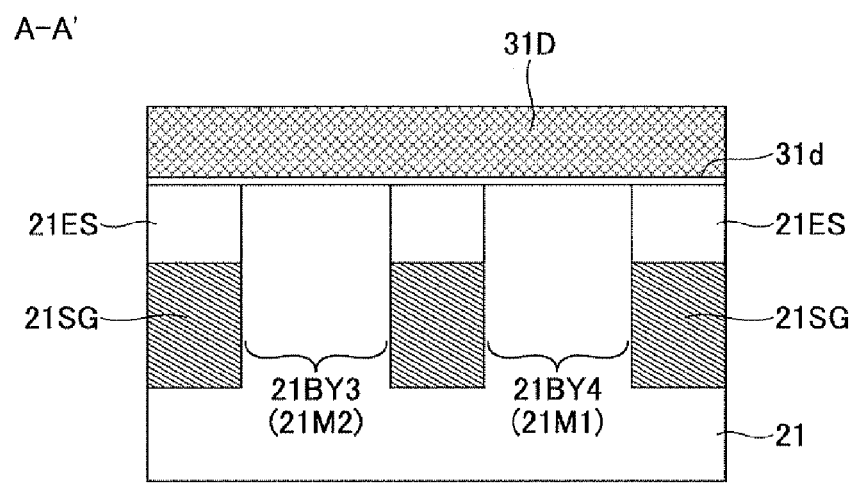
FIG. 22D is a cross-sectional view of the silicon bulk substrate of FIG. 22A taken along line A-A'.
Figure 22E:
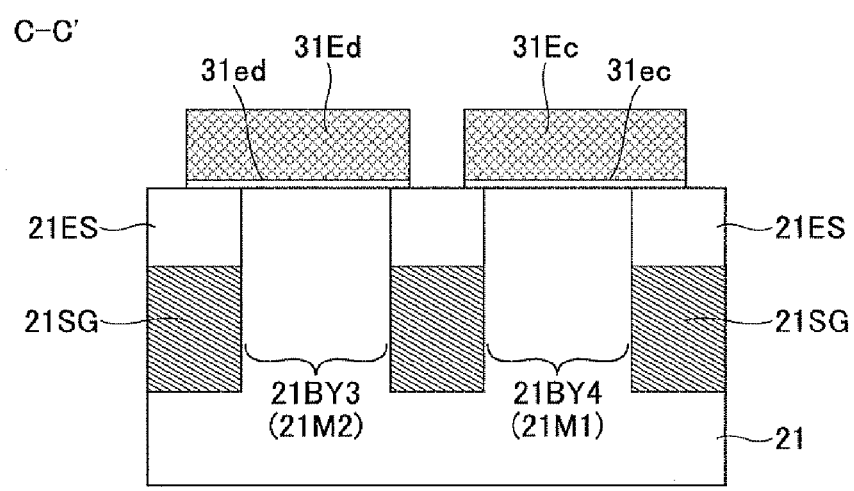
FIG. 22E is a cross-sectional view of the silicon bulk substrate of FIG. 22A taken along line C-C'.

FIG. 22A is a plan view of the silicon bulk substrate 21, FIG. 22B is a cross-sectional view of the silicon bulk substrate 21 of FIG. 22A taken along line AA-AA', FIG. 22C is a cross-sectional view of the silicon bulk substrate 21 of FIG. 22A taken along line BB-BB', FIG. 22D is a cross-sectional view of the silicon bulk substrate 21 of FIG. 22A taken along line A-A', and FIG. 22E is a cross-sectional view of the silicon bulk substrate 21 of FIG. 22A taken along line C-C'.

In the steps illustrated by FIGS. 22A through 22E, a portion of the silicon bulk substrate 21 corresponding to the element region 21A for the re-channel Dt-MOS transistors NMOS1 and NMOS2 is protected by a silicon nitride mask pattern 31C, and a portion of the silicon bulk substrate 21 corresponding to the element region 21B for the p-channel Dt-MOS transistors PMOS1 and PMOS2 is protected by a silicon nitride mask pattern 31D. Also, the contact regions 21Aa and 21Ab are protected by silicon nitride mask patterns 31Ea and 31Eb, and the contact regions 21Ba and 21Bb are protected by silicon nitride mask patterns 31Ed and 31Ed. As described above, the Dt-MOS transistor integrated circuit used for descriptions here has substantially the same configuration as that illustrated in FIG. 4 except that the contact region 21Aa of the n-channel Dt-MOS transistor NMOS1 is disposed to face the contact region 21Ba of the p-channel Dt-MOS transistor PMOS2, and the contact region 21Ab of the n-channel Dt-MOS transistor NMOS2 is disposed to face the contact region 21Bb of the p-channel Dt-MOS transistor PMOS1. Pad oxide films 31c, 31d, 31ea, 31eb, 31ec, and 31ed made of thermally-oxidized films are formed under the corresponding silicon nitride mask patterns 31C, 31D, 31Ea, 31Eb, 31Ec, and 31Ed.

Figure 23A:
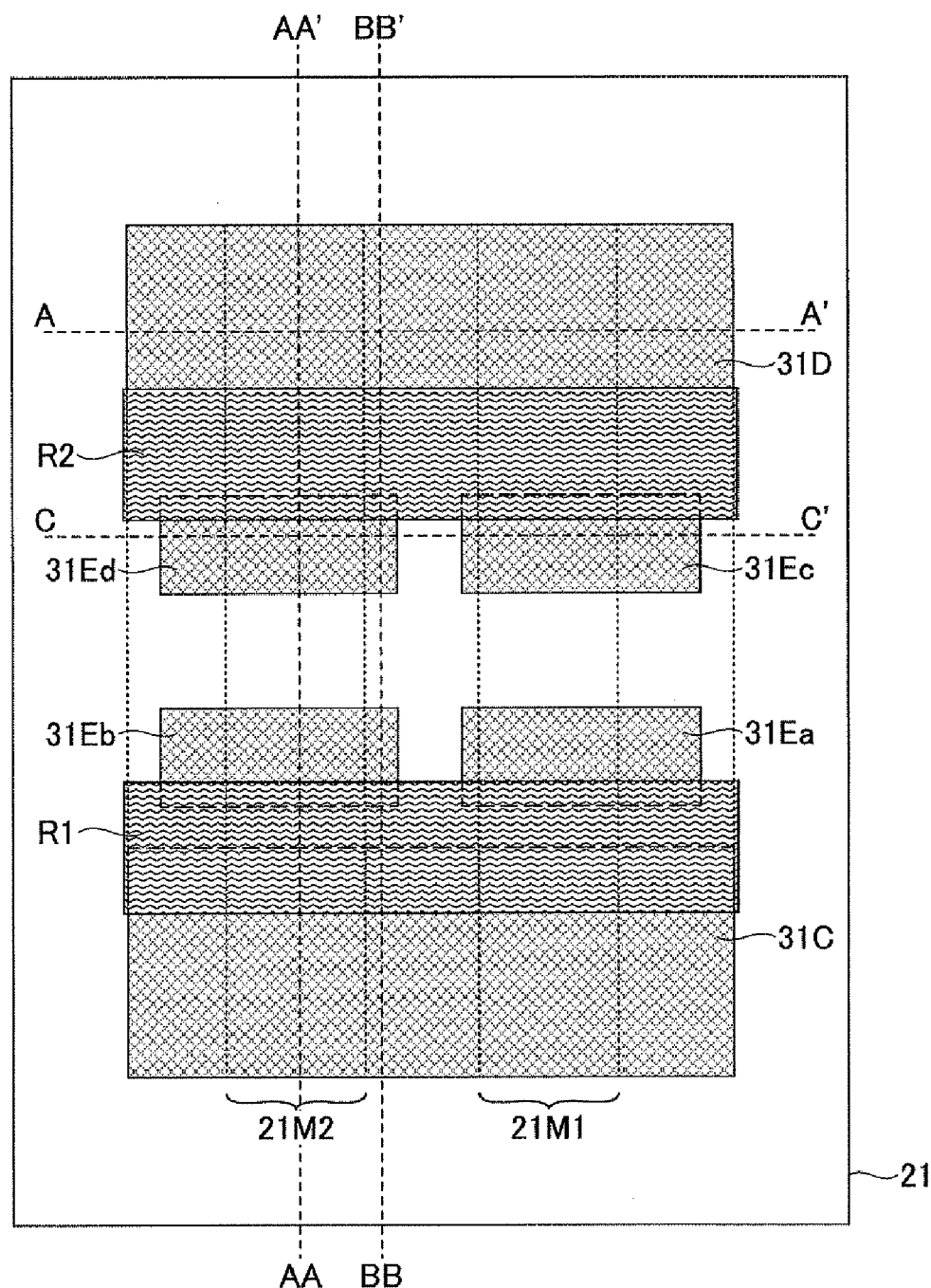
FIG. 23A is a plan view of a silicon bulk substrate used to describe a method of producing a semiconductor integrated circuit according to the first embodiment.
Figure 23B:
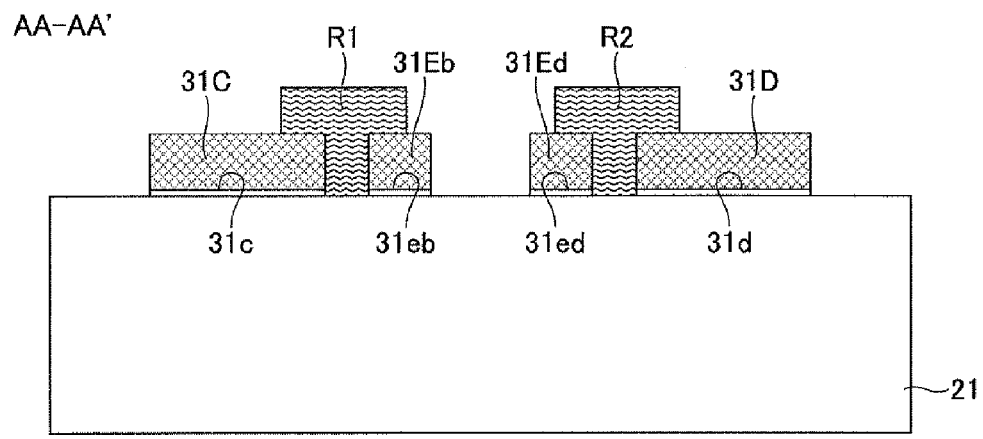
FIG. 23B is a cross-sectional view of the silicon bulk substrate of FIG. 23A taken along line AA-AA'.
Figure 23C:
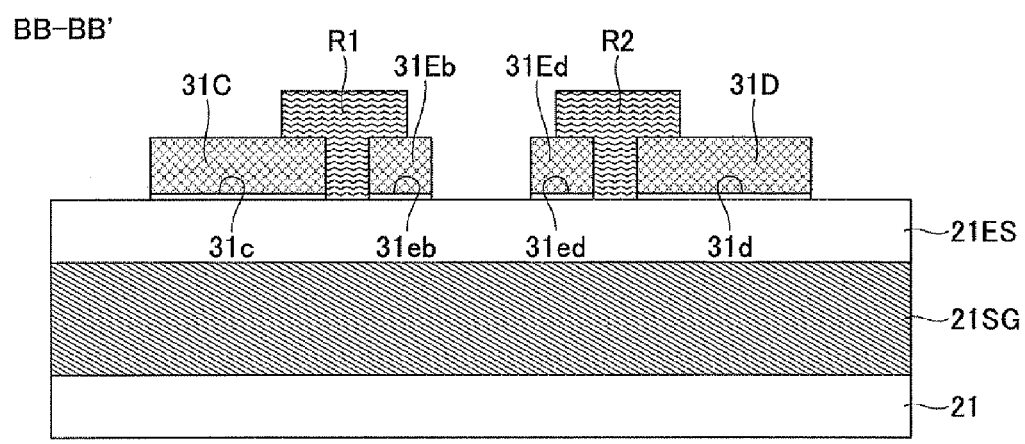
FIG. 23C is a cross-sectional view of the silicon bulk substrate of FIG. 23A taken along line BB-BB'.
Figure 23D:
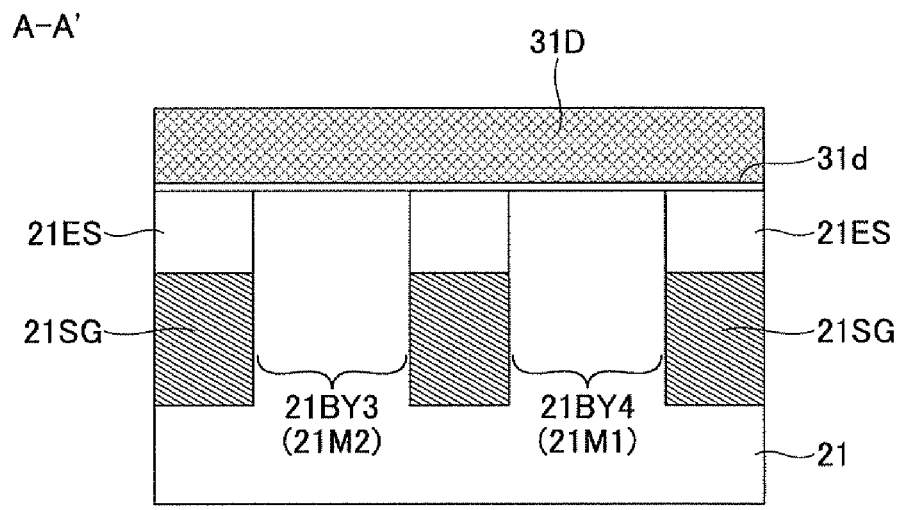
FIG. 23D is a cross-sectional view of the silicon bulk substrate of FIG. 23A taken along line A-A'.
Figure 23E:
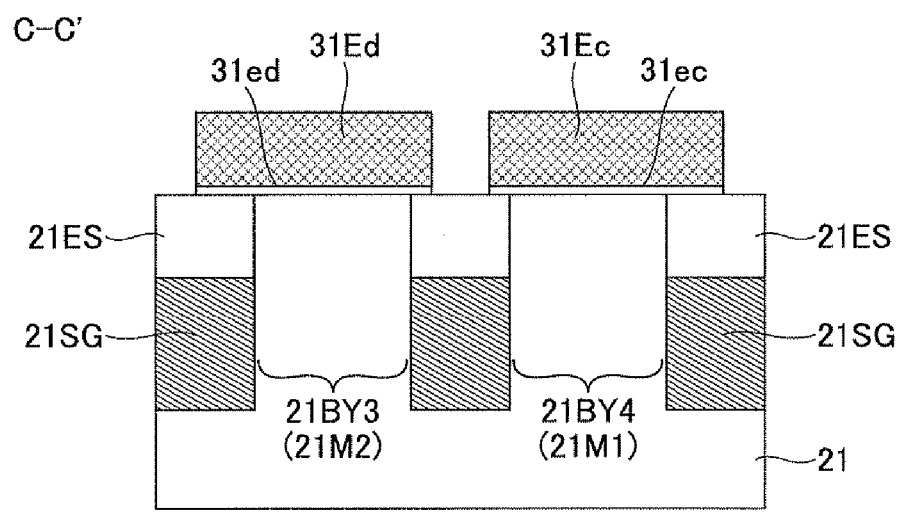
FIG. 23E is a cross-sectional view of the silicon bulk substrate of FIG. 23A taken along line C-C'.

FIG. 23A is a plan view of the silicon bulk substrate 21, FIG. 23B is a cross-sectional view of the silicon bulk substrate 21 of FIG. 23A taken along line AA-AA', FIG. 23C is a cross-sectional view of the silicon bulk substrate 21 of FIG. 23A taken along line BB-BB', FIG. 23D is a cross-sectional view of the silicon bulk substrate 21 of FIG. 23A taken along line A-A', and FIG. 23E is a cross-sectional view of the silicon bulk substrate 21 of FIG. 23A taken along line C-C'.

In the steps illustrated by FIGS. 23A through 23E, a resist pattern R1 is formed along the edge of the silicon nitride mask pattern 31C facing the silicon nitride mask patterns 31Ea and 31Eb to cover the surface of the silicon substrate 21 that is exposed between the silicon nitride mask pattern 31C and the silicon nitride mask patterns 31Ea and 31Eb. Also in the steps illustrated by FIGS. 23A through 23E, a resist pattern R2 is formed along the edge of the silicon nitride mask pattern 31D facing the silicon nitride mask patterns 31Ec and 31Ed to cover the surface of the silicon substrate 21 that is exposed between the silicon nitride mask pattern 31D and the silicon nitride mask patterns 31Ec and 31Ed.

Figure 24A:
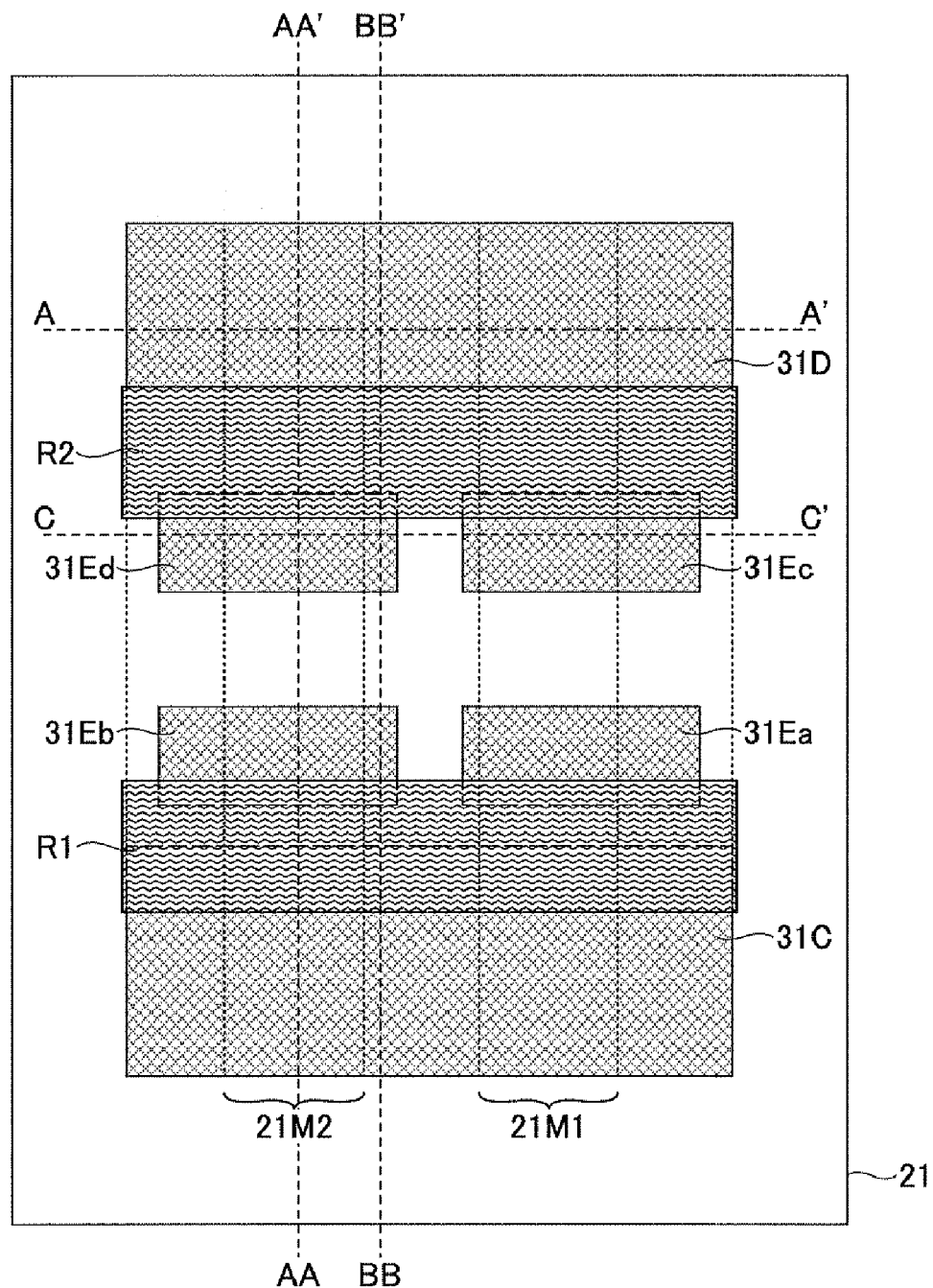
FIG. 24A is a plan view of a silicon bulk substrate used to describe a method of producing a semiconductor integrated circuit according to the first embodiment.
Figure 24B:
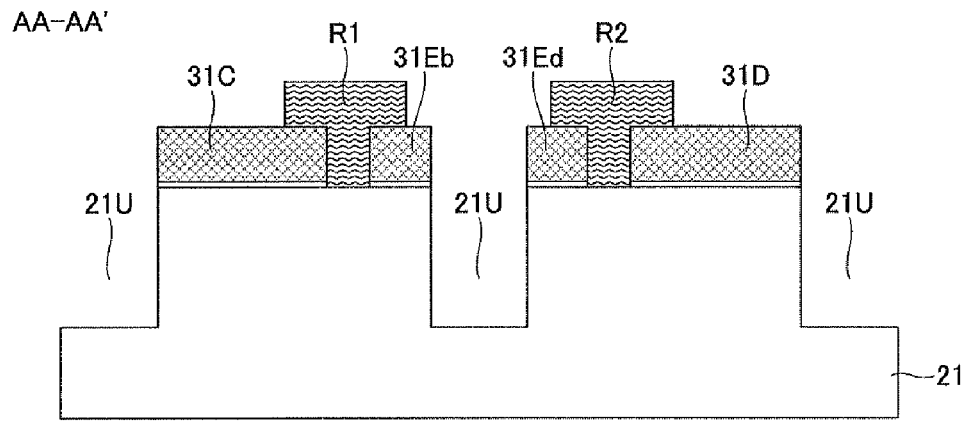
FIG. 24B is a cross-sectional view of the silicon bulk substrate of FIG. 24A taken along line AA-AA'.
Figure 24C:
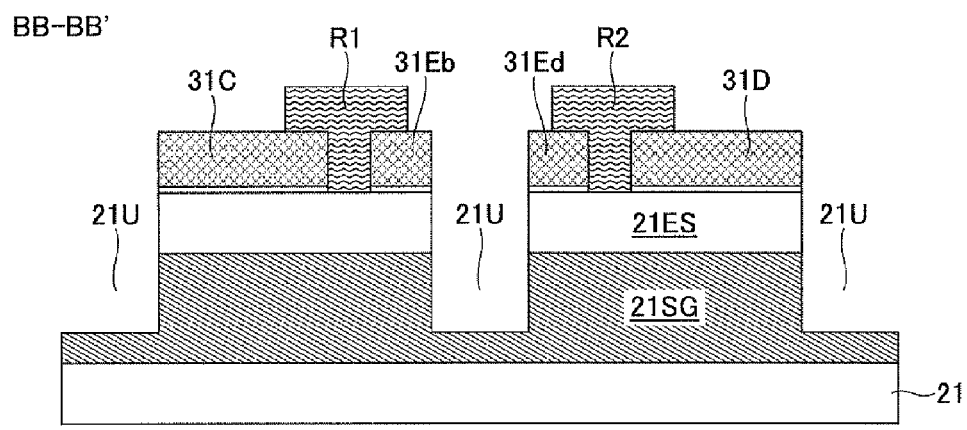
FIG. 24C is a cross-sectional view of the silicon bulk substrate of FIG. 24A taken along line BB-BB'.
Figure 24D:
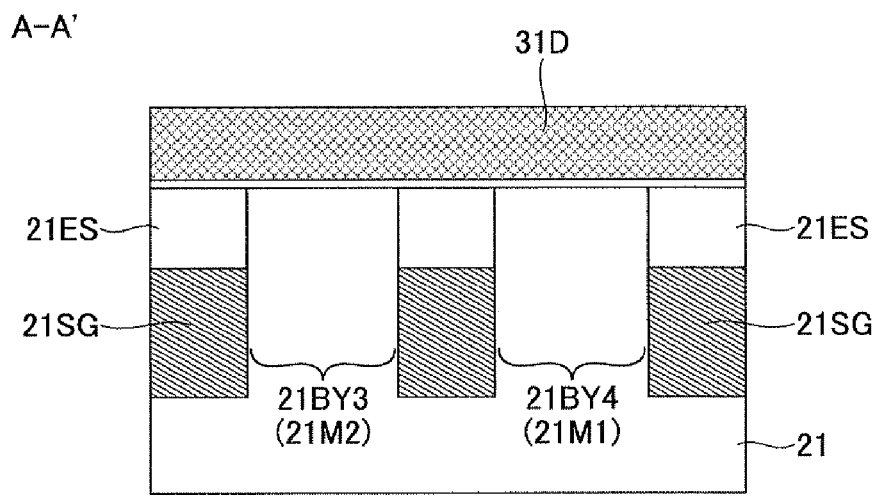
FIG. 24D is a cross-sectional view of the silicon bulk substrate of FIG. 24A taken along line A-A'.
Figure 24E:
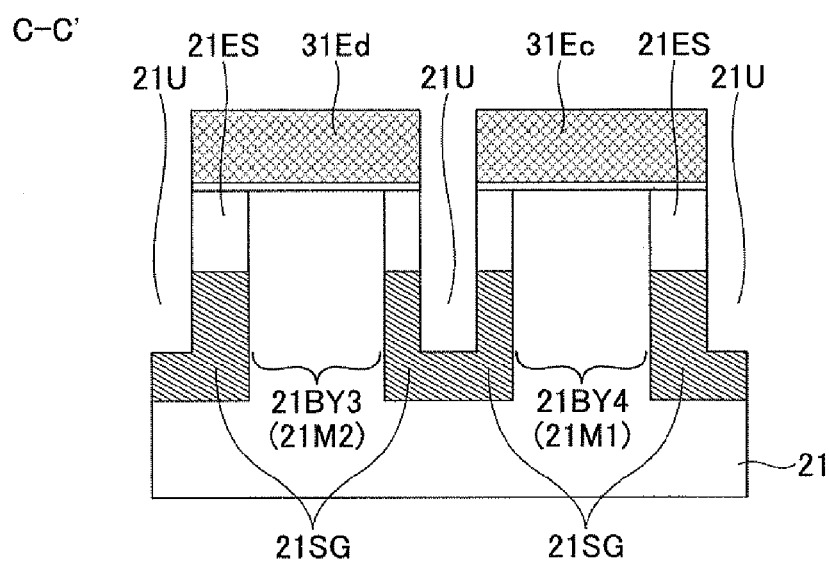
FIG. 24E is a cross-sectional view of the silicon bulk substrate of FIG. 24A taken along line C-C'.

FIG. 24A is a plan view of the silicon bulk substrate 21, FIG. 24B is a cross-sectional view of the silicon bulk substrate 21 of FIG. 24A taken along line AA-AA', FIG. 24C is a cross-sectional view of the silicon bulk substrate 21 of FIG. 24A taken along line BB-BB', FIG. 24D is a cross-sectional view of the silicon bulk substrate 21 of FIG. 24A taken along line A-A', and FIG. 24E is a cross-sectional view of the silicon bulk substrate 21 of FIG. 24A taken along line C-C'.

In the steps illustrated by FIGS. 24A through 24E, the silicon bulk substrate 21 is etched by dry etching using the silicon nitride mask patterns 31C, 31D, 31Ea, 31Eb, 31Ec, and 31Ed and the resist patterns R1 and R2 in a manner similar to the steps illustrated by FIGS. 19A through 19D. For the dry etching, an etching gas such as $Cl_2$ or HCl may be used. As a result, trenches 21U extending in the SiGe mixed crystal layers 21SG are formed in the silicon bulk substrate 21. In the steps of FIGS. 24A through 24E, the trenches 21U are formed such that the ends (or bottoms) of the trenches 21U do not extend beyond the lower ends of the SiGe mixed crystal layers 21SG.

Figure 25A:
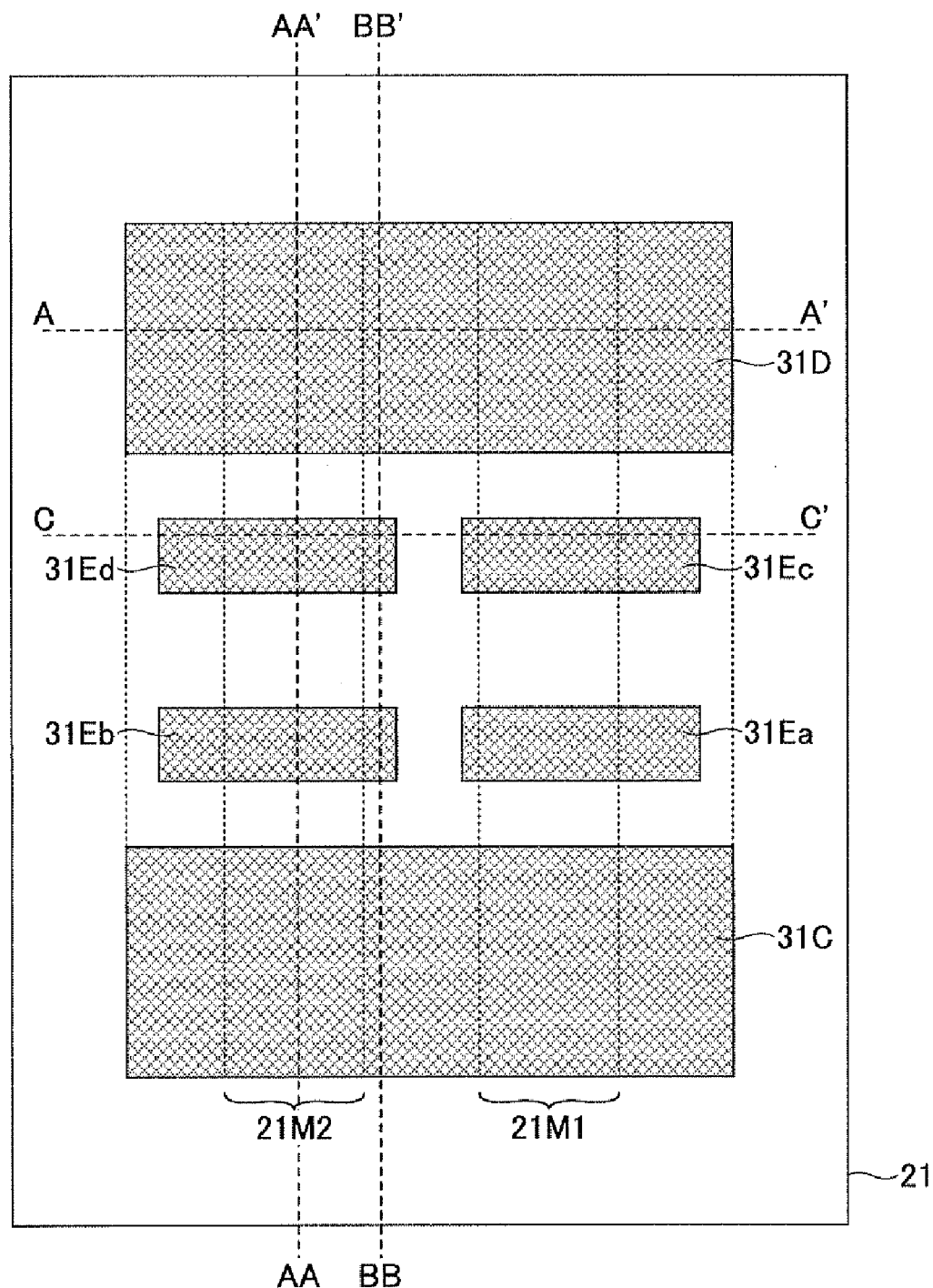
FIG. 25A is a plan view of a silicon bulk substrate used to describe a method of producing a semiconductor integrated circuit according to the first embodiment.
Figure 25B:
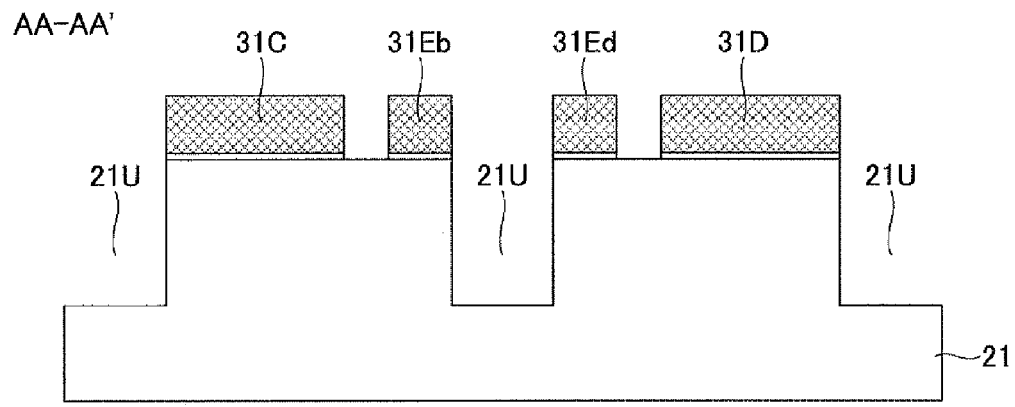
FIG. 25B is a cross-sectional view of the silicon bulk substrate of FIG. 25A taken along line AA-AA'.
Figure 25C:
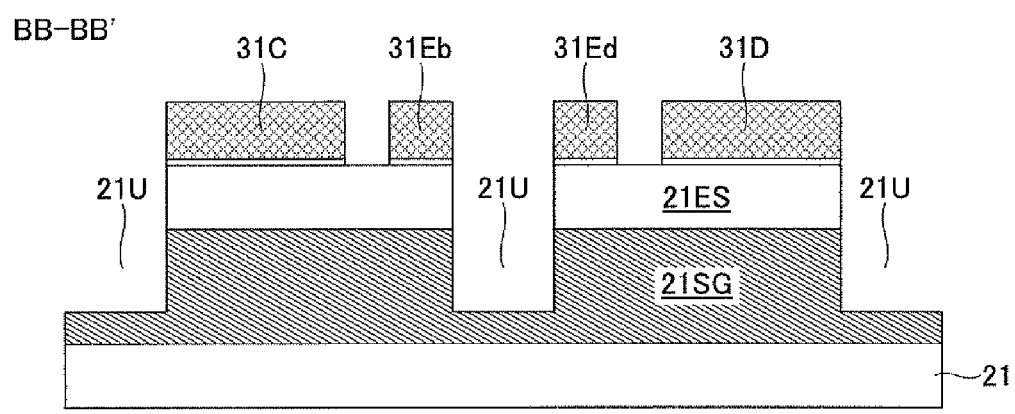
FIG. 25C is a cross-sectional view of the silicon bulk substrate of FIG. 25A taken along line BB-BB'.
Figure 25D:
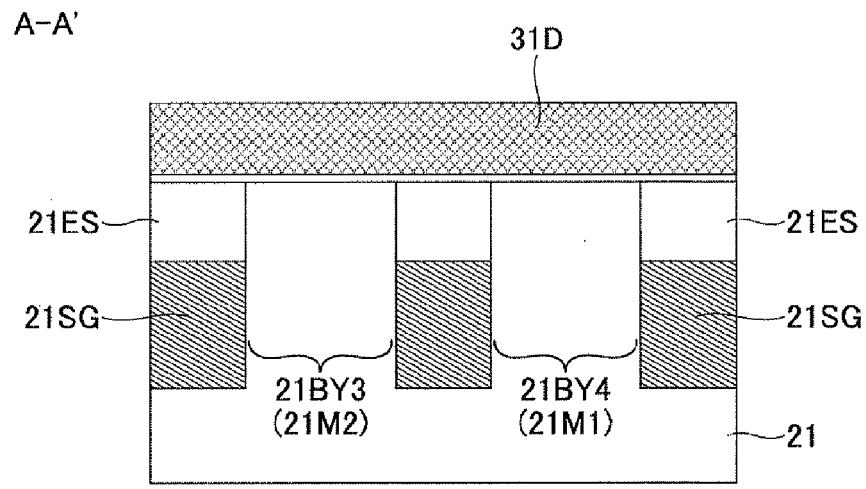
FIG. 25D is a cross-sectional view of the silicon bulk substrate of FIG. 25A taken along line A-A'.
Figure 25E:
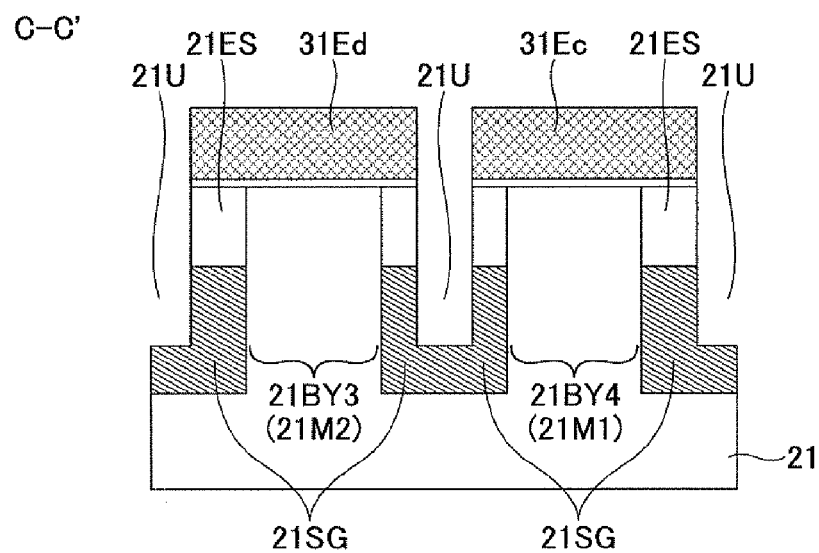
FIG. 25E is a cross-sectional view of the silicon bulk substrate of FIG. 25A taken along line C-C'.

FIG. 25A is a plan view of the silicon bulk substrate 21, FIG. 25B is a cross-sectional view of the silicon bulk substrate 21 of FIG. 25A taken along line AA-AA', FIG. 25C is a cross-sectional view of the silicon bulk substrate 21 of FIG. 25A taken along line BB-BB', FIG. 25D is a cross-sectional view of the silicon bulk substrate 21 of FIG. 25A taken along line A-A', and FIG. 25E is a cross-sectional view of the silicon bulk substrate 21 of FIG. 25A taken along line C-C'.

In the steps illustrated by FIGS. 25A through 25E, the resist patterns R1 and R2 are removed.

Figure 26A:
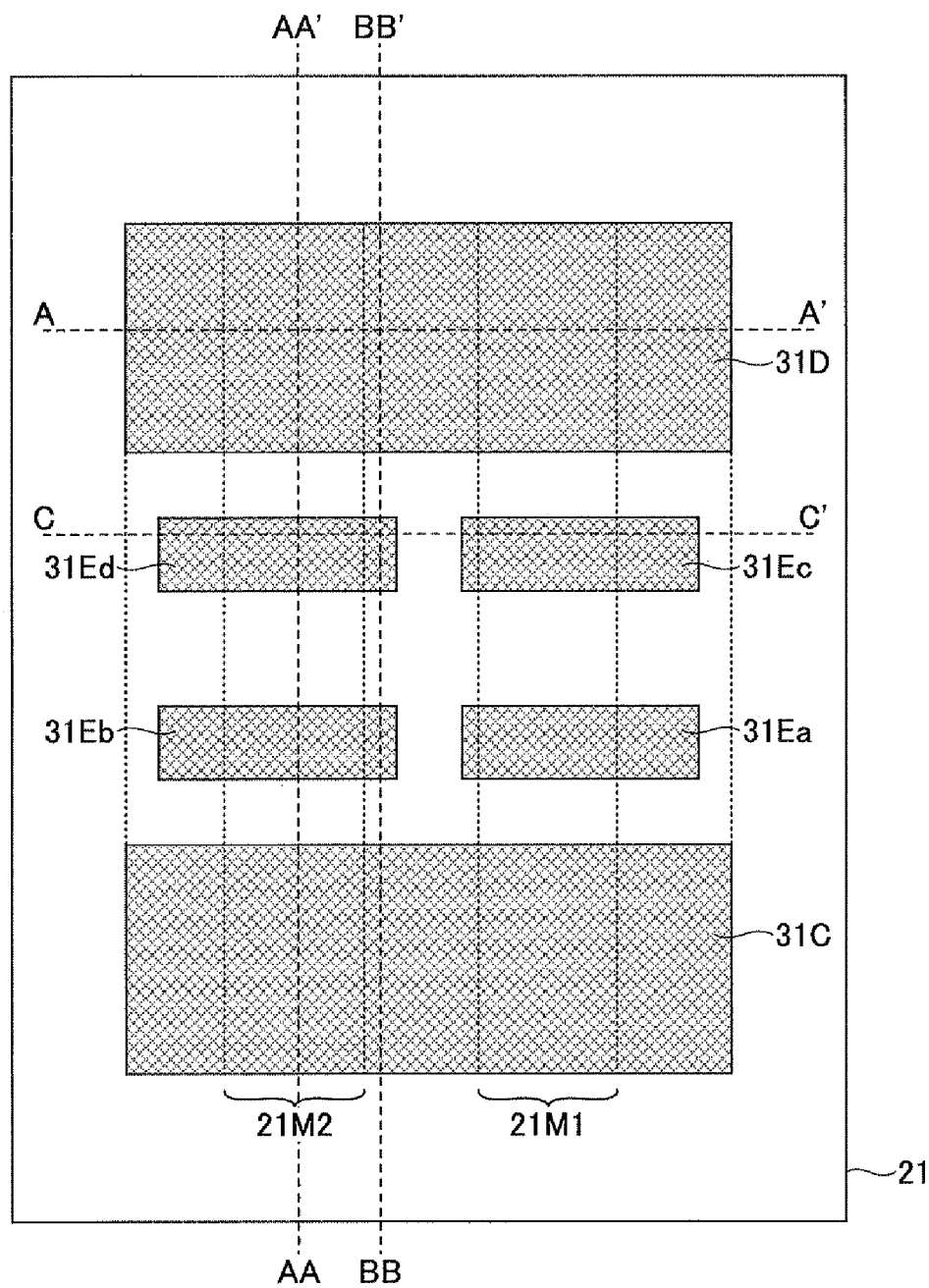
FIG. 26A is a plan view of a silicon bulk substrate used to describe a method of producing a semiconductor integrated circuit according to the first embodiment.
Figure 26B:
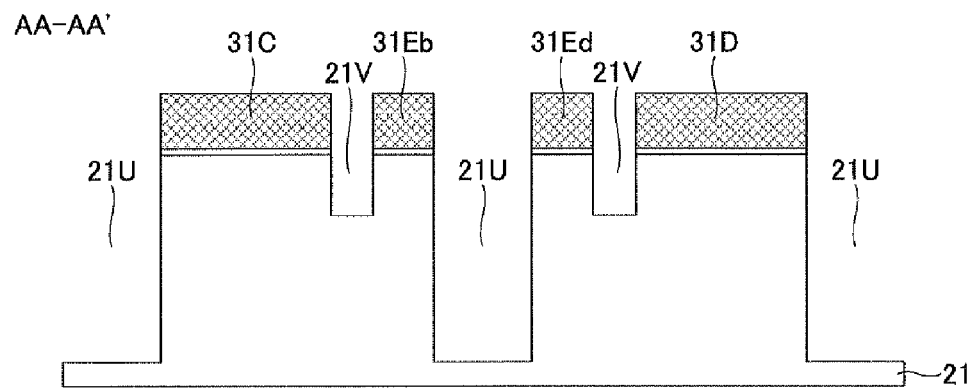
FIG. 26B is a cross-sectional view of the silicon bulk substrate of FIG. 26A taken along line AA-AA'.
Figure 26C:
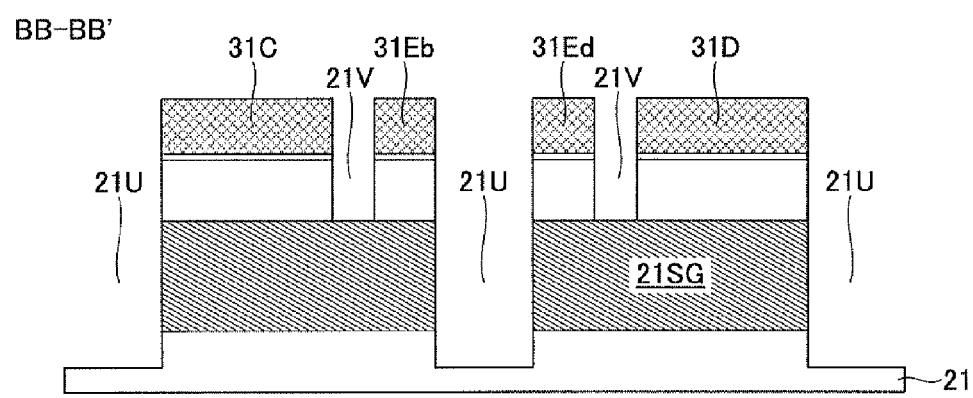
FIG. 26C is a cross-sectional view of the silicon bulk substrate of FIG. 26A taken along line BB-BB'.
Figure 26D:
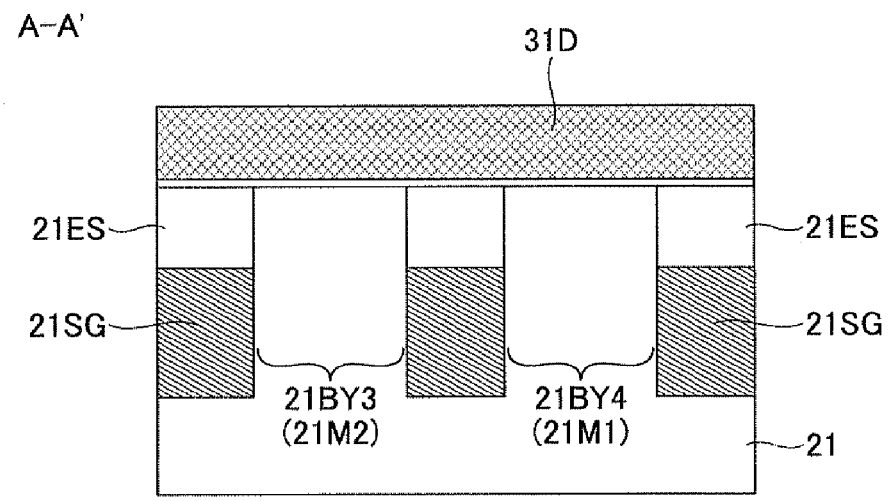
FIG. 26D is a cross-sectional view of the silicon bulk substrate of FIG. 26A taken along line A-A'.
Figure 26E:
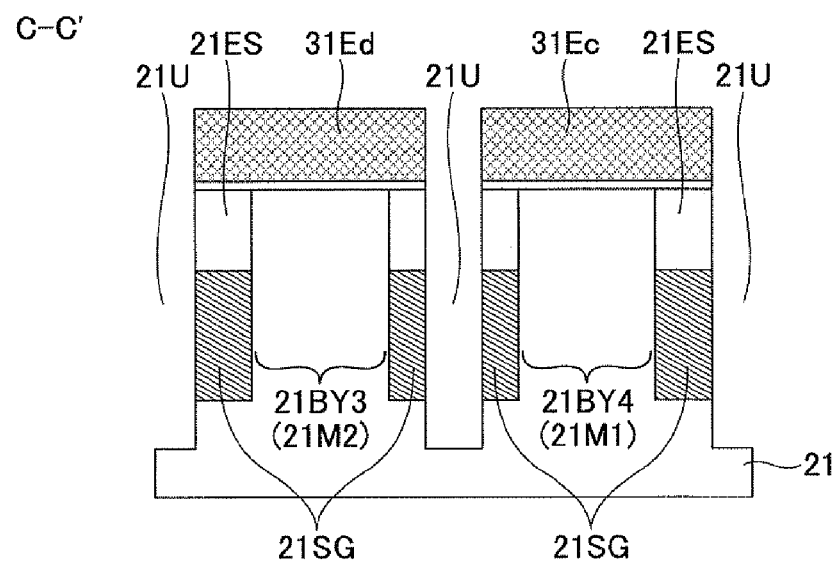
FIG. 26E is a cross-sectional view of the silicon bulk substrate of FIG. 26A taken along line C-C'.

FIG. 26A is a plan view of the silicon bulk substrate 21, FIG. 26B is a cross-sectional view of the silicon bulk substrate 21 of FIG. 26A taken along line AA-AA', FIG. 26C is a cross-sectional view of the silicon bulk substrate 21 of FIG. 26A taken along line BB-BB', FIG. 26D is a cross-sectional view of the silicon bulk substrate 21 of FIG. 26A taken along line A-A', and FIG. 26E is a cross-sectional view of the silicon bulk substrate 21 of FIG. 26A taken along line C-C'.

In the steps illustrated by FIGS. 26A through 26E, the silicon bulk substrate 21 is etched by dry etching using the silicon nitride mask patterns 31C, 31D, 31Ea, 31Eb, 31Ec, and 31Ed in a manner similar to the steps illustrated by FIGS. 24A through 24E. For the dry etching, an etching gas such as $Cl_2$ or HC may be used. As a result, shallow trenches 21V that reach the upper ends of the SiGe mixed crystal layers 21SG are formed between the silicon nitride mask patterns 31C and 31Eb and between the silicon nitride mask patterns 31D and 31Ed. Also as a result of the dry etching, the trenches 21U become deeper and extend beyond the lower ends of the SiGe mixed crystal layers 21SG.

Figure 27A:
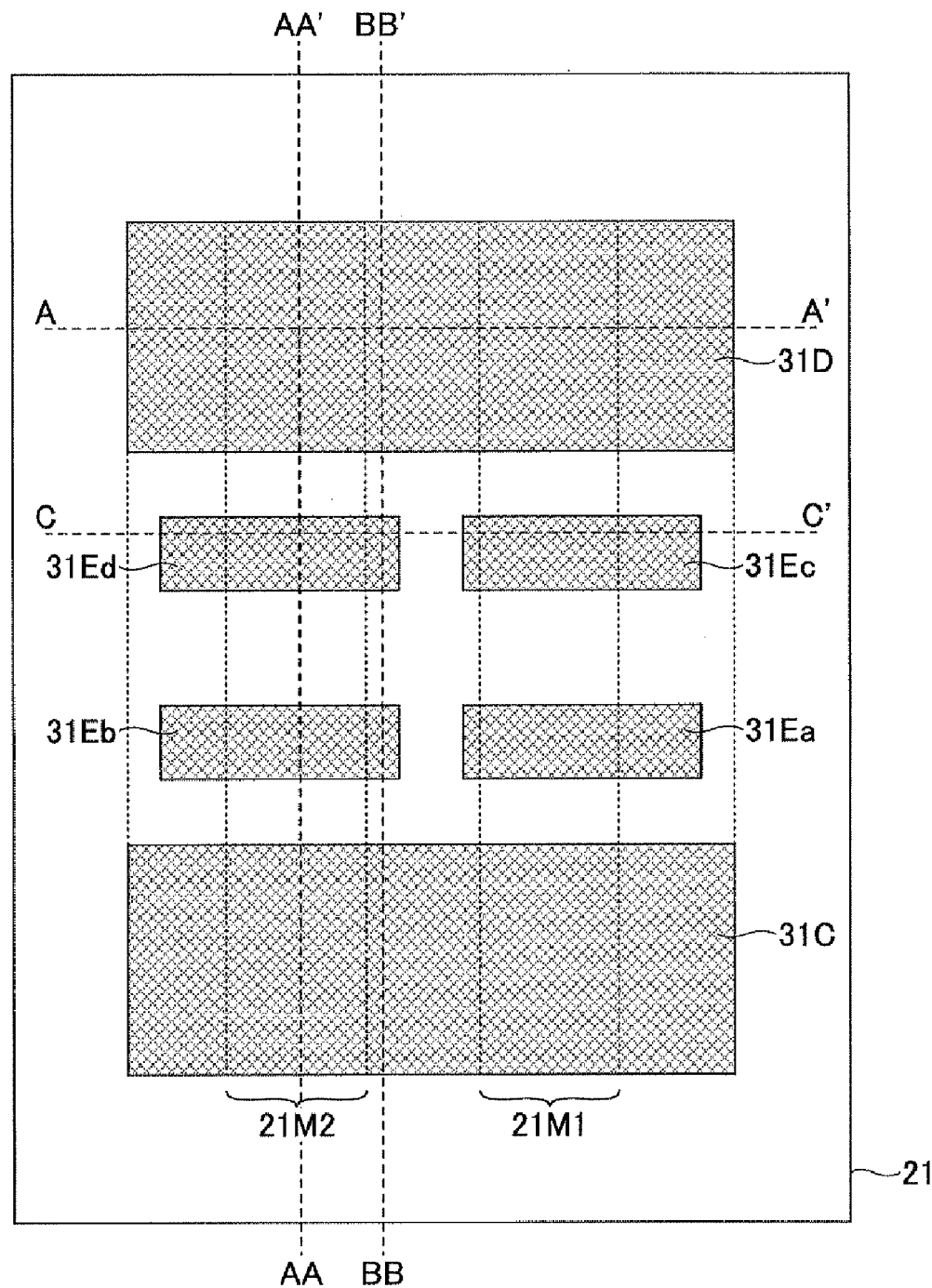
FIG. 27A is a plan view of a silicon bulk substrate used to describe a method of producing a semiconductor integrated circuit according to the first embodiment.
Figure 27D:
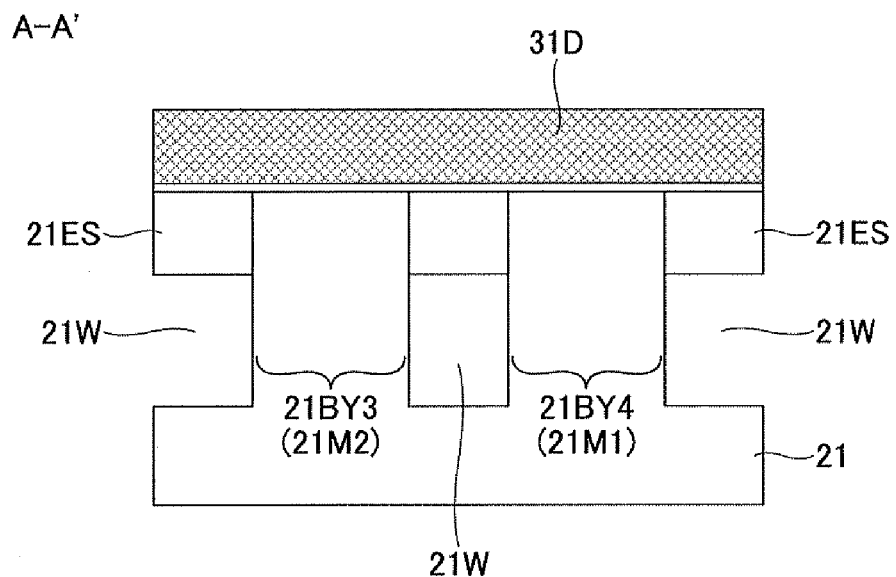
FIG. 27D is a cross-sectional view of the silicon bulk substrate of FIG. 27A taken along line A-A'.
Figure 27E:
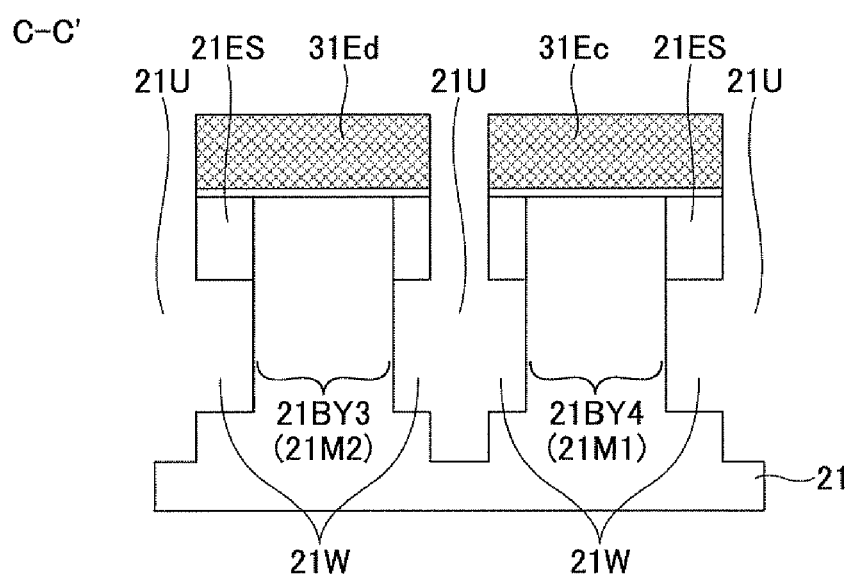
FIG. 27E is a cross-sectional view of the silicon bulk substrate of FIG. 27A taken along line C-C'.

FIG. 27A is a plan view of the silicon bulk substrate 21, FIG. 27B is a cross-sectional view of the silicon bulk substrate 21 of FIG. 27A taken along line AA-AA', FIG. 27C is a cross-sectional view of the silicon bulk substrate 21 of FIG. 27A taken along line BB-BB', FIG. 27D is a cross-sectional view of the silicon bulk substrate 21 of FIG. 27A taken along line A-A', and FIG. 27E is a cross-sectional view of the silicon bulk substrate 21 of FIG. 27A taken along line C-C'.

In the steps illustrated by FIGS. 27A through 27E, the SiGe mixed crystal layers 21SG exposed through the trenches 21U are selectively removed by dry etching with respect to the silicon bulk substrate 21 and the silicon epitaxial layers 21ES. For the dry etching, a mixed gas of $Cl_2$ and $H_2$ or an HCl gas may be used. As a result, gaps 21W corresponding to the removed SiGe mixed crystal layers 21SG are formed.

Figure 28A:
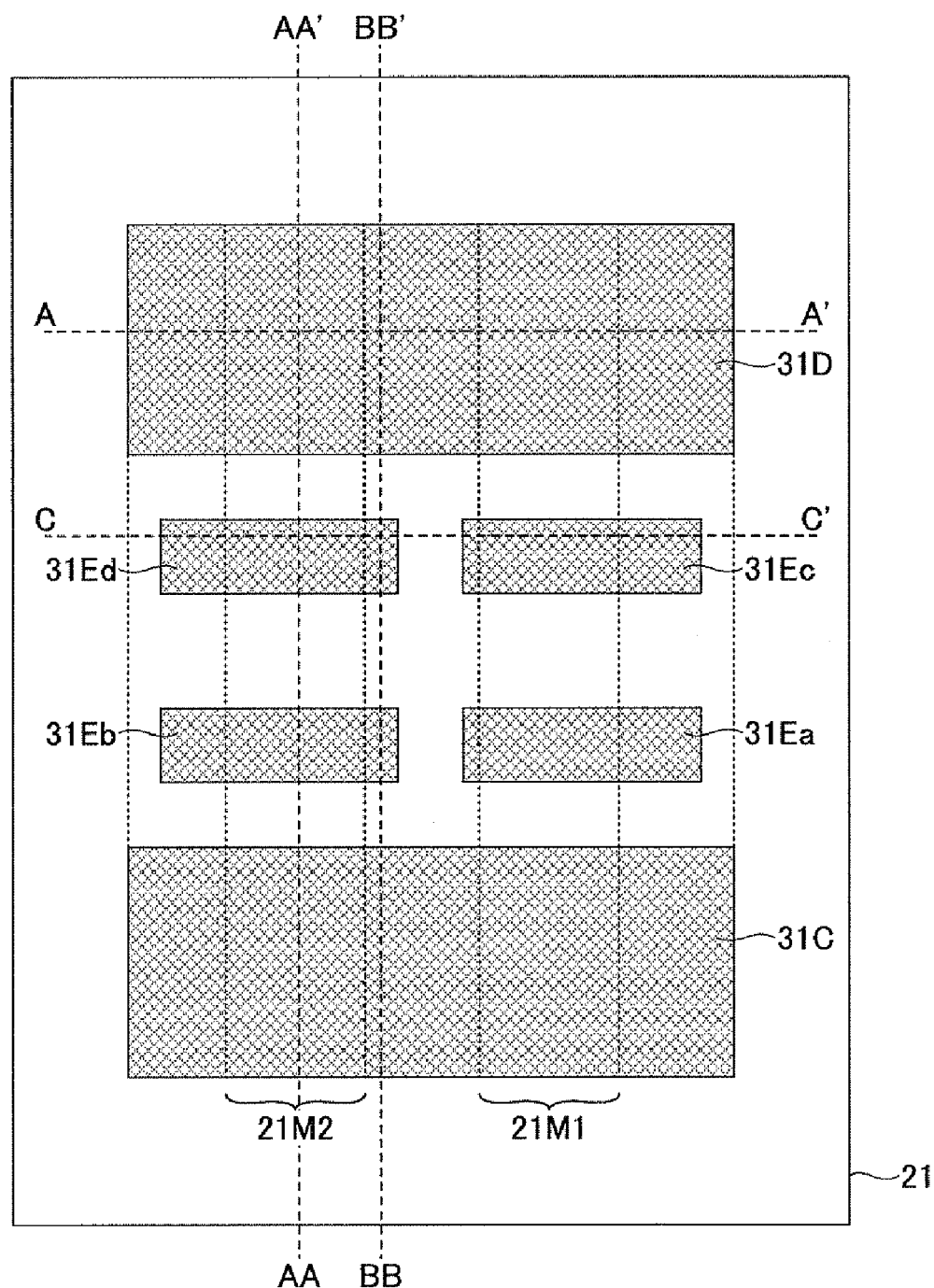
FIG. 28A is a plan view of a silicon bulk substrate used to describe a method of producing a semiconductor integrated circuit according to the first embodiment.
Figure 28B:
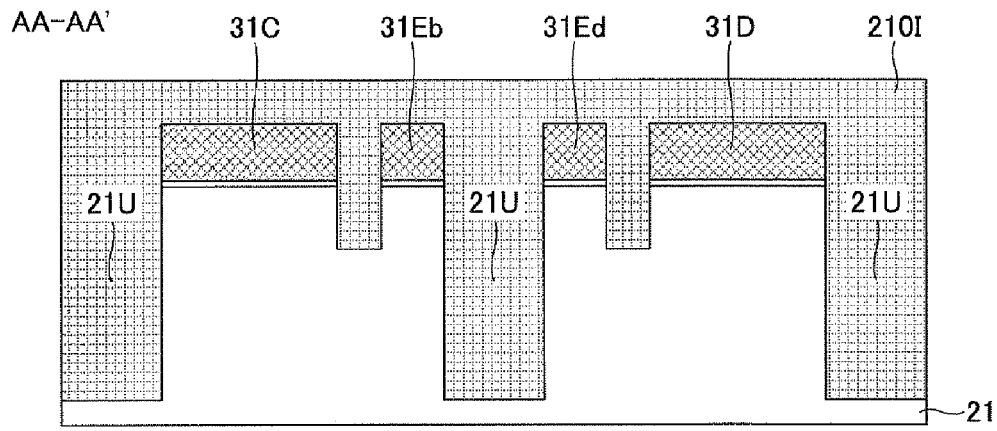
FIG. 28B is a cross-sectional view of the silicon bulk substrate of FIG. 28A taken along line AA-AA'.
Figure 28C:
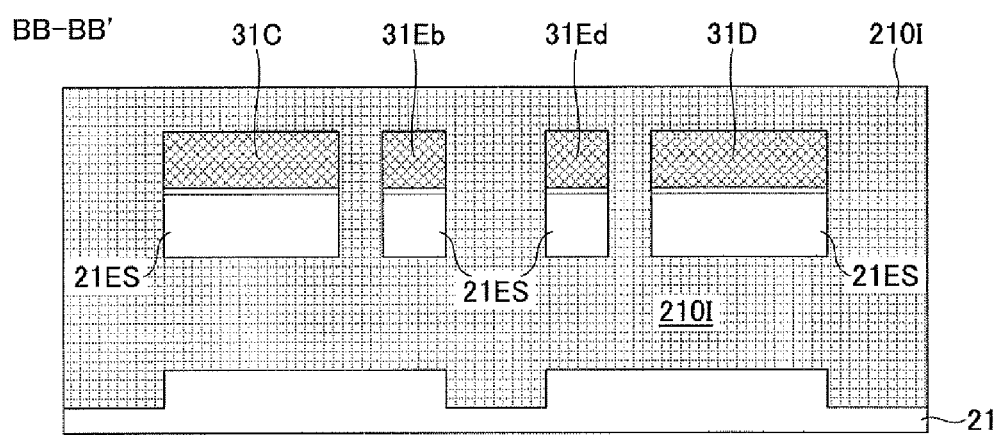
FIG. 28C is a cross-sectional view of the silicon bulk substrate of FIG. 28A taken along line BB-BB'.
Figure 28D:
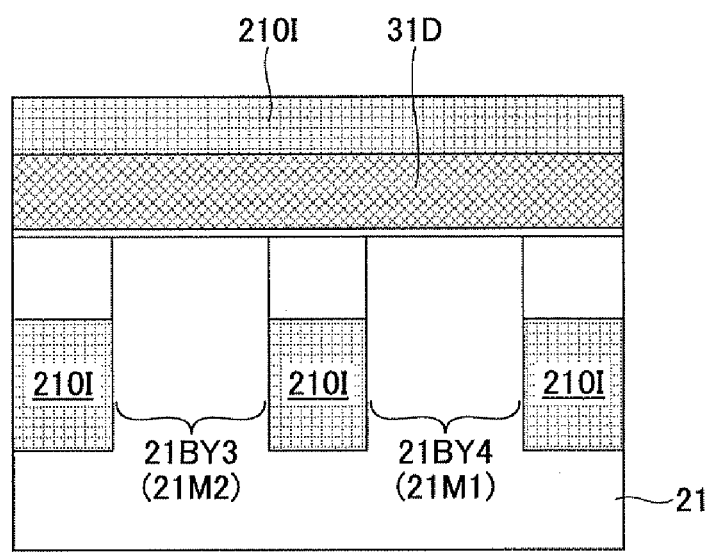
FIG. 28D is a cross-sectional view of the silicon bulk substrate of FIG. 28A taken along line A-A'.
Figure 28E:
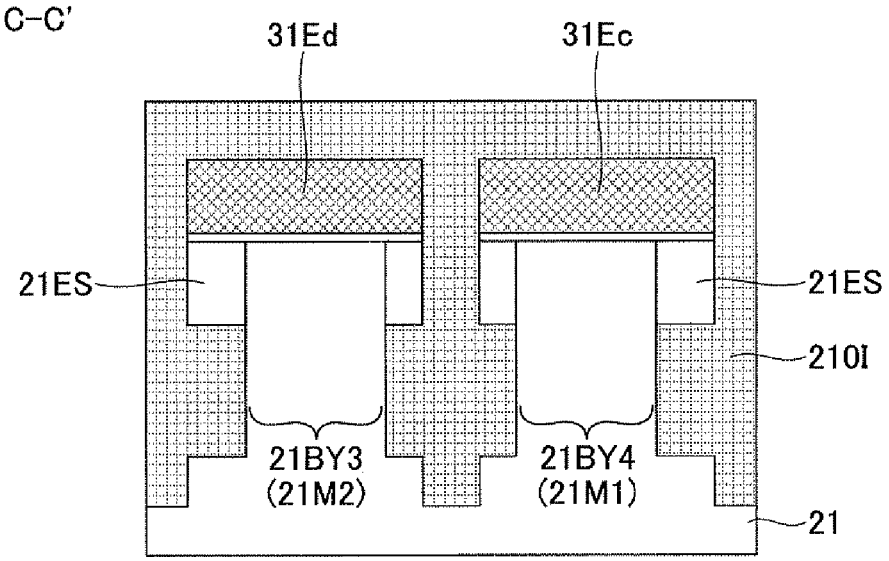
FIG. 28E is a cross-sectional view of the silicon bulk substrate of FIG. 28A taken along line C-C'.

FIG. 28A is a plan view of the silicon bulk substrate 21, FIG. 28B is a cross-sectional view of the silicon bulk substrate 21 of FIG. 28A taken along line AA-AA', FIG. 28C is a cross-sectional view of the silicon bulk substrate 21 of FIG. 28A taken along line BB-BB', FIG. 28D is a cross-sectional view of the silicon bulk substrate 21 of FIG. 28A taken along line A-A', and FIG. 28E is a cross-sectional view of the silicon bulk substrate 21 of FIG. 28A taken along line C-C'.

In the steps illustrated by FIGS. 28A through 28E, the gaps 21W are filled with insulating films 210I The insulating film 210I is formed, for example, by a high-density plasma CVD method using tetraethyl orthosilicate (TEOS) as a material.

Figure 29A:
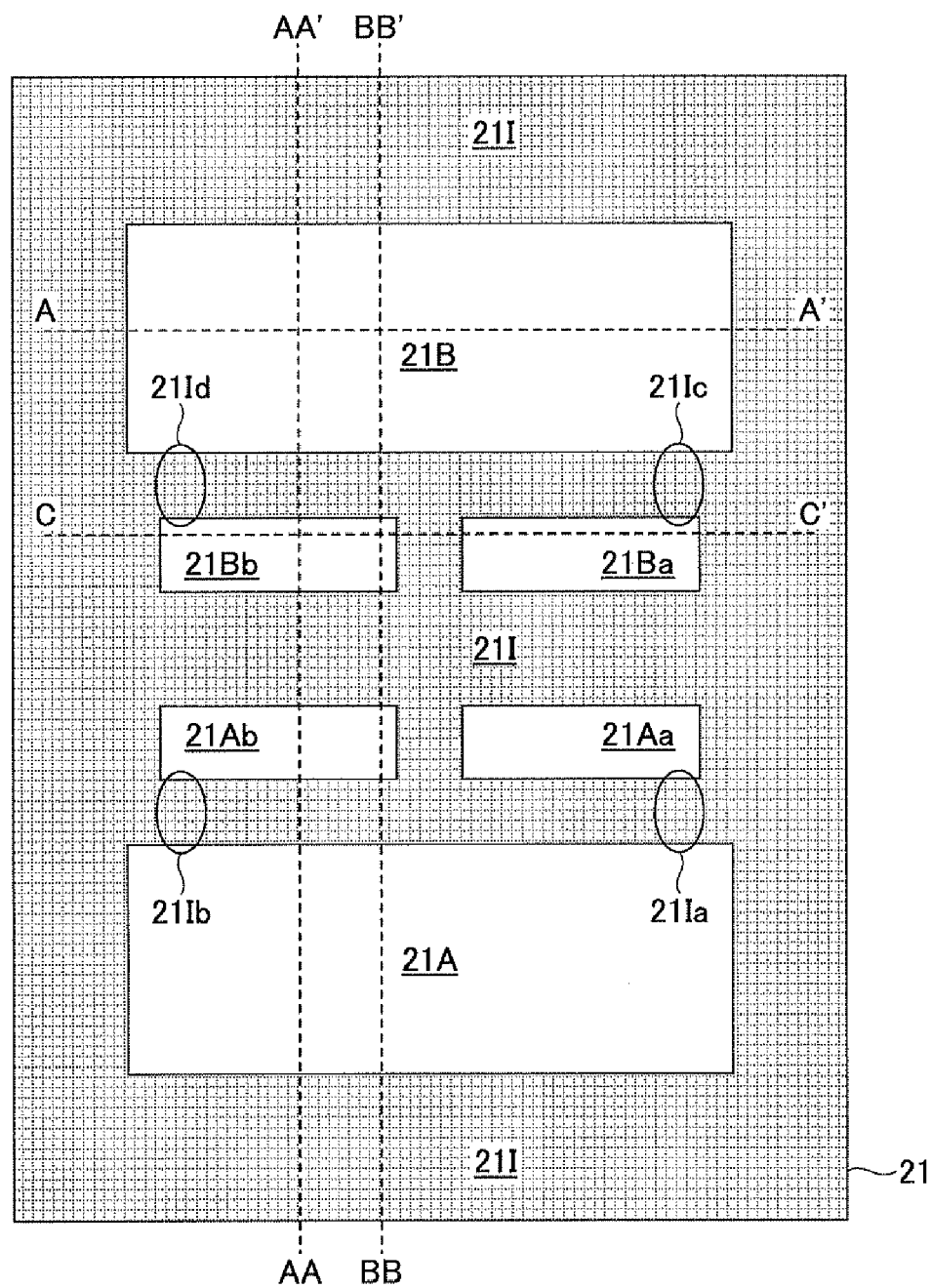
FIG. 29A is a plan view of a silicon bulk substrate used to describe a method of producing a semiconductor integrated circuit according to the first embodiment.
Figure 29B:
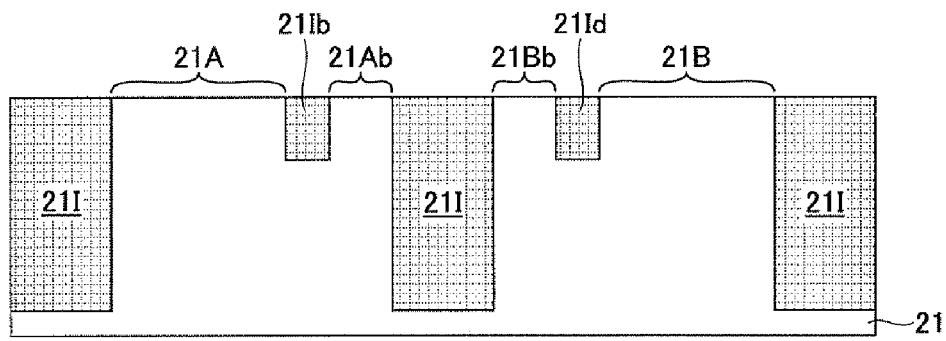
FIG. 29B is a cross-sectional view of the silicon bulk substrate of FIG. 29A taken along line AA-AA'.
Figure 29C:
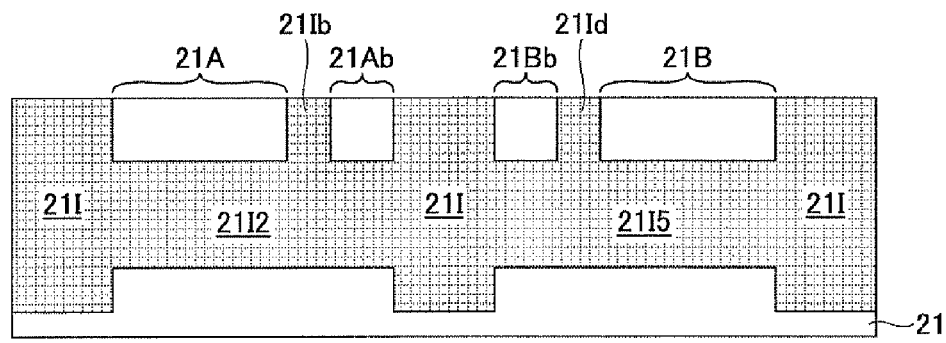
FIG. 29C is a cross-sectional view of the silicon bulk substrate of FIG. 29A taken along line BB-BB'.
Figure 29D:
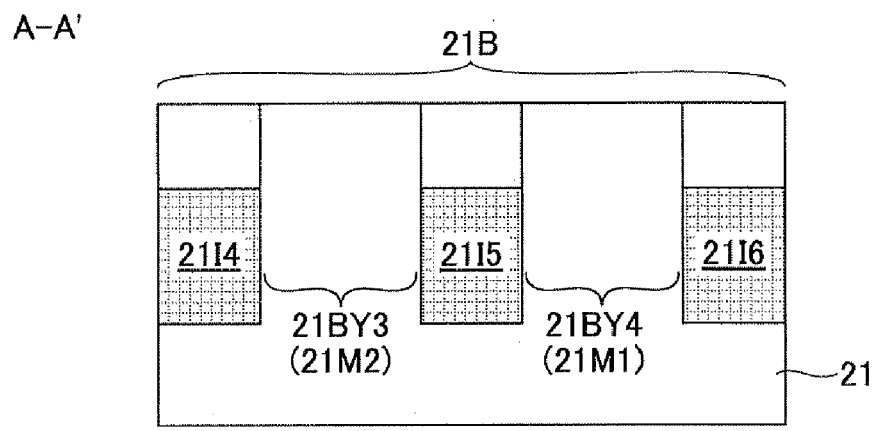
FIG. 29D is a cross-sectional view of the silicon bulk substrate of FIG. 29A taken along line A-A'.
Figure 29E:
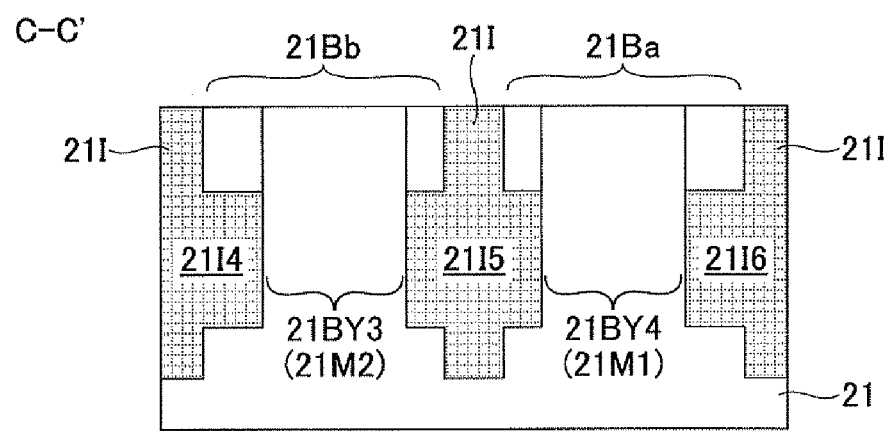
FIG. 29E is a cross-sectional view of the silicon bulk substrate of FIG. 29A taken along line C-C'.

FIG. 29A is a plan view of the silicon bulk substrate 21, FIG. 29B is a cross-sectional view of the silicon bulk substrate 21 of FIG. 29A taken along line AA-AA', FIG. 29C is a cross-sectional view of the silicon bulk substrate 21 of FIG. 29A taken along line BB-BB', FIG. 29D is a cross-sectional view of the silicon bulk substrate 21 of FIG. 29A taken along line A-A', and FIG. 29E is a cross-sectional view of the silicon bulk substrate 21 of FIG. 29A taken along line C-C'.

In the steps illustrated by FIGS. 29A through 29E, the silicon nitride mask patterns 31C, 31D, 31Ea, 31Eb, 31Ec, and 31Ed as well as the pad oxide films 31c, 31d, 31ea, 31eb, 31ec, and 31ed are removed by wet etching. As a result, as illustrated in FIG. 29A, a structure where the element regions 21A and 21B and the contact regions 21Aa, 21Ab, 21Ba, and 21Bb, which are exposed silicon surfaces, are defined by the element isolation region 21I and the element isolation sub-regions 21Ia through 21Id is obtained.

Referring to the cross section of FIG. 29B taken along line AA-AA', the surface of the silicon bulk substrate 21 is exposed at positions corresponding to the element regions 21A and 21B and the contact regions 21Ab and 21Bb in FIG. 10. Referring to the cross section of FIG. 29C taken along line BB-BB', the insulating region 21I2 is disposed below the element region 21A and the insulating region 21I5 is disposed below the element region 21B as in FIG. 11. The insulating regions 21I2 and 21I5 are contiguous with the element isolation region 21I.

As illustrated in FIGS. 29A, 29C, and 29E, the contact region 21Ab on the insulating region 21I2 is surrounded by the element isolation region 21I and the element isolation sub-region 21Ib, and the contact region 21Bb on the insulating region 21I5 is surrounded by the element isolation region 21I and the element isolation sub-region 21Id. Also, as illustrated in FIGS. 29B and 29E, the contact region 21Ab is electrically connected with the element region 21A under the element isolation sub-region 21Ib, and the contact region 21Bb is electrically connected with the element region 21B under the element isolation sub-region 21Id.

Figure 30A:
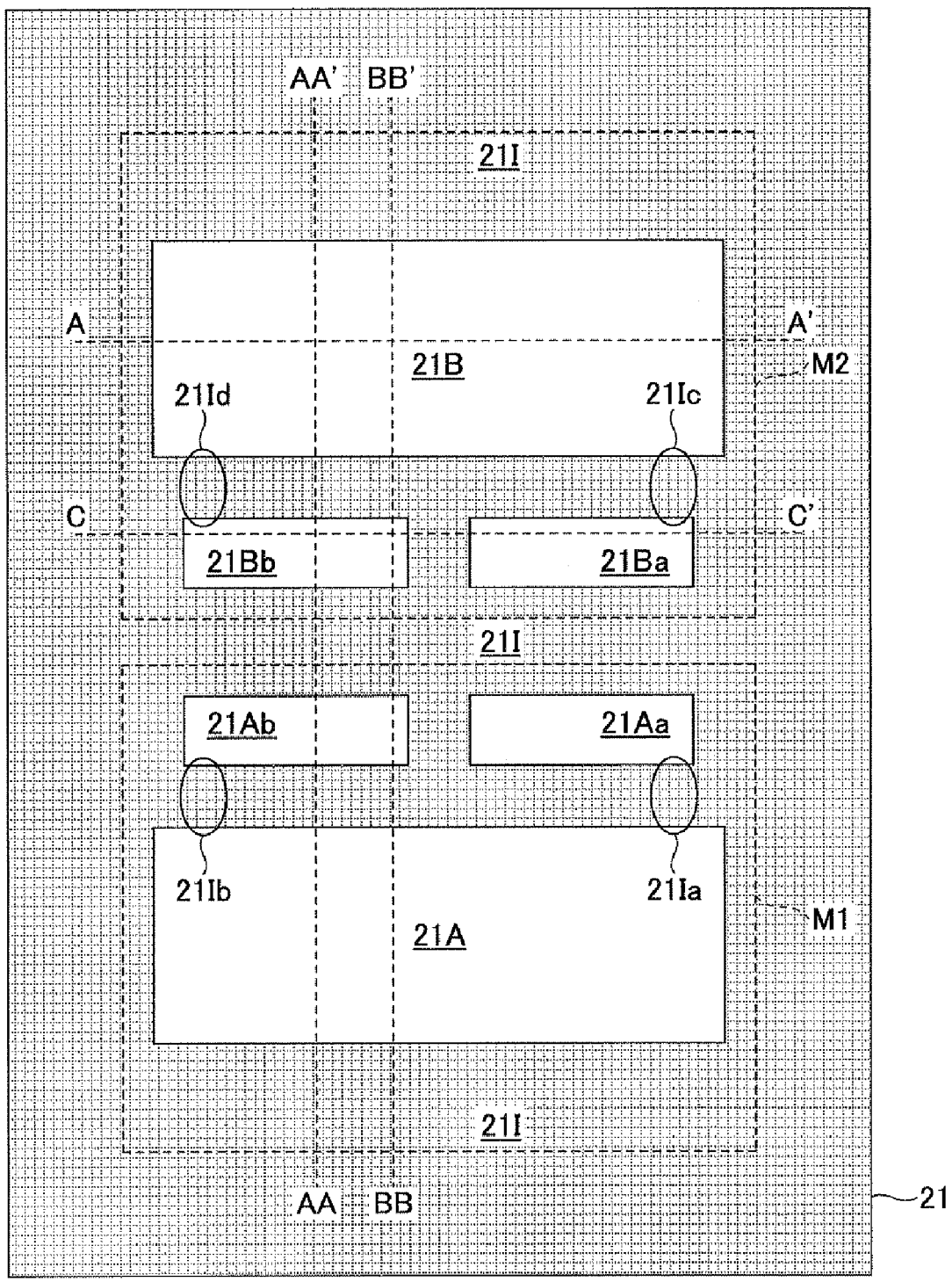
FIG. 30A is a plan view of a silicon bulk substrate used to describe a method of producing a semiconductor integrated circuit according to the first embodiment.
Figure 30B:
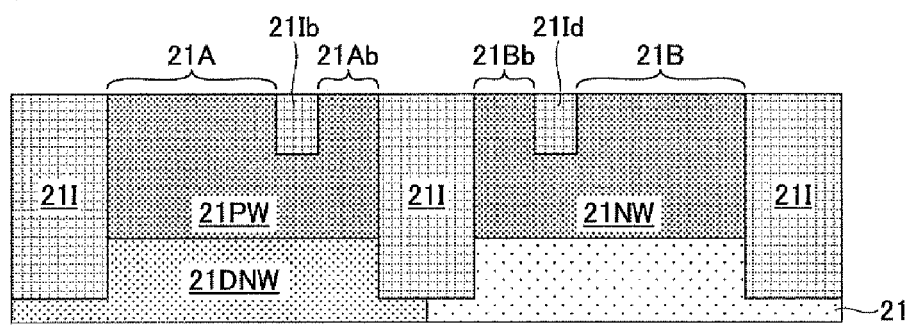
FIG. 30B is a cross-sectional view of the silicon bulk substrate of FIG. 30A taken along line AA-AA'.
Figure 30C:
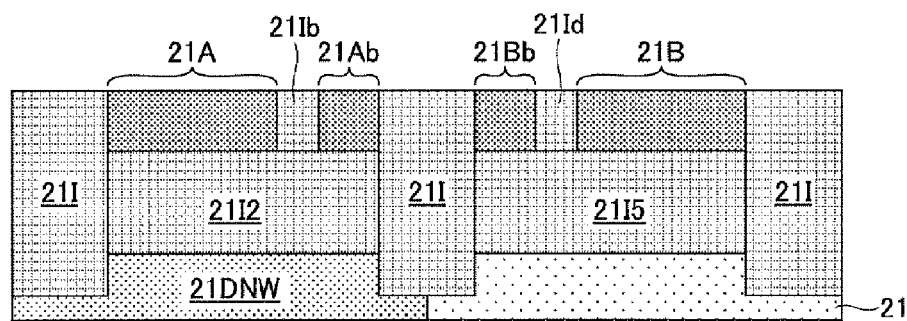
FIG. 30C is a cross-sectional view of the silicon bulk substrate of FIG. 30A taken along line BB-BB'.
Figure 30D:
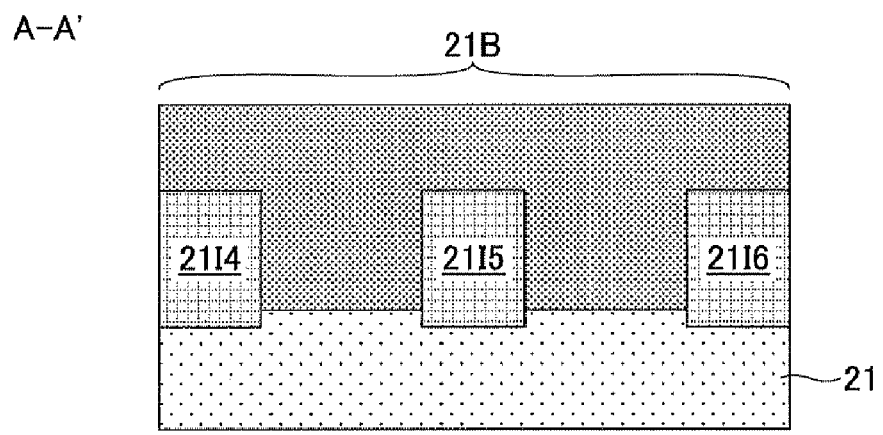
FIG. 30D is a cross-sectional view of the silicon bulk substrate of FIG. 30A taken along line A-A'.
Figure 30E:
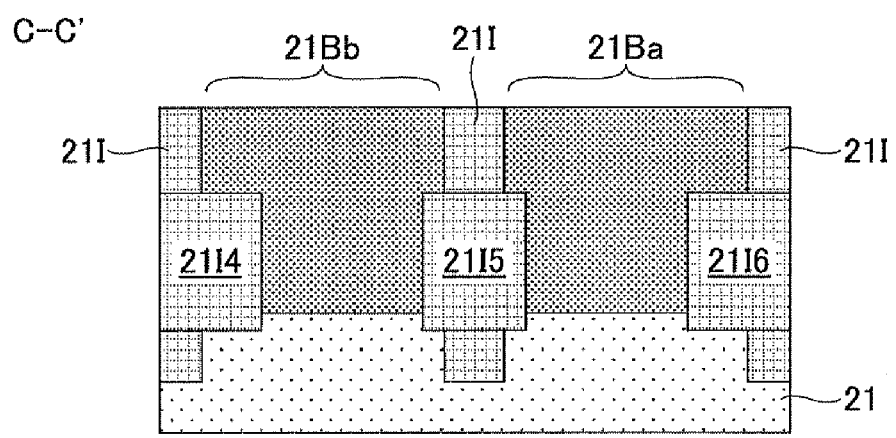
FIG. 30E is a cross-sectional view of the silicon bulk substrate of FIG. 30A taken along line C-C'.

FIG. 30A is a plan view of the silicon bulk substrate 21, FIG. 30B is a cross-sectional view of the silicon bulk substrate 21 of FIG. 30A taken along line AA-AA', FIG. 30C is a cross-sectional view of the silicon bulk substrate 21 of FIG. 30A taken along line BB-BB', FIG. 30D is a cross-sectional view of the silicon bulk substrate 21 of FIG. 30A taken along line A-A', and FIG. 30E is a cross-sectional view of the silicon bulk substrate 21 of FIG. 30A taken along line C-C'.

In the steps illustrated by FIGS. 30A through 30E, an n-type impurity element is ion-implanted into the silicon bulk substrate 21 under the element region 21A and the contact regions 21Aa and 21Ab using a mask M1 illustrated in FIG. 30A to form the n-type well 21DNW. For example, phosphorus (P) is ion-implanted under an acceleration voltage of 350 keV with a dose amount of $3 \times 10^{13}$ cm$^{-2}$ to form the n-type well 21DNW.

Next, a p-type impurity element is ion-implanted into the element region 21A and the contact regions 21Aa and 21Ab (i.e., they are p-doped) using the same mask M1 to form the p-type wells 21PW that correspond to the bodies 21BY1 and 21BY2. For example, boron (B) is ion-implanted under an acceleration voltage of 20 keV with a dose amount of $1 \times 10^{13}$ cm$^{-2}$ to form the p-type wells 21PW.

Next, an n-type impurity element is ion-implanted into the element region 21B and the contact regions 21Ba and 21Bb (i.e., they are n-doped) using a mask M2 to form the n-type wells 21NW that correspond to the bodies 21BY3 and 21BY4. For example, arsenic (As) is ion-implanted under an acceleration voltage of 60 keV with a dose amount of $1 \times 10^{13}$ cm$^{-2}$ to form the n-type wells 21NW.

Also in the steps illustrated by FIGS. 30A through 30E, the exposed silicon surfaces are oxidized by thermal oxidation or plasma oxidation to form gate insulating films (not shown) with a thickness of, for example, 1.7 nm that correspond to the gate insulating films 22OX1 through 22OX4.

The order of the ion implantation steps described above may be changed freely.

Figure 31A:
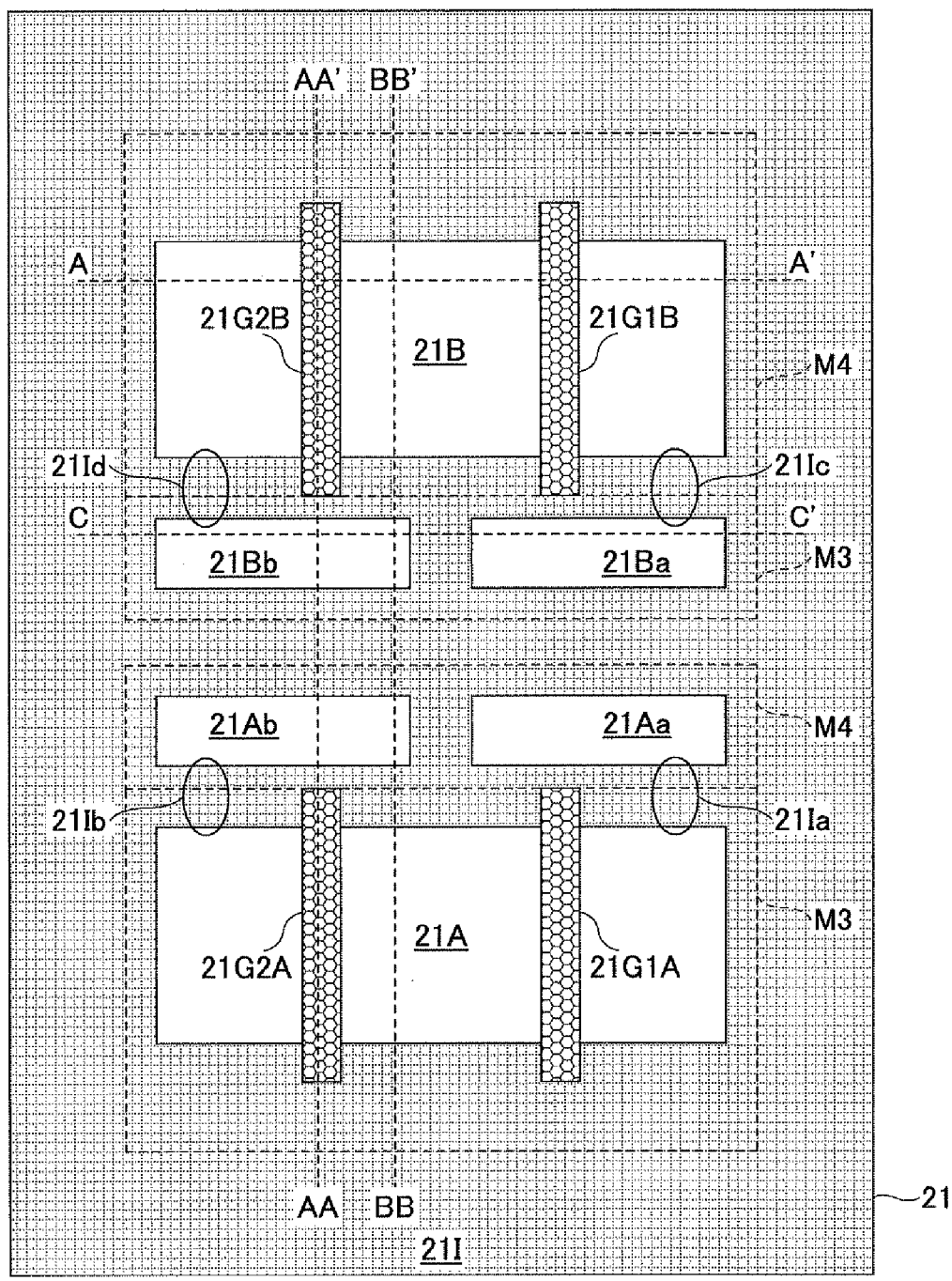
FIG. 31A is a plan view of a silicon bulk substrate used to describe a method of producing a semiconductor integrated circuit according to the first embodiment.
Figure 31B:
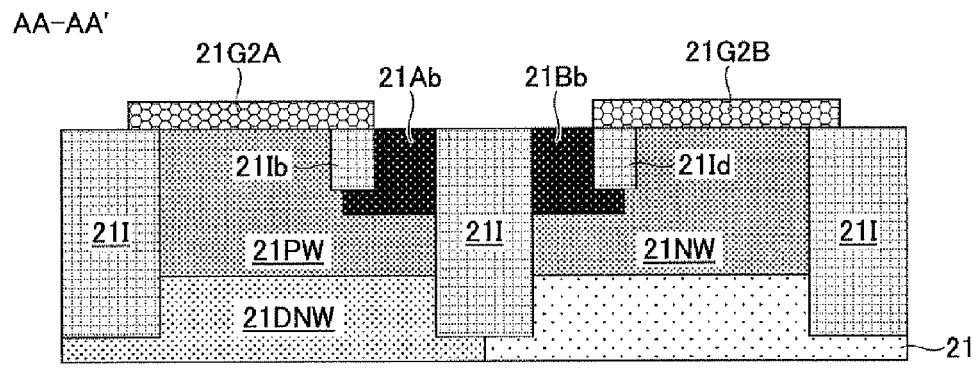
FIG. 31B is a cross-sectional view of the silicon bulk substrate of FIG. 31A taken along line AA-AA'.
Figure 31C:
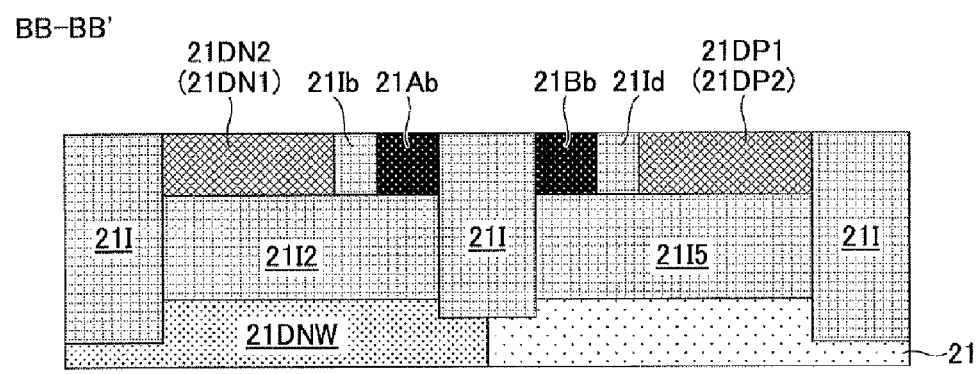
FIG. 31C is a cross-sectional view of the silicon bulk substrate of FIG. 31A taken along line BB-BB'.
Figure 31D:
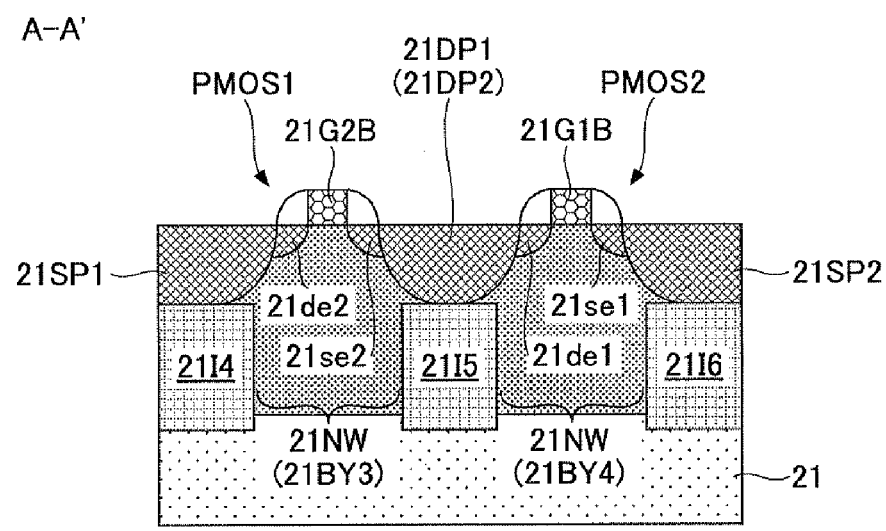
FIG. 31D is a cross-sectional view of the silicon bulk substrate of FIG. 31A taken along line A-A'.
Figure 31E:
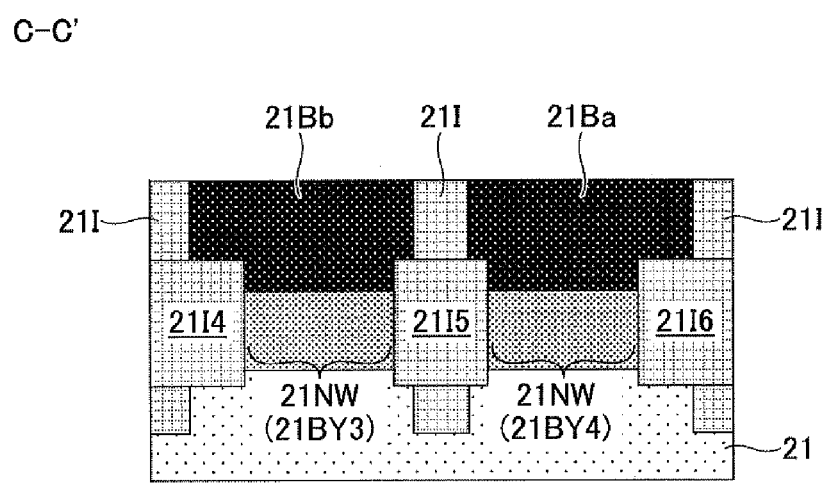
FIG. 31E is a cross-sectional view of the silicon bulk substrate of FIG. 31A taken along line C-C'.

FIG. 31A is a plan view of the silicon bulk substrate 21, FIG. 31B is a cross-sectional view of the silicon bulk substrate 21 of FIG. 31A taken along line AA-AA', FIG. 31C is a cross-sectional view of the silicon bulk substrate 21 of FIG. 31A taken along line BB-BB', FIG. 31D is a cross-sectional view of the silicon bulk substrate 21 of FIG. 31A taken along line A-A', and FIG. 31E is a cross-sectional view of the silicon bulk substrate 21 of FIG. 31A taken along line C-C'.

In the steps illustrated by FIGS. 31A through 31E, polysilicon patterns 21G1A and 21G2A corresponding to the polysilicon patterns 21G1 and 21G2 are formed on the element region 21A via the corresponding gate insulating films 22OX1 and 22OX2 (not shown). Also, polysilicon patterns 21G1B and 21G2B corresponding to the polysilicon patterns 21G1 and 21G2 are formed on the element region 21B via the corresponding gate insulating films 22OX3 and 22OX4 (not shown).

Also in the steps illustrated by FIGS. 31A through 31E, an n-type impurity element is ion-implanted in high concentration into the element region 21A and the contact regions 21Ba and 21Bb using a mask M3 to form the diffusion regions 21DN1, 21SN1, 21DN2, and 21SN2 corresponding to the source regions and the drain regions of the n-channel Dt-MOS transistors NMOS1 and NMOS2 and the contact regions 21Ba and 21Bb that are n+ doped. For example, phosphorus (P) is ion-implanted under an acceleration voltage of 8 keV with a dose amount of $1 \times 10^{16}$ cm$^{-2}$.

Further in the steps illustrated by FIGS. 31A through 31E, a p-type impurity element is ion-implanted in high concentration into the element region 21B and the contact regions 21Aa and 21Ab using a mask M4 to form the diffusion regions 21DP1, 21SP1, 21DP2, and 21SP2 corresponding to the source regions and the drain regions of the p-channel Dt-MOS transistors PMOS1 and PMOS2 and the contact regions 21Aa and 21Ab that are p+-doped. For example, boron (B) is ion-implanted under an acceleration voltage of 5 keV with a dose amount of $2 \times 10^{15}$ cm$^{-2}$.

As illustrated in FIG. 31D, a p-type source extension region 21se1 and a p-type drain extension region 21de1 are formed on the corresponding sides of a gate electrode implemented by the polysilicon pattern 21G1B, and a p-type source extension region 21se2 and a p-type drain extension region 21de2 are formed on the corresponding sides of a gate electrode implemented by the polysilicon pattern 21G2B. The extension regions are formed by ion-implanting a p-type impurity element using the polysilicon patterns 21G1B and 21G2B as self-aligning masks. The above described ion-implantation step for forming the diffusion regions 21DN1, 21SN1, 21DN2, and 21SN2 is performed using the polysilicon patterns 21G1B and 21G2B and their side wall insulating films as masks after forming the source and drain extension regions 21se1, 21de1, 21se2, and 21de2. Similarly, n-type source extension regions and n-type drain extension regions are also formed in the element region 21A. For example, the p-type source extension regions and the p-type drain extension regions may be formed by ion-implanting boron (B) under an acceleration voltage of 0.3 keV with a dose amount of $1 \times 10^{15}$ cm$^{-3}$; and the n-type source extension regions and the n-type drain extension regions may be formed by ion-implanting arsenic (As) under an acceleration voltage of 1 keV with a dose amount of $1 \times 10^{15}$ cm$^{-3}$.

Pocket implantation regions may also be formed in the steps of FIGS. 31A through 31D. For example, pocket implantation regions for the n-channel Dt-MOS transistors NMOS1 and NMOS2 may be formed by diagonal ion-implantation of boron (B) under an acceleration voltage of 7 keV with a dose amount of $1 \times 10^{14}$ cm$^{-2}$; and pocket implantation regions for the p-channel Dt-MOS transistors PMOS1 and PMOS2 may be formed by diagonal ion-implantation of arsenic (As) under an acceleration voltage of 40 keV with a dose amount of $1 \times 10^{13}$ cm$^{-2}$.

Further in the steps of FIGS. 31A through 31E, a silicide film (not shown) is formed on exposed silicon surfaces by the SALICIDE method.

Figure 32A:
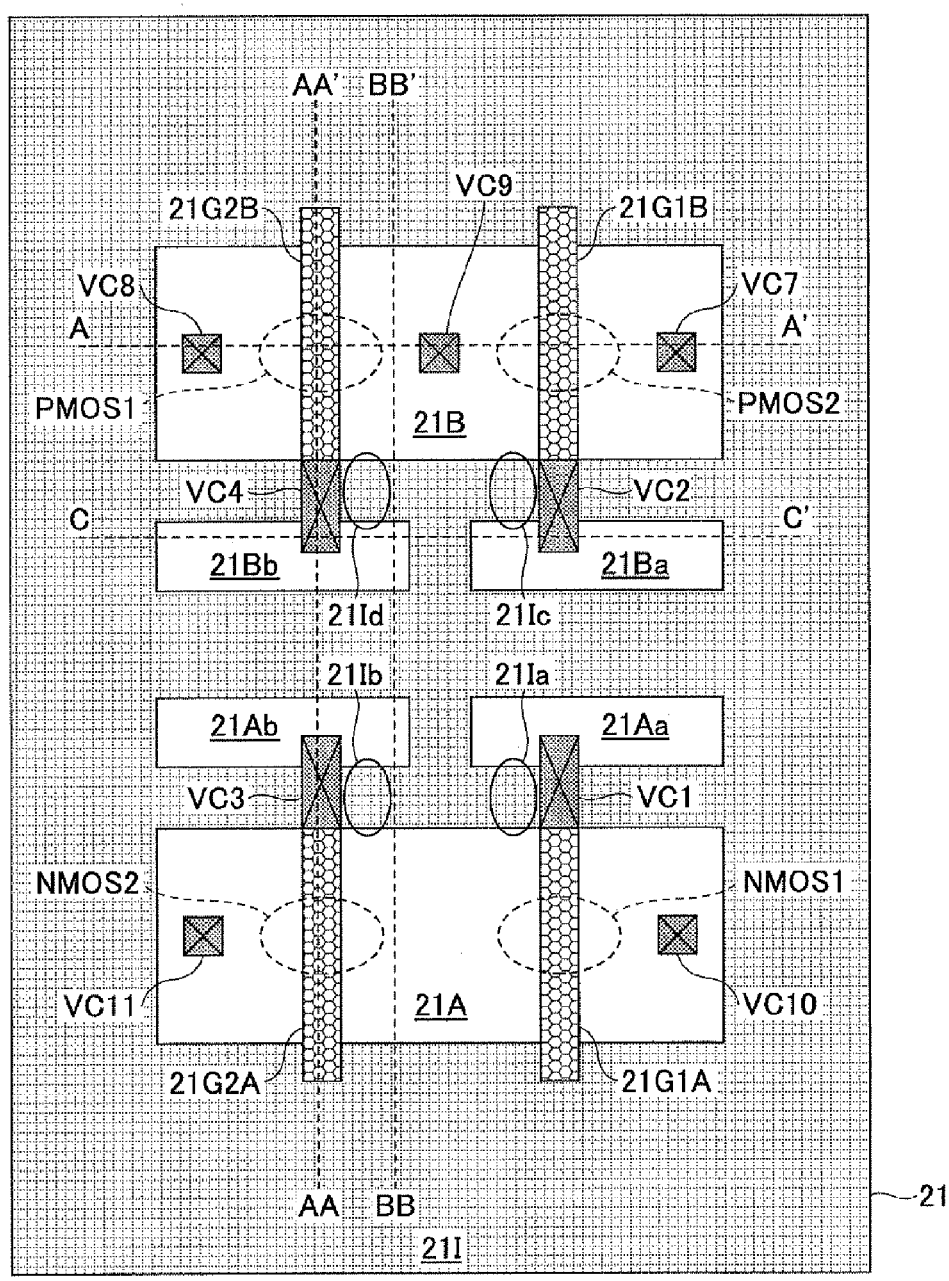
FIG. 32A is a plan view of a silicon bulk substrate used to describe a method of producing a semiconductor integrated circuit according to the first embodiment.
Figure 32B:
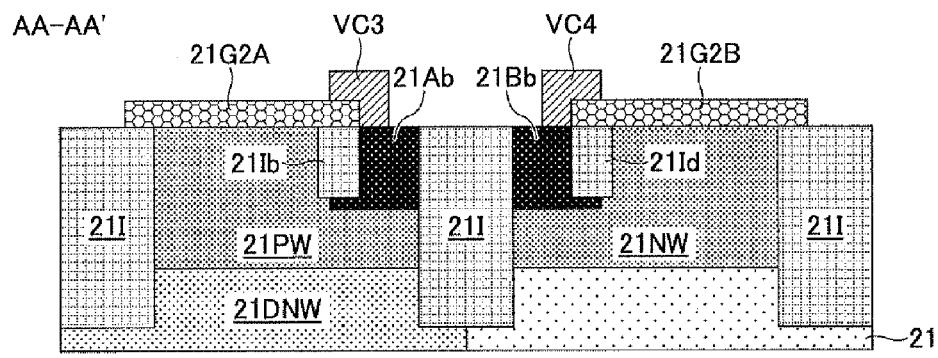
FIG. 32B is a cross-sectional view of the silicon bulk substrate of FIG. 32A taken along line AA-AA'.
Figure 32C:
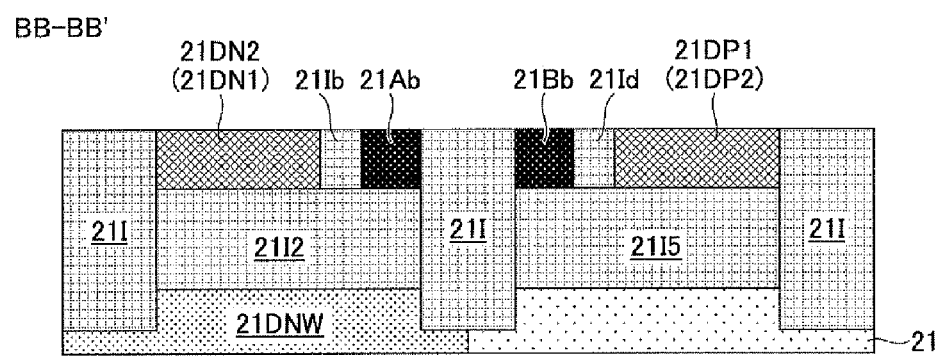
FIG. 32C is a cross-sectional view of the silicon bulk substrate of FIG. 32A taken along line BB-BB'.
Figure 32D:
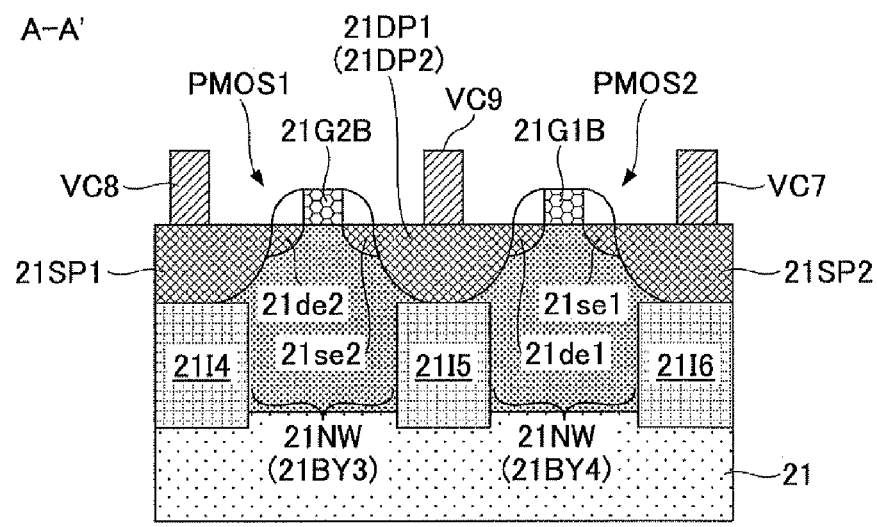
FIG. 32D is a cross-sectional view of the silicon bulk substrate of FIG. 32A taken along line A-A'.
Figure 32E:
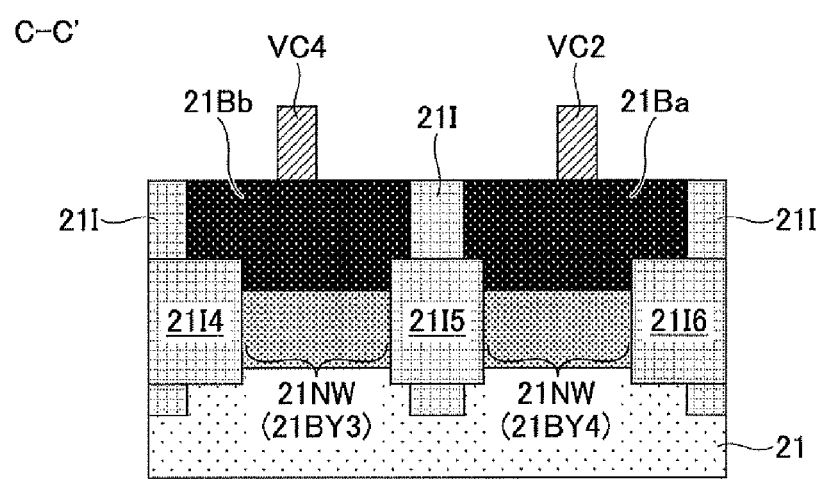
FIG. 32E is a cross-sectional view of the silicon bulk substrate of FIG. 32A taken along line C-C'.

FIG. 32A is a plan view of the silicon bulk substrate 21, FIG. 32B is a cross-sectional view of the silicon bulk substrate 21 of FIG. 32A taken along line AA-AA', FIG. 32C is a cross-sectional view of the silicon bulk substrate 21 of FIG. 32A taken along line BB-BB', FIG. 32D is a cross-sectional view of the silicon bulk substrate 21 of FIG. 32A taken along line A-A', and FIG. 32E is a cross-sectional view of the silicon bulk substrate 21 of FIG. 32A taken along line C-C'.

In the steps illustrated by FIGS. 32A through 32E, the via contacts VC1 through VC11 and the wiring patters PW1, PW2, GD1, and WP (not shown) are formed. As a result, a 2-input NAND circuit having a configuration similar to that of the 2-input NAND circuit 20 illustrated in FIG. 4 is obtained. The via contact VC1 is a shared contact for connecting the polysilicon pattern 21G1A and the contact region 21Aa, the via contact VC3 is a shared contact for connecting the polysilicon pattern 21G2A and the contact region 21Ab, the via contact VC2 is a shared contact for connecting the polysilicon pattern 21G1B and the contact region 21Ba, and the via contact VC4 is a shared contact for connecting the polysilicon pattern 21G2B and the contact region 21Bb. The polysilicon pattern 21G1A forms the gate electrode of the n-channel Dt-MOS transistor NMOS1, the polysilicon pattern 21G2A forms the gate electrode of the n-channel Dt-MOS transistor NMOS2, the polysilicon pattern 21G1B forms the gate electrode of the p-channel Dt-MOS transistor PMOS2, and the polysilicon pattern 21G2B forms the gate electrode of the p-channel Dt-MOS transistor PMOS1.

In the method of producing the 2-input NAND circuit described with reference to FIGS. 18A through 32E, the contact regions 21Aa, 21Ab, 21Ba, and 21Bb are formed at once using the silicon nitride mask patterns 31C, 31D, 31Ea, 31Eb, 31Ec, and 31Ed formed in the steps of FIGS. 22A through 22D.

Here, since the silicon nitride mask patterns 31C, 31D, 31Ea, 31Eb, 31Ec, and 31Ed are formed by photolithography using the same photomask, a positional error between the element region 21A and the contact regions 21Aa and 21Ab and a positional error between the element region 21B and the contact regions 21Ba and 21Bb can be effectively prevented. Therefore, although the ion implantation described with reference to FIGS. 31A through 31E is performed in two separate steps using two masks M3 and M4, it is not necessary to set the distance between the element region 21A and the contact regions 21Aa and 21Ab and the distance between the element region 21B and the contact regions 21Ba and 21Bb at values that are greater than necessary. This in turn makes it possible to set the width of the element isolation sub-regions 21Ia through 21Id at the minimum value, e.g., 0.11 μm, allowed by the design rules, and thereby makes it possible to prevent an increase in the area of the semiconductor logic circuit 20 including the Dt-MOS transistors NMOS1, NMOS2, PMOS1, and PMOS2.

Meanwhile, in the comparative example illustrated in FIG. 17B, the element isolation sub-regions 21Ia through 21Id in FIG. 32A are omitted. With this configuration, the p+ type contact region 21Aa is isolated from the n+ type regions of the element region 21A on both sides of the polysilicon pattern 21G1A by the pn junction; the p+ type contact region 21Ab is isolated from the n+ type regions of the element region 21A on both sides of the polysilicon pattern 21G2A by the pn junction; the n+ type contact region 21Ba is isolated from the p+ type regions of the element region 21B on both sides of the polysilicon pattern 21G1B by the pn junction; and the n+ type contact region 21Bb is isolated from the p+ type regions of the element region 21B on both sides of the polysilicon pattern 21G2B by the pn junction. When the pn junction is used for element isolation as in the comparative example, it is necessary to set the width of regions corresponding to the element isolation sub-regions 21Ia through 21Id in FIG. 32 taking into account the breakdown voltage of the pn junction and an error in the position of the ion implantation masks M3 and M4. For example, it is necessary to set the width of the regions corresponding to the element isolation sub-regions 21Ia through 21Id at 0.44 μm or greater. Thus, compared with the comparative example, this embodiment makes it possible to greatly reduce the area of a semiconductor integrated circuit.

Although not illustrated in FIGS. 32A through 32E, similar to FIG. 6, the lower end of the drain region 21DN1 of the n-channel Dt-MOS transistor NMOS1 is in contact with the upper end of the insulating region 21I1, the lower ends of the source region 21SN1 of the n-channel Dt-MOS transistor NMOS1 and the drain region 21DN2 of the n-channel Dt-MOS transistor NMOS2 are in contact with the upper end of the insulating region 21I2, and the lower end of the source region 21SN2 of the n-channel Dt-MOS transistor NMOS2 is in contact with the upper end of the insulating region 21I3.

Also, as illustrated in FIG. 32D, the lower end of the source region 21SP1 of the p-channel Dt-MOS transistor PMOS1 is in contact with the upper end of the insulating region 21I4, the lower ends of the drain region 21DP1 of the p-channel Dt-MOS transistor PMOS1 and the drain region 21DP2 of the p-channel Dt-MOS transistor PMOS2 are in contact with the upper end of the insulating region 21I5, and the lower end of the source region 21SP2 of the p-channel Dt-MOS transistor PMOS2 is in contact with the upper end of the insulating region 21I6.

This configuration makes it possible to greatly reduce the parasitic capacitance associated with the source regions and the drain regions of Dt-MOS transistors and thereby makes it possible to increase the operating speed of the Dt-MOS transistors.

The diffusion regions forming the source regions and the drain regions in the above descriptions may provide opposite functions depending on required operations of an actual circuit.

<Second Embodiment>

An exemplary method of producing a Dt-MOS transistor integrated circuit according to a second embodiment is described below. A Dt-MOS transistor integrated circuit used in the descriptions below has substantially the same configuration as that illustrated in FIG. 4 except that the contact region 21Aa of the n-channel Dt-MOS transistor NMOS1 is disposed to face the contact region 21Ba of the p-channel Dt-MOS transistor PMOS2, and the contact region 21Ab of the n-channel Dt-MOS transistor NMOS2 is disposed to face the contact region 21Bb of the p-channel Dt-MOS transistor PMOS1.

Figure 33A:
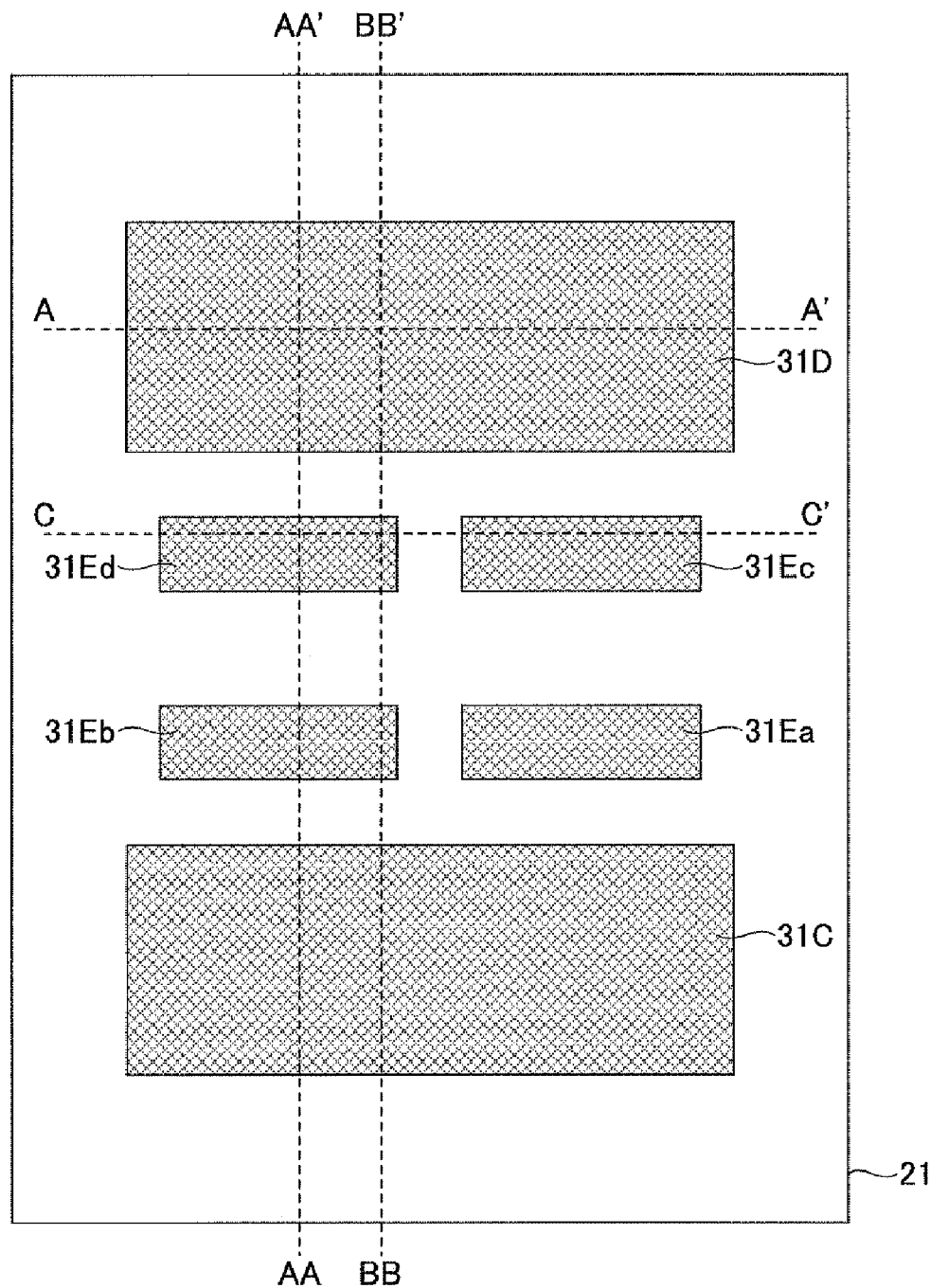
FIG. 33A is a plan view of a silicon bulk substrate used to describe a method of producing a semiconductor integrated circuit according to a second embodiment.
Figure 33B:
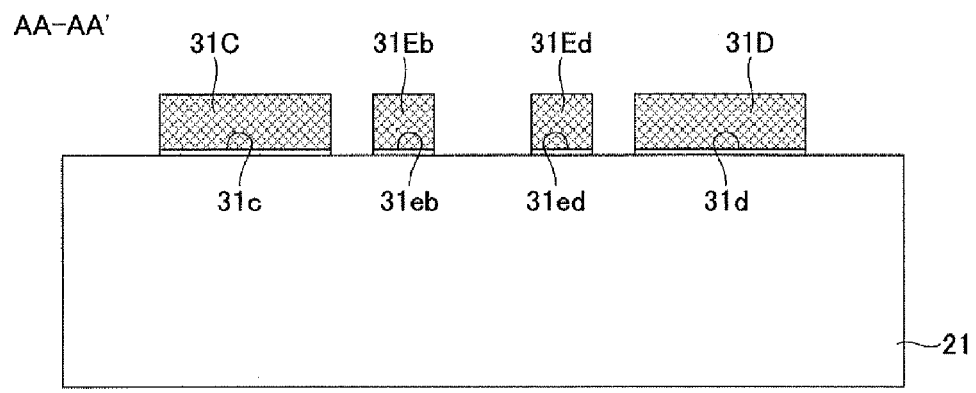
FIG. 33B is a cross-sectional view of the silicon bulk substrate of FIG. 33A taken along line AA-AA'.
Figure 33C:
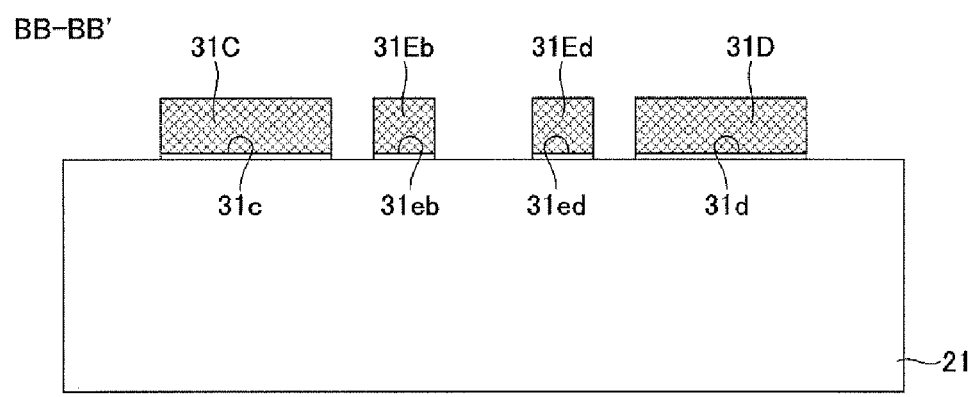
FIG. 33C is a cross-sectional view of the silicon bulk substrate of FIG. 33A taken along line BB-BB'.
Figure 33D:
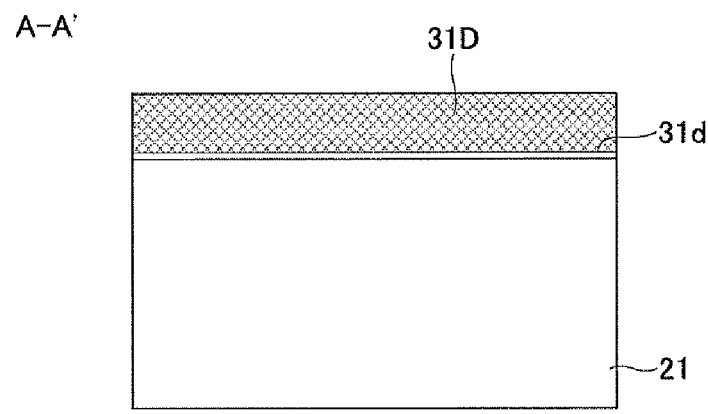
FIG. 33D is a cross-sectional view of the silicon bulk substrate of FIG. 33A taken along line A-A'.
Figure 33E:
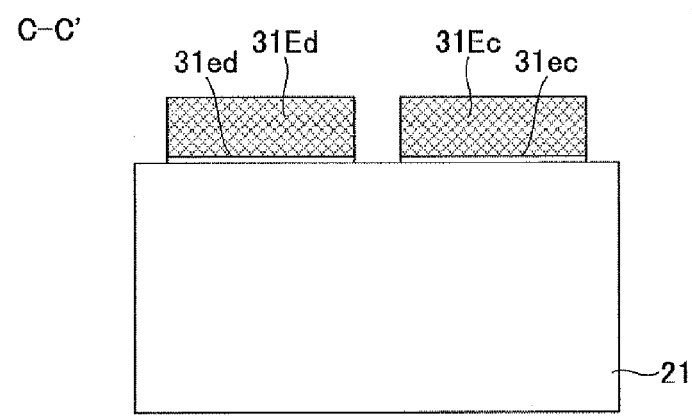
FIG. 33E is a cross-sectional view of the silicon bulk substrate of FIG. 33A taken along line C-C'.

FIG. 33A is a plan view of the silicon bulk substrate 21, FIG. 33B is a cross-sectional view of the silicon bulk substrate 21 of FIG. 33A taken along line AA-AA', FIG. 33C is a cross-sectional view of the silicon bulk substrate 21 of FIG. 33A taken along line BB-BB', FIG. 33D is a cross-sectional view of the silicon bulk substrate 21 of FIG. 33A taken along line A-A', and FIG. 33E is a cross-sectional view of the silicon bulk substrate 21 of FIG. 33A taken along line C-C'.

In the steps illustrated by FIG. 33A through 33E, silicon nitride mask patterns 31C, 31D, 31Ea, 31Eb, 31Ec, and 31Ed similar to those of FIGS. 22A through 22E are formed on the silicon bulk substrate 21. The silicon nitride mask pattern 31C is formed in a position corresponding to the element region 21A for the n-channel Dt-MOS transistors NMOS1 and NMOS2. The silicon nitride mask pattern 31D is formed in a position corresponding to the element region 21B for the p-channel Dt-MOS transistors PMOS1 and PMOS2. The silicon nitride mask patterns 31Ea, 31Eb, 31Ec, and 31Ed are formed in positions corresponding to the contact regions 21Aa, 21Ab, 21Ba, and 21Bb. In FIGS. 33A through 33E, however, no structure has been formed in the silicon bulk substrate 21. As in FIGS. 22A through 22E, pad oxide films 31c, 31d, 31ea, 31eb, 31ec, and 31ed made of thermally-oxidized films are formed between the silicon bulk substrate 21 and the corresponding silicon nitride mask patterns 31C, 31D, 31Ea, 31Eb, 31Ec, and 31Ed. In the drawings used in the descriptions below, the pad oxide films are omitted for brevity.

Figure 34A:
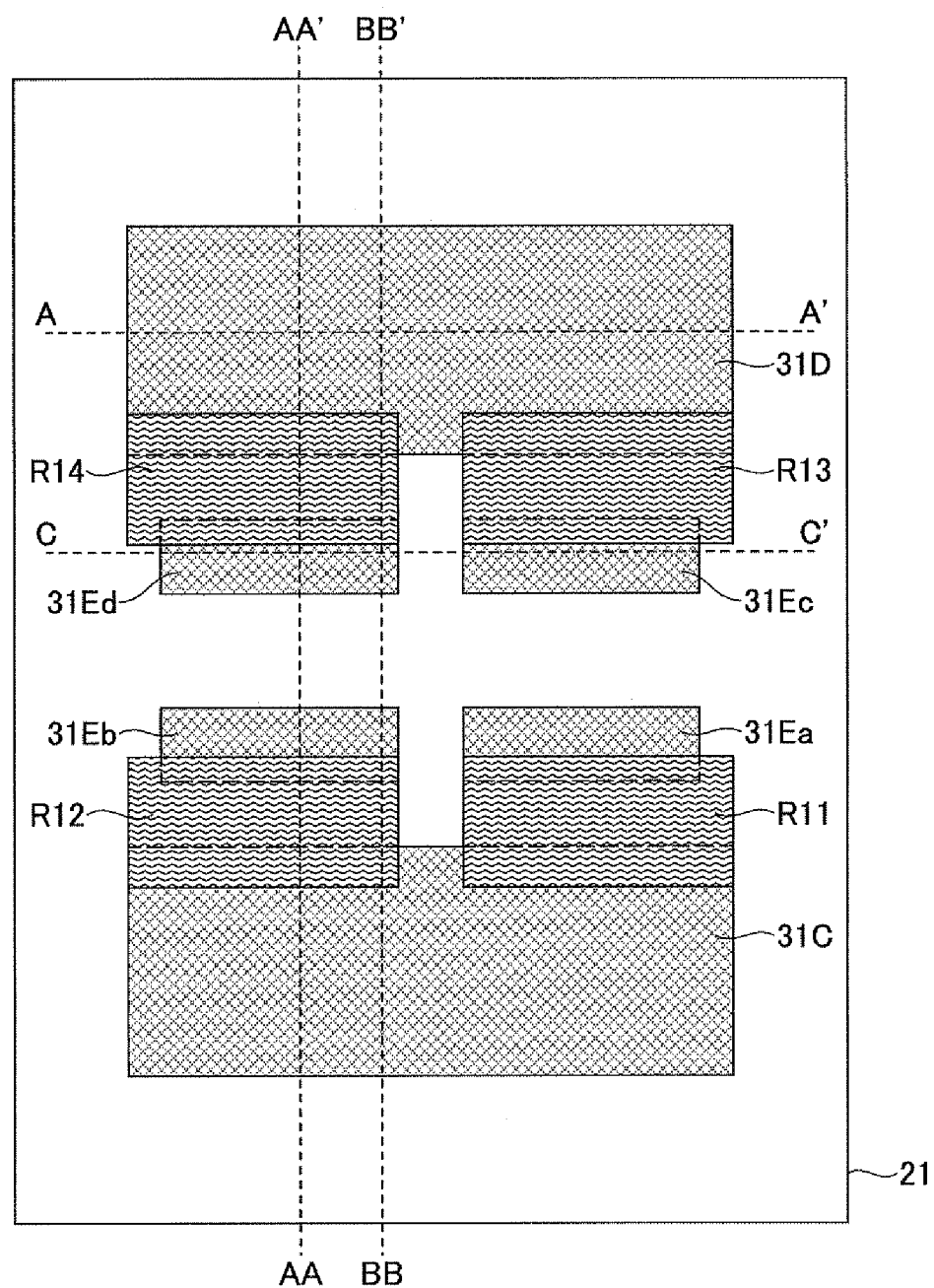
FIG. 34A is a plan view of a silicon bulk substrate used to describe a method of producing a semiconductor integrated circuit according to the second embodiment.
Figure 34B:
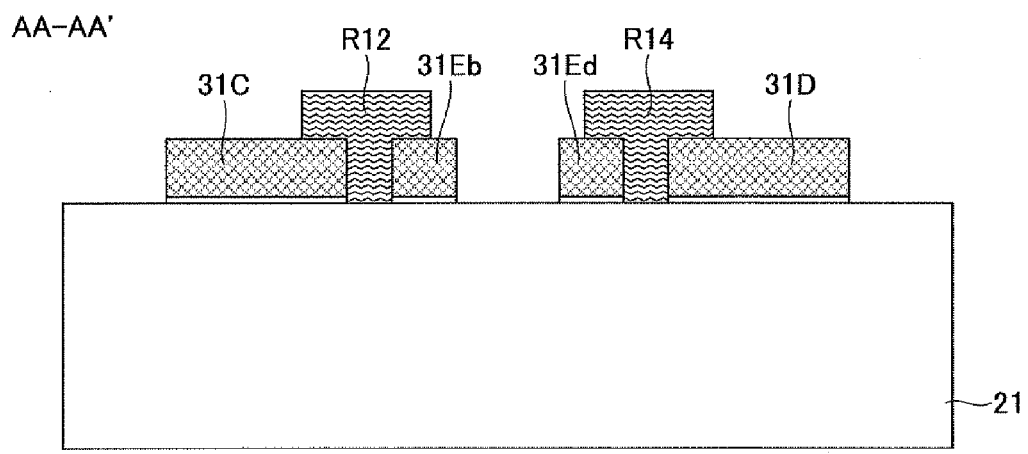
FIG. 34B is a cross-sectional view of the silicon bulk substrate of FIG. 34A taken along line AA-AA'.
Figure 34C:
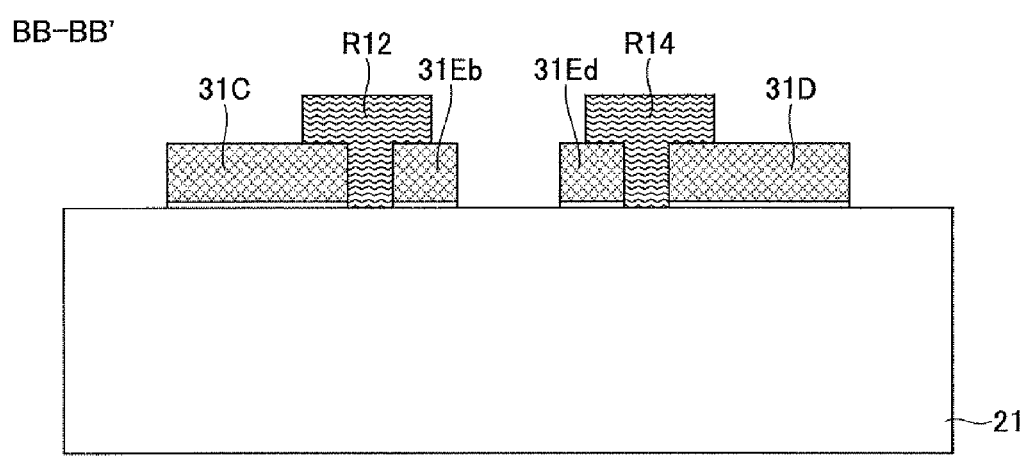
FIG. 34C is a cross-sectional view of the silicon bulk substrate of FIG. 34A taken along line BB-BB'.
Figure 34D:
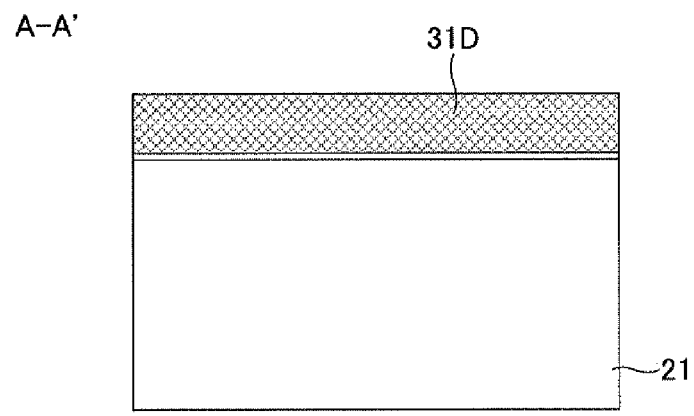
FIG. 34D is a cross-sectional view of the silicon bulk substrate of FIG. 34A taken along line A-A'.
Figure 34E:
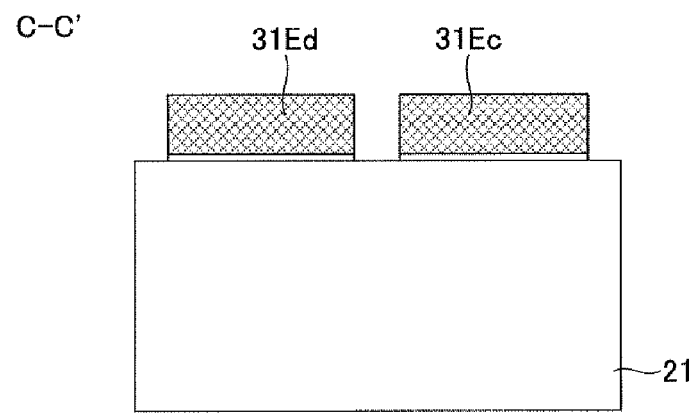
FIG. 34E is a cross-sectional view of the silicon bulk substrate of FIG. 34A taken along line C-C'.

FIG. 34A is a plan view of the silicon bulk substrate 21, FIG. 34B is a cross-sectional view of the silicon bulk substrate 21 of FIG. 34A taken along line AA-AA', FIG. 34C is a cross-sectional view of the silicon bulk substrate 21 of FIG. 34A taken along line BB-BB', FIG. 34D is a cross-sectional view of the silicon bulk substrate 21 of FIG. 34A taken along line A-A', and FIG. 34E is a cross-sectional view of the silicon bulk substrate 21 of FIG. 34A taken along line C-C'.

In the steps illustrated by FIGS. 34A through 34E, a resist pattern R11 is formed to cover the surface of the silicon bulk substrate 21 between the silicon nitride mask patterns 31C and 31Ea, a resist pattern R12 is formed to cover the surface of the silicon bulk substrate 21 between the silicon nitride mask patterns 31C and 31Eb, a resist pattern R13 is formed to cover the surface of the silicon bulk substrate 21 between the silicon nitride mask patterns 31D and 31Ec, and a resist pattern R14 is formed to cover the surface of the silicon bulk substrate 21 between the silicon nitride mask patterns 31D and 31Ed.

Figure 35A:
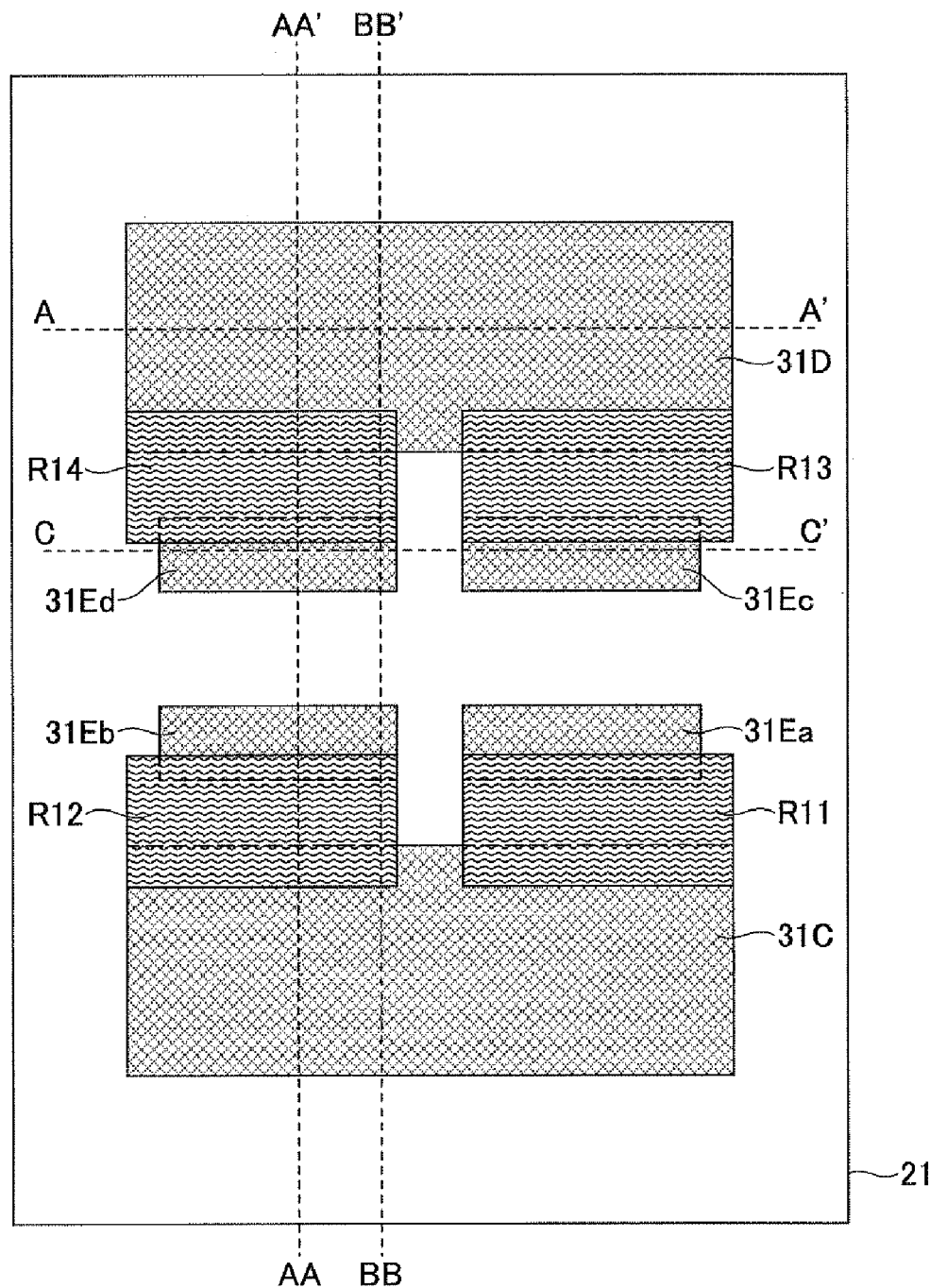
FIG. 35A is a plan view of a silicon bulk substrate used to describe a method of producing a semiconductor integrated circuit according to the second embodiment.
Figure 35B:
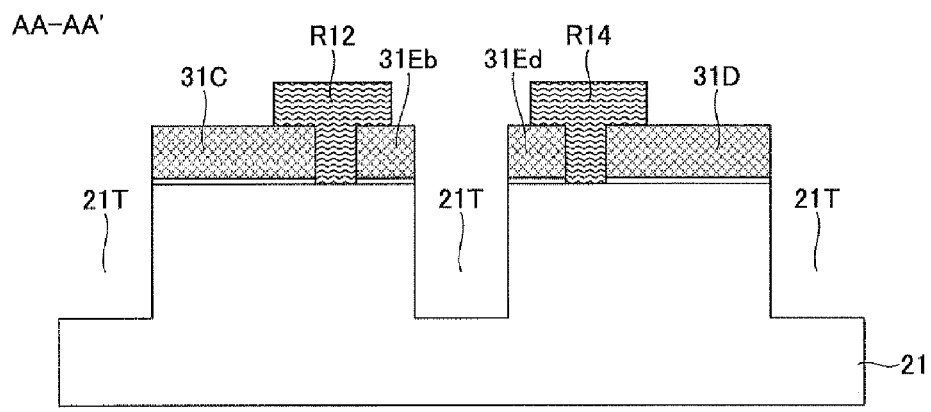
FIG. 35B is a cross-sectional view of the silicon bulk substrate of FIG. 35A taken along line AA-AA'.
Figure 35C:
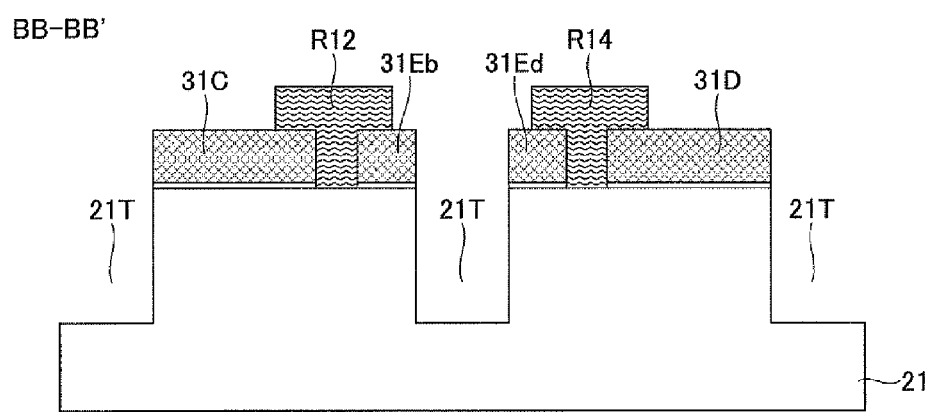
FIG. 35C is a cross-sectional view of the silicon bulk substrate of FIG. 35A taken along line BB-BB'.
Figure 35D:
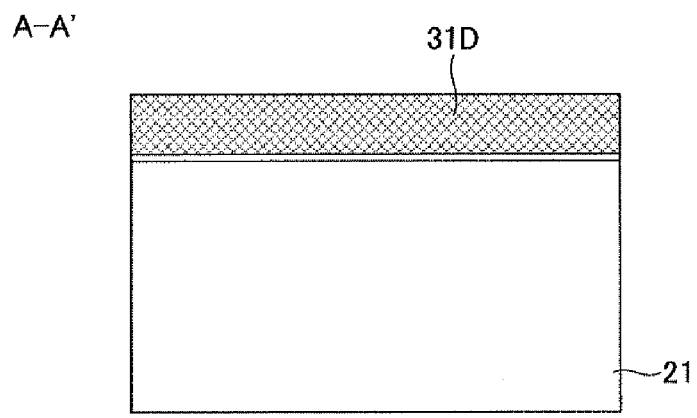
FIG. 35D is a cross-sectional view of the silicon bulk substrate of FIG. 35A taken along line A-A'.
Figure 35E:
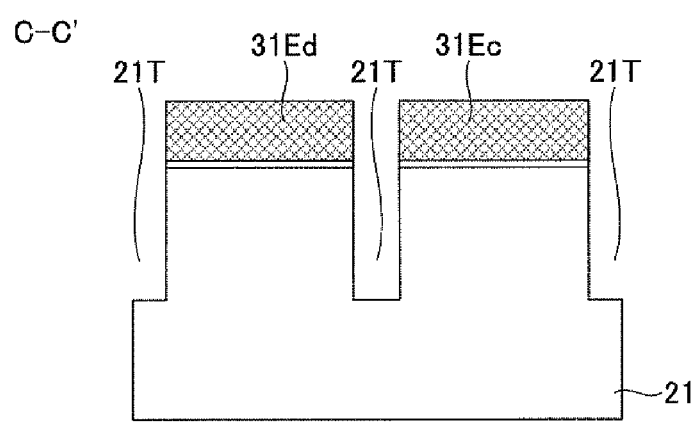
FIG. 35E is a cross-sectional view of the silicon bulk substrate of FIG. 35A taken along line C-C'.

FIG. 35A is a plan view of the silicon bulk substrate 21, FIG. 35B is a cross-sectional view of the silicon bulk substrate 21 of FIG. 35A taken along line AA-AA', FIG. 35C is a cross-sectional view of the silicon bulk substrate 21 of FIG. 35A taken along line BB-BB', FIG. 35D is a cross-sectional view of the silicon bulk substrate 21 of FIG. 35A taken along line A-A', and FIG. 35E is a cross-sectional view of the silicon bulk substrate 21 of FIG. 35A taken along line C-C'.

In the steps illustrated by FIGS. 35A through 35E, the silicon bulk substrate 21 is etched by dry etching using the silicon nitride mask patterns 31C, 31D, 31Ea, 31Eb, 31Ec, and 31Ed and the resist patterns R11 through R14 in a manner similar to the steps illustrated by FIGS. 19A through 19D. For the dry etching, a mixed gas of $Cl_2$ and $H_2$ or an HCl gas may be used. As a result, element isolation trenches 21T having a depth of, for example, 200 nm and corresponding to the element isolation region 21I are formed in the silicon bulk substrate 21.

Figure 36A:
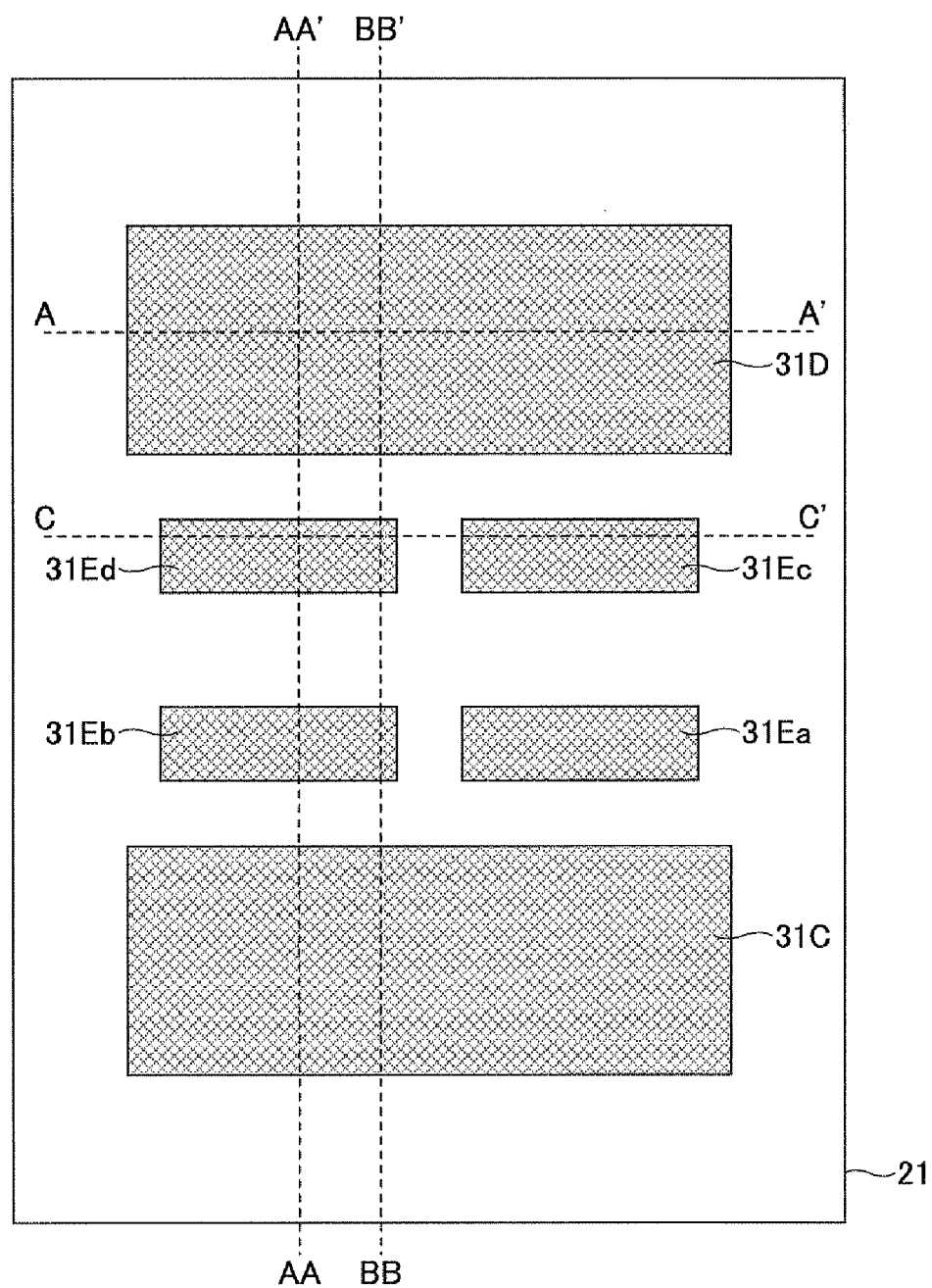
FIG. 36A is a plan view of a silicon bulk substrate used to describe a method of producing a semiconductor integrated circuit according to the second embodiment.
Figure 36B:
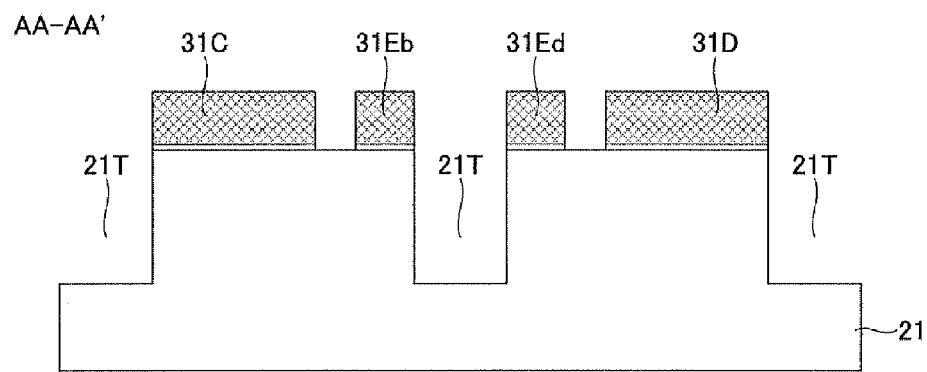
FIG. 36B is a cross-sectional view of the silicon bulk substrate of FIG. 36A taken along line AA-AA'.
Figure 36C:
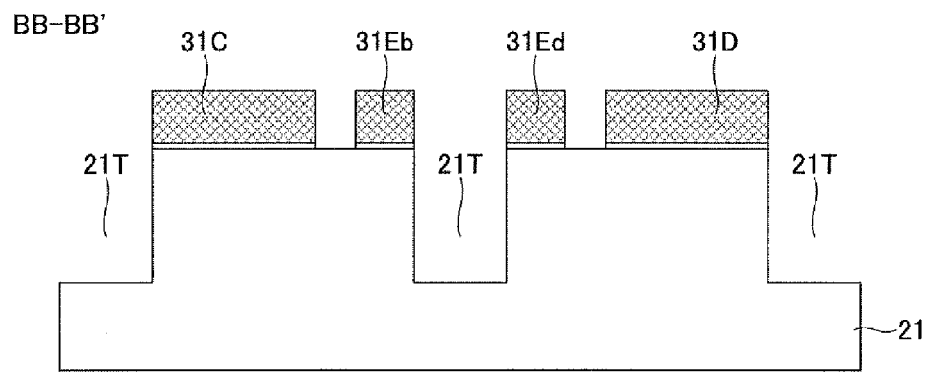
FIG. 36C is a cross-sectional view of the silicon bulk substrate of FIG. 36A taken along line BB-BB'.
Figure 36D:
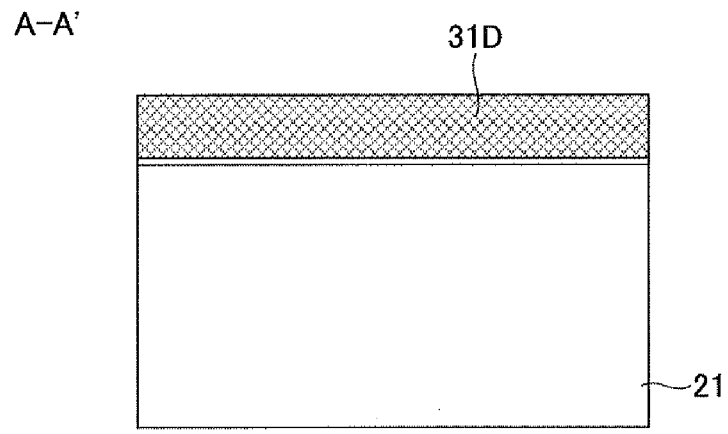
FIG. 36D is a cross-sectional view of the silicon bulk substrate of FIG. 36A taken along line A-A'.
Figure 36E:
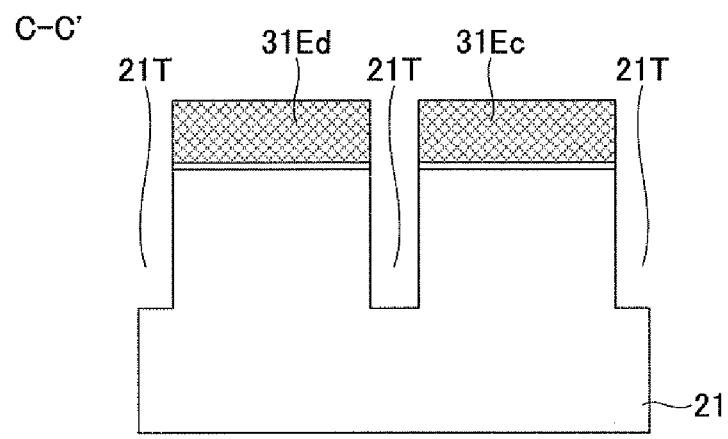
FIG. 36E is a cross-sectional view of the silicon bulk substrate of FIG. 36A taken along line C-C'.

FIG. 36A is a plan view of the silicon bulk substrate 21, FIG. 36B is a cross-sectional view of the silicon bulk substrate 21 of FIG. 36A taken along line AA-AA', FIG. 36C is a cross-sectional view of the silicon bulk substrate 21 of FIG. 36A taken along line BB-BB', FIG. 36D is a cross-sectional view of the silicon bulk substrate 21 of FIG. 36A taken along line A-A', and FIG. 36E is a cross-sectional view of the silicon bulk substrate 21 of FIG. 36A taken along line C-C'.

In the steps illustrated by FIGS. 36A through 36E, the resist patterns R11 through R14 are removed.

Figure 37A:
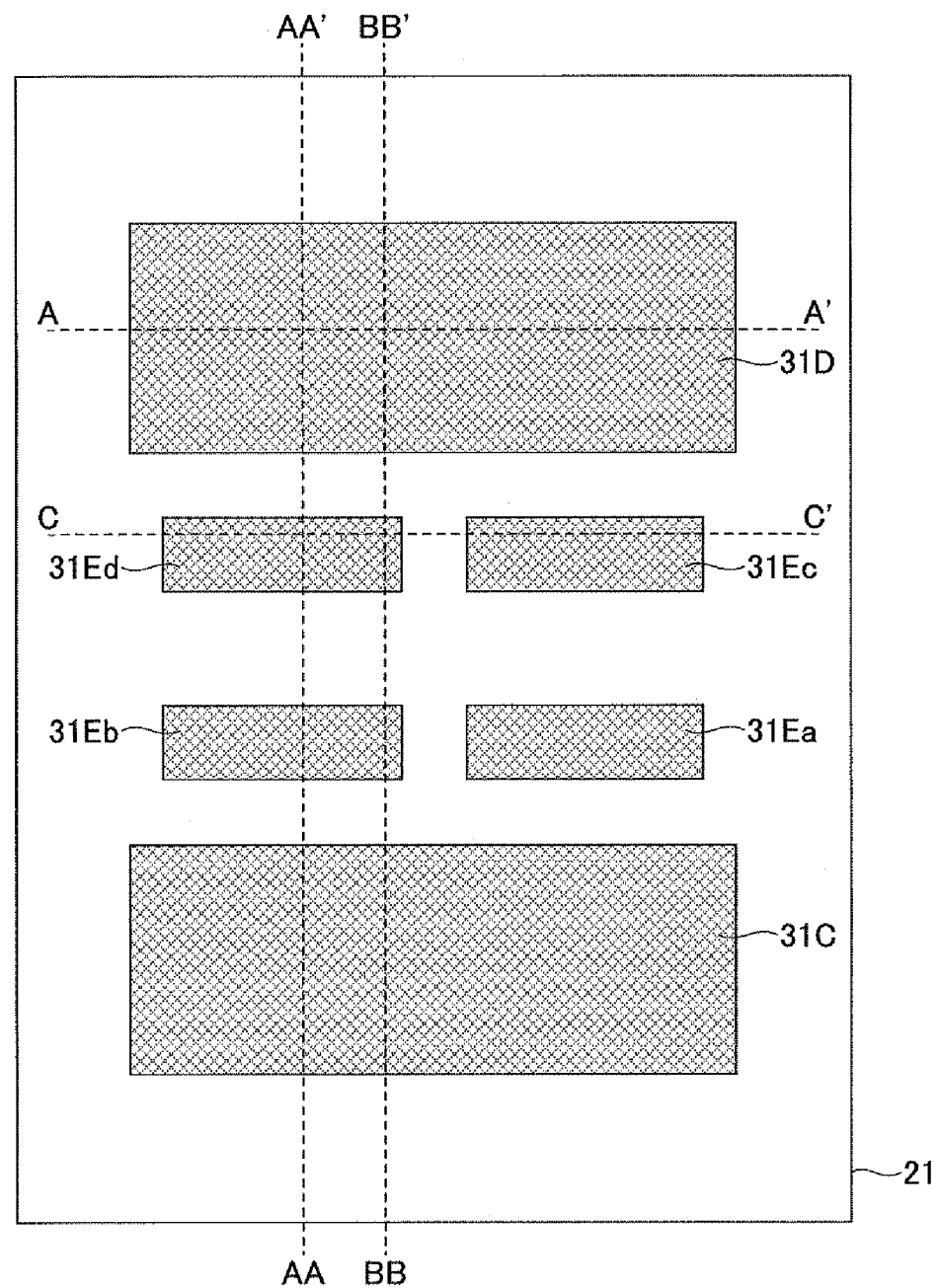
FIG. 37A is a plan view of a silicon bulk substrate used to describe a method of producing a semiconductor integrated circuit according to the second embodiment.
Figure 37B:
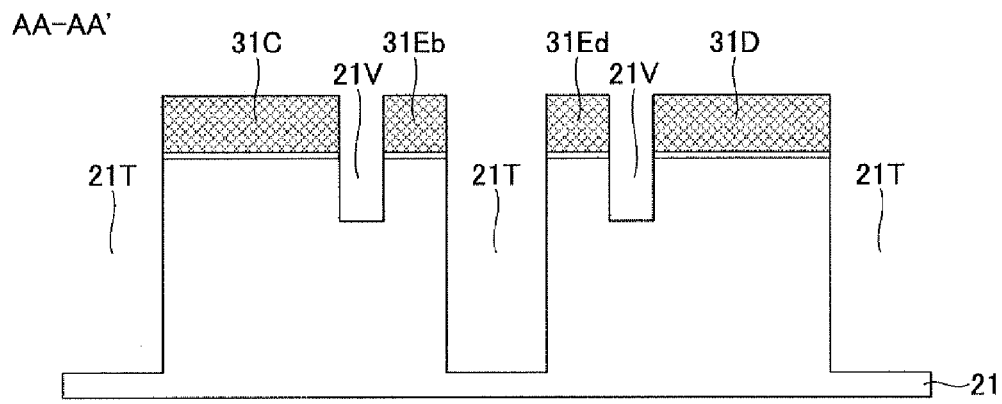
FIG. 37B is a cross-sectional view of the silicon bulk substrate of FIG. 37A taken along line AA-AA'.
Figure 37C:
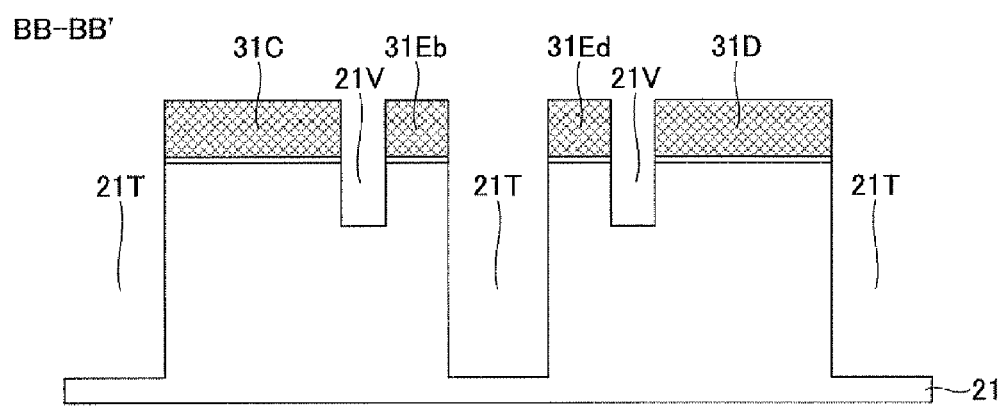
FIG. 37C is a cross-sectional view of the silicon bulk substrate of FIG. 37A taken along line BB-BB'.
Figure 37D:
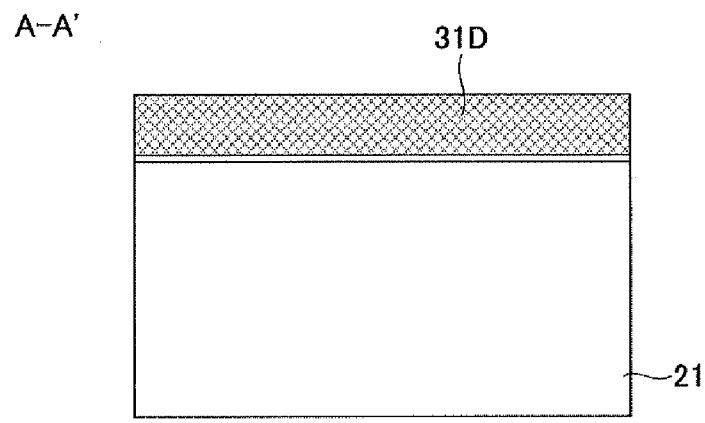
FIG. 37D is a cross-sectional view of the silicon bulk substrate of FIG. 37A taken along line A-A'.
Figure 37E:
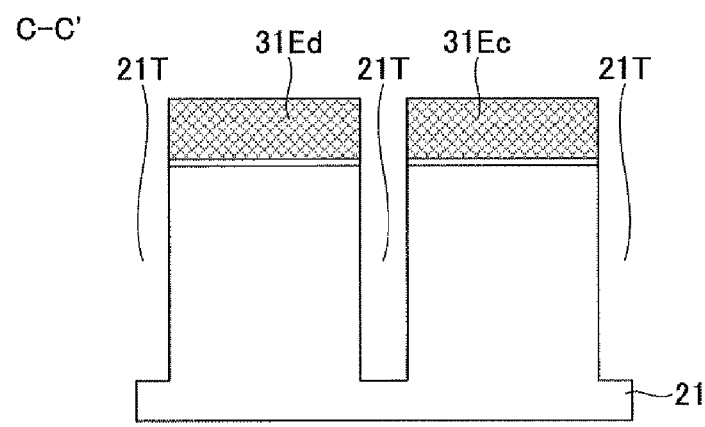
FIG. 37E is a cross-sectional view of the silicon bulk substrate of FIG. 37A taken along line C-C'.

FIG. 37A is a plan view of the silicon bulk substrate 21, FIG. 37B is a cross-sectional view of the silicon bulk substrate 21 of FIG. 37A taken along line AA-AA', FIG. 37C is a cross-sectional view of the silicon bulk substrate 21 of FIG. 37A taken along line BB-BB', FIG. 37D is a cross-sectional view of the silicon bulk substrate 21 of FIG. 37A taken along line A-A', and FIG. 37E is a cross-sectional view of the silicon bulk substrate 21 of FIG. 37A taken along line C-C'.

In the steps illustrated by FIG. 37A through 37E, the silicon bulk substrate 21 is dry-etched again by 40 nm using the silicon nitride mask patterns 31C, 31D, 31Ea, 31Eb, 31Ec, and 31Ed. As a result, the depth of the element isolation trenches 21T increases to 240 nm. Also as a result of the dry etching, shallow trenches 21V with a depth of 40 nm are formed between the silicon nitride mask patterns 31C and 31Eb and between the silicon nitride mask patterns 31Ed and 31D. Similarly, the trenches 21V are also formed between the silicon nitride mask patterns 31C and 31Ea and between the silicon nitride mask patterns 31Ec and 31D. The width of the trenches 21V is, for example, about 0.11 µm.

Figure 38A:
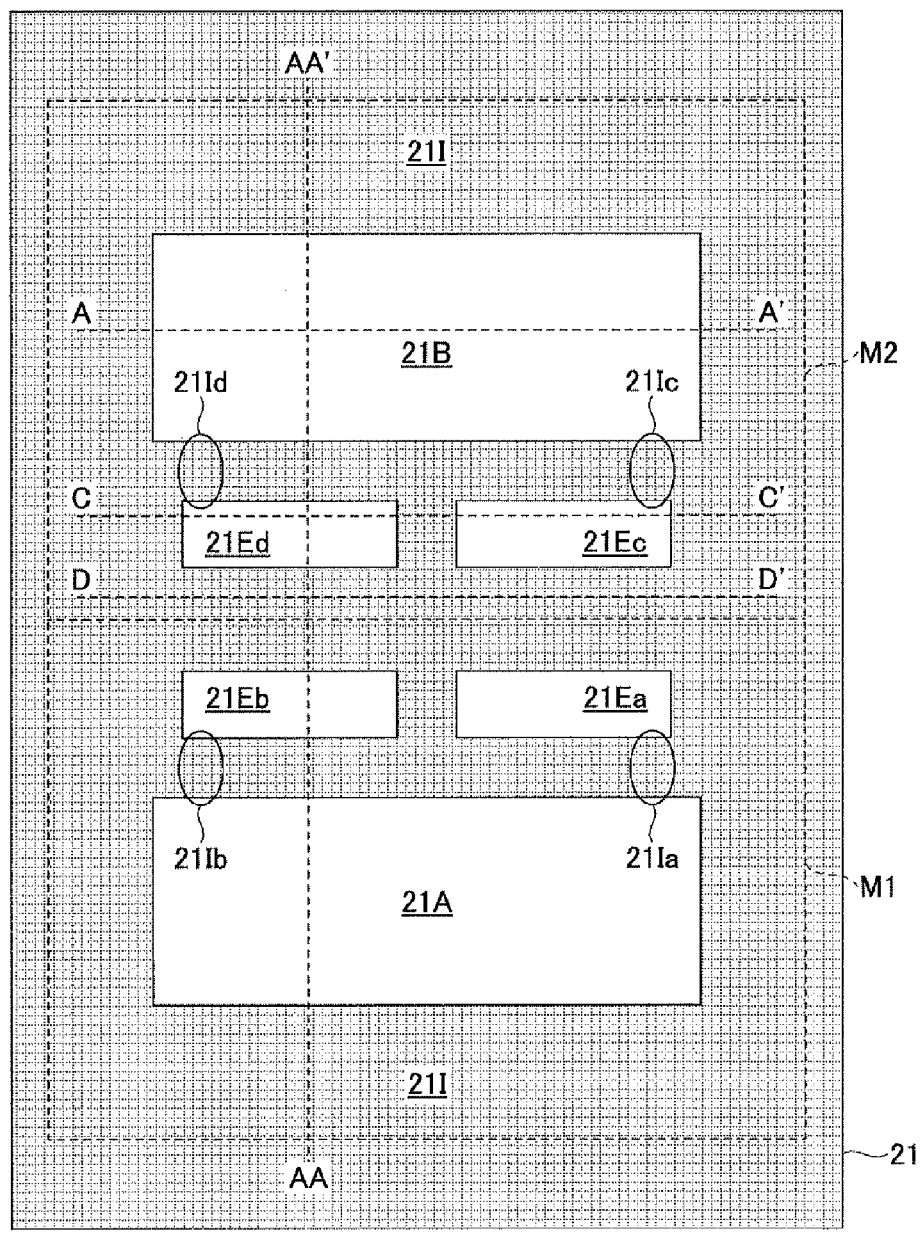
FIG. 38A is a plan view of a silicon bulk substrate used to describe a method of producing a semiconductor integrated circuit according to the second embodiment.
Figure 38B:
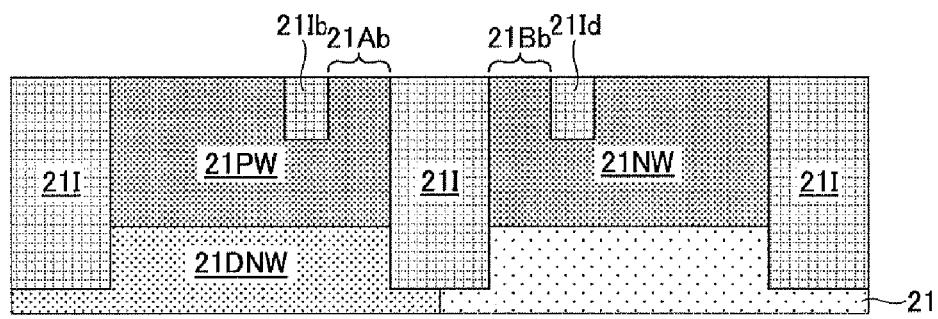
FIG. 38B is a cross-sectional view of the silicon bulk substrate of FIG. 38A taken along line AA-AA'.
Figure 38C:
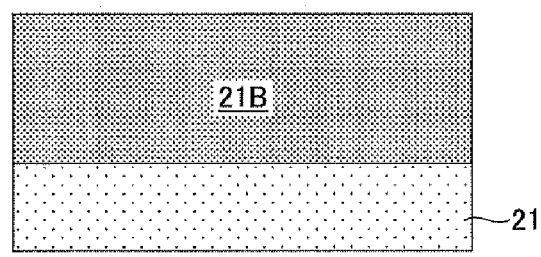
FIG. 38C is a cross-sectional view of the silicon bulk substrate of FIG. 38A taken along line A-A'.
Figure 38D:
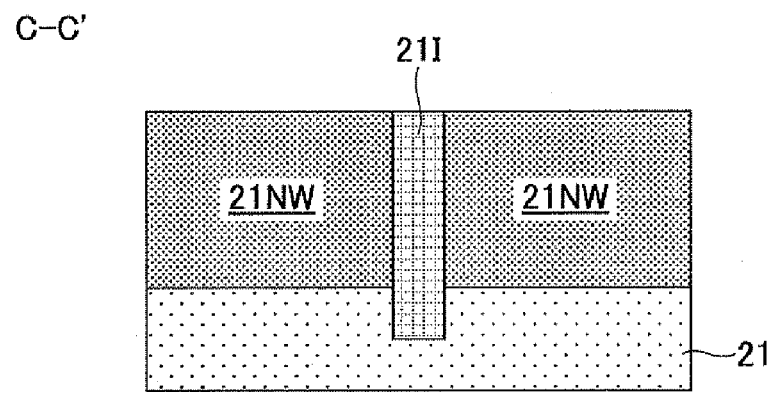
Figure 38E:
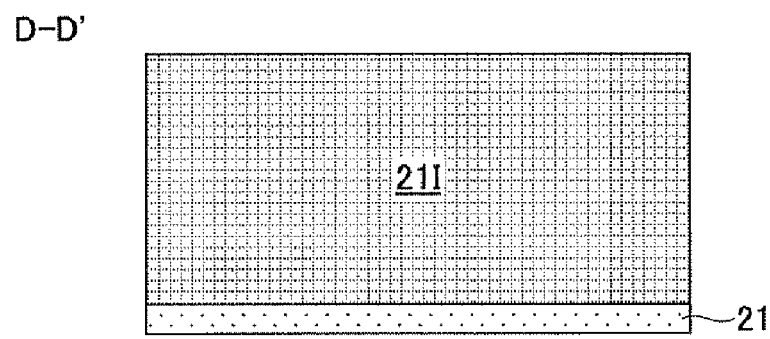

FIG. 38A is a plan view of the silicon bulk substrate 21, FIG. 38B is a cross-sectional view of the silicon bulk substrate 21 of FIG. 38A taken along line AA-AA', FIG. 38C is a cross-sectional view of the silicon bulk substrate 21 of FIG. 38A taken along line A-A', FIG. 38D is a cross-sectional view of the silicon bulk substrate 21 of FIG. 38A taken along line C-C', and FIG. 38E is a cross-sectional view of the silicon bulk substrate 21 of FIG. 38A taken along line D-D'.

In the steps illustrated by FIGS. 38A through 38E, the trenches 21T and 21V are filled with a silicon oxide film deposited by a high-density CVD method, unnecessary parts of the silicon oxide film on the silicon bulk substrate 21 are removed by chemical mechanical polishing, and the silicon nitride mask patterns 31C, 31D, 31Ea, 31Eb, 31Ec, and 31Ed and the pad oxide films 31c, 31d, 31ea, 31eb, 31ec, and 31ed are removed by wet etching. The element isolation trenches 21T filled with the silicon oxide film form the element isolation region 21I, and the shallow trenches 21V filled with the silicon oxide film form the element isolation sub-regions 21Ia through 21Id. Also, parts of the surface of the silicon bulk substrate 21 corresponding to the element regions 21A and 21B and the contact regions 21Aa, 21Ab, 21Ba, and 21Bb are exposed.

Also in the steps of FIGS. 38A through 38E, as in FIGS. 30A through 30E, ion implantation steps are performed.

First, an n-type impurity element is ion-implanted under the element region 21A and the contact regions 21Aa and 21Ab using a mask M1 illustrated in FIG. 38A to form the n-type well 21DNW. For example, phosphorus (P) is implanted under an acceleration voltage of 350 keV with a dose amount of $3 \times 10^{13}$ $cm^{-2}$ to form the n-type well 21DNW.

Next, a p-type impurity element is ion-implanted into the element region 21A and the contact regions 21Aa and 21Ab (i.e., they are p-doped) using the same mask M1 to form the p-type wells 21PW that correspond to the bodies 21BY1 and 21BY2. For example, boron (B) is implanted under an acceleration voltage of 20 keV with a dose amount of $1 \times 10^{13}$ $cm^{-2}$ to form the p-type wells 21PW.

Next, an n-type impurity element is ion-implanted into the element region 21B and the contact regions 21Ba and 21Bb (i.e., they are n-doped) using a mask M2 to form the n-type wells 21NW that correspond to the bodies 21BY3 and 21BY4. For example, arsenic (As) is implanted under an acceleration voltage of 60 keV with a dose amount of $1 \times 10^{13}$ $cm^{-2}$ to form the n-type wells 21NW.

Also in the steps illustrated by FIGS. 38A through 38E, the exposed silicon surfaces are oxidized by thermal oxidation or plasma oxidation to form gate insulating films (not shown) with a thickness of, for example, 1.7 nm that correspond to the gate insulating films 22OX1 through 22OX4.

The order of the ion implantation steps described above may be changed freely.

Figure 39A:
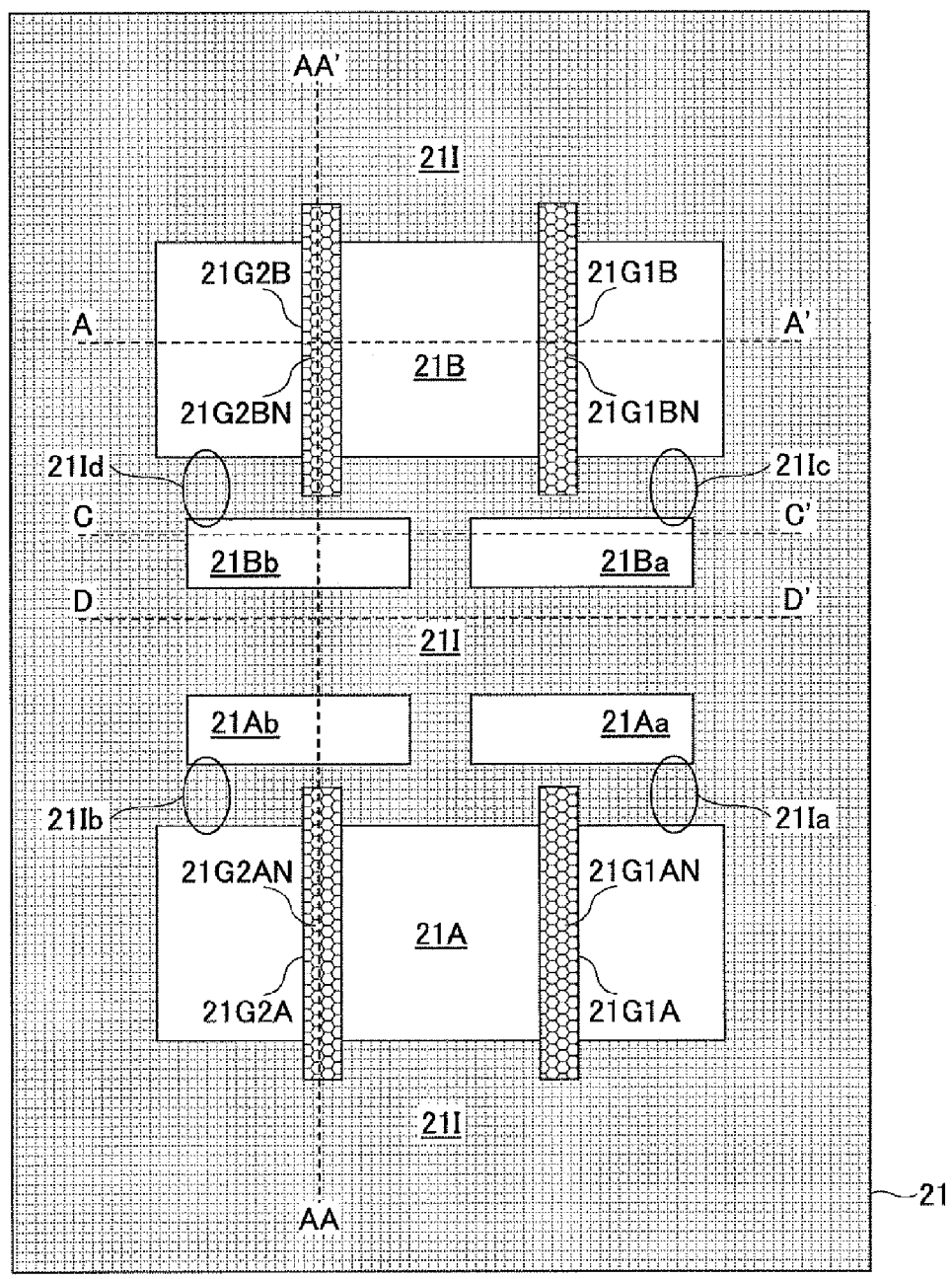
Figure 39B:
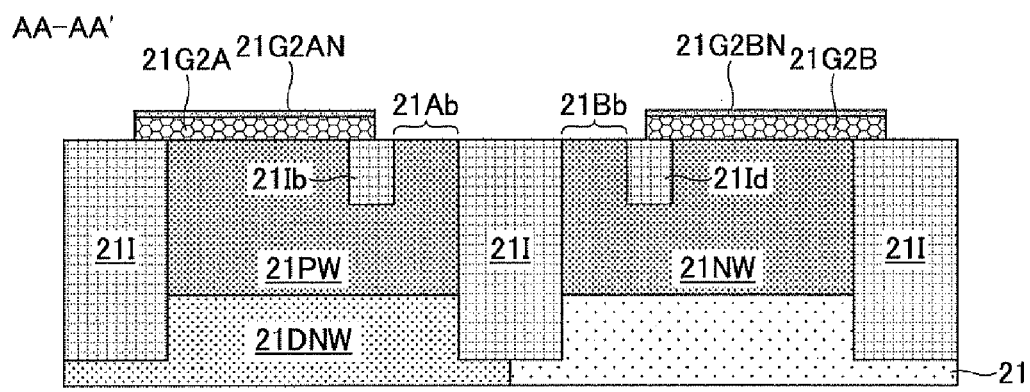
Figure 39C:
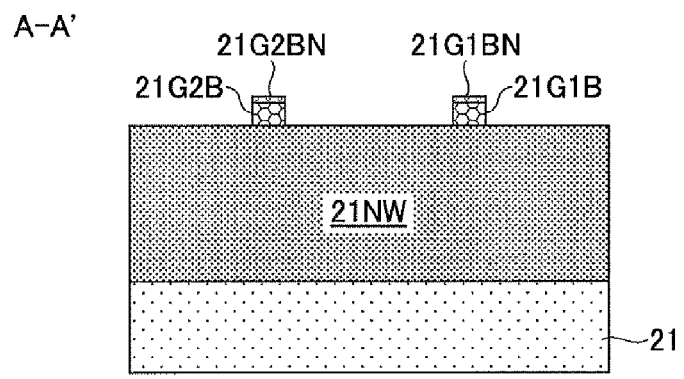
Figure 39D:
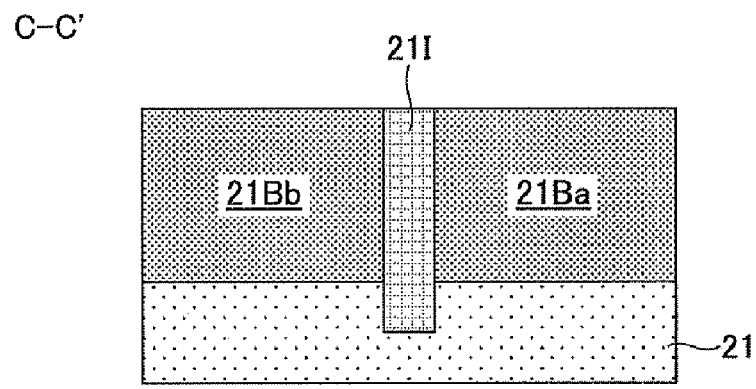
Figure 39E:
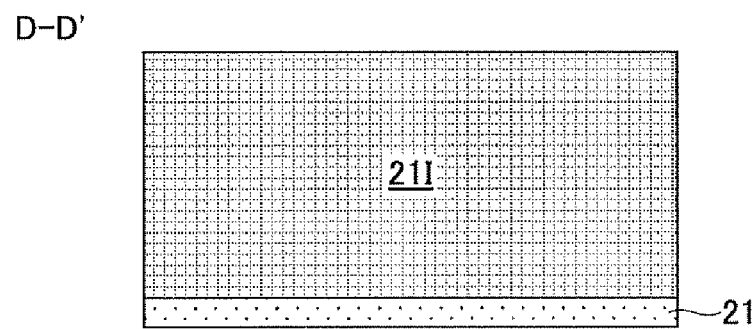

FIG. 39A is a plan view of the silicon bulk substrate 21, FIG. 39B is a cross-sectional view of the silicon bulk substrate 21 of FIG. 39A taken along line AA-AA', FIG. 39C is a cross-sectional view of the silicon bulk substrate 21 of FIG. 39A taken along line A-A', FIG. 39D is a cross-sectional view of the silicon bulk substrate 21 of FIG. 39A taken along line C-C', and FIG. 39E is a cross-sectional view of the silicon bulk substrate 21 of FIG. 39A taken along line D-D'.

In the steps illustrated by FIGS. 39A through 39E, polysilicon patterns 21G1A and 21G2A corresponding to the polysilicon patterns 21G1 and 21G2 are formed on the element region 21A via the corresponding gate insulating films 22OX1 and 22OX2 (not shown). Also, polysilicon patterns 21G1B and 21G2B corresponding to the polysilicon patterns 21G1 and 21G2 are formed on the element region 21B via the corresponding gate insulating films 22OX3 and 22OX4 (not shown).

More specifically, in the steps of FIGS. 39A through 39E, silicon oxide films or silicon oxynitrided films are formed as the gate insulating films 22OX1, 22OX2, 22OX3, and 22OX4 by thermal oxidation and plasma nitridation on the structure illustrated in FIGS. 38A and 38E, and polysilicon films and silicon nitride films are formed sequentially on the silicon oxide films or the silicon oxynitrided films. Then, the polysilicon films and the silicon nitride films are patterned to form the polysilicon patterns 21G1A, 21G1B, 21G2A, and 21G2B. Silicon nitride film patterns 21G1AN, 21G1BN, 21G2AN, and 21G2BN are supported on the formed polysilicon patterns 21G1A, 21G1B, 21G2A, and 21G2B.

Figure 40A:
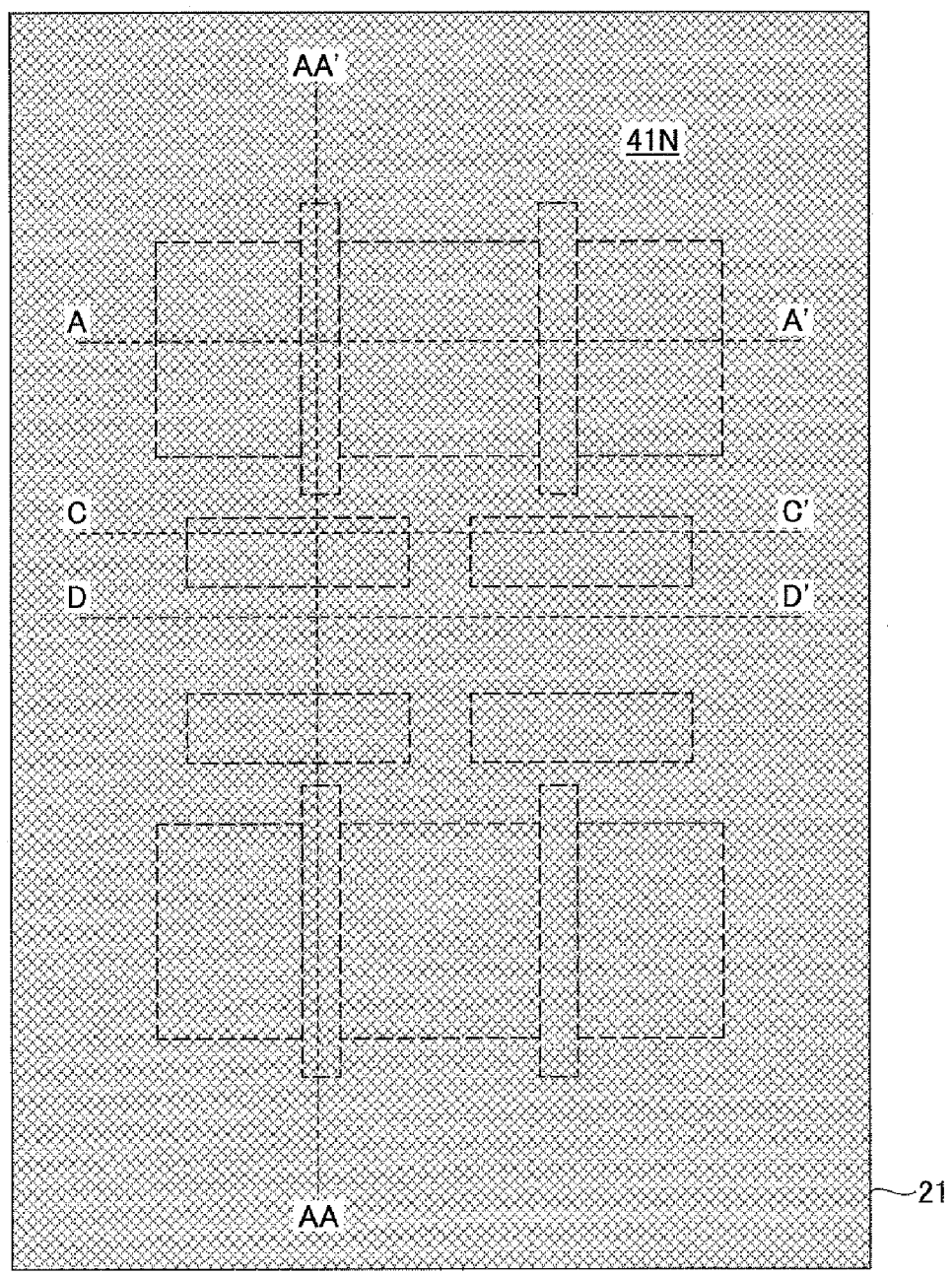
Figure 40B:
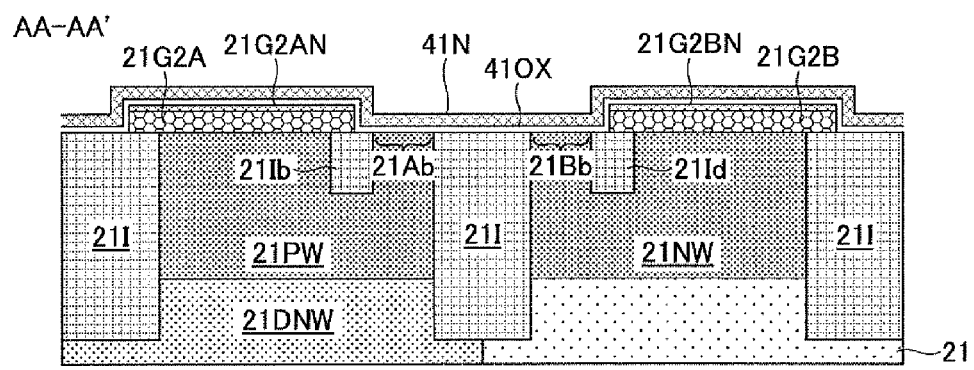
Figure 40C:
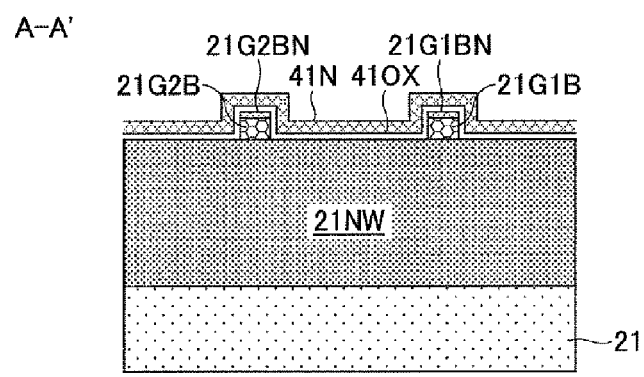
Figure 40D:
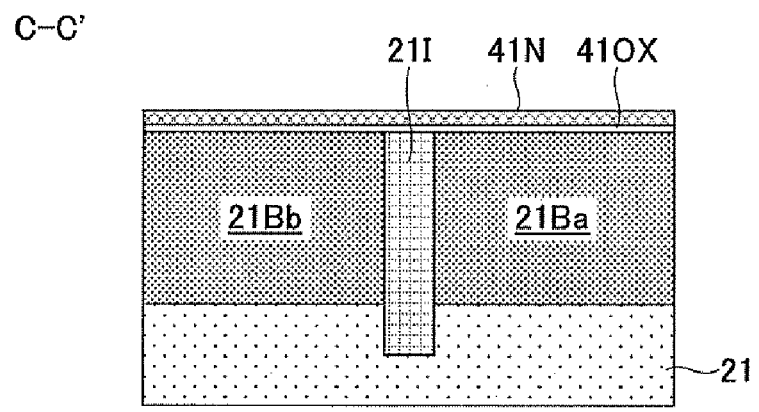
Figure 40E:
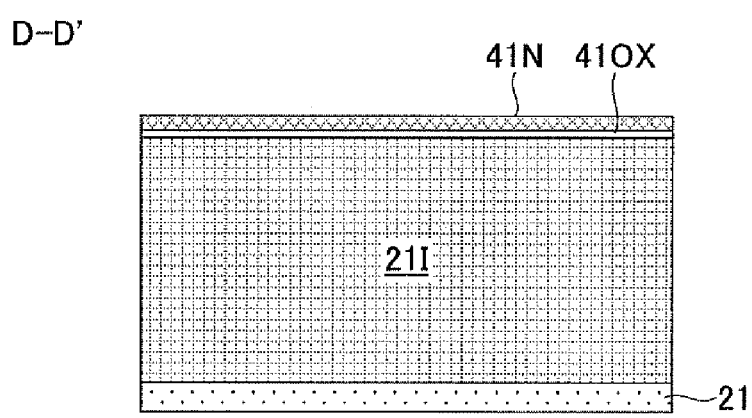

FIG. 40A is a plan view of the silicon bulk substrate 21, FIG. 40B is a cross-sectional view of the silicon bulk substrate 21 of FIG. 40A taken along line AA-AA', FIG. 40C is a cross-sectional view of the silicon bulk substrate 21 of FIG. 40A taken along line A-A', FIG. 40D is a cross-sectional view of the silicon bulk substrate 21 of FIG. 40A taken along line C-C', and FIG. 40E is a cross-sectional view of the silicon bulk substrate 21 of FIG. 40A taken along line D-D'.

In the steps illustrated by FIGS. 40A through 40E, a silicon oxide film 41OX and a silicon nitride film 41N are formed sequentially by a CVD method on the structure illustrated in FIGS. 39A through 39E to cover the silicon nitride film patterns 21G1AN, 21G1BN, 21G2AN, and 21G2BN via the silicon nitride film patterns 21G1AN, 21G1BN, 21G2AN, and 21G2BN.

FIG. 41A is a plan view of the silicon bulk substrate 21, FIG. 41B is a cross-sectional view of the silicon bulk substrate 21 of FIG. 41A taken along line AA-AA', FIG. 41C is a cross-sectional view of the silicon bulk substrate 21 of FIG. 41A taken along line A-A', FIG. 41D is a cross-sectional view of the silicon bulk substrate 21 of FIG. 41A taken along line C-C', and FIG. 41E is a cross-sectional view of the silicon bulk substrate 21 of FIG. 41A taken along line D-D'.

In the steps illustrated by FIGS. 41A through 41E, a resist pattern R15 is formed on the silicon bulk substrate 21 illustrated in FIGS. 40A through 40E such that a portion of the silicon nitride film 41N corresponding to the element region 21A and a portion of the silicon nitride film 41N corresponding to the element region 21B are exposed.

FIG. 42A is a plan view of the silicon bulk substrate 21, FIG. 42B is a cross-sectional view of the silicon bulk substrate 21 of FIG. 42A taken along line AA-AA', FIG. 42C is a cross-sectional view of the silicon bulk substrate 21 of FIG. 42A taken along line A-A', FIG. 42D is a cross-sectional view of the silicon bulk substrate 21 of FIG. 42A taken along line C-C', and FIG. 42E is a cross-sectional view of the silicon bulk substrate 21 of FIG. 42A taken along line D-D'.

In the steps illustrated by FIGS. 42A through 42E, with the resist pattern R15 on the silicon bulk substrate 21 left intact, the silicon nitride film 41N is etched using the silicon oxide film 41OX as an etching stopper by anisotropic dry etching that proceeds in a direction substantially perpendicular to the surface of the silicon bulk substrate 21. Then, the silicon oxide film 41OX is removed by etching using the silicon nitride films 21G1AN, 21G2AN, 21G1BN, and 21G2BN as etching stoppers.

As a result of the above etching steps, as illustrated in FIG. 42B, a structure where the silicon nitride films 21G1AN, 21G1BN, 21G2AN, and 21G2BN are exposed on the polysilicon patterns 21G1A, 21G1B, 21G2A, and 21G2B is obtained.

Also, as illustrated in FIG. 42C, side wall films made of the silicon oxide film 41OX and the silicon nitride film 41N are formed on the sides of the polysilicon patterns 21G1B and 21G2B. In FIG. 42C, the surface of the element region 21B is exposed. Although not shown, side wall films are also formed on the sides of the polysilicon patterns 21G1A and 21G2A and the surface of the element region 21A is exposed as a result of the steps of FIGS. 42A through 42E.

Meanwhile, the contact regions 21Ba and 21Bb are covered by the resist pattern R15 as in the cross section along line C-C' (FIG. 42D), and the element isolation region 21I is covered by the resist pattern R15 as in the cross section along line D-D' (FIG. 42E).

FIG. 43A is a plan view of the silicon bulk substrate 21, FIG. 43B is a cross-sectional view of the silicon bulk substrate 21 of FIG. 43A taken along line AA-AA', FIG. 43C is a cross-sectional view of the silicon bulk substrate 21 of FIG. 43A taken along line A-A', FIG. 43D is a cross-sectional view of the silicon bulk substrate 21 of FIG. 43A taken along line C-C', and FIG. 43E is a cross-sectional view of the silicon bulk substrate 21 of FIG. 43A taken along line D-D'.

In the steps illustrated by FIGS. 43A through 43E, the resist pattern R15 is removed.

As a result, as illustrated in FIG. 43A, a structure where the element regions 21A and 21B are defined by the element isolation region 21I, the element isolation sub-regions 21Ia, 21Ib, 21Ic, and 21Id, and the silicon nitride films 21G1AN, 21G1BN, 21G2AN, and 21G2BN.

FIG. 44A is a plan view of the silicon bulk substrate 21, FIG. 44B is a cross-sectional view of the silicon bulk substrate 21 of FIG. 44A taken along line AA-AA', FIG. 44C is a cross-sectional view of the silicon bulk substrate 21 of FIG. 44A taken along line A-A', FIG. 44D is a cross-sectional view of the silicon bulk substrate 21 of FIG. 44A taken along line C-C', and FIG. 44E is a cross-sectional view of the silicon bulk substrate 21 of FIG. 44A taken along line D-D'.

In the steps illustrated by FIGS. 44A through 44E, portions of the silicon bulk substrate 21 enclosed by dotted lines in FIG. 44A are etched by anisotropic dry etching that proceeds in a direction substantially perpendicular to the surface of the silicon bulk substrate 21 using the element isolation region 21I, the element isolation sub-regions 21Ia, 21Ib, 21Ic, and 21Id, and the silicon nitride films 21G1AN, 21G1BN, 21G2AN, and 21G2BN as masks. In the anisotropic dry etching, an etching gas such as a mixed gas of $Cl_2$ and $H_2$ or an HCl gas may be used. The portions of the silicon bulk substrate 21 are etched to form trenches TX that are deeper than the n-type wells 21NW in the element region 21B and deeper than the p-type wells 21PW in the element region 21A. As a result, as illustrated in FIG. 44C, the body 21BY4 is formed directly below the polysilicon pattern 21G1B and the body 21BY3 is formed directly below the polysilicon pattern 21G2B. The width of the body 21BY4 corresponds to the total width of the polysilicon pattern 21G1B and its side wall films, and the width of the body 21BY3 corresponds to the total width of the polysilicon pattern 21G2B and its side wall films. Similarly, the body 21BY1 is formed directly below the polysilicon pattern 21G1A and the body 21BY2 is formed directly below the polysilicon pattern 21G2A.

In this embodiment, the lower ends of the trenches 21TX do not exceed the lower end of the element isolation region 21I formed by filling the trenches T. This configuration makes it possible to prevent an excessive increase in the thickness of SiGe mixed crystal layers that are to be formed in a later step by filling the trenches 21TX and to be replaced with silicon oxide films, and thereby makes it easier to remove the SiGe mixed crystal layers by etching. Still, it is possible to make the trenches TX deeper than the element isolation region 21I.

FIG. 45A is a plan view of the silicon bulk substrate 21, FIG. 45B is a cross-sectional view of the silicon bulk substrate 21 of FIG. 45A taken along line AA-AA', FIG. 45C is a cross-sectional view of the silicon bulk substrate 21 of FIG. 45A taken along line A-A', FIG. 45D is a cross-sectional view of the silicon bulk substrate 21 of FIG. 45A taken along line C-C', and FIG. 45E is a cross-sectional view of the silicon bulk substrate 21 of FIG. 45A taken along line D-D'.

In the steps illustrated by FIGS. 45A through 45E, SiGe mixed crystal layers 21SG and silicon epitaxial layers 21ES are epitaxially grown in sequence in the trenches 21TX indicated by dotted lines in FIG. 44A by using the element isolation region 21I, the element isolation sub-regions 21Ia, 21Ib, 21Ic, and 21Id, and the silicon nitride films 21G1AN, 21G1BN, 21G2AN, and 21G2BN as masks (the same masks as those used in the steps of FIGS. 44A through 44E). The SiGe mixed crystal layers 21SG are formed, for example, by a CVD method using a mixed gas of silane ($SiH_4$) or dichlorosilane ($SiH_2Cl_2$), germane ($GeH_4$), hydrogen chloride (HCl), and hydrogen ($H_2$) as a material. The silicon epitaxial layers 21ES are formed, for example, by a CVD method using a mixed gas of silane or disilane, hydrogen chloride, and hydrogen as a material.

In the trenches 21TX, the SiGe mixed crystal layers 21SG are grown such that their upper ends correspond approximately to the lower ends of the element isolation sub-regions 21Ia through 21Id. In this example, the upper end of the SiGe mixed crystal layer 21SG exceeds the lower end of the element isolation sub-region 21Ib. This is preferable but is not a prerequisite. If the upper end of the SiGe mixed crystal layer 21SG is slightly below the lower end of the element isolation sub-region 21Ib, the n+ diffusion region forming the n-type diffusion regions 21SN1 and 21DN2 (the source diffusion region 21SN1 and the drain diffusion region 21DN2) touches the p-type wells 21PW under the element isolation sub-region 21Ib. Even in this case, if the resulting pn junction is sufficiently localized, the parasitic capacitance associated with the pn junction does not cause a substantial problem.

When the upper ends of the SiGe mixed crystal layers 21SG are at positions higher than the lower ends of the element isolation sub-regions 21Ia through 21Id, insulating regions to be formed by replacing the SiGe mixed crystal layers 21SG are connected with the element isolation sub-regions 21Ia through 21Id. This configuration is preferable to reduce the parasitic capacitance of the n+ diffusion regions 21NS1 and 21DN2 forming the source and drain regions.

FIG. 46A is a plan view of the silicon bulk substrate 21, FIG. 46B is a cross-sectional view of the silicon bulk substrate 21 of FIG. 46A taken along line AA-AA', FIG. 46C is a cross-sectional view of the silicon bulk substrate 21 of FIG. 46A taken along line A-A', FIG. 46D is a cross-sectional view of the silicon bulk substrate 21 of FIG. 46A taken along line C-C', and FIG. 46E is a cross-sectional view of the silicon bulk substrate 21 of FIG. 46A taken along line D-D'.

In the steps illustrated by FIGS. 46A through 46E, the silicon nitride films 41N, 21G1AN, 21G2AN, 21G1BN, and 21G2BN are removed by, for example, wet etching.

FIG. 47A is a plan view of the silicon bulk substrate 21, FIG. 47B is a cross-sectional view of the silicon bulk substrate 21 of FIG. 47A taken along line AA-AA', FIG. 47C is a cross-sectional view of the silicon bulk substrate 21 of FIG. 47A taken along line A-A', FIG. 47D is a cross-sectional view of the silicon bulk substrate 21 of FIG. 47A taken along line C-C', and FIG. 47E is a cross-sectional view of the silicon bulk substrate 21 of FIG. 47A taken along line D-D'.

In the steps illustrated by FIGS. 47A through 47E, ion implantation is performed on the structure illustrated in FIGS. 46A through 46E and the silicon epitaxial layers 21ES formed in the element region 21B are p-doped to form p-type source and drain extension regions $21se1$ and $21de1$ on the corresponding sides of the polysilicon pattern 21G1B and p-type source and drain extension regions $21se2$ and $21de2$ on the corresponding sides of the polysilicon pattern 21G2B as illustrated in FIG. 47C. Similarly, the silicon epitaxial layers 21ES formed in the element region 21A are n-doped to form n-type source and drain extension regions on the corresponding sides of the polysilicon pattern 21G1A and p-type source and drain extension regions on the corresponding sides of the polysilicon pattern 21G2A. Pocket implantation regions (not shown) may also be formed in the steps of FIGS. 47A through 47E by implanting a p-type impurity element into the element region 21A and an n-type impurity element into the element region 21B by diagonal ion-implantation.

Also in the steps of FIGS. 47A through 47E, side wall insulating films 21SW are formed on the sides of the polysilicon patterns 21G1A, 21G2A, 21G1B, and 21G2B by depositing and etching back a silicon oxide film. Then, similarly to the steps of FIGS. 31A through 31E, an n-type impurity element is ion-implanted in high concentration into the element region 21A and the contact regions 21Ba and 21Bb using a mask M3 to form the diffusion regions 21SN1, 21SN2, 21DN1, and 21DN2 corresponding to the source regions and the drain regions of the n-channel Dt-MOS transistors NMOS1 and NMOS2 and the contact regions 21Ba and 21Bb that are n+ doped. Also, an n-type impurity element is ion-implanted in high concentration into the polysilicon patterns 21G1A and 21G2A to form the n-type polysilicon gate electrodes 23GN1 and 23GN2.

Also, similarly to the steps of FIGS. 31A through 31E, a p-type impurity element is ion-implanted in high concentration into the element region 21B and the contact regions 21Aa and 21Ab using a mask M4 to form the diffusion regions 21SP1, 21SP2, 21DP1, and 21DP2 corresponding to the source regions and the drain regions of the p-channel Dt-MOS transistors PMOS1 and PMOS2 and the contact regions 21Aa and 21Ab that are p+ doped. Further, a p-type impurity element is ion-implanted in high concentration into the polysilicon patterns 21G1B and 21G2B to form the p-type polysilicon gate electrodes 23GP1 and 23GP2.

The conditions of ion-implantation in the steps of FIGS. 47A through 47E are substantially the same as those used in the steps of FIGS. 31A through 31E. Therefore, descriptions of the conditions of ion-implantation are omitted here.

Here, the silicon oxide film 41OX remaining on the contact regions 21Aa through 21Bb (see FIGS. 46D and 46E) are removed during the etch back step for forming the side wall insulating films 21SW.

FIG. 48A is a plan view of the silicon bulk substrate 21, FIG. 48B is a cross-sectional view of the silicon bulk substrate 21 of FIG. 48A taken along line AA-AA', FIG. 48C is a cross-sectional view of the silicon bulk substrate 21 of FIG.

48A taken along line A-A', FIG. 48D is a cross-sectional view of the silicon bulk substrate 21 of FIG. 48A taken along line C-C', and FIG. 48E is a cross-sectional view of the silicon bulk substrate 21 of FIG. 48A taken along line D-D'.

In the steps illustrated by FIGS. 48A through 48E, silicide layers are formed by, for example, the SALICIDE method on the exposed silicon surfaces of the structure illustrated in FIGS. 47A through 47E.

As a result, a silicide layer 21AS is formed on the exposed silicon surface in the element region 21A and a silicide layer 21BS is formed on the exposed silicon surface in the element region 21B. Also, a silicide layer 21G1NS is formed on the polysilicon gate electrode 23G1N, a silicide layer 21G2NS is formed on the polysilicon gate electrode 23G2N, a silicide layer 21G1PS is formed on the polysilicon gate electrode 23G1P, and a silicide layer 21G2PS is formed on the polysilicon gate electrode 23G2P.

Further, silicide layers 21AaS, 21AbS, 21BaS, and 21BbS are formed on the contact regions 21Aa, 21Ab, 21Ba, and 21Bb.

FIG. 49A is a plan view of the silicon bulk substrate 21, FIG. 49B is a cross-sectional view of the silicon bulk substrate 21 of FIG. 49A taken along line AA-AA', FIG. 49C is a cross-sectional view of the silicon bulk substrate 21 of FIG. 49A taken along line BB-BB', FIG. 49D is a cross-sectional view of the silicon bulk substrate 21 of FIG. 49A taken along line C-C', FIG. 49E is a cross-sectional view of the silicon bulk substrate 21 of FIG. 49A taken along line A-A', and FIG. 49F is a cross-sectional view of the silicon bulk substrate 21 of FIG. 49A taken along line D-D'.

In the steps illustrated by FIGS. 49A through 49F, a silicon nitride film 42 used as a mask is uniformly formed on the structure illustrated in FIGS. 48A through 48E.

FIG. 50A is a plan view of the silicon bulk substrate 21, FIG. 50B is a cross-sectional view of the silicon bulk substrate 21 of FIG. 50A taken along line AA-AA', FIG. 50C is a cross-sectional view of the silicon bulk substrate 21 of FIG. 50A taken along line BB-BB', FIG. 50D is a cross-sectional view of the silicon bulk substrate 21 of FIG. 50A taken along line C-C', FIG. 50E is a cross-sectional view of the silicon bulk substrate 21 of FIG. 50A taken along line A-A', and FIG. 50F is a cross-sectional view of the silicon bulk substrate 21 of FIG. 50A taken along line D-D'.

In the steps illustrated by FIGS. 50A through 50F, openings 42ND are formed in the silicon nitride film 42 at positions corresponding to the element isolation region 21I, and the silicon oxide film forming the element isolation region 21I is exposed through the openings 42ND.

FIG. 51A is a plan view of the silicon bulk substrate 21, FIG. 51B is a cross-sectional view of the silicon bulk substrate 21 of FIG. 51A taken along line AA-AA', FIG. 51C is a cross-sectional view of the silicon bulk substrate 21 of FIG. 51A taken along line BB-BB', FIG. 51D is a cross-sectional view of the silicon bulk substrate 21 of FIG. 51A taken along line C-C', FIG. 51E is a cross-sectional view of the silicon bulk substrate 21 of FIG. 51A taken along line A-A', and FIG. 51F is a cross-sectional view of the silicon bulk substrate 21 of FIG. 51A taken along line D-D'.

In the steps illustrated by FIGS. 51A through 51F, dry etching is performed through the openings 42NO in the silicon nitride film 42N to selectively remove the silicon oxide film forming the element isolation region 21I with respect to the silicon bulk substrate 21 and the silicon epitaxial layers 21ES. Then, dry etching is performed again through the openings 42N0 to selectively remove the SiGe mixed crystal layers 21SG exposed as a result of removing the silicon oxide film with respect to the silicon bulk substrate 21 and the silicon epitaxial layers 21ES. In the dry etching, a mixed gas of $Cl_2$ and $H_2$ or an HCl gas may be used as an etching gas. As a result, gaps 21W are formed in positions corresponding to the element isolation region 21I and the SiGe mixed crystal region 21SG. As illustrated in FIG. 51E, the gaps 21W are formed directly below the source region 21SP1 and the drain region 21DP1 of the p-channel Dt-MOS transistor PMOS1 and directly below the source region 21SP2 and the drain region 21DP2 of the p-channel Dt-MOS transistor PMOS2. Although not shown, the gaps 21W are also formed directly below the source region 21SN1 and the drain region 21DN1 of the n-channel Dt-MOS transistor NMOS1 and directly below the source region 21SN2 and the drain region 21DN2 of the n-channel Dt-MOS transistor NMOS2.

FIG. 52A is a plan view of the silicon bulk substrate 21, FIG. 52B is a cross-sectional view of the silicon bulk substrate 21 of FIG. 52A taken along line AA-AA', FIG. 52C is a cross-sectional view of the silicon bulk substrate 21 of FIG. 52A taken along line BB-BB', FIG. 52D is a cross-sectional view of the silicon bulk substrate 21 of FIG. 52A taken along line C-C', FIG. 52E is a cross-sectional view of the silicon bulk substrate 21 of FIG. 52A taken along line D-D', and FIG. 52F is a cross-sectional view of the silicon bulk substrate 21 of FIG. 52A taken along line A-A'.

In the steps illustrated by FIGS. 52A through 52E, a silicon oxide film 21OX is formed through the openings 42NO so as to fill the gaps 21W. For example, the silicon oxide film 21OX may be formed by a high-density CVD method using tetraethylorthosilicate (TEOS) as a material.

Then, the silicon oxide film 21OX on the silicon bulk substrate 21 and the silicon nitride film 42N under the silicon oxide film 21OX are removed by chemical mechanical polishing and wet etching. As illustrated in FIG. 52C, the gaps 21W corresponding to the previously formed element isolation region 21I are filled by the silicon oxide film 21OX. Also, as illustrated in FIG. 52F, the gaps 21W corresponding to the previously formed SiGe mixed crystal layers 21SG under the source and drain regions 21SP1, 21SP2, 21DP1, and 21DP2 of the p-channel Dt-MOS transistors PMOS1 and PMOS2 are filled by the silicon oxide film 21OX. As a result, a structure including the Dt-MOS transistors NMOS1, NMOS2, PMOS1, and PMOS2 with a configuration similar to that described in the above embodiment is obtained on the silicon bulk substrate 21. Descriptions of chemical mechanical polishing steps and wet etching steps and subsequent steps of forming the via contacts VC1 through VC4 are omitted here.

The Dt-MOS transistor of the second embodiment is different from the Dt-MOS transistor of the first embodiment in that the original p-type and n-type wells 21PW and 21NW remain below the contact regions 21Ab and 21Bb as illustrated in FIG. 52C. Even with this configuration, the silicon oxide film 21OX filling the gaps 21W and the shallow element isolation sub-region 21Ib prevent the p+ type contact region 21Ab from being electrically connected via the p-type well 21PW with the n+ type drain region 21DN2 of the n-channel Dt-MOS transistor NMOS2, and generation of huge parasitic capacitance due to the pn junction can be prevented. This also applies to the Dt-MOS transistors NMOS1, PMOS1, and PMOS2.

Also in this embodiment, since the silicon nitride mask patterns 31C, 31D, 31Ea, 31Eb, 31Ec, and 31Ed are formed by photolithography using the same photomask in the step of FIG. 33A, a positional error between the element regions 21A and 21B and the contact regions 21Aa through 21Bb can be effectively prevented. Also, since the element regions 21A and 21B and the contact regions 21Ab through 21Bb are defined by the element isolation region 21I and the element isolation sub-regions 21Ia through 21Id, a positional error between the element regions 21A and 21B and the contact regions 21Aa through 21Bb can be effectively prevented even if the ion implantation described with reference to FIG. 47A is performed in multiple steps using two masks M3 and M4.

Further, since the element isolation sub-regions 21Ia through 21Id do not form pn junctions with the element regions 21A and 21B, it possible to set the width of the element isolation sub-regions 21Ia through 21Id at the minimum value, e.g., 0.11 μm, allowed by the design rules without taking into account the breakdown voltage of the pn junctions.

Thus, the second embodiment also makes it possible to reduce the size of the Dt-MOS transistors NMOS1, NMOS2, PMOS1, and PMOS2 in the length direction of the gate electrodes.

Although not illustrated in FIGS. 52A through 52F, similar to FIG. 6, the lower end of the drain region 21DN1 of the n-channel Dt-MOS transistor NMOS1 is in contact with the upper end of the insulating region 21I1, the lower ends of the source region 21SN1 of the n-channel Dt-MOS transistor NMOS1 and the drain region 21DN2 of the n-channel Dt-MOS transistor NMOS2 are in contact with the upper end of the insulating region 21I2, and the lower end of the source region 21SN2 of the n-channel Dt-MOS transistor NMOS2 is in contact with the upper end of the insulating region 21I3.

Also, as illustrated in FIG. 52F, the lower end of the source region 21SP1 of the p-channel Dt-MOS transistor PMOS1 is in contact with the upper end of the silicon oxide film 21OX, the lower ends of the drain region 21DP1 of the p-channel Dt-MOS transistor PMOS1 and the drain region 21DP2 of the p-channel Dt-MOS transistor PMOS2 are in contact with the upper end of the silicon oxide film 21OX, and the lower end of the source region 21SP2 of the p-channel Dt-MOS transistor PMOS2 is in contact with the upper end of the silicon oxide film 21OX.

This configuration makes it possible to greatly reduce the parasitic capacitance associated with the source regions and the drain regions of Dt-MOS transistors and thereby makes it possible to increase the operating speed of the Dt-MOS transistors.

The diffusion regions forming the source regions and the drain regions in the above descriptions may provide opposite functions depending on required operations of an actual circuit.

<Third Embodiment>

In the above embodiments, 2-input NAND circuits are used as examples of semiconductor integrated circuits including n-channel and p-channel Dt-MOS transistors. However, the n-channel and p-channel Dt-MOS transistors according to the above embodiments can also be used separately or to form any other electronic circuit.

FIGS. 53A through 53E illustrate a semiconductor integrated circuit including one n-channel Dt-MOS transistor and one p-channel Dt-MOS transistor. The same reference numbers are used for the corresponding components in FIGS. 53A through 53E and the previous figures, and descriptions of those components are omitted.

In this embodiment, the n-channel Dt-MOS transistor NMOS1 including the gate electrode 23G1N contacting the contact region 21Aa is formed in the element region 21A, and the p-channel Dt-MOS transistor PMOS2 including the gate electrode 23G2P contacting the contact region 21Ba is formed in the element region 21B.

In other word, the element region 21A including the p-type well 21PW, the p+ type contact region 21Aa, the n+ type contact region 21Ba, and the element region 21B including the n-type well 21NW are arranged on the silicon bulk substrate 21.

This embodiment also makes it possible to reduce the size of the n-channel Dt-MOS transistor NMOS1 and the p-channel Dt-MOS transistor PMOS2 in the length direction of the gate electrodes.

The n-channel Dt-MOS transistor NMOS1 and the p-channel Dt-MOS transistor PMOS2 can be used to produce various logic circuits such as a CMOS device as illustrated by FIG. 54.

In the CMOS device illustrated by FIG. 54, a via contact 61in is formed on the element isolation region 21I between the contact regions 21Aa and 21Bb. The via contact 61in connects the gate electrode 23G1N with the contact region 21Aa, connects the gate electrode 23G2P with the contact region 21Ba, and also connects the gate electrode 23G1N and the gate electrode 23G2P with each other.

Also, a power supply pattern 61PWR and a power supply pattern 61GND are formed on the silicon bulk substrate 21. The power supply pattern 61PWR supplies a supply voltage Vcc via a source contact S to the source region of the p-channel Dt-MOS transistor PMOS2. The power supply pattern 61GND supplies a ground voltage Vss to the source region of the n-channel Dt-MOS transistor NMOS1.

Further, a wiring pattern 61WR is formed on the silicon bulk substrate 21. The wiring pattern 61WR contacts the drain region of the n-channel Dt-MOS transistor NMOS1 via a contact D and contacts the drain region of the p-channel Dt-MOS transistor PMOS2 via a contact D.

An input signal is supplied to the via contact 61in and an output signal is obtained from a via contact 61out. Thus, the semiconductor integrated circuit illustrated by FIG. 54 functions as a CMOS device.

FIG. 55 illustrates a CMOS device according to a variation of the third embodiment. The CMOS device of FIG. 55 includes substantially the same components as those of the CMOS device of FIG. 54, and therefore descriptions of the components are omitted.

In FIG. 55, the contact region 21Aa and the contact region 21Ba are disposed adjacent to each other. With this configuration, it is not possible to form a silicide layer on the contact regions 21Aa and 21Ba, and the pn junction between the contact regions 21Aa and 21Ba causes parasitic capacitance. However, this configuration makes it possible to further reduce the area of the CMOS device including the n-channel Dt-MOS transistor NMOS1 and the p-channel Dt-MOS transistor PMOS2.

<Fourth Embodiment>

FIG. 56 is an equivalent circuit schematic of one memory cell of a static random access memory (SRAM) 70 according to a fourth embodiment.

As illustrated in FIG. 56, the SRAM 70 includes a first CMOS inverter and a second CMOS inverter that constitute a flip-flop circuit. The first CMOS inverter includes an n-channel MOS transistor Tr1 and a p-channel MOS transistor Tr3 that are connected in series via a node N1 between a supply voltage Vdd and a supply voltage Vss. The second CMOS inverter includes an n-channel MOS transistor Tr6 and a p-channel MOS transistor Tr4 that are connected in series via a node N2 between the supply voltage Vdd and the supply voltage Vss. The node N1 is connected to a bit line /BL via a transfer transistor implemented by an re-channel Dt-MOS transistor Tr2 that is driven by a selection signal on a word line WL. The node N2 is connected to a bit line BL via a transfer transistor implemented by an n-channel Dt-MOS transistor Tr5 that is driven by a selection signal on the same word line WL. The transistors Tr1 through Tr6 are formed on a common silicon bulk substrate 71.

FIG. 57 is a plan view of the SRAM 70 of FIG. 56.

As illustrated in FIG. 57, shallow trench isolation (STI) regions (element isolation regions) STI1 through STI3 are formed on the silicon bulk substrate 71. The element isolation regions STI1 through STI3 have strip-like shapes and are parallel to each other. The n-channel MOS transistor Tr1 and the re-channel Dt-MOS transistor Tr2 are formed in an active region AC1 between the element isolation regions STI1 and STI2. The n-channel MOS transistor Tr6 and the re-channel Dt-MOS transistor Tr5 are formed in an active region AC2 between the element isolation regions STI1 and STI3. In the active regions AC1 and AC2, the surface of the silicon bulk substrate 71 is exposed.

In the element isolation region STI1, active regions AC3 and AC4 are defined, and the p-channel MOS transistors Tr3 and Tr4 are formed in the active regions AC3 and AC4. Gate electrodes G1 of the MOS transistor Tr1 and the MOS transistor Tr3 are both connected with the source region of the p-channel MOS transistor Tr4 through a via contact SC1. Similarly, gate electrodes G2 of the MOS transistor Tr6 and the MOS transistor Tr4 are both connected to the source region of the p-channel MOS transistor Tr3 through a via contact SC2. A power supply contact Vss1 to which the supply voltage Vss is supplied is formed at the source region of the MOS transistor Tr1. The drain region of the n-channel Dt-MOS transistor Tr2 is connected to the bit line /BL via a bit line contact BLC1. Similarly, a power supply contact Vss2 to which the supply voltage Vss is supplied is formed at the source region of the MOS transistor Tr6. The drain region of the n-channel Dt-MOS transistor Tr5 is connected to the bit line BL via a bit line contact BLC2.

In the active region AC1, an intermediate contact NC1 corresponding to the drain region of the re-channel MOS transistor Tr1 and the source region of the n-channel Dt-MOS transistor Tr2 is formed between the bit line contact BLC1 and the power supply contact Vss1. The intermediate contact NC1 is connected to the via contact SC2 through a wiring L1.

Similarly, in the active region AC2, an intermediate contact NC2 corresponding to the drain region of the n-channel MOS transistor Tr6 and the source region of the n-channel Dt-MOS transistor Tr5 is formed between the bit line contact BLC2 and the power supply contact Vss2. The intermediate contact NC2 is connected to the via contact SC1 through a wiring L2.

A gate electrode G3 of the n-channel Dt-MOS transistor Tr2 extends over a part of the element isolation region STI2 to a contact region CT1 formed in the element isolation region STI2 and contacts a via contact 70VC1. Similarly, a gate electrode G4 of the re-channel Dt-MOS transistor Tr5 extends over a part of the element isolation region STI3 to a contact region CT2 formed in the element isolation region STI3 and contacts a via contact 70VC2.

In the third embodiment, the n-channel Dt-MOS transistors Tr2 and Tr5 are implemented by the Dt-MOS transistors of the first or second embodiment. Accordingly, this makes it possible to reduce the sizes of the Dt-MOS transistors Tr2 and Tr2 in the length directions of the gate electrodes G3 and G4 and thereby makes it possible to reduce the area of the SRAM 70.

Also in this embodiment, as illustrated in FIG. 57, the n-channel Dt-MOS transistor Tr2 and the n-channel MOS transistor Tr1 are formed adjacent to each other in the same active region AC1, and the source region of the n-channel Dt-MOS transistor Tr2 and the drain region of the n-channel MOS transistor Tr1 are implemented by a common component (or region). Similarly, the n-channel Dt-MOS transistor Tr5 and the n-channel MOS transistor Tr6 are formed adjacent to each other in the same active region AC2, and the source region of the n-channel Dt-MOS transistor Tr5 and the drain region of the n-channel MOS transistor Tr6 are implemented by a common component (or region). With this configuration, there is no need to form an element isolation region between adjacent transistors. Thus, this configuration makes it possible to reduce the size of each cell of the SRAM 70 in the length direction of the gate electrodes of the MOS transistors Tr1 and Tr2.

Figure 1:
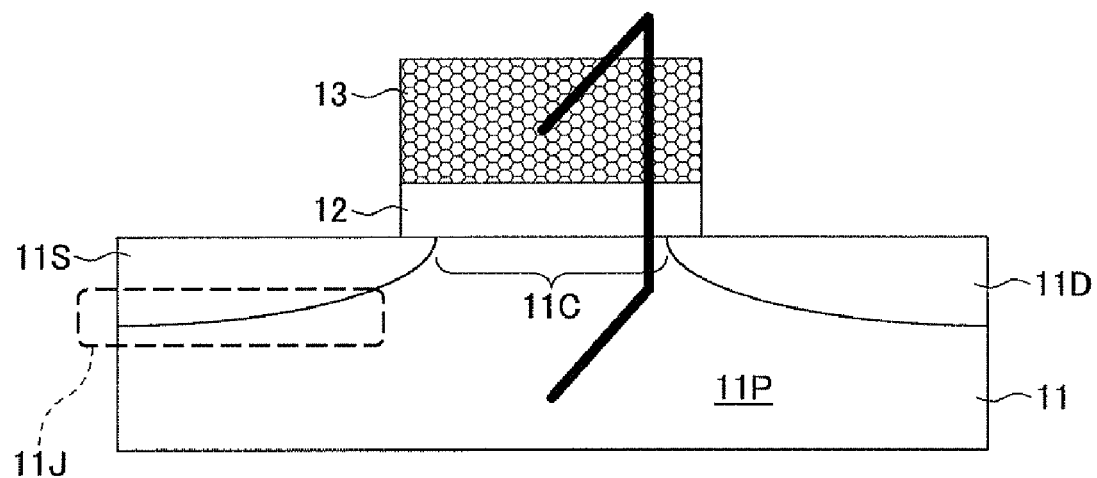
FIG. 1 is a drawing illustrating an exemplary configuration of a typical Dt-MOS transistor.
Figure 2:
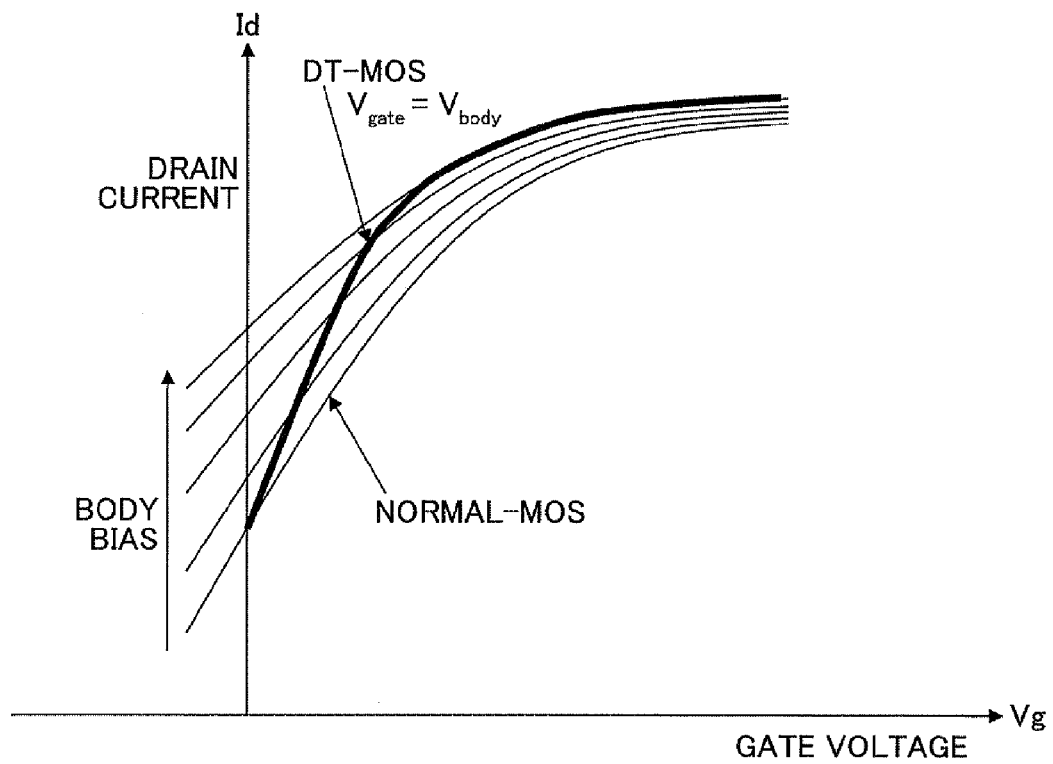
FIG. 2 is a graph representing typical operating characteristics of a Dt-MOS transistor.

In the SRAM 70 as illustrated in FIG. 7, a voltage change in the body region of the n-channel Dt-MOS transistor Tr2, which operates as a dynamic threshold transistor as described with reference to FIG. 2, also occurs in the channel region of the n-channel MOS transistor Tr1. As a result, the n-channel (non-Dt) MOS transistor Tr1 also functions like a dynamic threshold transistor. Similarly, a voltage change in the body region of the n-channel Dt-MOS transistor Tr5, which operates as a dynamic threshold transistor as described with reference to FIG. 2, also occurs in the channel region of the n-channel MOS transistor Tr6. As a result, the n-channel (non-Dt) MOS transistor Tr6 also functions like a dynamic threshold transistor.

FIGS. 58A and 58B are graphs representing a relationship between a read current Iread obtained at the bit line BL of the SRAM 70 and the supply voltage Vdd. In FIG. 58B, a part of the graph of FIG. 58A is enlarged and the read current Iread is indicated in a logarithmic scale.

As in FIGS. 58A and 58B, the read current Iread of the SRAM 70 when the supply voltage Vdd is 0.5 V is about seven times greater than that of a comparative example where no dynamic threshold transistor is used.

Thus, using the Dt-MOS transistors Tr2 and Tr5 makes it possible to increase the read current Iread. This in turn makes it possible to reduce the difference between the read current at the bit line BL and the read current at the bit line /BL.

In the above embodiments, p-type and n-type (conductivity types) may be interchanged.

As described above, this disclosure makes it possible to reduce the size of a Dt-MOS transistor and/or a semiconductor integrated circuit including a Dt-MOS transistor. Also, this disclosure makes it possible to produce a Dt-MOS transistor using a self-alignment process.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

The invention claimed is:

1. A semiconductor device, comprising:
    a silicon substrate;
    an element isolation region formed in the silicon substrate;
    an element region including a first well having a first conductivity type;
    a contact region having the first conductivity type, the element region and the contact region being defined by the element isolation region;
    a gate electrode formed on the silicon substrate via a gate insulating film and extending from the element region to a sub-region of the element isolation region between the element region and the contact region;
a source diffusion region formed in the first well and having a second conductivity type that is opposite to the first conductivity type;
a drain diffusion region formed in the first well and having the second conductivity type;
a first insulating region formed in the silicon substrate and disposed to contact a lower end of the source diffusion region;
a second insulating region formed in the silicon substrate and disposed to contact a lower end of the drain diffusion region; and
a via plug configured to electrically connect the gate electrode with the contact region, wherein
the first well is disposed below the gate electrode between the first insulating region and the second insulating region;
the first well is electrically connected with the contact region via the silicon substrate under the sub-region;
upper ends of the first and second insulating regions are located higher than a lower end of the first well;
lower ends of the first and second insulating regions are located lower than the lower end of the first well;
a lower end of the element isolation region except the sub-region is located lower than the lower end of the first well; and
the sub-region is in contact with the first and second insulating regions at a position higher than the lower end of the first well.

2. The semiconductor device as claimed in claim 1, wherein
the first and second insulating regions extend below the sub-region to the contact region; and
a lower end of the sub-region is in contact with the upper ends of the first and second insulating regions.

3. The semiconductor device as claimed in claim 1, further comprising:
a second well formed below the first well and having the second conductivity type,
wherein the lower ends of the first and second insulating regions are in contact with the second well.

4. The semiconductor device as claimed in claim 1, further comprising:
silicide layers formed on surfaces of the source diffusion region, the drain diffusion region, the contact region, and the gate electrode,
wherein the via plug is configured to electrically connect the gate electrode with the contact region via the silicide layers.

5. The semiconductor device as claimed in claim 1, wherein a width of the sub-region in a length direction of the gate electrode is about 0.11 μm.

6. A semiconductor device, comprising:
a silicon substrate;
an element isolation region formed in the silicon substrate;
a first element region including a p-type first well and a second element region including an n-type second well, the first element region and the second element region being defined by the element isolation region;
a p-type first contact region defined in the silicon substrate and disposed adjacent to the first element region;
an n-type second contact region defined in the silicon substrate and disposed adjacent to the second element region;
a first gate electrode formed on the silicon substrate via a first gate insulating film and extending from the first element region to a first sub-region of the element isolation region between the first element region and the first contact region;
a second gate electrode formed on the silicon substrate via a second gate insulating film and extending from the second element region to a second sub-region of the element isolation region between the second element region and the second contact region;
an n-type first source diffusion region formed in the first well;
an n-type first drain diffusion region formed in the first well;
a p-type second source diffusion region formed in the second well;
a p-type second drain diffusion region formed in the second well;
a first insulating region formed in the silicon substrate and disposed to contact a lower end of the first source diffusion region;
a second insulating region formed in the silicon substrate and disposed to contact a lower end of the first drain diffusion region;
a third insulating region formed in the silicon substrate and disposed to contact a lower end of the second source diffusion region;
a fourth insulating region formed in the silicon substrate and disposed to contact a lower end of the second drain diffusion region; and
a via plug, wherein
the first well is disposed below the first gate electrode between the first insulating region and the second insulating region;
the second well is disposed below the second gate electrode between the third insulating region and the fourth insulating region;
the first well extends below the first sub-region and is electrically connected with the first contact region;
the second well extends below the second sub-region and is electrically connected with the second contact region;
upper ends of the first and second insulating regions are located higher than a lower end of the first well;
upper ends of the third and fourth insulating regions are located higher than a lower end of the second well;
lower ends of the first and second insulating regions are located lower than the lower end of the first well;
lower ends of the third and fourth insulating regions are located lower than the lower end of the second well;
a lower end of the element isolation region except the first and second sub-regions is located lower than the lower ends of the first, second, third, and fourth insulating regions;
the first sub-region is in contact with the first and second insulating regions at a position higher than the lower end of the first well;
the second sub-region is in contact with the third and fourth insulating regions at a position higher than the lower end of the second well; and
the via plug is configured to connect the first gate electrode and the second gate electrode to each other, to electrically connect the first gate electrode with the first contact region, and to electrically connect the second gate electrode with the second contact region.

7. The semiconductor device as claimed in claim 6, wherein
the first and second insulating regions extend below the first sub-region to the first contact region;

a lower end of the first sub-region is in contact with the upper ends of the first and second insulating regions;

the third and fourth insulating regions extend below the second sub-region to the second contact region; and a lower end of the second sub-region is in contact with the upper ends of the third and fourth insulating regions.

8. The semiconductor device as claimed in claim 6, further comprising:

an n-type third well formed below the first well; and a p-type fourth well formed below the second well, wherein the lower ends of the first and second insulating regions are in contact with an upper end of the third well; and the lower ends of the third and fourth insulating regions are in contact with an upper end of the fourth well.

9. The semiconductor device as claimed in claim 6, further comprising:

silicide layers formed on surfaces of the first and second source diffusion regions, the first and second drain diffusion regions, the first and second contact regions, and the first and second gate electrodes, wherein the via plug is configured to electrically connect the first and second gate electrodes with the corresponding first and second contact regions via the silicide layers.

10. A semiconductor integrated circuit, comprising:

a silicon substrate;

an element isolation region formed in the silicon substrate;

a first element region including a p-type first well and a second element region including an n-type second well, the first element region and the second element region being defined by the element isolation region;

p-type first and second contact regions defined in the silicon substrate, the first and second contact regions being adjacent to each other and to the first element region;

n-type third and fourth contact regions defined in the silicon substrate, the third and fourth contact regions being adjacent to each other and to the second element region;

first and second n-channel MOS transistors formed in the first element region; and first and second p-channel MOS transistors formed in the second element region, wherein the first n-channel MOS transistor includes a first gate electrode formed on the silicon substrate via a first gate insulating film and extending from the first element region to a first sub-region of the element isolation region between the first element region and the first contact region, a first n-type diffusion region formed in the first well, and a second n-type diffusion region formed in the first well, the first n-type diffusion region and the second n-type diffusion region forming source and drain diffusion regions;

the second n-channel MOS transistor includes a second gate electrode formed on the silicon substrate via a second gate insulating film and extending in parallel with the first gate electrode from the first element region to a second sub-region of the element isolation region between the first element region and the second contact region, a third n-type diffusion region formed in the first well, and a fourth n-type diffusion region formed in the first well, the third n-type diffusion region and the fourth n-type diffusion region forming source and drain diffusion regions;

the first p-channel MOS transistor includes a third gate electrode formed on the silicon substrate via a third gate insulating film and extending from the second element region to a third sub-region of the element isolation region between the second element region and the third contact region, a first p-type diffusion region formed in the second well, and a second p-type diffusion region formed in the second well, the first p-type diffusion region and the second p-type diffusion region forming source and drain diffusion regions;

the second p-channel MOS transistor includes a fourth gate electrode formed on the silicon substrate via a fourth gate insulating film and extending in parallel with the third gate electrode from the second element region to a fourth sub-region of the element isolation region between the second element region and the fourth contact region, a third p-type diffusion region formed in the second well, and a fourth p-type diffusion region formed in the second well, the third p-type diffusion region and the fourth p-type diffusion region forming source and drain diffusion regions;

the second n-type diffusion region and the third n-type diffusion region are implemented by a same diffusion region formed in the first well;

the second p-type diffusion region and the third p-type diffusion region are implemented by a same diffusion region formed in the second well;

first, second, third, and fourth insulating regions are formed in the first element region so as to contact lower ends of the first, second, third, and fourth n-type diffusion regions;

fifth, sixth, seventh, and eighth insulating regions are formed in the second element region so as to contact lower ends of the first, second, third, and fourth p-type diffusion regions;

the second insulating region and the third insulating region are implemented by a same insulating region;

the sixth insulating region and the seventh insulating region are implemented by a same insulating region;

a p-type first body region of the first re-channel MOS transistor implemented by a part of the first well and extending below the first gate electrode between the first insulating region and the second insulating region extends further below the first sub-region and is electrically connected with the first contact region;

a p-type second body region of the second re-channel MOS transistor implemented by a part of the first well and extending below the second gate electrode between the third insulating region and the fourth insulating region extends further below the second sub-region and is electrically connected with the second contact region;

an n-type third body region of the first p-channel MOS transistor implemented by a part of the second well and extending below the third gate electrode between the fifth insulating region and the sixth insulating region extends further below the third sub-region and is electrically connected with the third contact region;

an n-type fourth body region of the second p-channel MOS transistor implemented by a part of the second well and extending below the fourth gate electrode between the seventh insulating region and the eighth insulating region extends further below the fourth sub-region and is electrically connected with the fourth contact region;

the first gate electrode is electrically connected with the first body region via the first contact region;

the second gate electrode is electrically connected with the second body region via the second contact region;

the third gate electrode is electrically connected with the third body region via the third contact region;

the fourth gate electrode is electrically connected with the fourth body region via the fourth contact region;

upper ends of the first, second, third, and fourth insulating regions are located higher than a lower end of the first well;

upper ends of the fifth, sixth, seventh, and eighth insulating regions are located higher than a lower end of the second well;

lower ends of the first, second, third, and fourth insulating regions are located lower than the lower end of the first well;

lower ends of the fifth, sixth, seventh, and eighth insulating regions are located lower than the lower end of the second well;

a lower end of the element isolation region except the first through fourth sub-regions is located lower than the lower ends of the first through eighth insulating regions;

the first sub-region is in contact with the first and second insulating regions at a position higher than the lower end of the first well;

the second sub-region is in contact with the third and fourth insulating regions at a position higher than the lower end of the first well;

the third sub-region is in contact with the fifth and sixth insulating regions at a position higher than the lower end of the second well;

the fourth sub-region is in contact with the seventh and eighth insulating regions at a position higher than the lower end of the second well; and wiring that contacts at least the first and fourth n-type diffusion regions and the first and fourth p-type diffusion regions is formed on the silicon substrate.

11. The semiconductor integrated circuit as claimed in claim 10, wherein the first and second insulating regions extend below the first sub-region to the first contact region;

a lower end of the first sub-region is in contact with the upper ends of the first and second insulating regions;

the third and fourth insulating regions extend below the second sub-region to the second contact region;

a lower end of the second sub-region is in contact with the upper ends of the third and fourth insulating regions;

the fifth and sixth insulating regions extend below the third sub-region to the third contact region;

a lower end of the third sub-region is in contact with the upper ends of the fifth and sixth insulating regions;

the seventh and eighth insulating regions extend below the fourth sub-region to the fourth contact region; and a lower end of the fourth sub-region is in contact with the upper ends of the seventh and eighth insulating regions.

12. The semiconductor integrated circuit as claimed in claim 10, wherein the wiring includes
  a ground pattern configured to ground the fourth n-type diffusion region,
  first and second power supply patterns configured to supply a supply voltage to the first and fourth p-type diffusion regions, and
  a wiring pattern configured to connect the first n-type diffusion region to the second and third p-type diffusion regions; and the semiconductor integrated circuit is a 2-input NAND circuit.

* * * * *